United States Patent [19]

Aker et al.

[11] Patent Number: 5,565,871
[45] Date of Patent: Oct. 15, 1996

[54] POLICE TRAFFIC RADAR FOR ALLOWING MANUAL REJECTION OF INCORRECT PATROL SPEED DISPLAY

[75] Inventors: John L. Aker, Kansas City, Mo.; Robert S. Gammenthaler, Princeton; Alan B. Mead, Plano, both of Tex.

[73] Assignee: Applied Concepts Inc., Plano, Tex.

[21] Appl. No.: 386,374

[22] Filed: Feb. 10, 1995

[51] Int. Cl.⁶ ..................................... G01S 15/60
[52] U.S. Cl. .......................... 342/176; 342/175; 342/104; 340/936
[58] Field of Search .................. 342/175, 176, 342/104; 340/936

[56] References Cited

U.S. PATENT DOCUMENTS

| | | | |
|---|---|---|---|
| Re. 29,401 | 9/1977 | Aker et al. | 343/8 |
| 3,438,831 | 4/1969 | Fathauer . | |
| 3,689,921 | 9/1972 | Berry | 343/8 |
| 3,936,824 | 2/1976 | Aker et al. | 343/8 |
| 4,214,243 | 7/1980 | Patterson | 343/8 |
| 4,236,140 | 11/1980 | Aker et al. | 343/8 |
| 4,293,859 | 10/1981 | Sergent | 343/702 |
| 4,335,382 | 6/1982 | Brown et al. | 343/8 |
| 4,335,383 | 6/1982 | Berry | 343/8 |
| 4,740,045 | 4/1988 | Goodson et al. | 342/112 |
| 4,743,908 | 5/1988 | Brassfield et al. | 342/113 |
| 4,988,994 | 1/1991 | Loeven | 340/936 |
| 5,371,718 | 12/1994 | Ikeda et al. | 367/91 |

OTHER PUBLICATIONS

Craig Paterson, Speed Enforcement Technology, An explanation of the latest features and capabilities of speed detection equipment, Law and Order, vol. 41, No. 9, Sep. 1993, pp. 32–41.

*Primary Examiner*—J. Woodrow Eldred
*Attorney, Agent, or Firm*—Ron Fish; Falk, Vestal & Fish

[57] ABSTRACT

A police radar utilizing digital data transmission from the antenna unit to a separately housed counting and display unit. The antenna has a double balanced mixer to suppress even order harmonics. The counting and display unit has a computer programmed to perform digital signal processing on the digital data received from the antenna to improve the quality and accuracy of calculated speeds for patrol speed, strongest target speed and fastest target speed. Fastest target speed can be displayed simultaneously with strongest target speed. Signal processing techniques are used to suppress false signals caused by double and triple bounce, harmonics, ntermodulation products, video display terminal interference, etc.

7 Claims, 46 Drawing Sheets

Chip antga16 PAL16R4

| 1 | 2 | 3 | 4 | 5 | 6 | 7 | 8 | 9 | 10 | ← PIN # |
|---|---|---|---|---|---|---|---|---|---|---|
| clk | cki | fso | adc | i4 | i5 | /res | rfi | ck | gnd | ← SIGNAL |

| /en | /dout | lc | /A | /B | /C | /D | /cko | xoff | vcc | ← SIGNAL |
|---|---|---|---|---|---|---|---|---|---|---|
| 11 | 12 | 13 | 14 | 15 | 16 | 17 | 18 | 19 | 20 | ← PIN # | equations

```
cko = /ck * /fso
    + /ck * A * /D
    + /ck * B
    + /ck * C
    + /ck * /A * D
cko.oe = vcc A := /fso + /A * B + /A * C + /A * D
B := fso * A * /B * /D + /A * B
C := A * B * /C + /A * C + /B * C
D := A * B * C * /D + /A * /B * /C * D
dout = adc * /D * /C
     + rfi * /ck * /A * B * C * /D
     + rfi * ck * A * B * C * /D
     + cki * /A * /B * /C * D
     + /cki * A * /B * /C * D
dout.oe = vcc
/lc = /cki * ck * A * /B * /C * D
lc.oe = vcc
/xoff = /res * i4 * /i5
xoff.oe = vcc
```

FIG. 15A

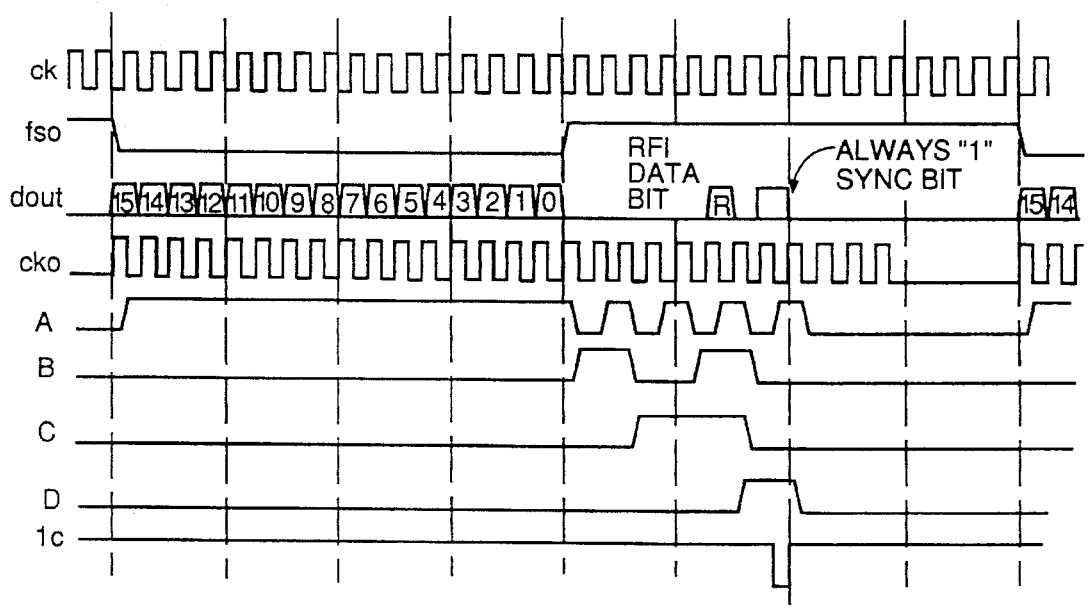

FIG. 15B

; Stalker II processor GAL #1 equations 10/21/93 chip prgal1 PAL16R4
  1   2   3    4    5    6    7    8   9  10 ←——484
clk sck ds ps xy a15 a14 a13 i8 gnd ←————480
/en promcs ramad13 /A /B /C /D ramcs sc2 vcc ←————482
 11  12     13      14 15 16 17  18   19  20 ←——486 equations
;15 count resettable one-shot
A := sck + /A * B + /A * C + /A * D      ;sck presets to state 1
B := A * /B * /sck + /A * B * /sck
C := A * B * /C * /sck + /A * C * /sck + /B * C * /sck
D := A * B * C * /D * /sck + /C * D * /sck + /B * D * /sck + /A * D * /sck
/sc2 = /A * /B * /C * /D * /sck     ;output when state 0 reached
sc2.oe = vcc
; prom selected from P:$8000 to $FFFF
/promcs = /ps * ds * a15
promcs.oe = vcc
;P:ram 0 to $3FFF, X: & Y: to $1FFF
/ramcs = /ps * ds * /a14 * /a15 + ps * /ds * /a13 * /a14 * /a15
ramcs.oe = vcc
/ramad13 = /ps * ds * /a13 + ps * /ds * xy
;ramad13.oe = vcc

FIG. 19

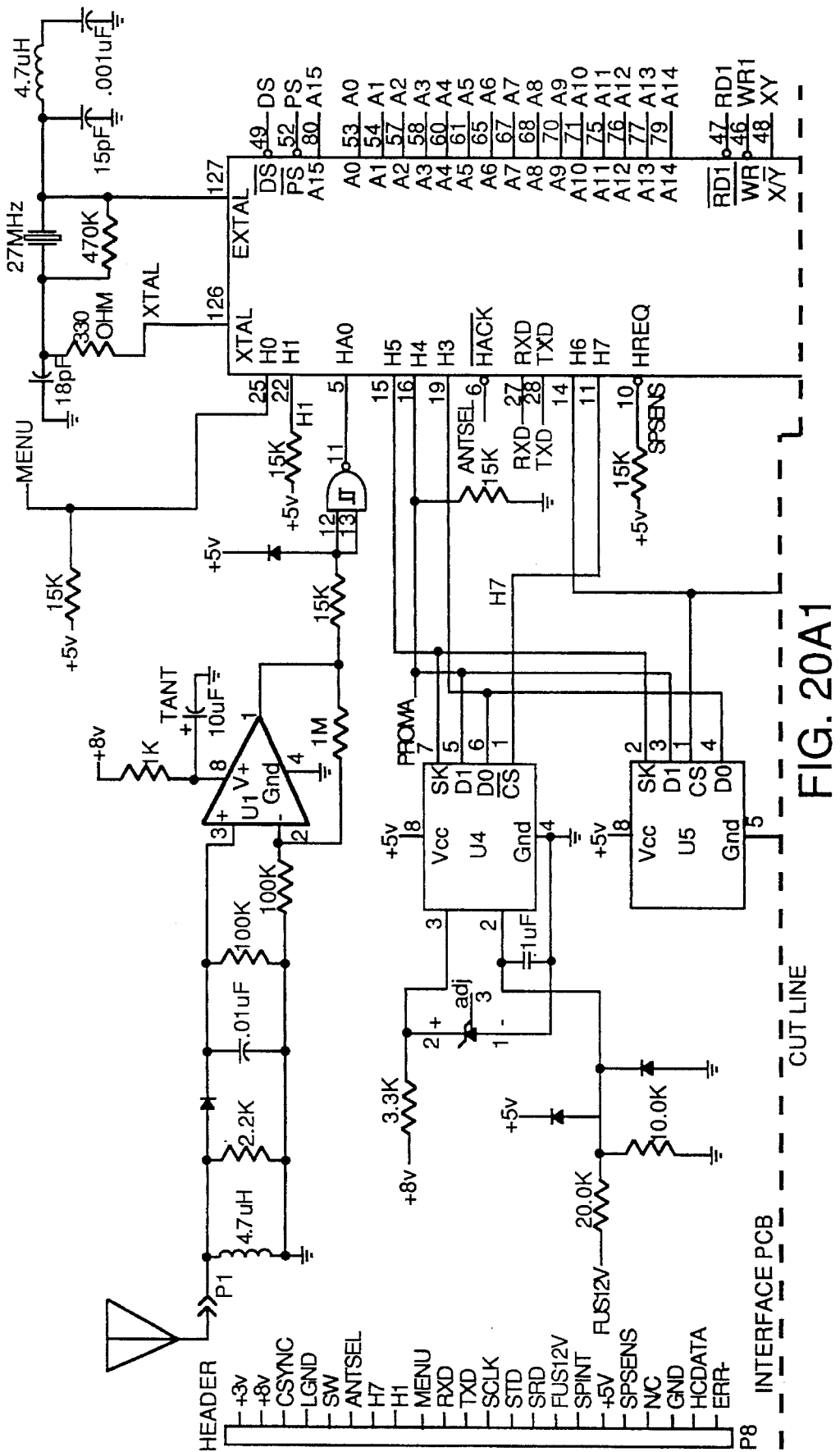
FIG. 20A1

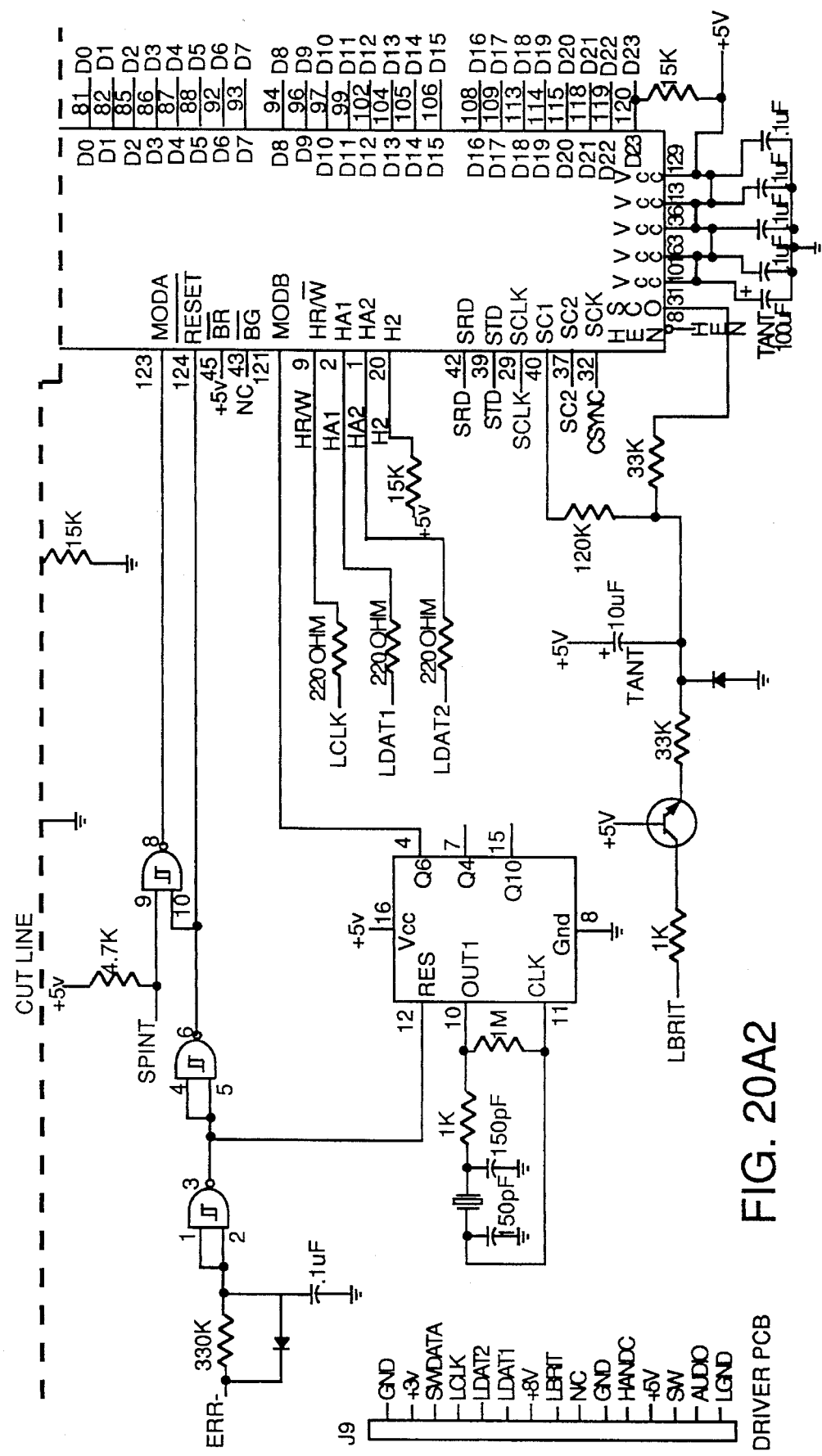
FIG. 20A2

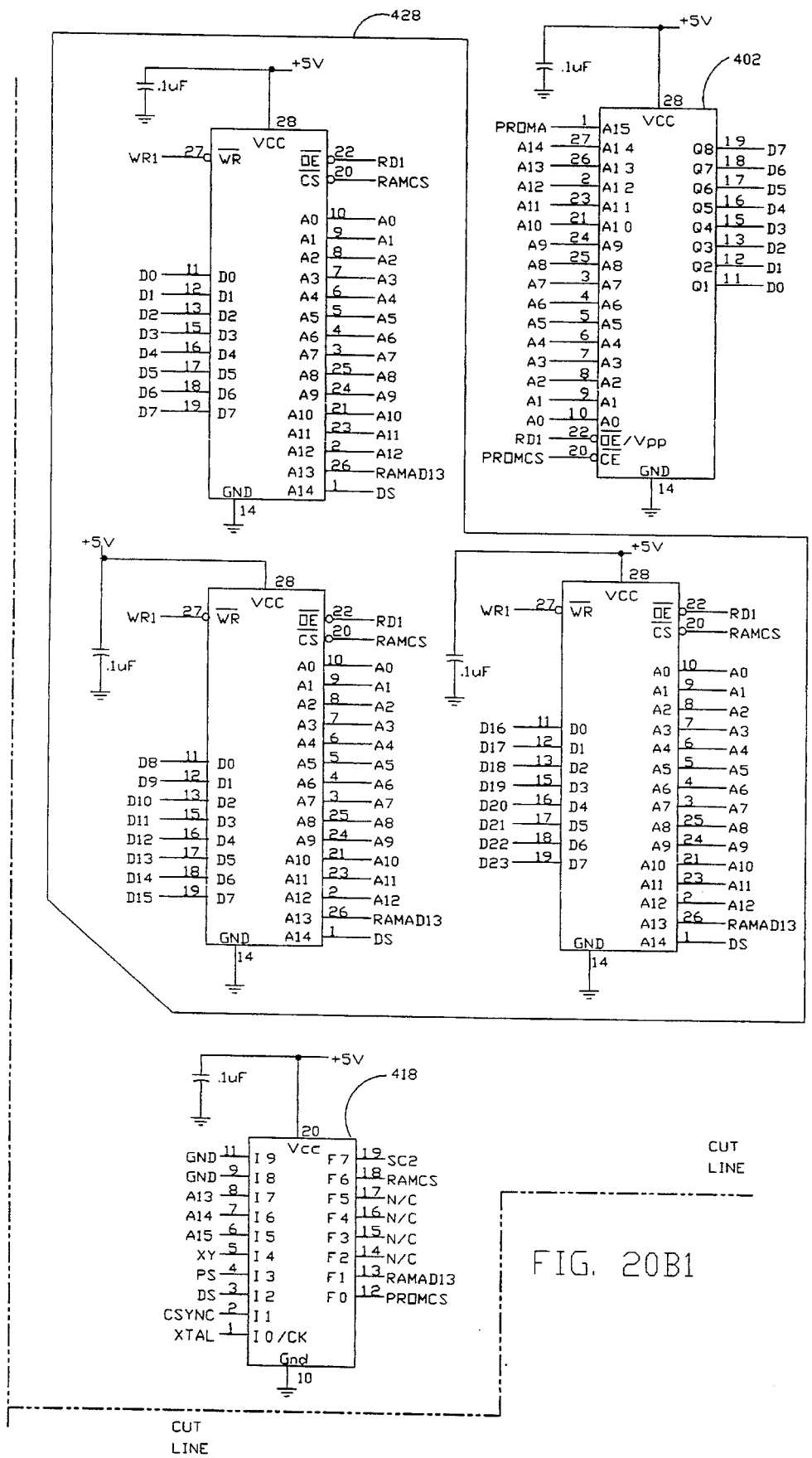
FIG. 20B1

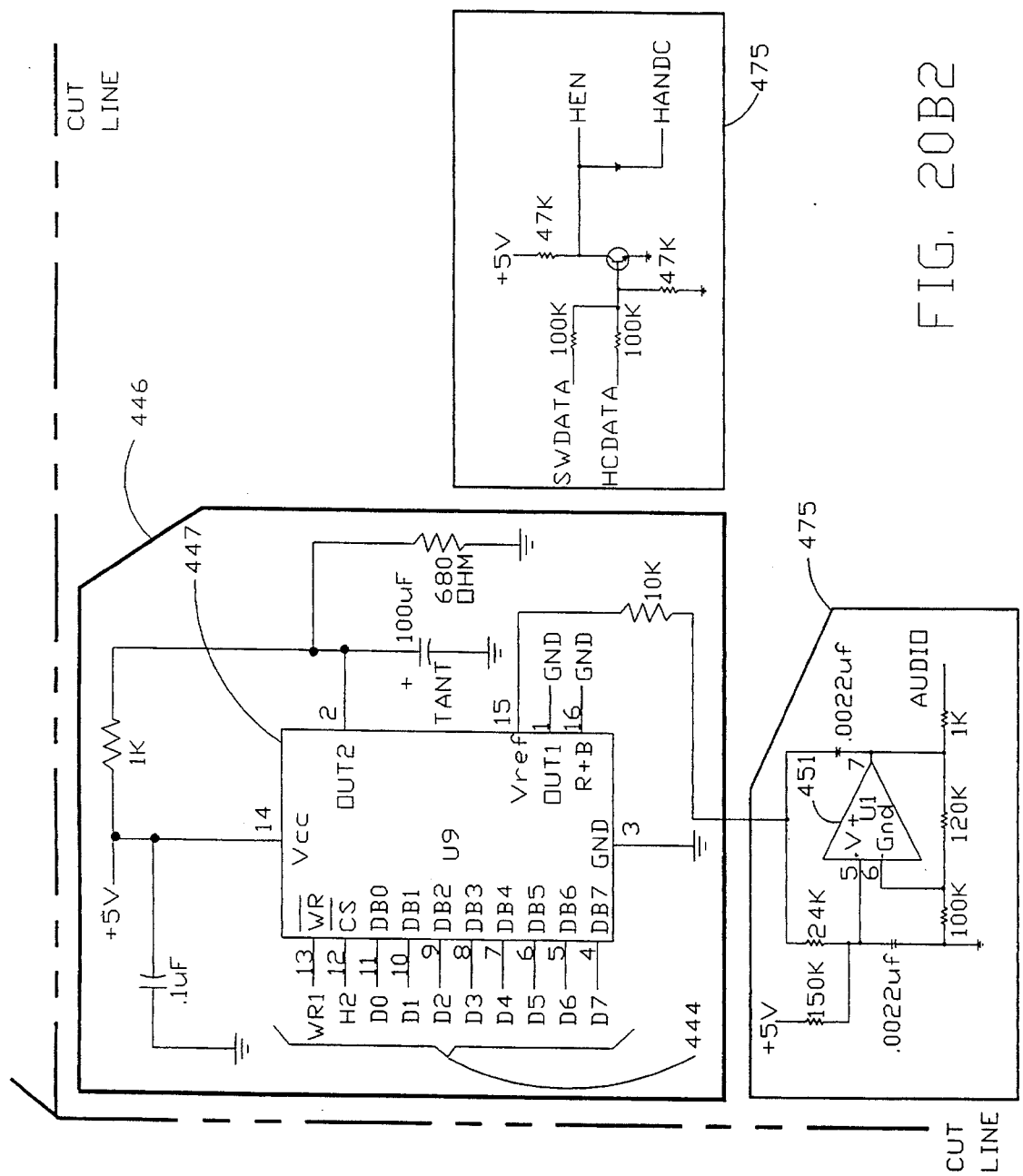

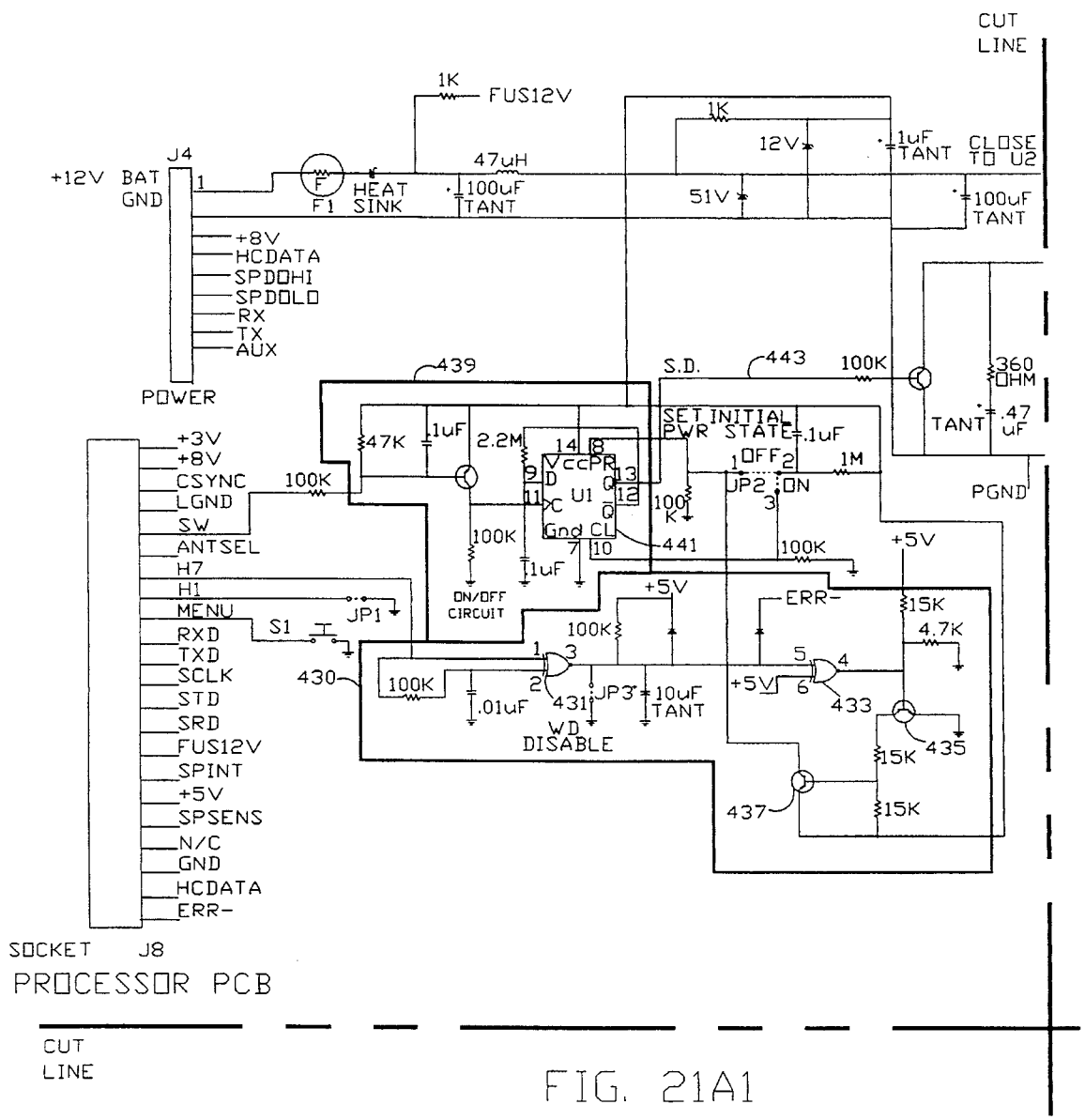
FIG. 21A1

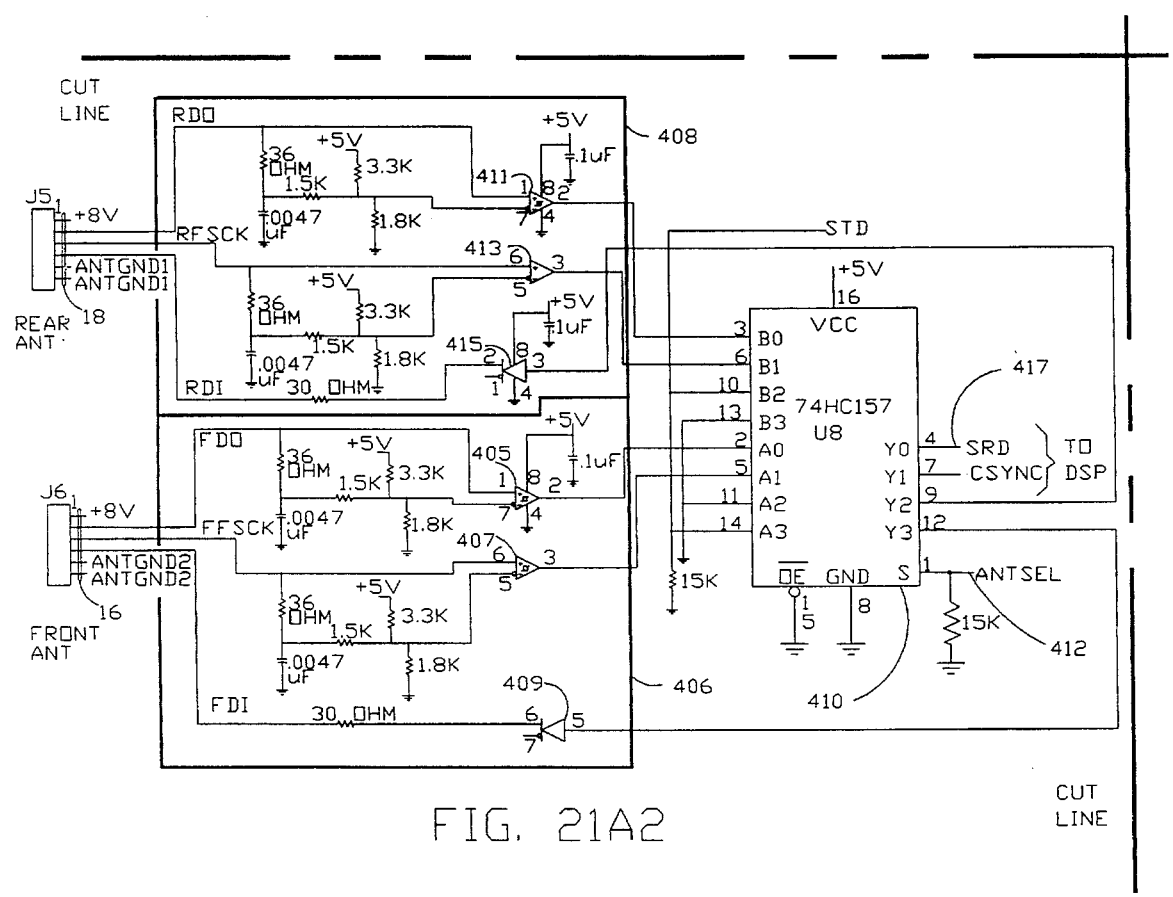
FIG. 21A2

POLICE TRAFFIC RADAR FOR ALLOWING MANUAL REJECTION OF INCORRECT PATROL SPEED DISPLAY

BACKGROUND OF THE INVENTION

The invention pertains generally to the field of doppler radars, and, more particularly, to the field of police traffic surveillance radars using doppler shifted radar returns to calculate speed.

Police radars have been in use for many years. Police radars output beams of microwave energy from directional antennas and collect microwave energy reflected from stationary and moving objects. The reflected microwave energy has had its frequency changed by the relative motion between the transmitting antenna and the object from which the energy was reflected by the Doppler shift phenomenon. To determine the relative speeds between the transmitting antenna (which is moving at the same speed as the patrol car or policeman which is supporting the transmitting antenna) and the objects from which the microwave energy is reflected, a sample of the transmitted energy is mixed with the reflected microwave energy in a nonlinear mixing diode. The mix products include upper and lower sidebands which represent sum and difference, respectively, between the transmit frequency and the frequency of the reflected microwave energy. Each target which reflects energy, such as the ground and a moving car, will generate a return signal with a frequency which is established by the speed of the target. The frequencies of these returns are analyzed to determine the speed of the patrol car (from the ground return or other returns from stationary objects) and the speed of the moving target with the strongest return.

The evolution of the designs of police radars to the current state of the art is probably best represented by the Stalker™ police traffic radar which is commercially available from the assignee of the present invention, Applied Concepts, Inc. of Richardson, Tex. The Stalker was the first police radar unit to convert the mix products to digital samples and send the digital data to a processor unit for analysis.

The prior art has several areas in which improvements can be made. The police cruiser is a noisy environment with radio frequency interference from the patrol car ignition system and police radio unit prevalent as well as random interference from CB radios in other vehicles. Further, the distance from the processing unit to the antenna unit is often quite large. These large distances cause the cable to pick up more noise, and losses in the cable can degrade the operation of the unit. Therefore, small cable size, good noise immunity and the ability to transmit over large distances the signals from which the patrol speed and target speed is the be calculated are important properties for an improved police radar to have.

One of the biggest problems in police radars is in insuring accurate measurement of patrol car speed and target speed. The law requires that the only target speed that is admissible evidence is the target speed calculated from the strongest signal which is not the return from a stationary object. There are several sources of strong signals that can cause erroneous radios. One is CB radios. Many CB users use illegal linear amplifiers that boost their signal power beyond the legal limit of 5 watts. Further, CB radios that are close to the patrol car can also cause strong radio frequency interference. A way to detect this type of radio frequency interference and eliminate it is desirable in police radars. Another big problem is harmonics of the transmitted signal. The transmitted signal has even order harmonics and odd order harmonics. By far, the strongest harmonic is the 2d order harmonic, and when this harmonic is in the microwave energy that bounces off stationary or moving objects, its signal strength can be quite high and can be mistaken for a target signal. It is highly desirable to have a mechanism to eliminate the even order harmonics during processing of the returned microwave energy.

Another source of errors is intermodulation products generated in the receiving and amplifying circuits. It is highly desirable to have a way of eliminating these intermodulation products. Further, it is highly desirable to have a way of eliminating weak signals which are not valid candidates for patrol speed during processing of the return signals.

Most police radars these days do not provide any indication to the patrolman of the speed of the fastest target in the returned microwave energy if that target is not the strongest target in the radar return since the patrolman is not legally authorized to cite the driver of that target since it is not the strongest target return. It is useful to be able to satisfy the requirement of displaying the speed of the strongest target return while simultaneously displaying the speed of the fastest target in the return. This provides the patrolman with advance warning that a faster target is approaching so that when the strongest target return recedes, he or she can re-aim the radar gun at the fastest target and make it the strongest target return for purposes of citing the driver thereof.

Another problem in prior art police radars is accidental calculation of the wrong patrol car speed. This can happen when, for example, the processor locks onto a harmonic return or when the patrol car comes to a stop and another car stops beside the patrol car and then pulls away. In the latter situation, the relative speed between the patrol car and the car pulling away may be inadvertently selected by the processor as the patrol car speed. It is useful to be able to manually reject an obviously incorrect patrol car speed and force the system to lock onto a different return for calculation of the patrol car speed. Further, if it is not possible to find another candidate for patrol speed, it is useful to have a system which can override the manual input rejecting the currently displayed patrol speed and continue to display that patrol speed.

SUMMARY OF THE INVENTION

A traffic surveillance radar according to the teachings of the invention utilizes a counting/display unit which is connected to two antenna units by a serial data path implemented through a small flexible cable. The antenna units use microwave turnstiles and ring hybrids so that receiver and transmitter sections can share the same antenna horn, and use a double balanced mixer diode structure to suppress even order harmonic distortion. Received signals are amplified by an amplifier which has its gain controlled digitally through serial data received from the counting/display unit. The received signals are converted to digital serial format data words and transmitted serially to the counting display unit in a plurality of frames. Part of each frame is devoted to sample data, and part of each frame includes control data such as synchronization bits, radio frequency interference bits and antenna personality bits. Cable size is kept small by not sending the frame synchronization signals that define the boundaries of each frame. These signals are encoded in the serial data by deleting a plurality of clock pulses of a serial clock sent from the antenna to the counting/display unit in each frame. The counting/display unit reconstructs the frame synchronization signals by detecting the blackout period of the serial clock and generating a new frame sync pulse at the end of the blackout interval in each frame.

The counting/display unit converts the serial format data to parallel format data and stores it in a data block. The sample words are processed by fast Fourier transform to generate a spectrum of lines that define the received signals. The spectrum is analyzed for signal patterns and signal strength is analyzed of the received signals. If signal strength is too low, the counting/display unit sends a gain increase command to the antenna unit which is active, but if the signal strength is too high, a gain decrease command is sent. The gain control commands are sent as serial data over the serial data link in synchronization with the serial clock transmitted from the antenna units to the counting/display unit.

The counting/display unit determines the patrol car speed from returns from stationary and moving objects by analyzing the data buffer of samples using fast Fourier analysis (FFT) to generate a spectrum of spectral lines. The spectrum is analyzed to find the 5 strongest low frequency (low speed) signals and these signals are saved for later use. The strongest of these signals will be tracked as the patrol speed, and the frequency of its spectral line will be analyzed for Doppler shift to determine and display the patrol car speed. The 5 strongest signals are then filtered out of the data buffer by application of a digital high pass filter, having its parameters set to filter out the low frequency strong signals so that they do not interfere with processing to find the strongest moving target signal and the fastest moving target signal.

Application of the digital filter to the data buffer generates another data block or spectral buffer. This spectral buffer is again analyzed using overlapping 512 point FFT's and Hamming windows to minimize end effects. The resulting spectrum is then analyzed to find the strongest moving target return that passes certain quality assurance tests. These quality assurance tests suppresses strongest target signals which do not have acceptable signal-to-noise ratios or are close to an integer multiple of patrol speed by processing them at lower sensitivity or eliminating display thereof altogether. If all quality assurance criteria are met, the speed of the strongest target return is calculated by converting the Doppler shifted frequency of its spectral line into miles per hour.

The counting/display unit also has a mode in which the fastest target signal can be simultaneously displayed in a different window from the window in which the strongest target speed is displayed. This is done by doing a top down search for the 7 fastest targets in the FFT spectrum and calculating the target signals strength, local noise power and local signal maximum quantities for each of these signals. These calculated quantities are stored in a table in descending order of speed. The fastest target signal candidate is then determined by passing the signals stored in the table, starting from the fastest target signal, seriatim through a battery of quality assurance tests until one signal passes all tests. The quality assurance tests are designed to block display of any fastest target signal which is possibly a false signal because it fails any of the following criteria: it has a signal-to-noise ratio which is too low given the current sensitivity setting of the radar unit; it is too close to another strong signal in frequency which could lead to an ambiguity as to which vehicle actually was travelling at the speed indicated by a particular fastest speed candidate signal; it may possibly have been caused by interference with mobile data terminals carried in some police cars; it has an apparent speed which is an integer multiple of the speed of the strongest target signal currently being displayed; it has an apparent speed which is either 2 or 3 times the patrol car speed and the patrol speed "true power", i.e., the power at the output of the mixer diodes, is above a certain power and the signal-to-noise ratio of the fastest speed candidate signal does not meet certain criteria or does not persist long enough in time; the five strongest signals in the FFT spectrum have signal powers above a certain level and the fastest speed candidate is possibly a harmonic of one of the signals or an intermodulation product of some combination of these 5 strongest signals. Additional threshold criteria are also imposed before the fastest target signal can be displayed. For example, it will not be displayed if the window in which it is normally displayed is displaying a locked value for the strongest target signal, or if the same fastest speed candidate has not occurred on two consecutive passes through the fast target qualification subroutine, or if the transmitter has not been on long enough, or if radio frequency interference has occurred during collection of the samples from which the fastest target signal was found, or if the strongest target's return is rapidly decreasing in frequency indicating the possibility of a false fast target caused by chirp scalloping in the FFT spectrum, or if the patrol speed was too recently acquired or is not currently being tracked. In alternative embodiments, some of these qualification and disqualification criteria may be eliminated, and the same can be said for the qualification and disqualification criteria used to qualify the strongest moving target signal as valid for display or to qualify the patrol speed as valid for display.

In alternative embodiments other quality assurance criteria may be imposed on either the patrol speed, strongest target speed display or the fastest target speed display or some of the above criteria may not be imposed.

BRIEF DESCRIPTION OF THE DRAWINGS

FIG. 15A is a collection of the input and output signals of the gate array logic in the antenna unit digital circuitry and the Boolean expressions that relate the input and output signals. FIG. 15B is a timing diagram showing the timing relationships between the input and output signals from the antenna gate array circuit.

FIG. 19 is a collection of the signals input and output from the gate array logic in the processing and display unit and the Boolean expressions that relate these input and output signals.

FIGS. 20A1–20A2 and 20B1–20B2 are a schematic diagram of the preferred embodiment of pertinent portions of the digital circuitry of the processing and display unit.

FIGS. 21A1–21A2 and 21B are a schematic diagram of the preferred embodiment of pertinent portions of the analog circuitry of the processing and display unit.

DETAILED DESCRIPTION OF THE PREFERRED EMBODIMENT

Figure 1:
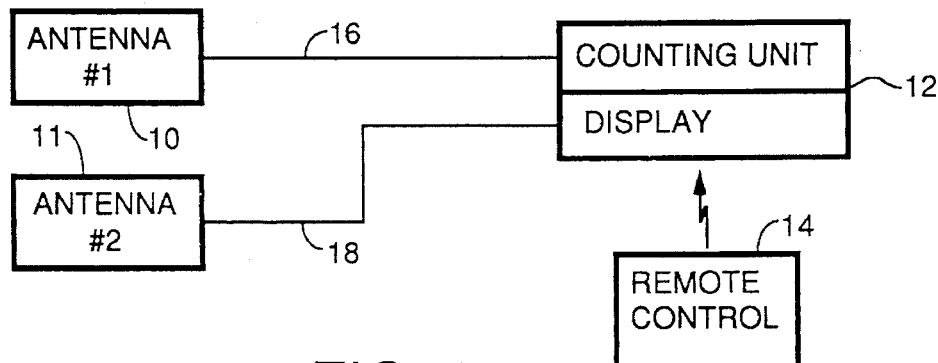
FIG. 1 is a block diagram of the overall system of the improved doppler traffic radar according to the teachings of the invention.

Referring to FIG. 1, there is shown a block diagram of the overall system of an improved doppler traffic radar according to the teachings of the invention. The improvements of the system taught herein are relative to the Stalker police radar that has been commercially available for several years from the assignee of the present invention, the technological details of which are hereby incorporated by reference. An antenna unit 10 radiates microwave energy in whatever direction it is pointed. In the preferred embodiment, two antenna units 10 and 11 are utilized. One unit is typically mounted in the front of the patrol car pointed forward and one unit is typically mounted in the back of the patrol car pointing backward. Each antenna is coupled to a counting/display unit 12 by a serial data cable capable of carrying packetized serial format data, represented by lines 16 and 18. In alternative embodiments, parallel digital data transmission may also be used. It is within the teachings of the invention to use any conventional design for said antenna units 10 and 11 and any conventional design for the counting/display unit 12 the improvement of the invention consisting of using either serial or parallel digital data communications between these units. It is further within the teachings of the invention to use hysteresis type line receivers on each digital data line passing between the antenna units and the counting/display unit 12 so as to improve the noise immunity for digital data communicated between these two units.

The counting/display unit houses a digital signal processor and associated peripheral circuitry to drive a display unit and to receive serial data from and transmit serial data to the two antenna units. The counting/display unit 12 (hereafter referred to as the "control unit") also includes software encoded in EPROM's, EEPROM's and gate arrays which control operations of the digital signal processor and parses management and control data out of the packets of serial data. The control unit 12 can be controlled by the trooper by pushing buttons on the front panel or it can be controlled by pushing buttons on a remote control 14. In the preferred embodiment, the remote control 14 is a conventional infrared remote control similar in structure to the one used to control television sets and audio equipment but including buttons for the unique modes and functions implemented in the control unit. In alternative embodiments, the remote control unit 14 can be coupled to the control unit by a cable or by UHF signals. In the latter case, the remote control has a similar structure to UHF remotes used to control satellite dish controllers/decoders such as the Echosphere 710 manufactured by the Echosphere Corporation of Inverness, Colo.

Figure 2:
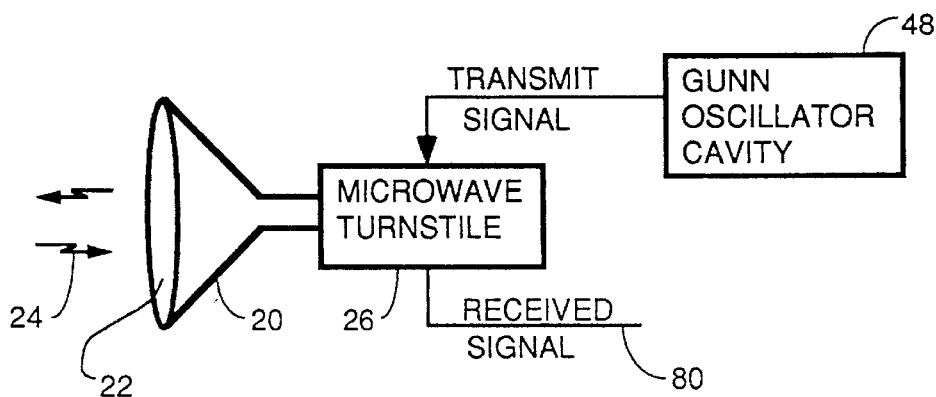
FIG. 2 is a block diagram of each of the antenna units.
Figure 3:
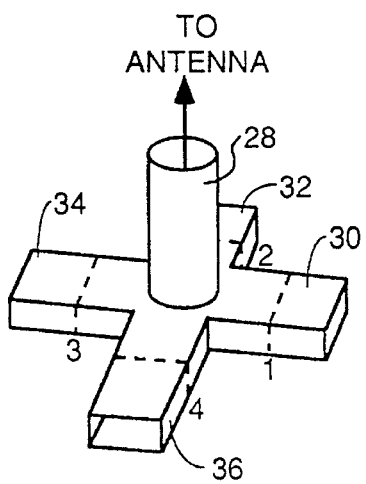
FIG. 3 is a symbolic view of a microwave turnstile that allows transmitting and receiving of microwave energy from the same antenna without switching circuitry.

Referring to FIG. 2, there is shown a block diagram of the antenna unit such as antenna unit 10. A conventional microwave horn 20 having a conventional corrective lens 22 emits coherent microwave energy toward moving and non-moving objects in the scene in front of the antenna. Some of the microwave energy bounces off the moving and non-moving objects in the scene and returns as microwave energy 24. This energy is collected and concentrated in horn 20 and fed to a turnstile duplexer 26 (hereafter turnstile). The function of the turnstile 26 is to provide isolation between the transmitted and received microwave energy. Turnstiles are known and are described in Montgomery et al., PRINCIPLES OF MICROWAVE CIRCUITS TK6553.M637 which is hereby incorporated by reference. Basically, the turnstile is designed to allow the transmitter and receiver circuitry to share the same antenna. The physical configuration of a turnstile is shown in FIG. 3. A circular antenna port 28 coupled to four rectangular waveguides 30, 32, 34 and 36. Two of the waveguides are terminated in short circuits. The length of the circular waveguide port 28 is carefully selected such that, if waveguides 34 and 36 are short circuited, transmit energy fed into waveguide 30 is coupled out circular antenna port 28 to the antenna but not into waveguide 32. Likewise, received energy entering circular antenna port 28 from the antenna is coupled into received energy waveguide 32 but not into waveguide 30 coupled to the transmitter. The turnstile functions to couple right hand polarized signals in one direction, I.e., down one waveguide, couples left hand polarized signals in a different direction, I.e., down another waveguide, thereby providing isolation. When a radar signal bounces off an object, its polarization changes from one polarization to the other.

Figure 4:
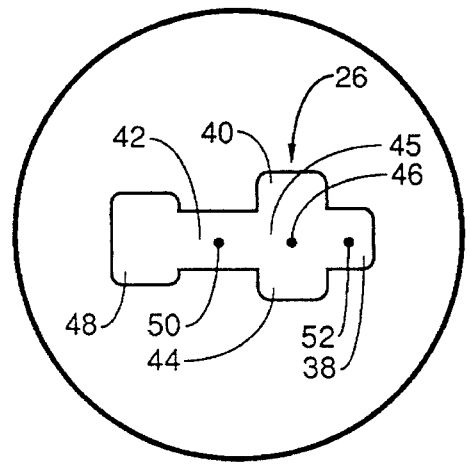
FIG. 4 is a symbolic plan view of the midplate and microwave turnstile structure showing the relative placements of the sniffer probe, the impedance balancing probe and the receiver probe.

More detail about the actual structure of the turnstile used in the improved traffic radar described herein is seen in FIG. 4. FIG. 4 is a plan view of a metal piece called a midplate which fits into the antenna structure just behind the horn 20. The actual antenna structure is cylindrical with an outside diameter substantially matching the outside diameter of the circular horn at its maximum diameter. This maximum diameter substantially matches the diameter of the midplate. Machined into the midplate are four rectangular, orthogonal waveguides designated 38, 40, 42 and 44 designed for use with microwave signals at a frequency of 34.7 gHz and are useable over a bandwidth of ±500 MHz. These waveguides take the form of rectangular shaped pits machined into the surface of the midplate joined to a central plenum 45 in which an impedance matching stub 46 is formed. The impedance matching stub points up out of the page from the floor of the central plenum where the waveguides join. The outline of the perimeters of the waveguides is visible in FIG. 4 as the crucifix shaped continuous line. A metal plate (not shown) is affixed to the top of the midplate to form a ceiling of the waveguides. An opening in this metal plate into the mouth of the horn allows microwave energy to leave the plenum and enter the horn and allows energy from the horn to enter the plenum.

Waveguides 40 and 44 are terminated in short circuits and have a difference in length of ¼ wavelength to provide a phase difference which converts rectangular polarization generated by the transmitter to the circular polarization that is transmitted. The circularly polarized energy is transmitted upward out of the page by impedance matching stub 46 and into the horn (not shown). Waveguide 42 joins the central plenum 45 to a Gunn oscillator cavity 48. Waveguide 38 guides received microwave energy to the detector diodes (not shown) in the receiver circuitry. A sniffer probe 50 couples some of the transmitted energy from Gunn oscillator cavity 48 to a mixer (not shown) for beating down the received energy to determine the amount of Doppler shift that has occurred. Another sniffer probe 52 in waveguide 38 couples received energy in waveguide 38 to detector diodes (not shown). The receive probe 52 is ¼ wavelength long, but the sniffer probe 50 need not be ¼ wavelength because it is only used to sample the transmitted energy. The mixer circuitry and detector diodes are mounted on the reverse side of the midplate to be described next.

Figure 8:
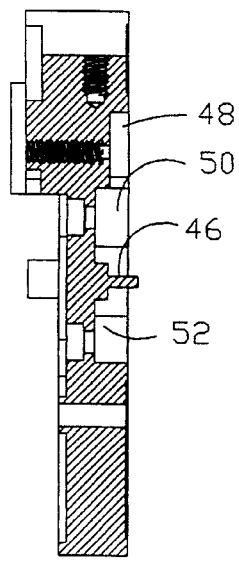
FIG. 8 is a sectional view of the microwave turnstile waveguide structure taken along the section line 8–8' in FIG. 7.
Figure 7:
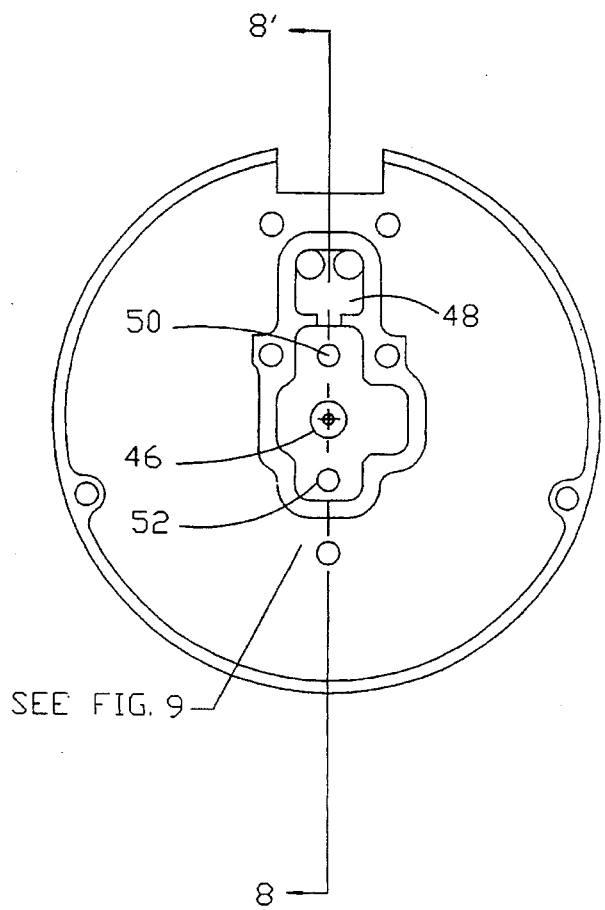
FIG. 7 is a plan view of the overall midplate structure including the microwave turnstile waveguide structure.
Figure 9:
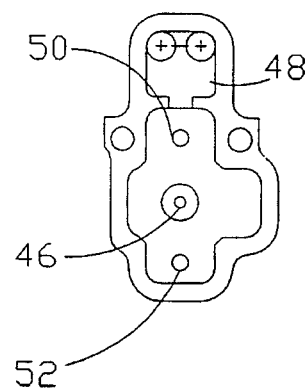
FIG. 9 is a plan view drawing of the microwave turnstile waveguide structure.

The construction details for the waveguide structure and the impedance matching stub are shown in FIGS. 7–9. FIG. 7 is a plan view of the midplate side showing the waveguides drawn to 135% of scale. FIG. 8 is a sectional view of the midplate taken along section line 8–8' through the turnstile area and Gunn oscillator cavity. FIG. 9 is a detailed plan view of the turnstile area and Gunn oscillator cavity.

DOUBLE BALANCED ANTENNA STRUCTURE FOR NOISE AN HARMONIC SUPPRESSION

Figure 5:
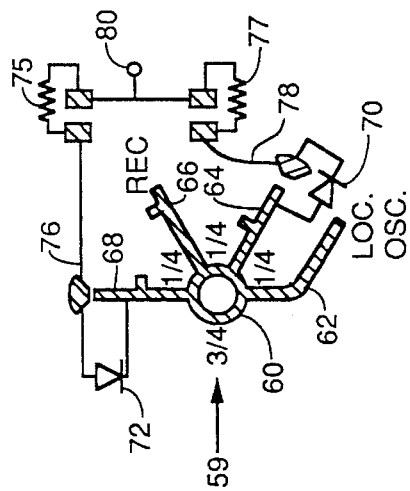
FIG. 5 is a plan view of the ring hybrid and double balanced mixer diode structure on the backside of the midplate opposite the microwave turnstile waveguide structure.

Referring to FIG. 5, there is shown a plan view of the layout of the double balanced ring hybrid mixer structure 59 which improves the common mode noise rejection characteristics of the traffic radar according to the teachings of the invention. The double balanced mixer structure of the preferred embodiment uses push-pull mixer diodes to suppress even order harmonic distortion. The ring hybrid structure of FIG. 5 is formed on the backside of the midplate structure shown in FIG. 4. A ring hybrid structure 60 in the form of a circle of metal or other conductor which is electrically coupled to four electrically conductive strips 62, 64, 66 and 68. Conductor 62 is coupled between the ring hybrid 60 and a feed-through conductor coupled to the sniffer probe 50 shown in FIG. 4. Conductor 66 is coupled between the ring hybrid 60 and a feed-through conductor coupled to the received energy probe 52 shown in FIG. 4. Conductor 64 is coupled between ring hybrid 60 and a mixer diode 70. Conductor 68 is coupled between ring hybrid 60 and diode 72.

The purpose of the ring hybrid 60 is to prevent coupling of any energy from the local oscillator on conductor 62 into the receive conductor 66. Likewise, the ring hybrid 60 serves to prevent coupling of any energy received by the receiver probe 52 from conductor 66 into conductor 62. It is also a function of the ring hybrid to insure that when there is no received signal, no local oscillator signal gets to the mixer diodes. Also, the ring hybrid serves to prevent any received signal from reaching the mixer diodes when the local oscillator is not functioning.

The manner in which the ring hybrid 60 performs its isolation function is based upon the differences in physical dimensions between the four conductive arms connected to the ring hybrid and the phase differences which result therefrom during propagation of signals from the local oscillator and receiver probes around the ring. For example, the signal from the local oscillator enters the ring hybrid at the junction thereof with conductor 62 and travels around both halves of the ring to reach the conductor 68 coupled to one of the mixer diodes 72. Since the distance around the left half of the ring is 0.75 wavelength and the distance around the right half of the ring is 0.75 wavelength (the distances between conductive arms in fractions of a wavelength is written in the spaces between the conductors just outside the ring), the two local oscillator signals arrive in phase and are coupled into conductor 68 to the mixing diode. Likewise, the local oscillator signal reaches the other mixer diode 70 by travelling 0.25 wavelength around the right half of the ring and 1.25 wavelengths around the left half. Therefore, these two signal components reach conductor 64 in phase and couple into conductor 64 to reach mixer diode 70. Conversely, the local oscillator signals reach conductor 66 coupled to the receiver probe 52 out of phase, because the two signals components travel 1 wavelength around the left half and 0.5 wavelengths around the right half. Because the two signals components are out of phase when they reach conductor 66, they cancel and no local oscillator signal reaches the receiver probe 52 through conductor 66. Likewise, signal from the receiver probe 52 enters the ring hybrid at the intersection thereof with conductor 66. From there it travels 0.25 wavelengths around the right side of the ring to reach arm 68 and 1.25 wavelengths around the left side of the ring. Therefore, the two signal components reach arm 68 in phase and are coupled to the mixer diode 72. Likewise, the signal from the receiver probe travels 0.25 wavelengths to conductor 64 around the right side of the ring and 1.25 wavelengths around the left side of the ring. Therefore, the two signal components reach conductor 64 in phase and couple to the mixer diode 70. No signal from the receiver probe couples into the local oscillator conductor 62 because the two signal components travel 0.5 and 1 wavelengths, respectively, around the ring hybrid to reach conductor 62. Therefore, the two receive probe signal components are out of phase at conductor 62 and cancel each other out and no receive probe energy is coupled to the local oscillator.

The mixer output is shown at 80. No local oscillator energy appears at the mixer output 80, because the local oscillator signal on conductor 64 is 180 degrees out of phase with the local oscillator signal on conductor 68 because of the differences in path length traversed by the signals from the local oscillator around me ring hybrid before reaching the mixer diodes 72 and 70. Conversely, the signal components on conductors 64 and 68 from the receiver probe conductor 66 are in phase (0.25 and 0.25 path lengths, respectively, from conductor 66 to conductors 64 and 68) and therefore the receiver signal components from the mixer diodes 70 and 72 are in phase and add at the mixer output 80. However, these signals are such low levels and at such high frequencies as to be invisible to the audio and digital circuitry coupled to the mixer output 80. The beat frequency mix product signals propagating along conductors 76 and 78 and through 10 ohm resistors 75 and 77 are at audio frequencies and are in phase and therefore they add at the mixer output 80. The frequency of the beat frequency components depends upon the Doppler shifts caused by the relative speeds between the patrol car and the various objects painted by the radar which cause radar returns. These Doppler shifts generally result in the beat frequency components in the audible range.

The ring hybrid structure is a push-push, double-balanced structure because of the structure of the ring hybrid 60 and the fact that the mixer diode 72 has its cathode coupled to conductor 68 while mixer diode 70 has its anode coupled to conductor 64. The push-pull structure arrangement of the diodes is a function of the fact that the local oscillator signals reach the mixer diodes coupled to conductors 64 and 68 180 degrees out of phase so that when one diode is turned off by the local oscillator signal, the other is turned on by it and vice versa 180 degrees later.

Best performance is obtained when the diodes are matched, but the variation between production diodes is so small that, in practice, the diodes are not matched.

The advantage of using a double balanced structure is in better signal-to-noise ratio by virtue of rejection of common mode noise. Also, lower noise results from the fact that the local oscillator signal components on conductors 78 and 76 are out of phase with each other and cancel at mixer output. This is very important because the local oscillator signal always has common mode noise on it since it is impossible to generate a noise free local oscillator signal. In the single ended mixers used in prior art police traffic radars, the mixer output contains significant amounts of noise caused by rectification of the amplitude noise components in the local oscillator signal alone.

Another significant advantage of using the double balanced mixer design is that no even harmonics are generated in the nonlinear mixer diodes. This is because the local oscillator signals arrive at the two mixer diodes 180 degrees out of phase in one mixer diode relative to the other. The elimination of the even harmonics greatly increases the sensitivity of the radar in the following way. The law requires that traffic radar display the speed of only the strongest signal. Police radars, when used while the patrol car is moving, receive returns from stationary objects from which the patrol car speed is derived, and they receive returns from moving objects from which a closing speed is derived. The speed of the target is derived from subtracting the patrol speed from the target's closing speed. The presence of harmonics in the mixer output confuses the radar, because the system cannot tell whether the harmonic signals are real targets or harmonics. The harmonics are of lesser amplitude as the harmonic number goes up. Therefore, the third and fourth harmonics are of less amplitude than the second harmonic. Unfortunately, the second harmonic can be quite strong, especially, the second harmonic of the patrol car speed. If this second harmonic is present in the mixer output and it is stronger than the other signals from actual target(s), by law the radar cannot display any target speed, even if the radar is smart enough to know that the strongest signal is a harmonic. Therefore, none of the weaker signals from targets can be displayed and the police radar is essentially blinded to these weaker signals as their returns must either be ignored or suppressed. Thus, in police radars not using the double balanced mixer design, sensitivity to weak returns is not optimal. By using the double balanced mixer design to eliminate the even numbered harmonics, the sensitivity of the receiver to weak target returns is improved because only the third and fifth harmonics remain to be dealt with. Since these harmonics are weaker in amplitude than the second order harmonic, the sensitivity of the radar is improved. The third order harmonic is suppressed by the software of the improved radar system.

In general, the received data at the antenna is sampled at typically 44 kHz and each sample results in a 16-bit serial data word produced by the Analog to Digital Converter. The ADC also generates a framing signal at the sample rate and synchronous clock signal running at 32 times the sample rate (approx. 1.8 mHz). The first 24 of each 32 clock pulses are used by a logic array (GAL- see discussion of GAL 252 below) to form a 24 bit serial word with the first 16 bits being allocated to the received data and the last 8 bits representing various status conditions (RFI, Antenna type). The microprocessor in the counter/display unit 12 includes a hardware Synchronous Serial Interface (SSI) facility for conversion between serial and parallel data formats. The SSI contains both a receive and transmit data section which is set up by software initialization to an externally clocked, 24-bit word configuration. As each serial data word from the antenna is received, a control word is shifted out from the SSI transmit section and serially transmitted to the antenna unit. The control word has 2 bits assigned to transmitter on/off control, 3 bits assigned to gain control of the analog signal amplifier in the antenna and a bit which is used to inject the self-test signal into the amplifier section. The control word is converted into parallel form in the antenna by shift register which is latched by a pulse from the GAL at the completion of each transmission.

Digital gain control of an amplifier section in the antenna is performed by the microprocessor in the counting/display unit 12. The software structure involved in gain control consists of a Receive Interrupt routine and subroutines in the main program loop. The Receive Interrupt routine has highest priority in the interrupt structure and has a modulo 4096 address pointer which loads each received word into a circular buffer in RAM. The circular buffer is broken into two 2048 word data blocks. The most recently completed block of received data is processed by the main program loop as the next block to be processed is built by the Received Interrupt. In order to minimize the effect of transient signals introduced by step changes in the gain of the signal amplifier, the gain is only changed at the time that the received data block is completed and ready for processing and a new data block is beginning. To achieve this, when the main program loop completes processing the oldest data block, it waits for the values of the interrupt address pointer to indicate that the newest block is nearly complete. Computation for gain change is made at that time and any gain changes made take effect at the start of the next data block. The Gain Analysis subroutine does a comparison within the newest data block for the absolute peak signal value within the block. The comparison does not include 64 points at the beginning and end of the data block to avoid contamination by gain change transients as mentioned above. If the peak value is less than a predefined low value, a gain increase is called for by the subroutine. If the peak is greater than a high value (typically 50% of the analog-to-digital converter or ADC dynamic range) a gain decrease is called for. In addition, if the peak value is greater than 90% of the ADC dynamic range, an overload may have occurred and an overload flag is set which notifies following routines in the main program loop that the data block is invalid. The 2048 24-bit words in the data block are also logically "ORED" into a test word at this time. If an RFI (Radio Frequency Interference) condition existed during any of the received words in the block, it will appear at the corresponding bit position in the test word and an RFI flag will be set. The received data word also has certain bit positions that are always zero. If these positions are not zero in the test word, a loss of receive synchronization is indicated and the main program will act to re-initialize the SSI.

Figure 6:
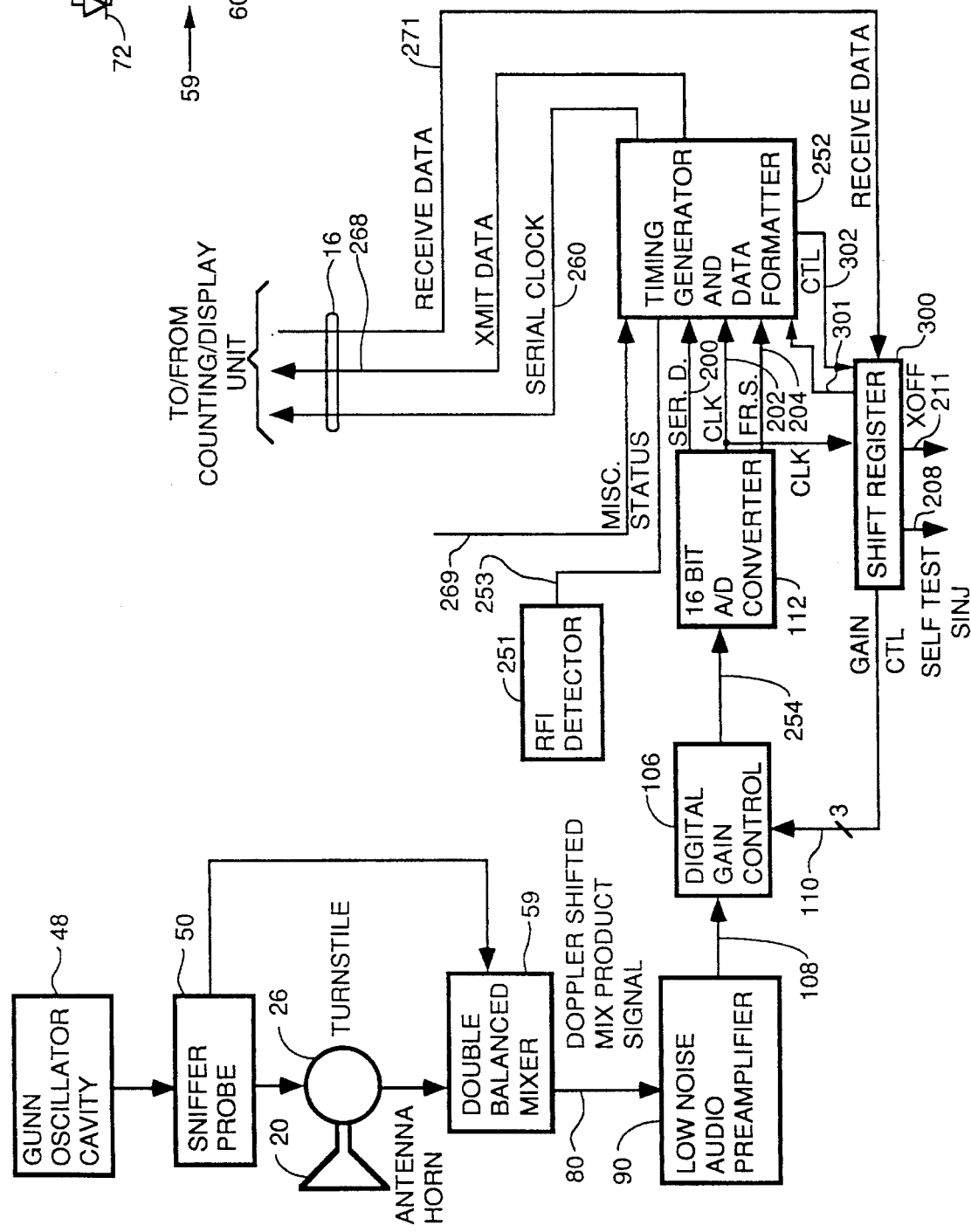
FIG. 6 is a block diagram of each of the antenna structures.

Referring to FIG. 6, there is shown a block diagram of the analog and digital circuitry within each of antennas 10 and 11 in FIG. 1. Some of the microwave circuitry and waveguides have already been discussed and are represented in block form such as the Gunn oscillator 48, the sniffer probe 50, the turnstile 26, the antenna 20 and the double balanced mixer 59.

Figure 10:
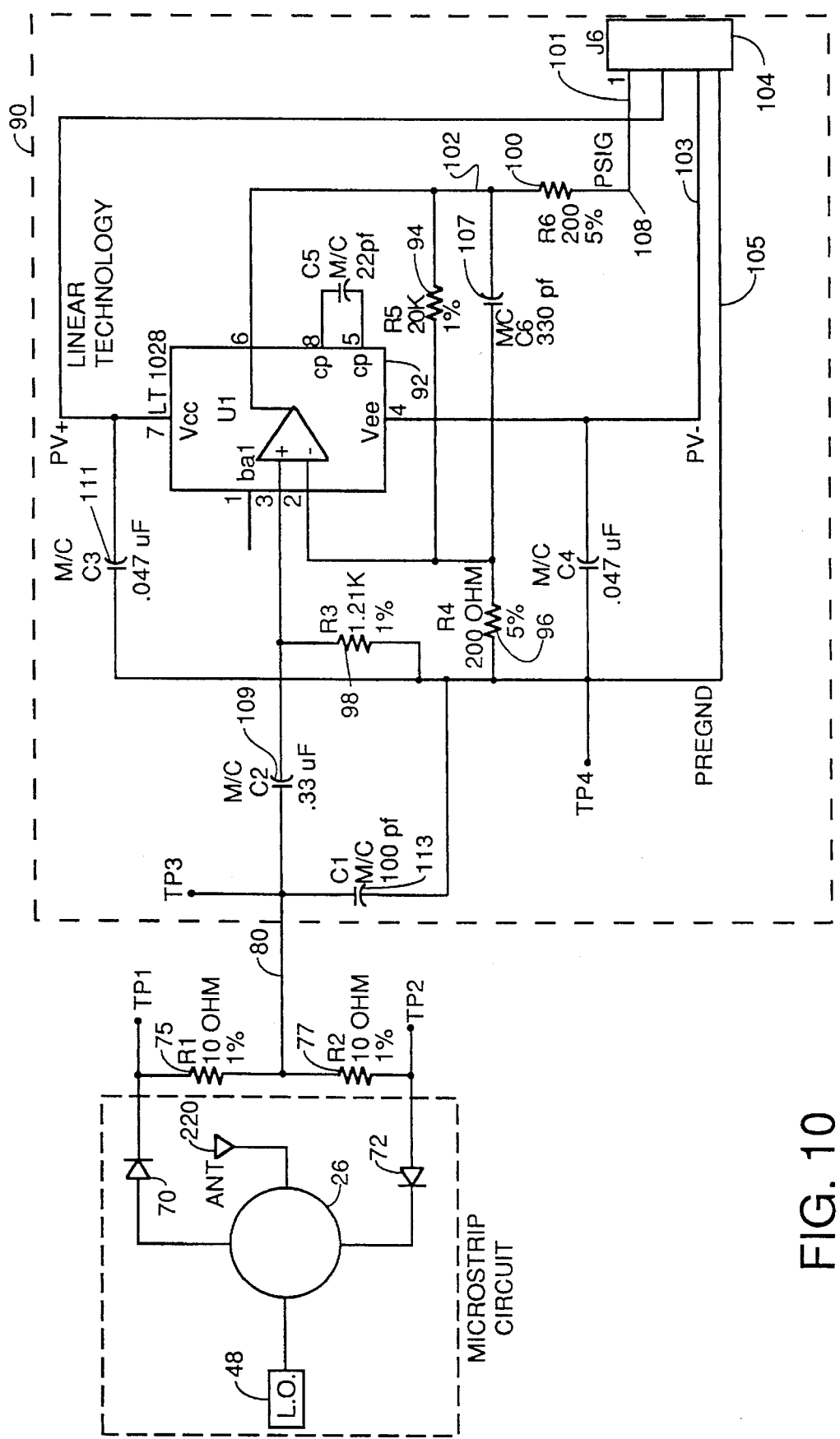
FIG. 10 is a schematic diagram of the low noise preamplifier circuit that amplifies the mix product signal from the mixer diodes before gain adjustment and analog-to-digital conversion.

The output of the double balanced mixer 59 at node 80 is coupled to a conventional low noise audio preamplifier 90 which is integrated on the same surface as the ring hybrid using a surface mount integrated circuit. In the preferred embodiment, the low noise preamplifier utilizes a model LT1028 integrated circuit amplifier available commercially from Linear Technology with a one nanovolt per root Hertz noise specification. The remaining components of the preamplifier 90 are shown in schematic diagram form in FIG. 10. The LT1028 integrated circuit amplifier 92 has a gain of 100 established by the resistors 94 and 96. Resistor 98 establishes the video load impedance on the double balanced mixer. The rest of the components are optimized for best signal-to-noise performance. The amplified audio signal is output to isolation resistor 100 on line 102 to a "connector" 104 comprised of a plurality of feedthrough capacitors which serve to prevent external RF energy from getting into the preamplifier circuit. Resistor 100 isolates the amplifier from the bypass capacitance in the feedthrough connector (which shunt any RF energy on the feedthrough lines to signal ground) so as to prevent destabilization of the amplifier. Connector 104 feeds the audio signal to a digitally controlled gain control circuit 106 on FIG. 6 (also shown in schematic form on FIGS. 11A and 11B). Lines 101 and 103 supply power to the integrated circuit and line 105 is a common ground line which is tied to the ground of the counter/display unit 12 in FIG. 1 and to the patrol car ground. Capacitor 107 provides a 20 KHz rolloff in frequency response to prevent aliasing in the downstream analog-to-digital conversion circuitry. Capacitor 109 provides DC blocking of any DC component coming out of the mixer, and capacitor 111 provides power supply bypass to couple any RF energy on the power lines to ground. Capacitor 113 shunts any RF on the mixer output line 80 to signal ground.

Referring again to FIG. 6, the digital gain control circuit 106 alters the amplitude level of the audio signal on line 108 from the preamplifier under control of a three bit digital signal on bus 110. The amplitude can therefore be altered to any of 8 discrete gain levels of 9 db each depending upon the states of the three bits on bus 110. The digital GAIN CTL signal on line 110 is plucked from the stream of data packets sent by the counter/display unit 12 to the antenna unit on bus 16. Bus 16 is bi-directional and carries multiple streams of data packets back and forth between the counter/display unit 12 and the antenna units 10 and 11 in FIG. 1.

Figure 11A:
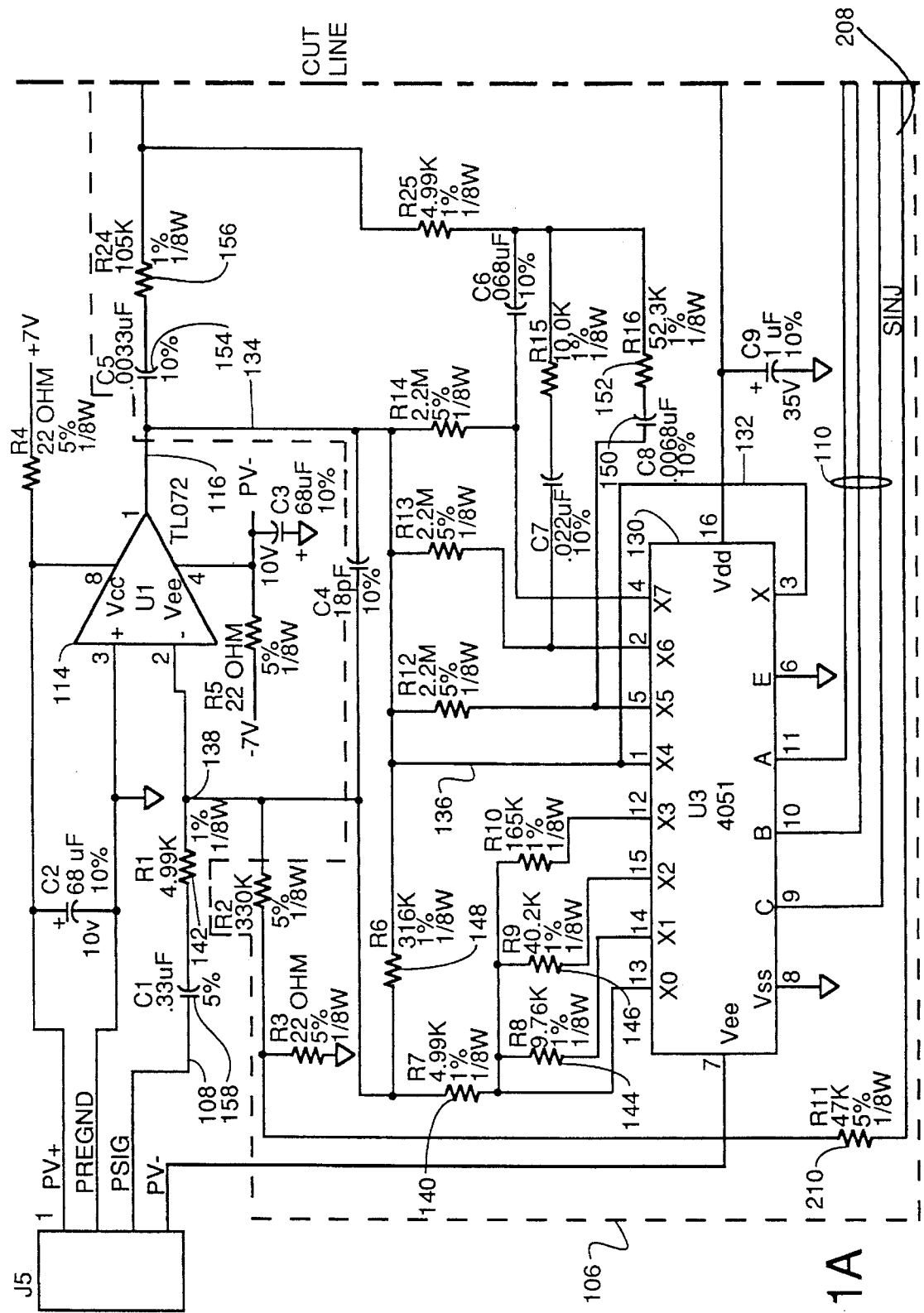
FIGS. 11A and 11B are a schematic diagram of the analog-to-digital converter and digital gain control circuitry of the preferred embodiment of the antenna unit.
Figure 11B:
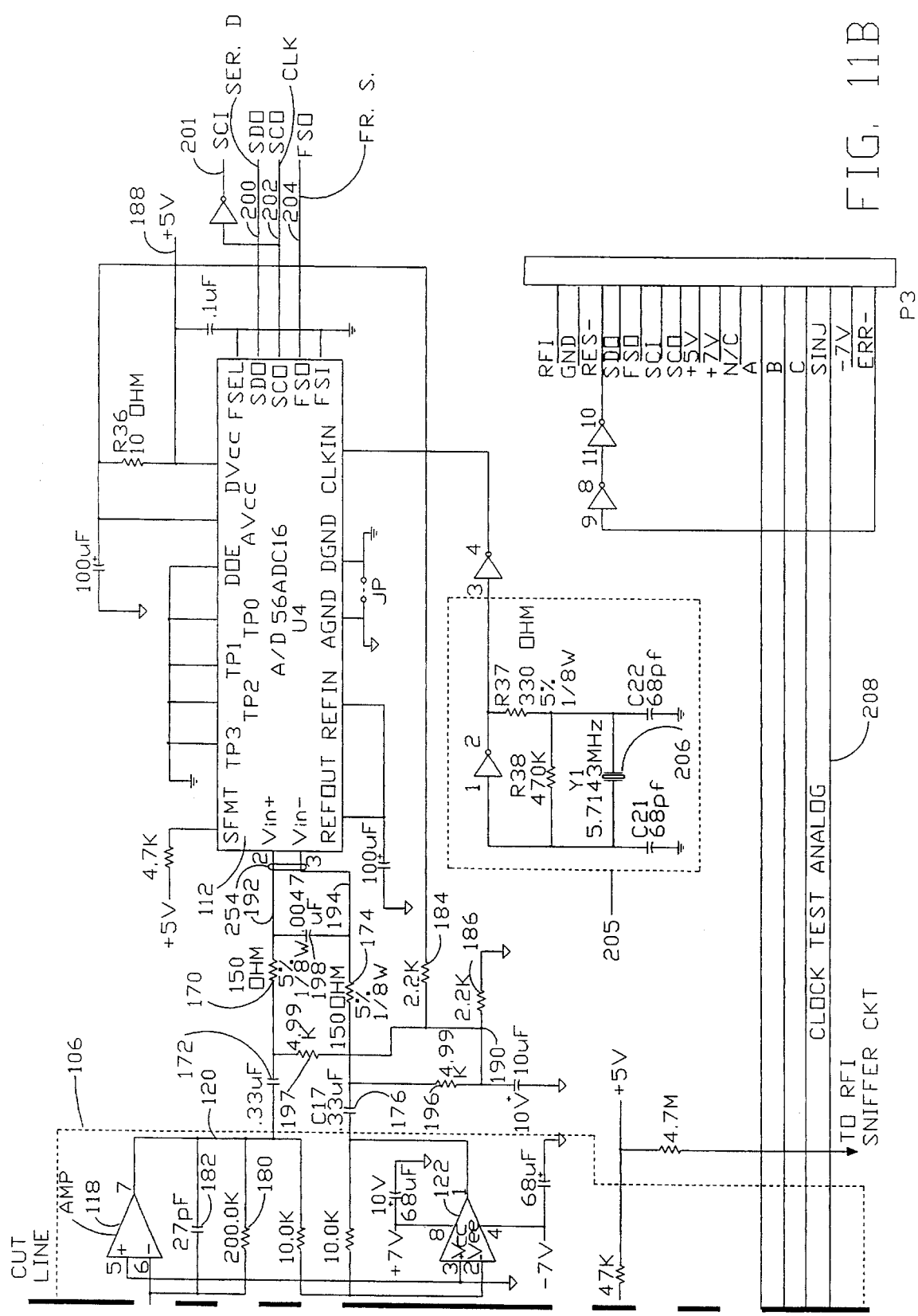

Referring to FIGS. 11A and 11B, there is shown a schematic diagram of the portion of the antenna circuitry shown in FIG. 6 which includes digital gain control circuit 106 and analog-to-digital converter 112 (hereafter A/D converter 112). The audio output signal PSIG of the preamplifier 90 is applied via line 108 to the inverting input of a Texas Instruments TL072 differential amplifier 114. The output of this amplifier on line 116 is applied to the inverting input of another Texas Instruments TL072 differential amplifier 118 on FIG. 11B. The output of amplifier 118 is applied via line 120 to the input of another Texas Instruments TL072 differential amplifier 122 connected as a unity gain phase invertor. Amplifiers 120 and 122 serve to provide push-pull inputs to the A/D converter 112 for better noise immunity and wide dynamic range. The use of the push-pull inputs to the A/D converter gives better common mode noise immunity to noise on the power supply and ground lines etc. The A/D converter 112, in the preferred embodiment, is a Motorola 56ADC16.

The digital gain control circuit is implemented with a CMOS multiplexer 130 which has three switching control inputs labelled A, B and C and 8 output pins labelled X0–X7. The states of the three bits on bus 110 coupled to the A, B and C inputs controls which of the 8 output pins is coupled to the X pin. The X pin is coupled by line 132 to the X4 pin. The X0 through X7 pins are coupled to various sizes of gain setting input and feedback resistors for amplifiers 114 and 118 to change the gain. The output of the amplifier 114 is connected to the X pin via lines 134, 136 and 132. The lowest gain setting will result when the bits on bus 110 cause the X pin to be coupled to the X0 pin. In such a case, the output 116 of amplifier 114 is coupled back to the summing junction/input node 138 of amplifier 114 through 4.99 Kohm resistor 140. Since the input resistance of amplifier 114 is set by resistor 142 at 4.99K, the amplifier is running at unity gain in this configuration. Likewise, when the bits A–C are set so as to connect the X pin to the X1 pin, 9.76K resistor 144 is added in series with resistor 140, so the gain becomes the ratio (9.76K+4.99K)/4.99K. Similarly, when the X pin is connected to the X2 pin, 40.2K resistor 146 is coupled in series with resistor 140 so the gain of amplifier 114 becomes (40.2K+4.99K)/4.99K. Therefore, the gain of the amplifier 114 becomes successively higher as the bit pattern on bus 110 changes so as to connect the X pin to higher order pins until X is connected to X4. At that point, the only feedback resistance for amplifier 114 is the 316K resistor which causes amplifier 114 to run at its highest possible gain. When the input bits A–C are set to couple the X pin to the X5 pin, capacitor 150 and resistor 152 are switched into parallel with the RC input network for amplifier 118 comprised of capacitor 154 and resistor 156. Since capacitor 154 and resistor 156 are fairly high impedance values in the frequency range of interest, amplifier 118 runs at fairly low gain until capacitor 150 and resistor 152 are switched into parallel. When that happens, the impedance of the input circuit between the output of amplifier 114 and the input of amplifier 118 drops, and the gain of amplifier 118 rises. The combination of capacitor 150 and resistor 152 have the same time constant as the combination of capacitor 154 and resistor 156 so as to not alter the low frequency rolloff of the passband from the 500 Hertz established by the filter of capacitor 154 and resistor 156 and the combination of capacitor 158 and resistor 142 for amplifier 114. This low frequency corner of the passband is also implemented by the filters in FIG. 11 B comprised of resistors 170 and 174 and their series capacitors 172 and 176.

As the bits on bus 110 couple the X pin to the XS, X6 and X7 pins in different states of the A, B and C bits, lower and lower impedance RC combinations are connected in parallel with the RC combination comprised of capacitor 154 and resistor 156. This lowers the input impedance from the output of the amplifier 114 to the input of the amplifier 118. Since the gain of amplifier 118 is equal to the feedback impedance divided by the input impedance, the gain of amplifier 118 rises in 3 distinct steps since the feedback impedance established by the resistor 180 and the capacitor 182 is fixed. Thus, the gain is controlled by first raising the gain of the amplifier 114 to the maximum extent possible to maintain best signal-to-noise ratio, and then, when the maximum gain is reached, the gain of stage 118 is raised.

The overall gain of the circuit shown in FIGS. 11A and 11B is about 10,000 when operating at full gain.

Bias for the input lines of the A/D converter 112 is established by resistors 184 and 186 which act as a voltage divider to divide the 5 volt power supply voltage on line 188 in half. The resulting voltage of approximately 2.5 volts is applied to the A/D converter inputs at 192 and 194 by resistors 196 and 197. Resistors 170 and 174 combine with capacitor 198 to further remove any high frequency noise on the input lines 192 and 194.

The A/D converter 112 produces three output signals: SER D. on line 200 which is the digitized form of the analog signals on lines 192 and 194 in serial format; CLK on line 202 which is a clock pulse for every bit of serial data; and FR. S. on line 204 which is a signal which occurs every 32 bits of serial data on line 200. The FRAME SYNC signal is used by the counter/display unit as a reference point to assemble packets of 32 bits into a parallel data word. The A/D converter only generates 16 bits of serial data, and either resends the same 16 bits out on line 200 during the second 16 bit interval or sends all zeroes. These same signals (in abbreviated form) are shown in FIG. 6 on signal lines with the same reference numbers.

A crystal oscillator 205 having a 5.7143 MHz crystal 206 generates the clock signal for the A/D converter which establishes the sample rate. The sample rate is 44.643 KHz and is set by dividing the clock rate by 128.

In order to correctly interpret the serial data, the counter/display unit must know the sample rate and that the clock signal supplied to the A/D converter 112 is correct. To insure that the serial data was generated at a 44.643 KHz clock rate and that the A/D converter and gain control system is working correctly, the system has a self-test feature. This feature is implemented by the counter/display unit 12 in FIG. 1 injecting an analog signal of known frequency and amplitude into the analog signal input of the circuitry shown on FIGS. 11A and 11B. This test signal is the signal SINJ on line 208. This signal gets coupled to the summing junction input 138 of amplifier 114 through resistor 210. By examining the resulting serial data on line 200 when SINJ is injected, the counter/display unit can determine whether the gain control circuitry, clock and A/D converter are working correctly.

Figure 12:
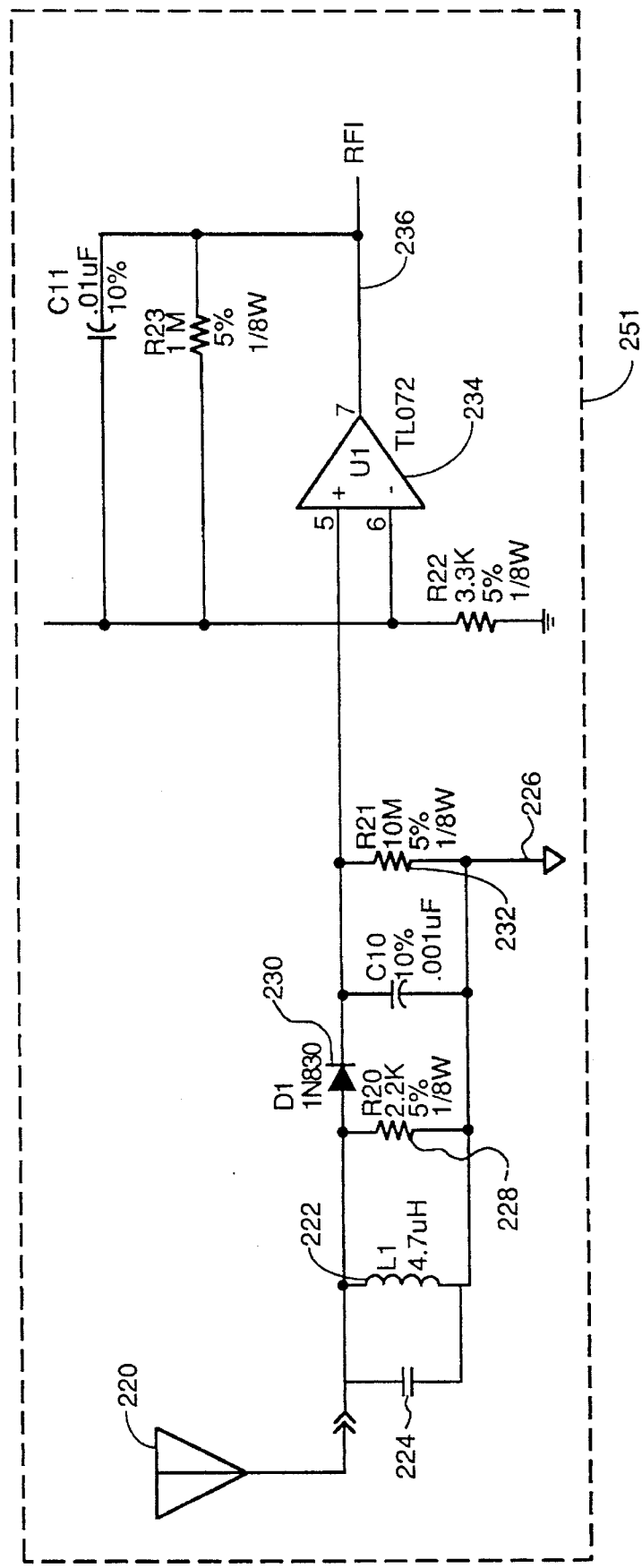
FIG. 12 is a schematic of the RFI Detector circuit.

Referring to FIG. 12, there is shown a schematic diagram of an RFI detector or RF sniffer that serves to detect the presence of interfering RF signals and signal the counting/display unit that its readings of target speeds may be invalid because of RF interference. One of the principal frequencies where RF interference is likely to occur is at about 27 MHz which is the citizen's band frequency. In order to detect radio frequency interference or RFI, the antenna unit of the traffic radar includes a tiny wire stub antenna which is coupled to an RF choke inductor 222 which has a value selected to resonant with the apparent capacitance of the antenna 220 at 27 MHz. The apparent capacitance of the antenna is represented by the capacitor 224. This parallel tuned circuit therefore is at maximum impedance at 27 MHz and generates the maximum voltage drop across it to signal ground 226 at that frequency. The RFI detector is a broadband, low Q circuit designed to sense the presence of RFI anywhere in the band from about 27 MHz up to about 500 MHz. Resistor 228 lowers the Q of the circuit to provide the broadband response. Diode 230 is a low level Schottky Barrier detector diode that can detect signals with as low an amplitude as one millionth of a watt. The diode works best when loaded with a very high output impedance. Therefore, a 10 megohm resistor and a high input impedance FET amplifier 234 couple the cathode of the amplifier to ground. The FET amplifier 234 has a gain of 300. The output of the FET amplifier is an analog RFI signal on line 236.

Figure 13A:
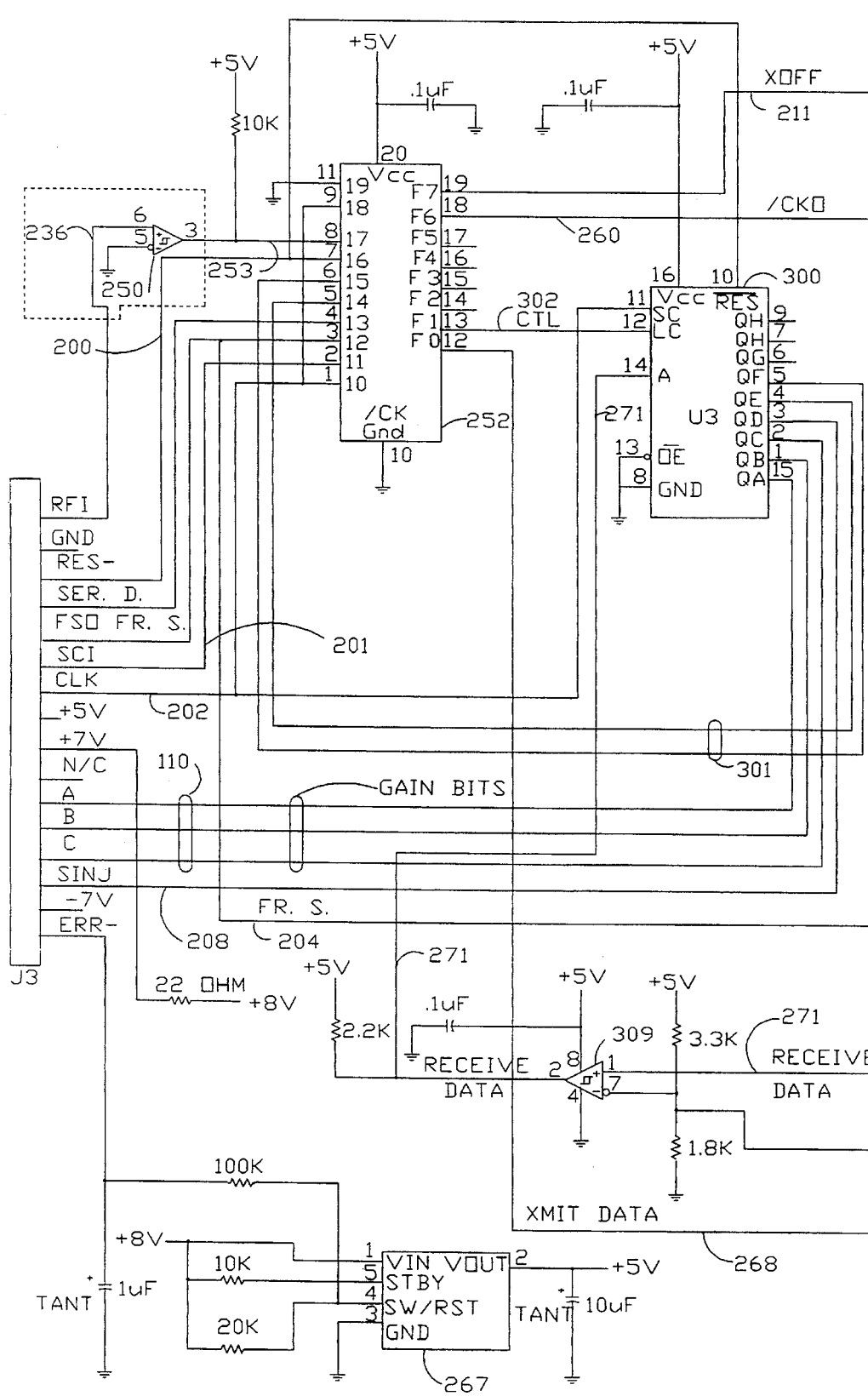
FIGS. 13A and 13B are a schematic diagram of the gate array logic and the transmit an receive line drivers of the preferred embodiment of each of the antenna units.
Figure 13B:
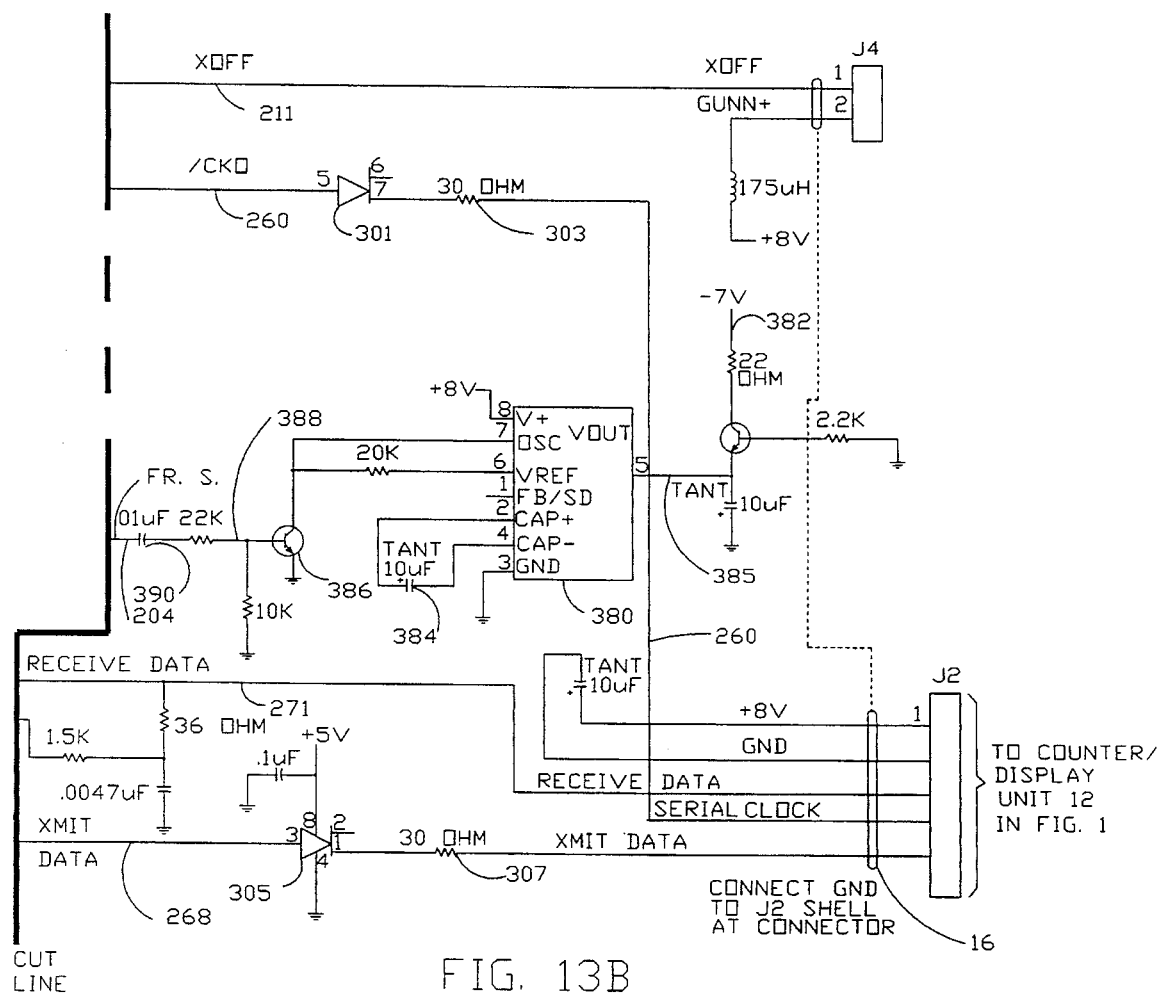

Referring to FIGS. 13A and 13B, there is shown a schematic diagram of the digital circuitry within each of antennas 10 and 11 in FIG. 1. The analog RFI signal on line 236 is coupled to an RS422 receiver 250 which is basically a comparator with hysteresis. The comparator 250 serves as an RFI threshold detector by comparing the analog voltage on line 236 to an internal reference signal which is about ½ the power supply Vcc level. When the amplitude of the RFI signal rises above the reference level sufficiently to overcome the hysteresis, the comparator 250 changes states thereby altering the logic level applied to pin 8 of a gate array logic integrated circuit 252. This signals that RFI interference is present and the speed readings may be unreliable.

The gate array logic 252 functions as the timing generator and formatter in FIG. 6. The purpose of this circuit is to format the data in the 32 bit frames of serial data arriving on line 200 from the A/D converter 112 into a special frame. This special frame of data includes both target speed data and management and control data. Specifically, gate array logic converts the 32 bits in every frame on line 200 into a frame with the first 24 bits representing the doppler shifted analog signal on line 254 from the digital gain control circuit 106 and the last 8 bits reserved for management and control data with an interrupt generated just before the frame sync pulse. No target speed data is lost in this process because all the target speed data in included in the first 16 bits in every frame, and the last 16 bits of every frame are either a repeat of the first 16 bits or all zeroes. The gate array logic converts the serial clock signal on line 202 of FIG. 6 to an altered serial clock signal on line 260 so that the receiving circuitry at the counter/display unit can recover the frame sync signal from the altered serial clock signal on line 260. The manner in which this is done can best be understood by reference to FIG. 14. Recovery of the frame sync signal by the counter/display unit 12 in FIG. 1 is used by the counter/display unit to frame its own transmissions of data back to the antennas. In this way, only one clock can be used to synchronize transmissions of serial digital data in both directions.

Figure 14:
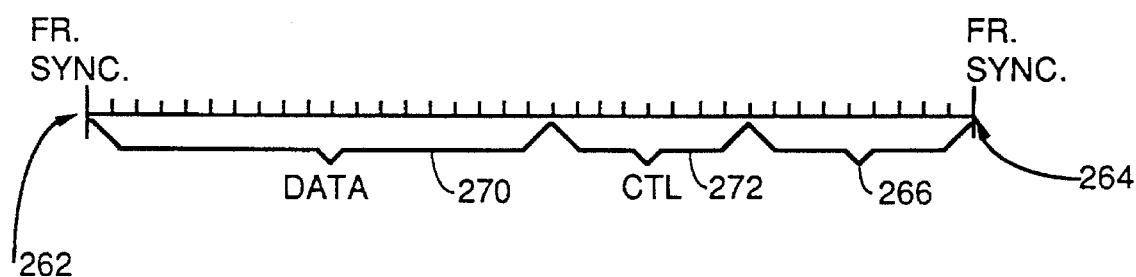
FIG. 14 is diagram of the timing relationship of the clock pulses and silent interval in every frame of serial digital data transmitted from the antenna to the processing and display unit relative to the frame sync signals that define the boundaries of each frame.

FIG. 14 shows a single frame of clock signals of the modified clock signal on line 260 in FIG. 6. The relative times of the frame sync signals which are generated on line 204 by the A/D converter 112 in FIG. 6 are shown at 262 and 264 in FIG. 14. Between these two times, 32 clock pulses occur on line 200 in FIG. 6. The gate array logic 252 in FIGS. 6 and 13A serves to pass the clock pulses on line 200 along to line 260 but to delete the last 8 clock pulses of each frame. This interval of no clock pulses in every frame is represented by bracket 266 in FIG. 14. Thus, line 260 contains, for each frame 24 clock pulses followed by an interval equal to 8 clock pulses during which no clock pulses occur. In some embodiments, the number of deleted clock pulses can be more or less than 8 so long as the interval marked by an absence of clock pulses is long enough to be detectable in the counter/display unit 12 so that the frame sync pulses can be reconstructed. No frame sync pulses are transmitted on line 260 in FIG. 6. Instead, this "silent" interval 266 in FIG. 14 is detected in the counter display unit, and used to regenerate a frame sync pulse within the counter display unit. This is done by using a retriggerable flip-flop to detect the silent interval, and arm a frame sync generation circuit. Then, when the next clock signal occurs, a frame sync pulse is immediately generated.

The gate array logic 252 in FIG. 6 also passes the SERIAL DATA signal from line 200 onto line 268 as the XMIT DATA signal for transmission to the counter/display unit 12 in FIG. 1 in synchronization with the SERIAL CLOCK signal on line 260. The target speed data is contained in the bits transmitted during the first 16 clock intervals represented by interval 270 in FIG. 14. Interval 272 is reserved for management and control data.

There are 8 control bits which are transmitted during interval 272 in FIG. 14. Some of these are a known pattern which used as a frame reliability check by a digital signal processor (hereafter DSP) in the counter/display unit to be discussed below. In other words, the DSP looks for this known pattern of bits (several consecutive zeroes) during interval 272 as a reliability indicator to verify that the bits transmitted during that frame are probably correct and synchronization has been maintained in the transmission. Therefore, an additional function of the gate array logic is to insert the known bit pattern into the serial data stream on line 268 in FIG. 6 being transmitted to the counter/display unit during interval 272.

In addition, one of the 8 control bits transmitted during interval 272 is reserved for the output of the RFI comparator 250. When radio frequency interference is present, the RFI detector 251, comprised of the circuitry of FIG. 12 plus comparator 250 on FIG. 13A, outputs a logic 1 on line 253 to the gate array logic 252. The gate array logic then inserts this bit into one of the control bits transmitted as XMIT DATA on line 268 in FIG. 6 during interval 272 to signal the DSP that the target speed data may be unreliable. In alternative embodiments, where the digital data path between the antenna unit and the counting unit is a parallel format data path, control and status information can be sent between these two units as parallel format bytes, or by modifications of a transmitted clock duty cycle, clock phase, clock pulse amplitude, I.e., some clock attribute with the variation of the clock attributed mapped by any form of coding to the control and status data to be sent. Separate unidirectional parallel data paths for transmitting from antenna to counting unit and from counting unit to antenna may be used in some alternative embodiments, or a single parallel data path which is bidirectional and time or frequency division multiplexed may also be used.

The other control bits can be used for such things as "personality" bits to indicate, for example, that the particular antenna connected to the counter/display unit 12 is 24 GHz as opposed to 34 GHz etc. or other items of information that the DSP must know to properly process signals received from the antennas. These bits are labelled as the MISC STATUS bits on bus 269 in FIG. 6. Typically, these personality bits will be supplied from a hard wired source, or a register that is written at power-up time from an EPROM, EEPROM or a ROM (not shown).

A timing diagram for the relationships between the signals tha that are input and output from the gate array logic 252 in FIG. 13A is shown in FIG. 15B.

The counter/display unit also sends data to the antenna units to control various things. That data comes into the antenna unit on the RECEIVE DATA bus 271. The RECEIVE DATA bits are a serial data stream which includes gain control bits, a transmit on/off control bit which controls when the traffic radar emits radar energy to paint a target, and the self test signal previously discussed. This serial data stream is applied to the serial data input of a serial-in-parallel-out shift register 300. This shift register receives its clock signal from the clock signal generated by the A/D converter 112 on line 202 in FIG. 6. The gate array logic 252 generates a control signal on line 302 coupled to the shift register to cause it to output the various bits in parallel format such that the gain bits are put out in parallel on bus 110 and the self-test signal SINJ is output on line 208 and the XOFF transmit control signal providing on/off control for the Gunn oscillator is output on line 211. Some of the output signals from the shift register are coupled as inputs to the gate array logic 252 via bus 301: The shift register therefor converts the serial format RECEIVE DATA into parallel format while simultaneously parsing out the various bits of the control word and applying the appropriate bits to the appropriate inputs.

The Boolean logic for the antenna gate array 252 is given in FIG. 15A. The Boolean relationships between the various signals that are input and output from the gate array logic are given in the section entitled "equations". The Boolean relationships of FIG. 15A, as with equations for all the gate array logic chips disclosed herein, were compiled using the Opal Jr. Compiler commercially available from National Semiconductor. The various logic signals that are combined using these Boolean relationships are defined by pin number in the four lines immediately above the equations sections. The first and fourth lines having numbers represent the pin numbers in FIG. 13A upon which appears the signal having the acronym given just below the pin number or just above the pin number. The Boolean operators are represented by /=not, *=and, +=or.

Referring again to FIG. 13A, the shift register 300 is a 74HC595 with the CTL signal on line 302 coupled to its LC input. Other signal lines corresponding to signal lines disclosed in FIGS. 6 and 11B are given identical reference numbers. The SCI signal on line 201 is an inverted clock from the CLK signal on line 202. The XMIT DATA signal on line 268 emanates from pin 12 of the gate array logic. The RECEIVE DATA on line 271 is coupled to pin A of the shift register 300 and shifts serial data therein to load the shift register in synchronization with the same clock signal CLK that the gate array logic 252 uses. The frame sync signal FR. S. on line 204 is coupled to the base of transistor Q1 in FIG. 13A. The RECEIVE DATA signal on line 271 comes from connector J2 on FIG. 13B, and the XMIT DATA signal on line 268 goes to connector J2. J2 is connected by a serial interface cable 16 or 18 to the counter/display unit 12 in FIG. 1. The SERIAL CLOCK signal on line 260 in FIG. 6 corresponds to the/CKO signal emanating from pin 18 of the gate array logic 252 in FIG. 13A. This signal is buffered by an RS422 differential clock buffer 301 on FIG. 13B. A 30 ohm resistor 303 matches the impedance of line 260 to the impedance of the serial data cable 16 or 18 from the antenna to the counter/display unit 12 in FIG. 1. This impedance matching allows successful transmission of data without excessive reflection over a cable 16 which is about 25 feet long. Likewise, the XMIT DATA signal on line 268 is buffered by a RS422 differential clock buffer 305 on FIG. 13B with a 30 ohm impedance matching resistor 307. Likewise, the RECEIVE DATA signal on line 271 is buffered by a RS422 differential clock buffer 309 on FIG. 13A. The three digital gain bits on bus 110 are output at pins 1, 2 and 15 by the shift register 300 on FIG. 13A. The self test signal SINJ on line 208 is output by pin 3 of the shift register 300 and is a 5 KHz square wave generated by the counter/display unit. Integrated circuit 267 is a voltage regulator which supplies regulated 5 volt supply for the integrated circuits on the antenna digital circuit board.

In FIG. 13B, integrated circuit 380 is a negative voltage generator which serves to generate a negative voltage of −7 volts at terminal 382. This is done by alternately charging capacitor 384 to +8 volts and reversing the connections so that the terminal of the capacitor that is positive with respect to ground is connected to ground and the terminal that was formerly connected to ground is connected to the output line 385 of the integrated circuit. Switching by the integrated circuit is controlled by transistor 386 which has its base connected to the Fr. S. Frame sync signal. The resistor 388 and capacitor 390 convert the Fr.S. Signal into a pulse, and transistor 386 sharpens this pulse and applies it to the negative voltage converter 380. This arrangement causes the switching rate of the negative voltage converter 380 to be the same as the frame rate thereby eliminating a source of noise. The negative voltage source is needed for various ones of the analog and digital circuits on the antenna analog and digital boards.

Figures 16, 17:
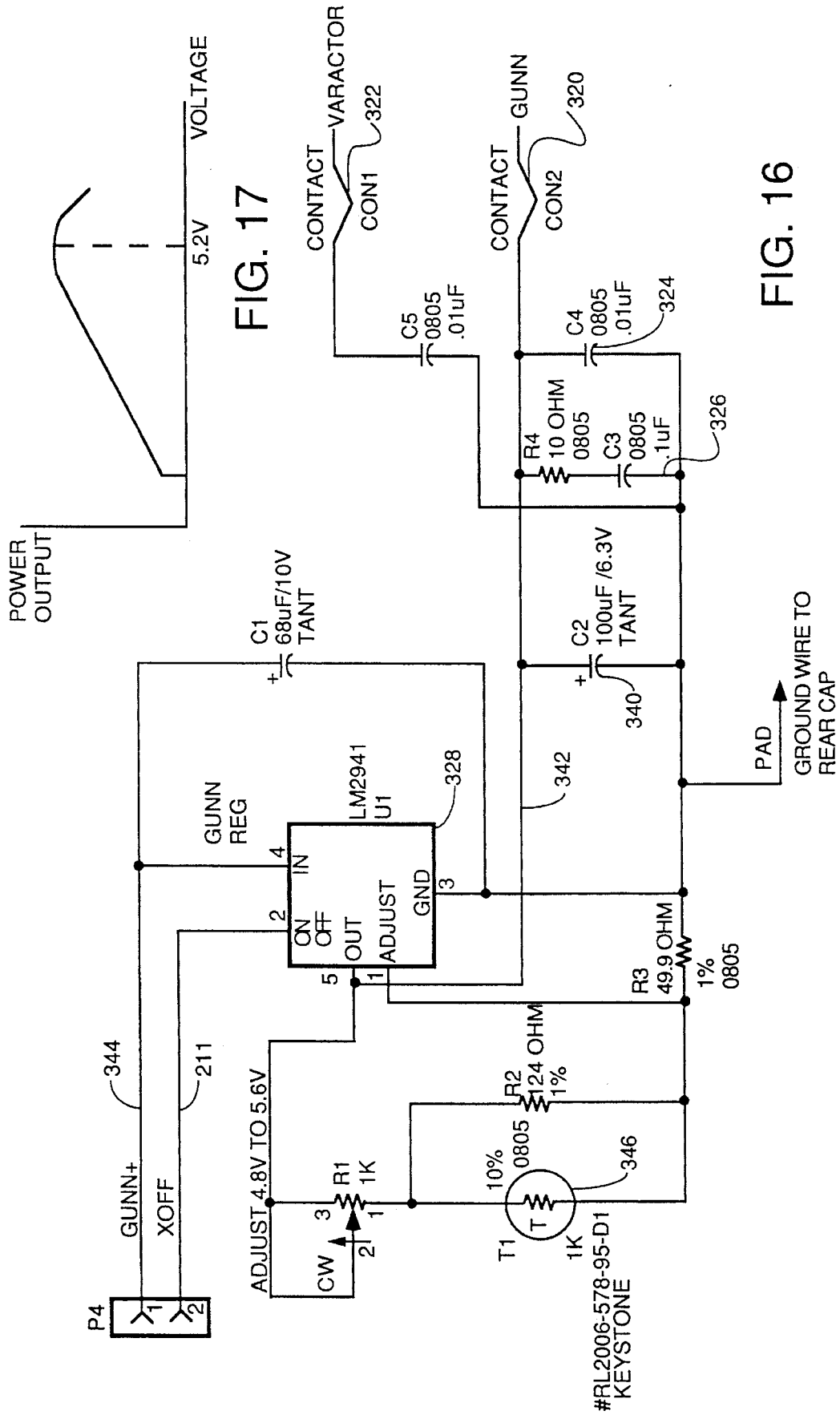
FIG. 16 is a schematic diagram of the preferred embodiment of the voltage regulator circuit for the Gunn oscillator that generates the microwave energy to be transmitted.
FIG. 17 shows a graph of the power output of the Gunn oscillator versus power supply voltage.

The XOFF signal on line 211 in FIGS. 13A and 13B emanates from pin 19 of the gate array logic 252 and causes the Gunn oscillator to oscillate when it is a logic 1 and stops oscillation thereof when it is a logic 0. The Gunn oscillator circuit is shown on FIG. 16. The Gunn oscillator diode is coupled to terminal 320. In some embodiments, a varactor diode is coupled to terminal 322 to provide a tunable Gunn oscillator. Two bypass capacitors 324 and 326 isolate the RF from the voltage regulator chip 328. A large capacitor 340 provides stability for the voltage regulator 328 and filters any residual noise off the regulated power supply line 342 which supplies power to the Gunn oscillator diode. The voltage regulator chip 328 supplies a regulated 5.2 volts from a 7 volt supply on line 344. Thermistor 346 adjusts the power output of the voltage regulator chip 328 so as to stabilize the power output of the Gunn oscillator under changing temperature conditions. If the thermistor were not used, the power output of the Gunn oscillator would decrease with increasing temperature. The maximum power output of the transmitter is needed for maximum range and signal-to-noise ratio. FIG. 17 shows a graph of the power output of the Gunn oscillator versus power supply voltage. At approximately 5.2 volts, the power output of the Gunn oscillator is relatively insensitive to variations in the power supply voltage. Thus, the oscillator power output will not be amplitude modulated by variations in the power supply voltage if the operating point is selected to be approximately 5.2 volts, and therefore this voltage has been selected for the operating point and the thermistor keeps the operating point stable in the flat, horizontal area of the curve.

Use of the hysteresis RS422 receivers 305, 301 and 309 prevents the degradation in the sharpness of transition times of the digital transitions propagating on lines 16 and 18 from causing multiple "uncertainty transitions" in circuitry receiving the degraded transitions. That is, a normal transition has a very short transition time when it enters the line, but because of the resistance and capacitance of the transmission lines 16 and 18, the short transition time gets stretched. This can cause multiple "uncertainty" transitions by comparators as the relatively long transition time of the degraded logic transition is compared to the comparator's reference voltage. The use of hysteresis type receivers prevents these multiple "uncertainty" transitions by making a transition when the threshold is crossed in one direction, and not making a transition again when a transition in the other direction is encountered until the threshold is crossed by an amount equal to the hysteresis amount.

Figure 18:
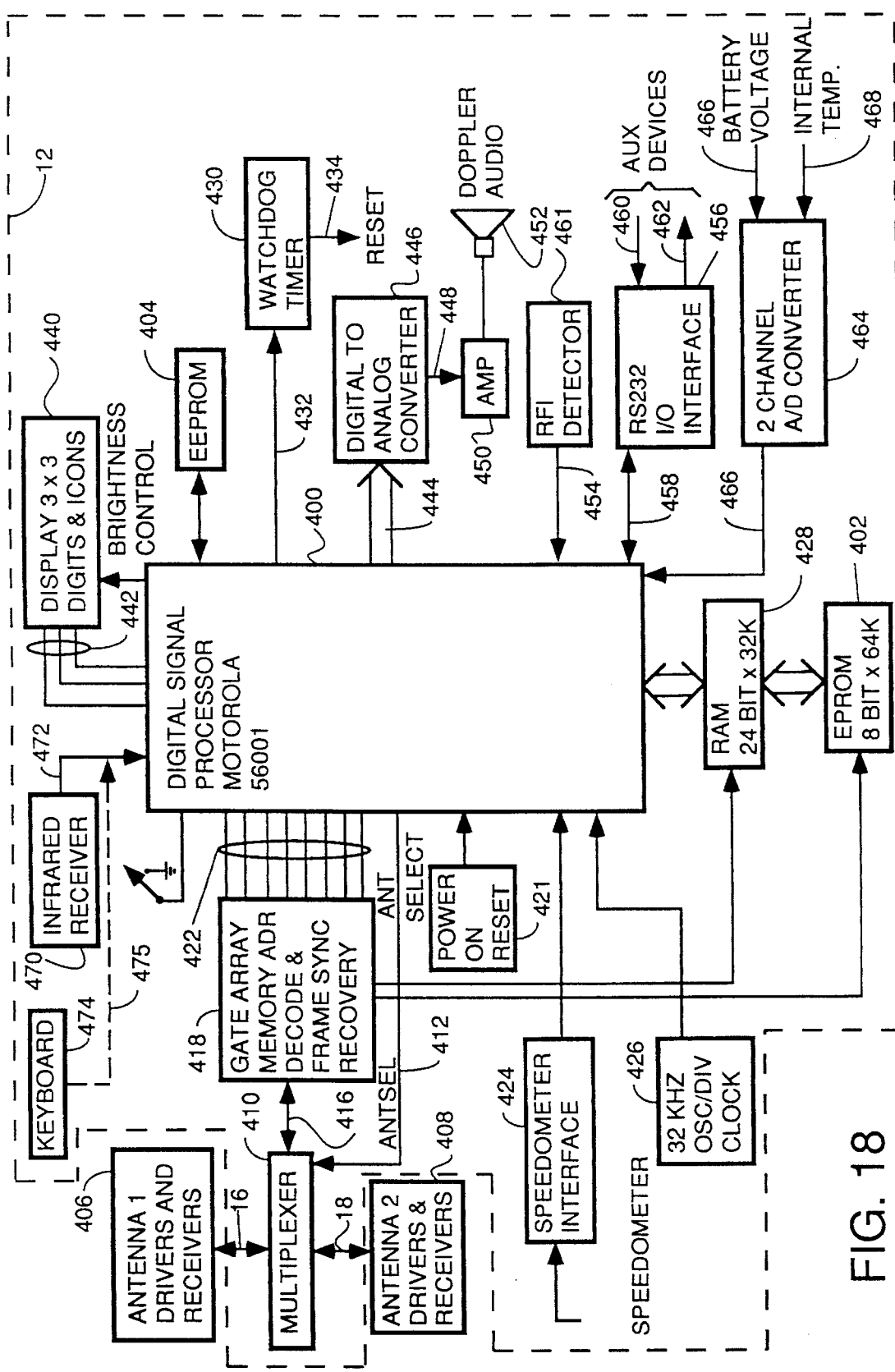
FIG. 18 is a block diagram of one embodiment of the processing and display unit.

Referring to FIG. 18, there is shown a block diagram of the digital circuitry inside the counter/display unit 12 in FIG. 1. A digital signal processor 400 is essentially a special purpose microprocessor that runs control software stored in EPROM 402 and/or EEPROM 404. In most embodiments, the control program is stored in EPROM 402 and various user controllable and other parameters that may be changed from time to time are stored in EEPROM 404. The control program is detailed in the flow charts described later herein and the actual executable binary code in included herewith as Appendix A. The code of Appendix A is ported for a Motorola 56001 digital signal processor (hereafter DSP). The control program is read into RAM 428 at power up time for faster access by the DSP. RAM 428 is also used as scratchpad memory if necessary by the DSP.

Serial data passes between the DSP and the antenna drivers and receivers, represented by blocks 406 and 408, via a multiplexer 410. The serial data from the DSP to be transmitted to one or the other of the antennas selected by multiplexer 410 is carried on the STD signal line in FIG. 21A1 and 21A2. The antenna control word (in parallel form) for transmission to the antenna in serial format is generated and modified by use of the bit-set and bit-clear instructions in various subroutines executed by the DSP. This word is transmitted by the SSI (a hardware circuit within the DSP) upon each receive interrupt generated by the SSI. A receive interrupt is generated every 24 clock bits received from the antenna. Switching of the multiplexer 410 is controlled by an antenna select signal on line 412. In one state of this signal, the stream of digital data from antenna 1 enters the multiplexer 410 on bus 16 and leaves the multiplexer on shared output line 416 which is coupled to gate array logic 418. In the other digital state of the antenna select signal on line 412, serial data from antenna 2 enters the multiplexer 410 via bus 18 and is relayed to gate array logic 418 via bus 416. Likewise, serial data to be sent to the antennas by the counting/display unit 12 is sent to the gate array 418 by the DSP 400 over data bus 422 and is transferred from there to the appropriate antenna via bus 416, multiplexer 410 and buses 414 and 420.

The DSP includes an SSI serial communications circuit which normally requires 4 signals for synchronous bi-directional communications (clock, receive data, transmit data and frame sync). In order to reduce cable and connector costs and to be able to operate with a smaller, more flexible shielded cable, the frame sync signal is not communicated but is implied by gating the continuous clock into bursts of 24 clock pulses. The SSI has no mechanism for detecting external clock interval and must be initialized for synchronization during the eight-clock interval between the 24 clock pulses. To detect the interval between clock bursts the logic array (GAL) 418 on the processor board is programmed to form a re-triggerable one-shot whose delay interval is greater than that between the clock pulses within the clock bursts. The logic output of the one-shot is connected to a processor port line. A one-shot is implemented within the GAL by using 4 registers to form a 16-state counter. The 27 mHz processor clock is fed to the GAL and advances the counter state when the communications clock is in the low logic state. When the communications clock is a logic high state, the counter is reset to logic state 1 (0001). The interval between communication clocks within the clock burst is shorter than the interval required to advance the counter 15 states to state 0 (0000). However, during the 8-pulse interval, the counter in the GAL will advance and hold at state 0, indicating the end of the clock burst event to a processor port line. To establish synchronization, the SSI must be reset by software during the interval between clock bursts. Once initialized, the port state is no longer monitored by the main software loop as this is resource-intensive task for the processor. Rather, a loss of synchronization is detected by the received data pattern which has certain reserved bit positions for this purpose As noted above, the gate array 418 serves to recover the frame sync signal from the serial data stream from the antennas and does other tasks according to its Boolean truth table which is included herewith as FIG. 19. Basically, the gate array 418 examines the serial clock signal received from whatever antenna is currently coupled to the gate array to determine when the "blackout" period or "silent interval" 266 in FIG. 14 occurs. When the silent interval period occurs, the gate array arms itself to generate a frame sync pulse upon the next occurrence of a clock pulse. As soon as the next clock pulse occurs, the gate array 418 sends a frame sync pulse to the DSP thereby recovering the frame sync signal without requiring the actual transmission thereof by the antenna circuitry.

In alternative embodiments, other means other than clock pulse dropouts may be used to convey information such as when the frame sync intervals start and end, when radio frequency interference has been detected, antenna personality data and other miscellaneous status or control data. Such other embodiments can use any type of clock modification to encode such data including, but not limited to: variation of the clock duty cycle, variation of the clock phase, variation of the clock frequency or general variation of the clock pulse amplitudes to other amplitudes other than the zero amplitude used during the silent interval in the preferred embodiment, or any combination of the above. These variations can be assigned a code such that the data to be conveyed can be mapped to a corresponding variation of some attribute of the clock signal.

The gate array 418 also recreates a serial clock signal by using the received clock signals from the antennas and generating additional clock signals timed so as to continue the periodicity of the clock signals received from the antennas and sufficient in number to fill in the silent interval. This reconstructed clock signal is provided to the DSP for purposes of synchronizing outgoing serial data transmissions to the antennas to the same clock signal to which the incoming serial data was synchronized. This allows the DSP to send serial data to the antennas like gain control bits, transmitter oscillator on/off control bits, and self test signals using the same clock signal the antennas use. This minimizes the number of wires that need to be in the cables 16 and 18 in FIG. 1 and simplifies the circuitry in both the antennas and the counter/display unit 12.

In alternative embodiments, gate array 418 also serves to convert the serial format data on buses 16 and 18 containing the digital data samples of the audio output of the mixer diodes into parallel format on parallel bus 422 in FIG. 18. In the preferred embodiment, the serial-to-parallel data conversion is performed by a UART type circuit called the SSI integrated within the DSP. In the preferred embodiment, shown in FIGS. 20A1, and 20A2, 20B1 and 20B2, 21A1 and 21A2 and 21B and unlike the embodiment shown in FIG. 18, the serial data from the selected antenna is output by the multiplexer 410 (see FIG. 21A1 and 21A2) as the SRD signal on line 417. This serial data signal on line 417 is coupled directly to an input of the DSP 400 (see pin 42 on FIG. 20A) and contains the 32 bit frames received from the antenna. Of these 32 bits, 16 bits are digital sample data from the A/D converter representing the analog signal output by the mixer diodes in the selected antenna and 8 bits are control data such as the RFI bit. The DSP hardware converts this serial data stream to a 24 bit parallel format digital word and stores it in an array of 24 bit words in RAM. The DSP then parses out the control data from each word using an SSI command, and uses the 16 bits of digital sample data for performing the Fast Fourier Transform. The spectral components from the FFT analysis are then used to calculate patrol speed, target speed of the strongest target return and target speed of the fastest target in a multiple target environment.

The DSP also has an optional speedometer interface 424 in some embodiments through which the DSP can read the actual patrol car speed for purposes of comparing this speed to the "patrol speed" derived from the radar returns of stationary objects. The software of Appendix 1 does not use the actual speedometer speed as the patrol speed because this is not accurate enough. Instead, the patrol speed is derived from the Doppler shifted radar returns from the ground. This is done by using the strongest radar return over time and assuming this is the return from the ground. Basically, the ground return is usually the strongest radar return although when targets get close, their returns become stronger for a short time than the ground return but then the target return goes away altogether. The software therefore assumes that the strongest return over an interval which is longest enough to distinguish over transitory target returns, is the return from which the patrol speed is derived. The software also includes the ability to compare the calculated patrol speed from the return selected in the above described manner to the speed read from the speedometer, and, if the difference is greater than 3 MPH, to discard the calculated patrol speed and re-calculate it from a different radar return.

Moving radar Doppler systems with no independent input of patrol speed information sometimes suffer from a condition called "shadowing". Shadowing usually occurs after patrol speed tracking has been lost, for example, when the patrol vehicle momentarily halted, and the patrol speed tracking system attempts to track a moving vehicle, resulting in a erroneous display of patrol speed. The Doppler signal related to patrol speed is normally a fairly strong signal, as disclosed in U.S. Pat. No. 3,936,824 which shows a method for filtering out the patrol speed signal in order to measure a weaker target signal, said patent being hereby incorporated by reference. If patrol speed tracking has been lost, the likelihood of shadowing is reduced by a requirement that the signal strength of a patrol speed candidate be greater than a certain minimum value in order to be acquired and tracked. Once in tracking mode, patrol speed performance is improved by a requirement that the patrol speed signal value be greater than a certain second minimum signal value in order to maintain tracking mode. For example, it sometimes happens that the system will lock onto the wrong radar return in calculating the patrol speed. This often happens at stop signs where the ground return is lost when the patrol car stops. If another car pulls away from the patrol car, the radar may lock onto the return from the other car and assume it is the patrol speed. One of the novel features of the system is the ability to manually reject a displayed patrol speed which is probably incorrect. When the trooper sees the improper patrol speed displayed, he or she can push a button on the infrared remote or the front panel keyboard that sends a signal to the DSP telling it to reject the calculated patrol speed and to lock onto another return and calculate the patrol speed from that return. A more detailed discussion of how this is done is included below in the discussions of the flow charts.

A 10 KHz clock signal is provided to the DSP by oscillator/divider 426. Each time this clock signal occurs, an interrupt service routine is performed to examine the state of the HEN input at pin 8 of the DSP chip on FIG. 20A1 and 20A2. This HEN signal is an OR function of three possible signal sources and is generated by the OR circuit 475 on FIG. 20B1 and 20B2. This OR circuit has three inputs. The HANDC input is from the infrared receiver which is triggered by the infrared hand controller. The SWDATA input is from an infrared switch encoder (not shown) which is hardwired to a plurality of front panel switches. The HCDATA input is an input from a hardwired hand controller connected to a rear connector on the unit. All three of these inputs will carry RC-5 bi-phase serial bitstreams.

The DSP has a watchdog timer 430 which is continually reset by a periodic pulse on line 432. If there is a software crash, and the DSP becomes non-operational, the watchdog timer 430 does not receive its pulse on line 432 and the timer therefore issues a RESET signal on line 434 which causes the DSP to reset and start over from the top of the control program.

The DSP drives a conventional LED display unit 440 which has at least two LED display windows to display the target speed and a "fastest" speed. The displayed target speed is the calculated speed of the strongest signal in the collection of radar returns. The "fastest" speed displayed on the counter/display unit 12 is the speed of the fastest target return in the collection of returns even if this is not the fastest speed. The display unit 440 also has various icon displays that are lighted to indicate what mode of operation the machine is in or machine status. Data controlling what is displayed is sent by the DSP to the display unit via bus 442. Display 440 in FIG. 18 includes two multisegment LED drivers, one for each of two LED windows on the front panel. Each multisegment driver receives serial data on one of the lines of bus 442 and a clock signal on one of the other lines of the bus. The multisegment driver latches the data, decodes it and generates appropriate segment drive signals for the LED segments to display the data.

The function of the DSP 400 and its control software in FIG. 18 is, among other things, to perform a Fast Fourier Transform on the serial data stream arriving from the antenna to derive the patrol speed and the closing velocity of the strongest target signal as well as the closing velocity of the fastest target speed. The incoming digital data from the antenna is a digital representation of a very complex waveform which includes returns from stationary objects and returns from objects that are moving relative to the patrol car as well as harmonics. The patrol speed is derived by finding the strongest Fourier component and correcting for the effect of the gain control adjustment to derive the true signal power of the return represented by the strongest Fourier component. Target identification is performed using an algorithm that compares the amplitude level of a Fourier component which is thought to represent a target return to the amplitude levels of the Fourier components in the neighborhood of the selected Fourier component to determine if a minimum difference exists. In the preferred embodiment, the amplitudes of the neighboring Fourier components are averaged and the average is compared to the amplitude of the Fourier component under investigation as a possible target return. If a minimum difference of 10 db exists between the average and the return under investigation, it is deemed a valid target return. As such, this target analysis algorithm processes signal-to-noise ratio as opposed to absolute amplitude. Selection of the Fourier component thought to represent a target return is based upon relative amplitude since only the speed of the strongest return that is not patrol speed is legally admissible.

In the preferred embodiment, the DSP sets the gain level of the system at some value and accumulates 2048 samples in a data buffer in RAM 428 in FIG. 18. These samples are a digital representation of a segment of the analog signal from the mixing diodes which contains all the information regarding the patrol speed, any target returns and any harmonics that are present. The 2048 samples are then analyzed using a Fast Fourier Transform and the Fourier components are analyzed to determine if they fall within an acceptable range of amplitudes, i.e., not too weak nor too strong. If all the Fourier components do not lie within the acceptable range of amplitudes, all the samples are discarded and 2048 new samples are collected after the DSP sets the gain level of the system to a new value and the process is repeated. The Fast Fourier Transform (hereafter FFT) is performed on the 2048 samples by doing seven consecutive FFT's, each being performed on 512 samples with a 50% overlap. In other words, the first FFT is performed on the first 512 samples, and the second FFT is performed on another 512 samples starting with the 257th sample in the buffer. The third FFT is performed on 512 samples starting with the sample 256 samples further into the buffer.

Figure 22:
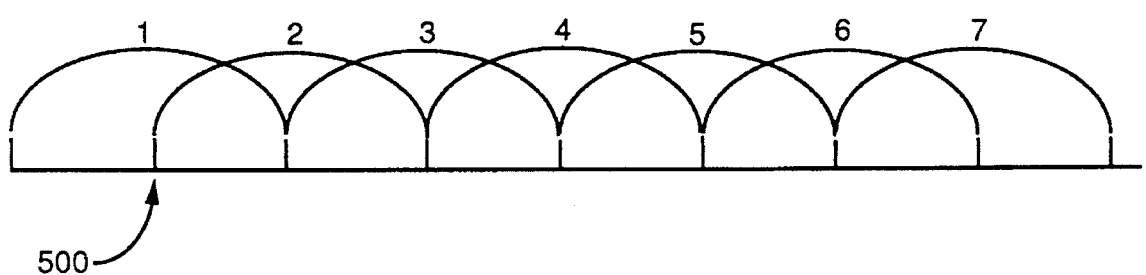
FIG. 22 is diagram of how the FFT's performed on the data block overlap.

In the preferred embodiment, Hamming Windows are used to improve the quality of the Fourier analysis by minimizing edge effects. Referring to FIG. 22, there is shown a conceptual diagram of how the Hamming Windows overlap. Each of the curved components labelled 1 through 7 is a Hamming window which supplies weighing coefficients to each of the 512 samples in the FFT. Thus, the first sample has a Hamming coefficient that is less than the second sample and so on. Likewise, the Hamming weighing coefficient for the 256th sample (designated at 500 in FIG. 22) is at a maximum in the first FFT and a minimum in the second FFT. Since noise components randomly go up and down, and since the results are averaged over the 2048 samples, the noise components tend to cancel out and a slight improvement in signal/noise ratio results. The seven Hamming Windows shown in FIG. 22 represent the seven overlapping FFT's that are performed.

After performing these seven FFT's, the results of the seven FFT's are then averaged. This reduces the contamination of the spectrum in the form of smearing, i.e., false energy in "bins" on either side of a legitimate spectral line or "bin", caused by the false model of 2048 samples with signal power falling to zero on either side of the 2048 sample group. This "end effect" is reduced by use of the Hamming Windows described above.

When 512 samples are used for an FFT, the result is 256 frequency points in the spectrum, each point represented by a real and imaginary component. The magnitude of each frequency component so represented is equal to the square root of the sum of the squares of the real and imaginary components. However, since the police radar system is interested in determining the signal power of the strongest signal, and since signal power is the sum of the squares of the real and imaginary components, the DSP calculates only the sum of the squares of each frequency component so as to determine the signal power of each of the 256 components.

Each spectral line output by the FFT is output as with a real and imaginary component. The sum of the squares of these components yields the apparent power of that spectral line. The apparent power of each spectral line is computed. After the power of all FFT spectral points resulting from the 2048 sample buffer has been calculated, the spectral point with the highest apparent power is determined for purposes of searching for a patrol speed candidate. The power of that spectral line or frequency component is then recalculated to take into effect the gain level applied to the entire 2048 data block or sample buffer (the gain set by the signals on bus 110 on FIG. 11A). This power adjustment is made based upon the relationship of equation (1) below.

$$(1) T = A \times 10_{(G/10)}$$

where

T=true power at the output of the mixer diodes

A=apparent power

G=the gain adjustment in decibels applied on bus 110 to the entire 2048 sample buffer.

Using equation (1), the true power of a signal can be determined from the apparent power calculated by the FFT and the gain value that was in effect when the 2048 samples from which the apparent power was calculated were collected. The reason that this is done is that it has been observed that at a certain level of true power of any particular frequency strong signal at the output of the mixer diodes, double bounce false signals, harmonically generated false signals and intermodulation false signals usually are generated from the strong signal.

The foregoing algorithm is not used in calculating target speeds. For target processing, the power of each spectral component, I.e., bin, is compared to the power of some of its neighboring spectral components to determine if it is a legitimate target return or just noise. This is done by selecting a particular bin out of the 256 bins returned by each FFT or out of the power averaged bins after the results of the 7 overlapping FFT's have been averaged and comparing the power thereof to the average power of 8 of its neighboring bins. In doing this comparison, the power in the 2 immediately adjacent bins of the selected bin is ignored. This done because of the possibility of power smearing as described above resulting from deviation between the assumed signal model and the actual signal. Also, sometimes signals have frequencies that sit between bins of the FFT, and this results in some of the energy from the signal spilling into neighboring bins. The power in the next 4 higher bins is then calculated as is the power in the next 4 lower bins, excluding the 2 immediately adjacent bins. In some embodiments, the power from these 8 bins is averaged and in some embodiments, the sum of the 8 bins is used knowing that this sum is 8 times higher than the average. The power in the selected bin must be 10 db higher than the average power of the 8 neighboring bins to be selected as a target return. In the case where the average power of the 8 bins is not calculated, the power in the selected bin is multiplied by 8, and the result is compared to the sum of the power of the 8 bins to determine if it is 10 db higher.

In some embodiments, after all the targets are located in this manner, the absolute or true power of each target is calculated using equation (1) above and the gain adjustment that was in effect when that target return bin power was calculated, and the strongest target return is analyzed for Doppler shift and the resulting speed is displayed as the target speed in the target speed display window on the front panel of the counter/display unit. The other target returns are also examined to determine which is the fastest target, and that fastest target speed is displayed in another display window on the front panel of the counter/display unit.

Signal power has an effect on distortion with stronger signals causing more distortion if linear ranges of the various mixer diodes, amplifiers etcetera are exceeded. Distortion causes harmonics. Since the strongest signal return is usually the patrol speed, harmonics of the patrol speed are quite prevalent and can appear to the system as targets. The system therefor guards against this possibility by using more stringent qualification criteria for "signals" that have apparent speeds that are two times and three times the patrol speed. Such potential targets are scrutinized to determine if the signal power is greater than the signal power of the neighboring bins by a factor which is even greater than 10 db. Typically 15 or 20 db will be used, but in other embodiments other factors may be used. In the preferred embodiment, more stringent scrutiny is applied at harmonics of the patrol speed spectral component if the gain adjustment used for the buffer of samples from which the patrol speed was calculated was a large downward gain adjustment. Such a large downward gain adjustment means that the signals received at that time were very strong which leads to a higher possibility that harmonics of the patrol speed were generated. Harmonics of the target are not usually a problem. However, when the patrol car is moving, the patrol speed is a strong return, and, although it is removed from the spectrum after the patrol speed is calculated, the harmonics of the patrol speed are not removed and can be misidentified as target returns unless they are suppressed by applying more stringent target qualification criteria thereto.

Figure 25:
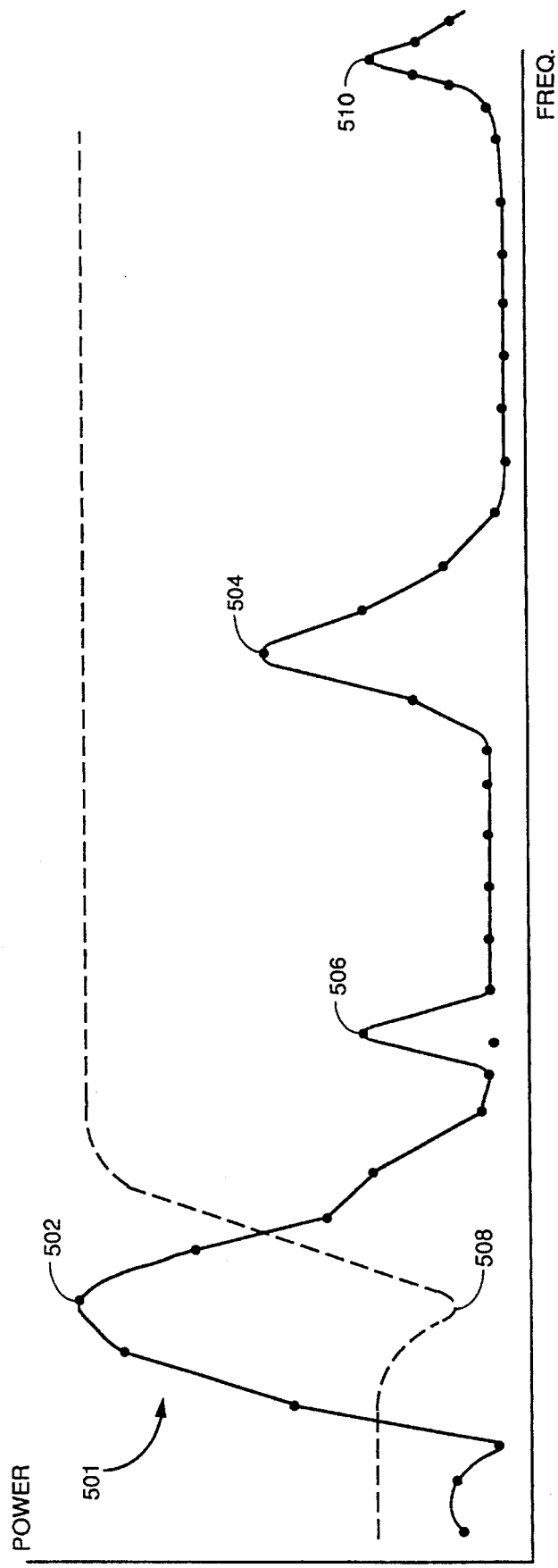
FIG. 25 illustrates a typical FFT output spectrum.

The foregoing concepts are better understood by reference to FIG. 25 which shows a typical Fourier component spectrum resulting from FFT analysis of a buffer of digital samples of the output of the mixer diodes. The solid curve indicated generally at 501 is a plot of the Fourier component spectrum where each dot is one bin or one frequency component result from the FFT. Each dot has a power level, represented by its position on the vertical axis and a frequency, represented by its position along the horizontal axis. The large power point at 502 represents the patrol speed, and the smaller power point at 504 represents the speed of the target (the radar is shown as operating in "opposite lane" mode where the patrol speed is less than that of the target relative closing speed shown at 504. A harmonic of the patrol speed is shown at 506. Even though the sin x/x filter response of an FFT is not a particularly good filter, it is adequate and computationally efficient. Therefore, an FFT is used to calculate the points on solid curve 501 in FIG. 25 because it takes much less computer time to calculate the points than it would to calculate them using a computer model of 256 elliptical filters. However, in other embodiments, other filter models can be used. Once the patrol speed is determined, the DSP and its control software effectively filter out the patrol speed return at 502 by superimposing a high pass, high quality elliptical filter response with a zero placed at the center frequency of the patrol speed (the zero is shown graphically at 508) over the FFT calculated spectrum. The DSP then removes the patrol speed spectral components by applying the elliptical filter response shown by the dashed curve 503 to the various frequency components. When the patrol car is in the same lane as the target, the radar is informed of this fact by the patrolman and applies a low pass elliptical filter to filter out the patrol speed because in that case, the patrol speed will be higher in frequency than the relative closing speed of the target even if the absolute speed of the target is moving faster than the patrol car.

The strength of the harmonic at 506 depends upon the signal power of the patrol speed point at 502. If the target return at 504 were lower in power, the harmonic at 506 could easily be mistaken for a real target. Therefore, to minimize this possibility, the DSP and its control software calculate the absolute power of the patrol speed point at 502, and determine if it is high enough to indicate that harmonics will be present in the FFT spectrum. If it is high enough, then the DSP lowers the sensitivity of the radar to returns in the frequency ranges around the frequency of the second and third harmonics by applying more stringent signal to noise ratio criteria to peaks at these harmonic frequencies than are applied to normal target peaks at other frequencies.

The DSP calculates the target speed and outputs a stream of digital numbers on bus 444 which define amplitude points on a periodic waveform which has a frequency that is related to the doppler shift between the outgoing radar energy and the returned, doppler shifted energy from a target. This stream of digital numbers is converted to an analog waveform by digital-to-analog converter 446 which outputs an analog signal on line 448. The analog signal is amplified by amplifier 450 and applied to a speaker 452 for audio feedback to the police officer operating the radar.

To insure that radio frequency interference does not render the measured target speed inaccurate, another RFI detector 452 is employed in the counter/display unit 12. This RFI detector is the same structure as the RFI detector in the antennas and serves the same purpose. When radio frequency interference is detected which is of a sufficiently high level to interfere with the accuracy of speed calculation by the DSP, the RFI detector outputs a signal on line 454 which causes the DSP to take appropriate action to avoid displaying any possible invalid target speed. In some embodiments, that action may be to blank the target display and in other embodiments, the display may be lit with a code in the target speed windows indicating the target speed will not be displayed or an icon may be lit which indicates any displayed target speed may be invalid.

In some embodiments, the radar system may be connected to auxiliary devices such as a computer etc. To implement such coupling, an RS232 interface 456 couples a DSP serial data port coupled to line to auxiliary devices via serial data lines 460 and 462. Such auxiliary devices may include a large roadside electronic sign that displays vehicle speed to passing drivers, computers or video systems that take pictures of the passing targets with radar data as to their speed.

To insure the integrity of the target speed calculation, the vehicle battery voltage is monitored and the internal temperature of the counting/display unit 12 is also monitored. Sometimes police officers sit in their patrol cars for long periods of time with the engine off clocking speeders. This can run the vehicle battery down to a voltage level where reliable operation cannot be assured. The DSP monitors the vehicle battery voltage using a 2 channel A/D converter having an analog input coupled to the vehicle battery via line 466. The battery voltage is converted to a digital number which can be read by the A/D converter 464 via bus 466. When the battery voltage gets too low for reliable operation, the DSP detects this fact in one of the periodic reads of the data from the A/D converter 464 and shuts its operation down. Also, the cabin area of patrol cars and the contents thereof can become very hot when left sitting in the sun for long periods of time. These high temperatures can cause thermal runaway of solid state devices or sufficiently alter the operation of solid state devices as to render the results suspect. Therefore, the internal temperature of the counter/ display unit 12 is monitored by a temperature transducer coupled to the DSP via analog signal line 468. The A/D converter 464 converts this temperature to a digital number which is periodically read by the DSP via bus 466. When the internal temperature in the patrol car gets too high, the DSP shuts its operations down. With the unit operating in the summertime on the black dashboard of a patrol car, temperatures can reach 100 degrees centigrade. The components in the system are rated for 85 degrees centigrade, so when temperatures climb above 90 degrees centigrade, operations cease in the DSP and it enters a low power sleep mode and the antenna circuitry is turned off. Once the DSP enters the sleep mode, it wakes up periodically and reads the temperature data from the A/D converter 464. As soon as the temperature drops below the safe limit, operations resume.

The DSP is controlled by way of an infrared remote control much like the remote control used by many modern television sets. Infrared signals from this remote control (not shown) are received by infrared receiver 470 and converted to digital commands on bus 472. These digital commands control the mode of operation of the overall system etc. In alternative embodiments, a keyboard 474 on the front panel of the counter/display unit 12 may be used to enter commands to control operation of the system.

Referring to FIG. 19, the Boolean equations for gate array logic 418 are shown. The various signals that are combined by the Boolean equations are listed at 480 and 482. These signals are input and output signals from the DSP chip on FIG. 20A1 and 20A2. FIGS. 20A1 and 20A2 and 20B1 and 20B2 are the schematic diagram of the digital logic of the counter/display unit 12 shown in FIG. 18. These signals at 480 and 482 of FIG. 19 appear on the pin numbers listed at 484 and 486. These pin numbers correspond to the pin numbers of the integrated circuit 418 on FIG. 20B1 and 20B2. Reference numbers of various logic elements on FIGS. 20A1 and 20A2 and 20B1 and 20B2 that are identical to reference numbers on FIG. 18 indicate the integrated circuits that correspond to identically numbered functional blocks on FIG. 18. FIGS. 21A1 and 21A2 and 21B are a schematic diagram of the analog circuitry in the counter/ display unit. Circuits elements with reference numbers identical to functional blocks in FIG. 18 are the circuit elements that perform the functions of the identically numbered blocks in FIG. 18.

Referring to FIGS. 20A1 and 20A2 and 20B1 and 20B2, the two 74HC132 integrated circuits enclosed within dashed box 421 serve as a power-on reset circuit. Manual control data to control the mode of operation of the counter display unit and other aspects of the operation can be entered through the infrared receiver 470 or keyboard 474 in FIG. 18. An "OR tie" circuit 475 in FIG. 20B1 and 20B2 allows the user input commands to be entered either through the keyboard 474, a wire remote plug on the rear panel of the unit or the built-in infrared receiver 470. The digital-to-analog converter 446 of FIG. 18 is implemented with integrated circuit 447. Buffer amplifier 450 in FIG. 18 is implemented in FIG. 20B1 and 20B2 using differential amplifier 451. The 32 KHz clock 426 in FIG. 18 is implemented using 640 KHz crystal 427 and an integrated circuit divider 429 in FIG. 20A1 and 20A2. The temperature and battery voltage monitoring function of block 464 in FIG. 18 is carried out by 2 channel A/D converter chip 465 and its associated interface circuitry connecting battery voltage line 466 and temperature transducer line 468 thereto. Radio interference detector 452 in FIG. 18 is implemented by differential amplifier 453 in FIG. 20A1 and 20A2 and its associated RF tuned circuit 455 coupling antenna 457 to the amplifier. The structure and operation of the RFI detector are substantially identical with the RFI detector in the antenna circuitry previously described. Line 459 couples the DSP 400 to a manually operated switch, not shown, which is used to control a setup mode. RAM 428 and EPROM 402 are found in the upper right hand corner of FIG. 20B1 and 20B2.

Referring to FIGS. 21A1 and 21A2 and 21B, two line receivers with hysteresis 405 and 407 receive the XMIT DATA and SERIAL CLOCK serial data streams from the front antenna. These two integrated circuits combine with line driver 409 to make up the antenna 1 driver and receiver block 406 in FIG. 18. Line driver 409 transmits the serial data of the RECEIVE DATA signal in FIG. 13B to the antenna 1 circuitry via bus 16 in FIG. 1. The line drivers 411 and 413 receives the serial data streams of XMIT DATA and SERIAL CLOCK from antenna 2. Line driver 415 transmits the serial data stream of the RECEIVE DATA signal to antenna 2 via bus 18 in FIG. 1.

Line drivers 405, 407, 409, 411,413 and 415 all serve to buffer and condition the serial data transmitted bi-directionally between the antennas and the counter/display unit so that the data can be transmitted approximately 25 feet or more. The line drivers 405, 407, 409, 411,413 and 415 all use hysteresis to maximize the noise immunity of the system and to prevent "uncertainty" noise generated by the system caused by slow logic transition across the logic level comparison threshold.

Figure 21B:
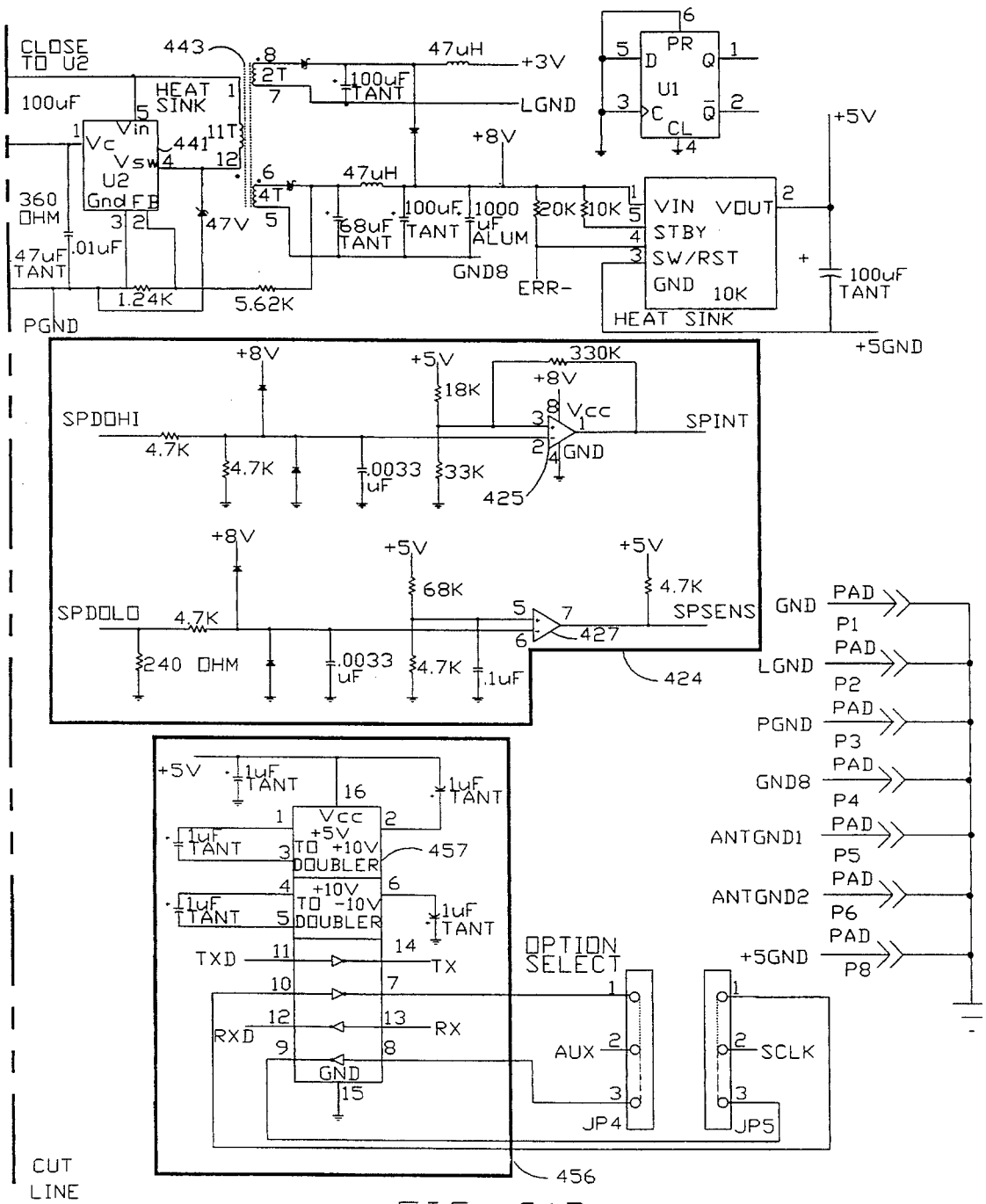

The watchdog timer 430 in FIG. 18 is implemented in FIG. 21A1 and 21A2 and FIG. 21B with integrated circuits 431,433 and transistors 435 and 437. The circuitry inside box 439 in FIG. 21A1 and 21A2 is a manual power on/off circuit. A switch on the front panel (not shown) is coupled to the base of transistor Q1 such that when the switch is actuated, the transistor collector clocks the clock input of the flip-flop 441 thereby causing the flip-flop to toggle. The Q output of this flip-flop generates a shut down signal S.D. that is coupled by line 443 to the base of transistor Q2. This transistor controls the operation of a power supply integrated circuit 441 on FIG. 21B.

Integrated circuit 441 in FIG. 21B is a switch mode power supply that allows transformer 443 to create several different DC power supply voltages from the 12 volt DC car battery.

The speedometer interface 424 in FIG. 18 is implemented in FIG. 20B1 and 20B2 with differential amplifiers 425 and 427.

The RS232 interface 456 in FIG. 18 is implemented with an integrated circuit 457 in FIG. 21B.

The gain adjustment number in the control software is used for several beneficial effects. First, as mentioned above, the gain adjustment number can be used to calculated the true power of the patrol speed. The true power of the return thought to be the patrol speed can then be used to make a more informed choice as to which of the returns in a multiple return or apparent return spectrum is the correct patrol speed. Further, more accurate selection of the patrol speed return using the gain correction number aids greatly in better harmonic suppression as described above and also aids in configuring an elliptical filter response curve with a zero located over the patrol speed to filter out this return before doing target processing.

In the preferred embodiment, the system also looks for the fastest target speed and use of the gain adjustment number to more accurately identify the patrol speed helps suppress the intermodulation product which might otherwise be mistaken as the fastest target speed but which is really an anomaly. Specifically, the intermodulation product that results from the upper sideband, i.e., the sum of the transmit frequency and the doppler shifted signal at the frequency dictated by the relative closing speed can be mistaken as a real target return (shown in FIG. 25 at peak 510) and displayed as the fastest speed unless steps are taken to suppress it. An example will help to clarify this concept. Suppose the patrol speed has been processed by selection of the strongest signal and use of the gain adjustment number to calculate the true power results in a determination that the patrol speed is 55. Suppose also that there is a target moving at 65 mph in the opposite lane so that the doppler shifted return shows a closing velocity of 120 mph. The intermodulation product will be the sum of 120 and 55 or 175 mph. Thus, the intermodulation product results in false return showing an apparent speed of 175 mph closing velocity minus patrol speed of 55 mph or 120 mph. This intermodulation product, unless suppressed or filtered out, will then cause the system to display 120 mph as the fastest target erroneously.

The DSP and its control software drives the displays so as to simultaneously display both the strongest target signal and the fastest target signal. In the prior art, some units will display the fastest target speed but only when a switch is held down. The problem with this arrangement is that while the switch is being held down, no tracking history of the strongest target return is being accumulated. The courts generally like to have tracking history evidence for conviction, so the prior art arrangement is disadvantageous in that respect. The traffic surveillance radar according to the teachings of the invention eliminates this disadvantage by simultaneously displaying the strongest target return (the one with the best signal-to-noise ratio) in the left display window and the fastest target return in the right display window. When the fastest target return becomes the strongest return, it is automatically displayed in the left display window, and the patrolman can push a switch to lock onto the target return displayed in the left window for purposes of citation. The system does all this by doing the following things in the following order in one embodiment: performing the overlapping FFT's and eliminating the immediate neighbors of each return before averaging the apparent power of eight neighboring bins of a return, four on either side thereof so as to determine the signal-to-noise ratio of each return; using the gain adjustment number to determine the true power for purposes of determining the patrol speed and then filtering out the patrol speed return using a digitally simulated elliptical filter with a zero on the patrol speed; suppressing harmonics of the patrol speed; suppressing intermodulation products to eliminate the apparent fastest target caused by the upper sideband in the product signal from the mixer diodes; selecting the target return with the best signal-to-noise ratio as the strongest target return and calculating and displaying the speed of that strongest target return in the left window; calculating the speed of each remaining target return and selecting the target return with the highest speed for simultaneous display in the right window. In the preferred embodiment, the fastest target speed is not displayed in the right window if it is the same as the strongest target speed. In other embodiments, the fastest target speed is simultaneously displayed in the right window even if it is the same target return as the strongest signal displayed in the left window. In some embodiments, only a single display window is used and the fastest target speed is always displayed in that window. In the preferred embodiment, three display windows are used, and the patrol speed is displayed in the rightmost window, the strongest target speed is displayed in the leftmost window and the fastest target speed is selectively displayed in the middle window.

Referring to FIGS. 23A–23E, there is shown a flow chart for the fast target processing in either moving mode or stationary mode. In the preferred embodiment, the patrolman indicates to the radar unit when the radar is being operated with the patrol car not moving to avoid the difficulty of searching for patrol car speed when the Doppler shift of reflected signals from stationary objects is zero. Zero Doppler shift causes problems in processing by the DSP. Fastest target processing allows the operator to "look past" the strongest target (usually the closest vehicle) and measure and display speeds of more distant vehicles which are approaching at a faster speed than the strongest target. Intermodulation effects can produce spectral signals which can be falsely interpreted as weak "faster" targets. In order to determine if a target is a true faster target, the received data is operated on by a 512 point FFT, which results in a 256 point spectral analysis. The spectral strength and spectral bin number of the five strongest spectral lines are used to determine if the potential target bin number is a multiple of one of these lines or if its spectral bin number is nearly the same as the sum of any two of the five lines or nearly the same as the absolute difference of any two of the five lines (see FASTQUAL subroutine flow chart below).

The strength of a target multiple is related to the strength of its fundamental, while the strength of a sum or difference intermodulation product is related to a product function of the strength of its two components. Target multiples are evaluated for second and third harmonic possibilities each, with a potential for 10 harmonic frequencies to be considered. The sum and difference permutation generates 20 frequencies. A target multiple must have a fundamental absolute signal strength above a certain threshold to be considered as a possible false fast target. Similarly a potential intermodulation false target must have both components with an absolute signal strength above a certain second threshold to be ruled as a false target. These thresholds were determined experimentally as radar receivers vary from unit to unit in intermodulation characteristics.

Figure 28:
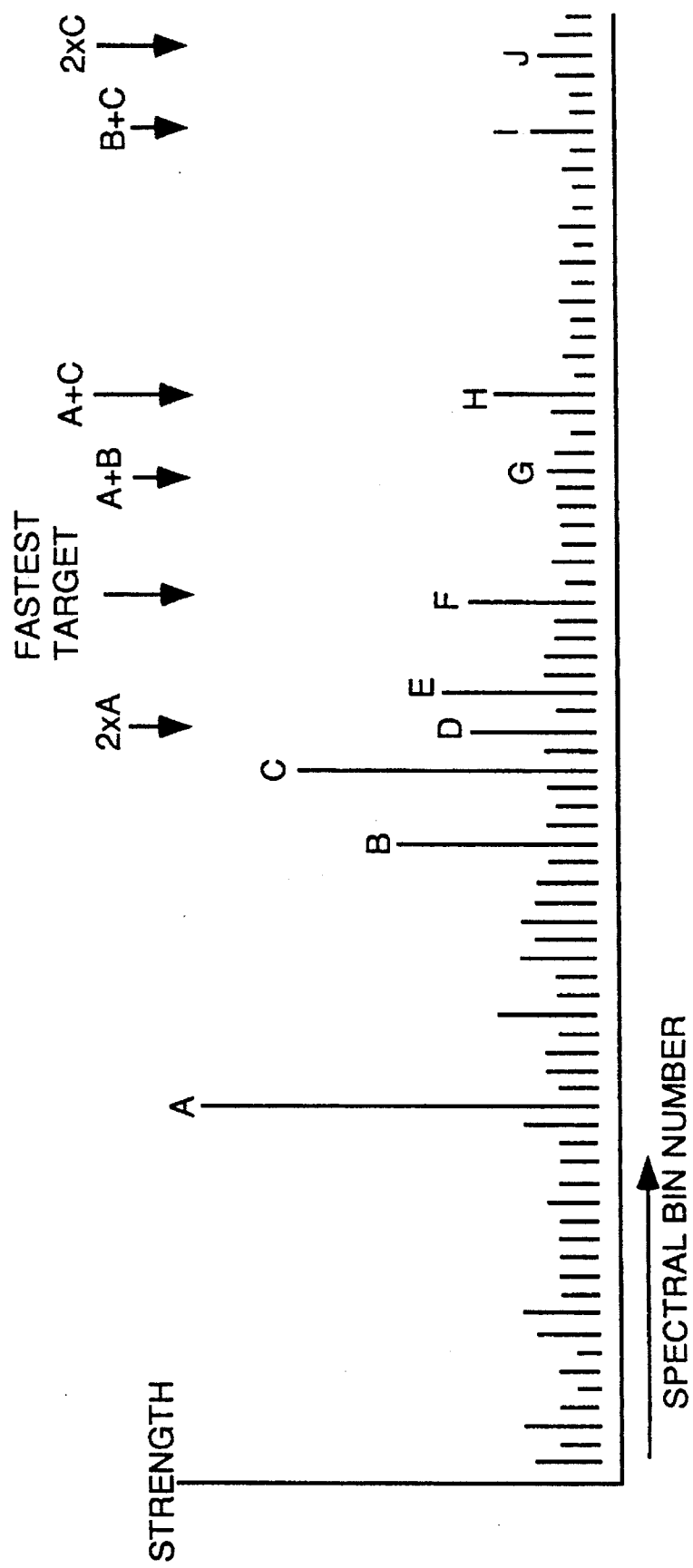
FIG. 28 is another diagram of an FFT spectrum illustrating the presence of false signals caused by harmonic distortion and intermodulation products.

As an example, in the moving radar spectral diagram of FIG. 28, signals A,B,C, E &F represent real targets of interest. Signal A is a Patrol Speed signal from a nearby stationary target. Signal C is the strongest moving target while B is a slower, weaker target and would not generate a displayed speed. In the example of FIG. 28, only signals A, B & C have enough signal strength to generate false spectral lines by harmonic distortion and intermodulation products and multiple bounce returns. Line D is a 2*A harmonic (2 times multiple bounce signal generated by signal A) possibility and would not be processed. E and F represent faster targets with F being fastest. Line G can be generated by intermodulation between A & B. Lines H & I are similarly potentially due to intermodulation and line J could be a 2*C harmonic and would not be processed.

Figure 23A:
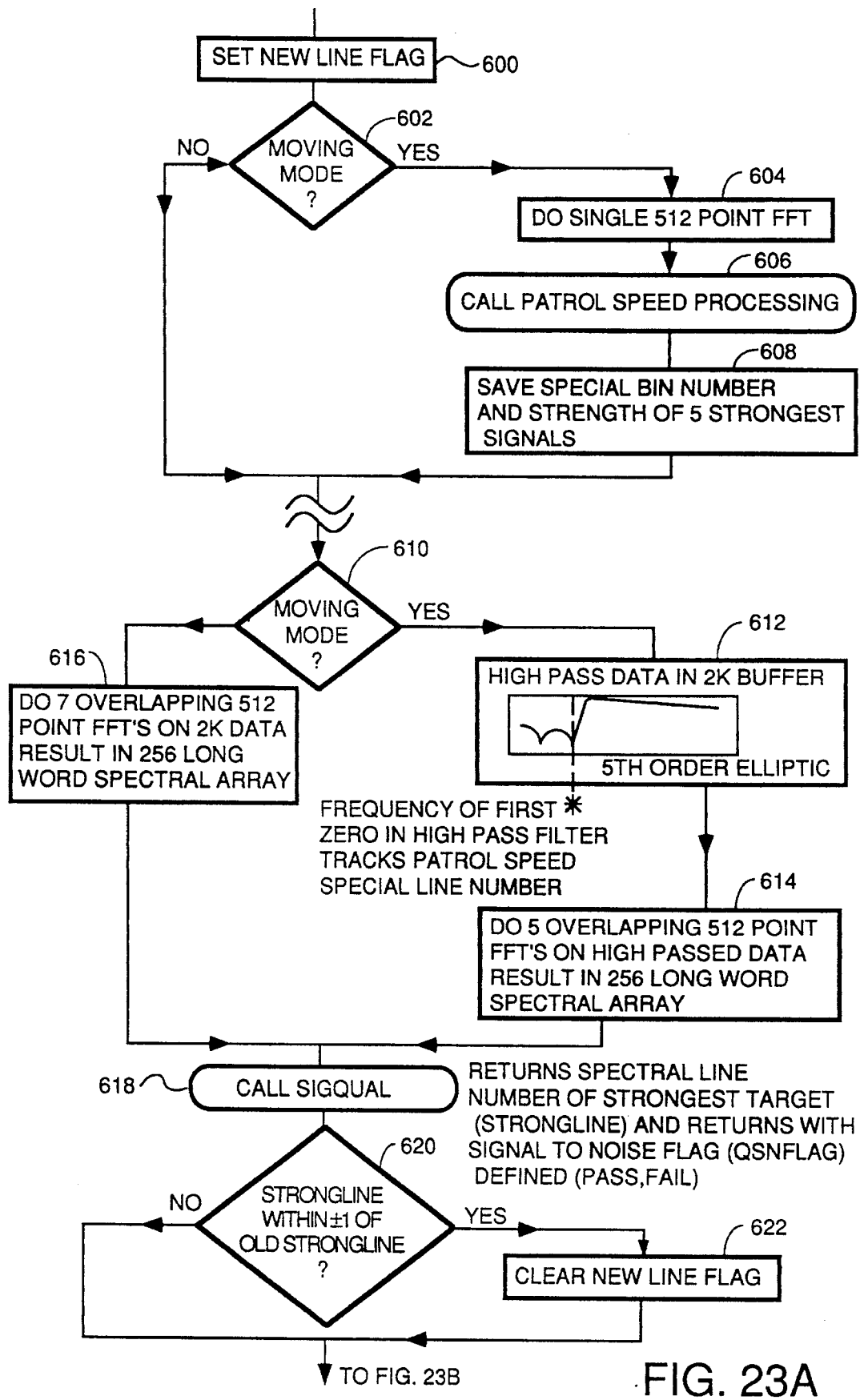
FIGS. 23A–23E are a flow chart of the fastest target processing portion of the main program loop.

The details of this fastest signal processing will now be discussed in greater detail. In FIG. 23A, block 600 represents the process of setting the newline flag. This is done to setup the flag so that it can be cleared under certain circumstances later in the process. Test 602 determines whether the unit is operating in moving mode. The patrolman tells the unit which mode to operate in, but the mode can be changed from moving to stationary or vice versa at any time. If the unit is in moving mode, steps 604, 606 and 608 are performed to find the 5 strongest signal returns and save them in a buffer so that they are available after the high pass filtering is done later in the process. This is done because the patrol speed return and possibly intermodulation products and harmonic multiples of the patrol speed may be in this group of the 5 strongest returns and it is necessary to retain knowledge of these 5 signals because their harmonics may still be present in the spectrum after the high pass elliptical filtering process is performed. Step 604 represents the process of performing a single 512 point FFT on the first 512 samples in the sample buffer. The sample data is stored in a circular buffer which is large enough to store two 2048 blocks of samples. The two blocks are processed in a pseudo-ping-pong fashion in the sense that when the first 2048 block is filled, the FFT processing starts, while an interrupt routine is busy filling the next 2048 block. Whenever a frame is received from the antenna, the interrupt service routine interrupts main loop processing and stores the freshly received frame in the second 2048 block.

Step 606 is a subroutine call to the patrol speed processing routine which functions to find the best patrol speed candidate and tracks it after locking. The patrol speed processing routine was performed in the Stalker prior art and will not be described further herein. The structure and processing of the Stalker prior art is hereby incorporated by reference. Step 604 generates 256 spectral lines or bins. The first 88 of these spectral lines represent speeds up to about 70 mph which usually contains the patrol speed.

Figure 26:
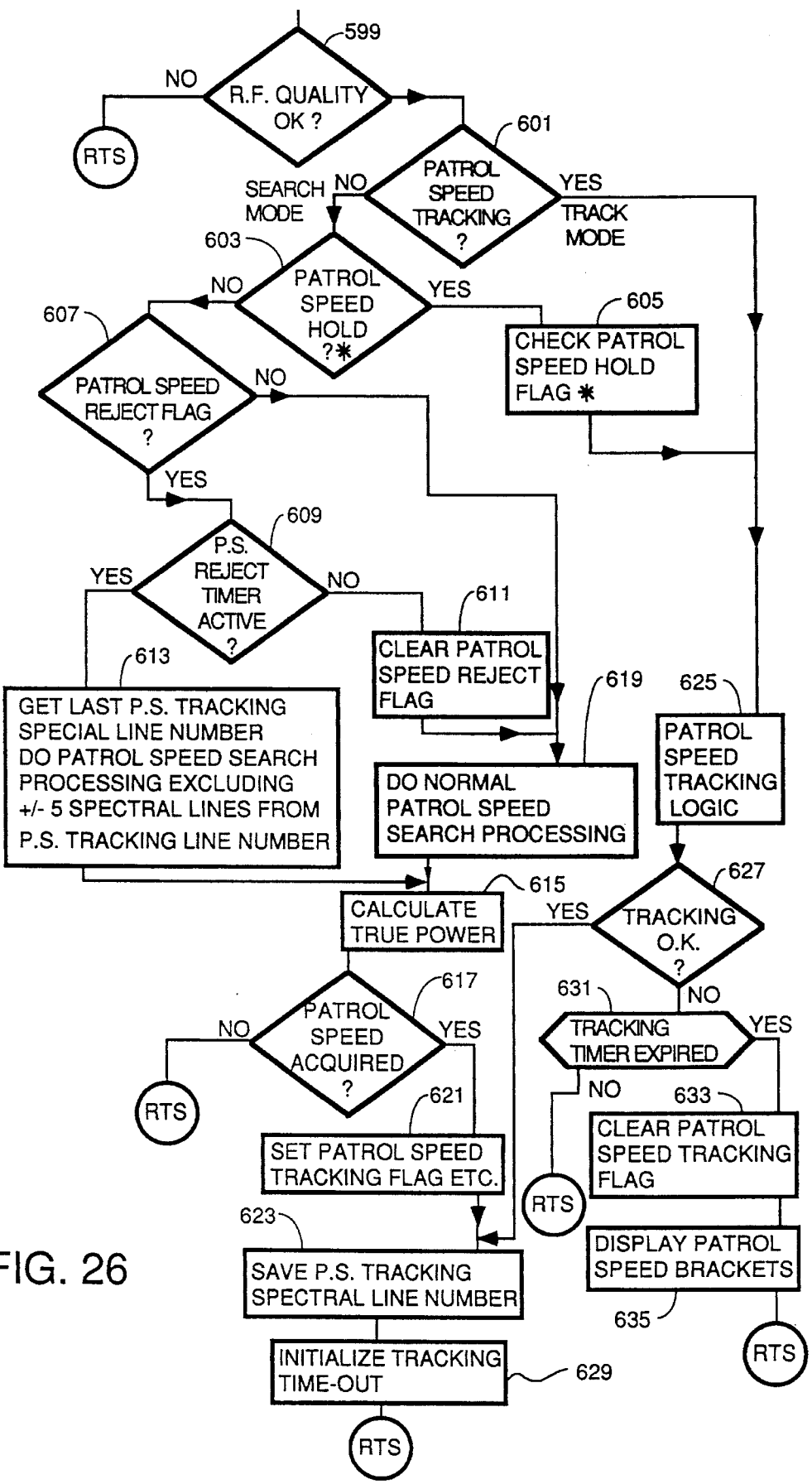
FIG. 26 is a flow chart of the patrol speed acquisition and tracking processing.

Referring to FIG. 26, there is shown a high level flow chart of the patrol speed processing. The process shown in FIG. 26 is called and performed about every 40 milliseconds. The first thing that is done is the test represented by block 599 to determine if the RF quality is acceptable. If insufficient time has elapsed from the time the transmitter is turned on to allow the RF returns to stabilize before the routine of FIG. 26 is called, the test of block 599 will return processing to the main loop without performing the patrol speed processing. Next, a determination of whether the radar is in track mode or search mode as represented by block 601 is performed. If the unit is in search mode, the test of block 603 is performed to determine if the unit is in hold mode. Hold mode is a mode that turns off the transmitter for evasion of radar detectors. When in hold mode, patrol speed cannot be tracked. If the unit is in hold mode, and the patrolman enters a command to exit hold mode, step 605 is performed to clear the hold mode and attempt to begin tracking the patrol speed again. The radar unit assumes initially that the patrol speed is the same as it was when hold mode was entered. This is attempted once, and a tracking window is setup around the spectral line which was the last tracked patrol speed, and the lower tracking signal strength criteria is used (discussed further below). If no spectral line of the current spectrum within the window matches this patrol speed, the unit will not go into track mode and search mode will be continued to find the new patrol speed.

If the unit was not in hold mode when step 603 was performed, test 607 was made to determine if the patrolman has pushed the "reject displayed patrol speed" button (which sets a patrol speed reject flag and records the spectral line number of the spectral line which represents the rejected patrol speed). If the answer is yes, the processing of block 609 is performed to determine if a 5 second timer that was started when the patrolman pushed the reject button has elapsed. If 5 seconds has elapsed, the patrol speed reject flag is cleared as represented by block 611. If 5 seconds has not elapsed, then a special patrol speed processing process is performed represented by block 613 to find a new patrol speed candidate. The process represented by block 613 excludes spectral lines within ±5 spectral lines from the previously tracked patrol speed spectral line number recorded when the patrolman pushed the reject button. Then, a standard search for a new patrol speed candidate is made excluding the 11 rejected spectral lines. The process of block 613 returns a pointer to a spectral line for a new patrol speed candidate. If the branch from 609 to block 611 is taken, the search processing of block 619 is performed to find a new patrol speed candidate. This processing is similar to processing of block 613 except that there is no rejection of the previous patrol speed spectral line and its 5 nearest neighbors on each side. After the new patrol speed candidate spectral line is selected by either the process of block 613 or 619, the processing of block 615 is performed to calculate the true power of the signal return represented by the new patrol speed candidate spectral line using the gain adjustment number that was sent to the preamplifier in the antenna when the samples were generated from which the new patrol speed candidate was selected. After this process is completed, the test of block 617 is performed to determine if a patrol speed has been successfully acquired, i.e., meeting minimum acquisition signal strength criteria. This is done by testing the spectral line pointed to by the routine of either block 613 or 619 to determine if the patrol speed candidate signal has the minimum required signal strength. This minimum required signal strength may be determined experimentally and depends upon the type and polarization of the antenna (because stationary objects react differently in terms of radar crosssection to circular, horizontal or vertical polarization of the transmitted signal) and the power of the transmitter and the conversion efficiency of the receiver section. Since many different options exist for these components that fall within the scope of the claims, no attempt will be made here to recite a minimum acceptable signal power since it can be different for each different embodiment.

If the processing of test 617 indicates a new patrol speed has been successfully acquired, then the processing of block 621 is performed to set the patrol speed tracking flag for purposes of controlling branching by test 601. The processing of block 621 also sets a digital Chebychev bandpass filter with a center frequency centered at the spectral line declared as the new patrol speed and with a 3 db bandwidth wide enough to encompass about ±1.2 spectral lines, then all 2048 real time digital samples are passed through the digital bandpass filter and stores the resulting set of digital samples in a temporary buffer. The resulting set of digital samples defines an approximate sine wave having the frequency of the new patrol speed candidate. The processing of block 621 then calls another routine to measure the frequency of the signal defined by the filter output samples by finding the zero crossings and measuring the time interval between the zero crossings by counting samples and calculating the frequency from this data. Then the patrol speed is calculated from this frequency using the relationship that Doppler shift results in a frequency shift of about 103 Hertz per mile per hour. Then the processing of block 621 updates the patrol speed display with the appropriate speed measure (mph or km/hr).

Next, the processing of block 623 is performed to save the spectral line representing the new patrol speed in case the patrolman rejects the new patrol speed and as an input to the tracking process.

Returning to blocks 605, if the hold mode has been ceased by the patrolman and the transmitter has been turned back on and the processing of block 605 clears the hold flag for a single attempt to track at the previously recorded patrol speed. Likewise, if the test of block 601 indicates that the unit is in track mode, processing vectors to the processing of block 625. The processing of block 625 is patrol speed tracking logic where a tracking window is set up around the spectral line last tracked as the patrol speed and examines the current spectrum resulting from the FFT of samples generated since the transmitter was turned back on and looks for the strongest signal in the tracking window. A true patrol speed signal will be smeared in energy on the low side because of cosine error resulting from an apparent slow down of the object because of the changing geometry of the relationship between the antenna and the stationary object as the patrol car passes it. However, the energy of a true patrol speed signal will fall rapidly to the noise on the high side. Therefore, to help determine if the strongest signal in the tracking window is really a patrol speed return, a signal-to-noise ratio will be calculated for the new candidate for the signal strength at its peak compared to the signal strength of third and fourth higher frequency spectral lines after skipping the first and second higher frequency spectral lines. The third higher spectal line must be at least 6 db down and the fourth spectral line must be at least 9 db down for the signal to accepted as the new patrol speed.

If the selected signal meets these requirements, then the test 627 is performed to determine if the signal true power of the selected signal is high enough to qualify as a patrol speed. The minimum acceptable signal power is lower than the criteria applied for original acquisition in search mode, but must be experimentally determined for the particular embodiment. If the signal power is adequate, then the processing of block 623 is performed as previously discussed and a tracking timer is initialized to begin counting up from a negative number to zero as symbolized by block 629.

If test 627 indicates signal strength is not adequate, then test 631 is performed to determine whether the tracking timer has expired. It will have already expired if the test of 631 is reached from an exit from hold mode. If the test of 631 is reached from the track mode branch out of test 601, the tracking timer may not have expired, and the test 631 will branch appropriately. If it is expired, the process of block 633 is performed to clear the patrol speed tracking flag, and the process of block 635 is performed to blank the patrol speed display (in the preferred embodiment, brackets with nothing between them are displayed by the process of block 635).

Figure 27:
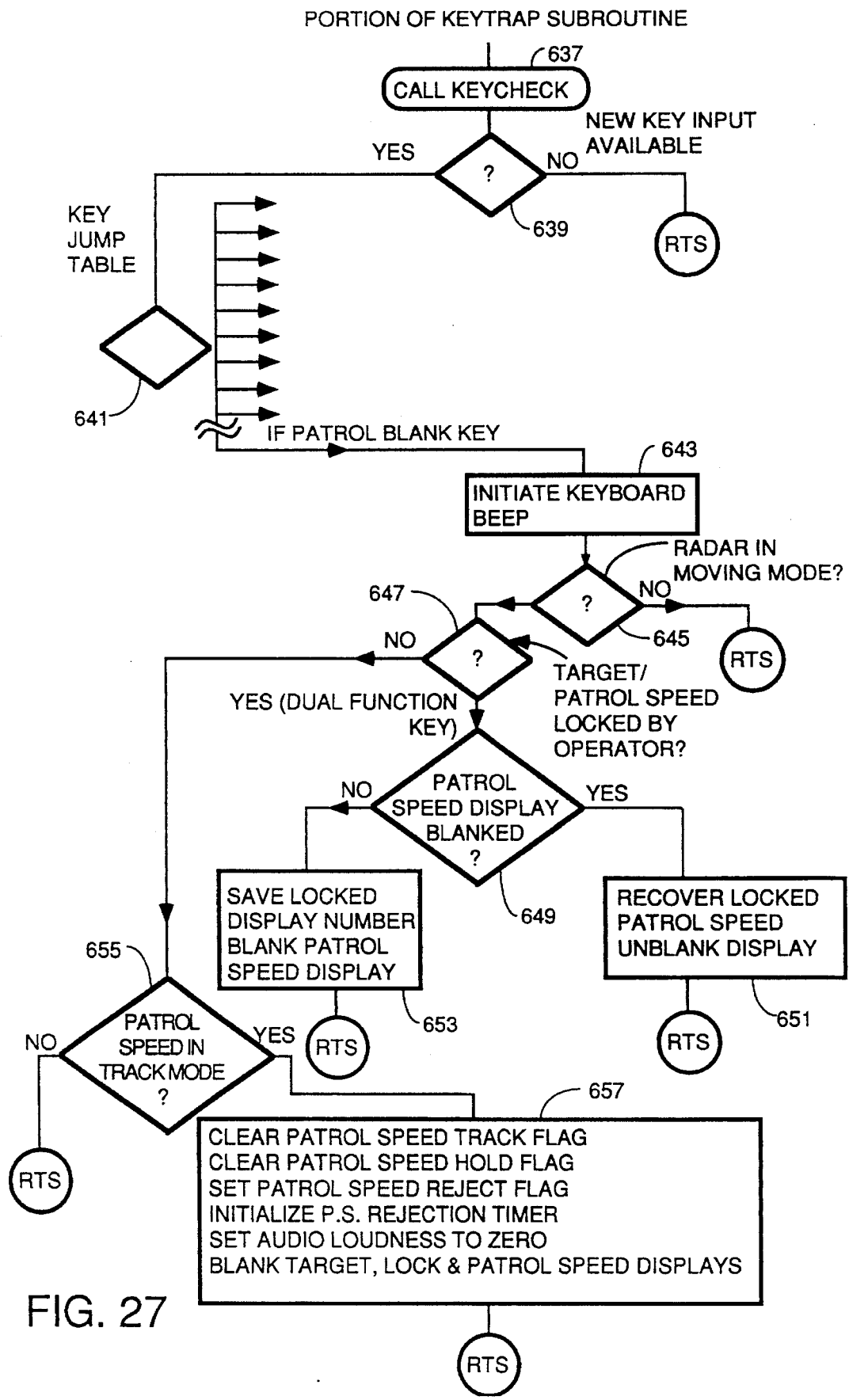
FIG. 27 is a flow chart of the processing to receive user input to reject an incorrect patrol speed display.

To further explain the processing that occurs in carrying out user inputs such as the request to reject an incorrect displayed patrol speed, please refer to FIG. 27. FIG. 27 is a portion of a subroutine that is periodically called from the main loop to process operator key inputs. In the preferred embodiment, the user can enter inputs to the unit from either an infrared remote control or from buttons on the front panel. The buttons on the front panel are hardwired to an infrared controller chip and only bypass the infrared radiation path. The infrared controller chip issues a serial stream of characters that corresponds uniquely to the command received either from the front panel or the infrared controller in RC-5 bi-phase code with a bit interval of 1.68 msec. The interrupt service routine carried out every 100 microseconds by the DSP to sample the state of the HEN input on FIG. 20A1 and 20A2 compresses the bi-phase bit stream by counting the number of sample times between each change of states of the HEN input to build a buffer of data. The KEYCHECK subroutine examines this buffer of data to analyze the pattern of transitions between logic 1 and logic 0 to determine if the intervals between transitions are acceptable and when a valid start of command pattern is received and if a command of some kind has been received. KEYCHECK returns a flag that a key has been pressed. All of that processing is represented by block 637.

Next, test 639 is performed to determine if a new key has been pressed so as to distinguish between commands that are continually issued by the infrared controllers until the key pressed is released by the patrolman. If not, processing returns to the main loop. If so, processing, jumps to the key jump table represented by block 641. The purpose of this table is to determine what action to take for the key that has been pressed. For purposes of this disclosure, the only relevant key command is the patrol blank command which represents the message from the patrolman that the currently displayed patrol speed is an incorrect patrol speed and instructing the unit to not display this speed again and to search for a new candidate for patrol speed. If, after 5 seconds, no new candidate for patrol speed can be found, the unit will re-display the rejected patrol speed.

If the patrol blank command is received, the processing of block 643 to initiate a keyboard beep, then test 645 is performed to determine if the radar is in moving mode. If in moving mode, test 647 is performed to determine if the patrolman has locked the target and patrol speed on the display. The blanking key has a dual function. One function is to reject an incorrect patrol speed, but the other function is to blank the patrol speed if it has been locked so that perpetrator cannot see the patrol speed during the ticketing process. If the target and patrol speed have been locked by the operator, then test 649 determines whether the patrol speed has been blanked. If so, the process of 651 recovers the locked patrol speed and unblanks the display to display it. If the patrol speed has not been blanked, process 653 saves the locked patrol speed number and blanks the patrol speed display.

If test 647 determines that the target and patrol speed have not been locked, test 655 is performed to determine if the unit is in patrol speed tracking mode. If not, processing returns to the main loop. If so, the process of block 657 is performed to clear the patrol speed tracking flag, clear the patrol speed hold flag, set the patrol speed reject flag, initialize the patrol speed rejection timer, set audio loudness to zero and blank the target, lock and patrol speed displays. In the preferred embodiment, three display windows exist on the front panel. The leftmost window displays the target speed. The middle window displays any target speed that the patrolman indicates he or she wants to lock or freeze at some value. The right window displays the current patrol speed or the patrol speed at the time of the lock. When the unit is placed in fastest mode, the lock window is used to display the fastest target speed as long as a target speed has not been locked therein.

Returning to the consideration of FIG. 23A, step 608 saves the spectral bin number and true power of the 5 strongest signals (a signal is defined as a strongest spectral line and its immediately adjacent neighboring spectral lines on either side thereof) found in the first 88 spectral lines from the first FFT results.

Some code that is not relevant to the claimed invention is executed next, and then the test 610 is reached. Test 610 determines if the radar is in moving mode. In moving mode, there will be a patrol speed return that interferes with target speed processing. Therefore, if in moving mode, the processing of block 612 is performed to filter out the patrol speed return by setting up a digital high pass 5th order elliptical filter with a zero set at the frequency of the patrol speed. Then all 2048 samples from the current block being processed are passed through the filter to generate a new block of 2048 filtered samples which are stored in a temporary buffer. Then the processing of block 614 is performed to do 5 overlapping 512 point FFT's on the filtered samples. At the end of each of these 5 overlapping FFTs, the starting address pointer for the next FFT is advanced 384 samples. Each FFT results in 256 spectral powers (sum of the squares of the real and imaginary vectors in each bin). The spectral powers of all 5 FFT's are added together to yield a 256 longword spectral array (48 bits per longword).

If the unit is in stationary mode, the processing of block 616 is performed to calculate 7 overlapping FFT's, each of which overlaps by 256 samples. No high pass filtering is needed, because in stationary mode, no patrol speed return is present to interfere with target processing.

After the processing of blocks 616 or 614 are completed, block 618 calls the subroutine SIGQUAL which functions to perform a prior art routine to locate the strongest signal which meets an acceptance criteria and suppresses target signals which are close to an integer multiple of the patrol speed by processing them at a lower sensitivity. The routine returns a spectral line number and a signal-to-noise flag. The strongest signal is picked on the basis of strongest relative apparent power. The signal-to-noise ratio is calculated by adding the apparent powers of 30 neighboring spectral lines excluding the candidate line and its two immediately adjacent spectral lines. The apparent powers of the 61 neighbors (roughly 32 spectral lines on either side of the candidate line) are added up and then a right shift of 5 places is performed to divide by a factor of 32 to derive a noise value. The noise value result is then compared to the apparent power of the candidate line to calculate the signal-to-ratio and the signal-to-noise ratio is then compared to a criteria to determine if the candidate spectral line can be used as a legitimate target speed. The minimum acceptable signal-to-noise ratio, in the preferred embodiment, is subject to operator input (in the preferred embodiment, the operator can select between 4 sensitivity values). There is a factory setting for maximum sensitivity. The patrolman can reduce this maximum sensitivity in four steps. There is also a local noise maximum criteria which must be satisfied. If there is another strong signal in the vicinity of the candidate strongest signal, no target speed will be displayed if the local noise maximum apparent power exceeds the local maximum noise power criteria. The neighborhood in which this local noise maximum must appear is restricted to a frequency range within ±5 spectral lines on both the high and low frequency sides of the candidate spectral line excluding the candidate spectral line and its two immediately adjacent neighbors. Because there can be ambiguity in the target speed display where there is another strong signal of almost the same signal strength as the candidate signal in the immediate vicinity of the candidate signal, no target speed is displayed in this circumstance to avoid an error in citing the wrong driver.

The sensitivity value selected by the patrolman is used as an index into tables of signal-to-noise ratios and Iocal-noise-maximum-to-signal-maximum power. The apparent power of the target and the sensitivity value are used to pick two entries out of these tables, and the selected entries are compared to the signal-to-noise value and the Iocal-noise-maximum-to-signal-maximum value calculated from the neighborhood of the candidate signal. If the calculated exceed the selected table entries, then the QSNFLAG is cleared indicating the spectral line returned (STRONGLINE) is a valid strongest signal.

The SIGQUAL routine also performs a process of examining apparent targets which have speeds of an integer multiple of the patrol speed to determine if they are real targets. Certain stationary objects like signs that a patrol car passes may cause multiple bounce radar returns that look like targets travelling at an integer multiple of the patrol car speed. Because these returns tend to be momentary, once the candidate strongest target signal has been selected, a special section of code is executed to make sure the strongest target signal is not a "ghost" signal caused by a double bounce from a highly reflective object by determining how long the signal has been present and looking at the patrol speed true power and determining if the patrol speed true power is great enough to cause a double bounce detection. In a moving radar system, a common problem that occurs with high radar sensitivity is called "ghosting" which results in a false target reading the same as patrol speed or in some cases, twice patrol speed. These readings are caused both by intermodulation effects and by actual radar multiple bounces between the patrol vehicle and some highly reflective stationary target. Prior art radars such as the Stalker dealt with this problem by de-sensitizing the radar for target speeds that are multiples of patrol speeds. This has the effect of greatly shortening the range on targets in these speed ranges, sometimes unnecessarily. If the patrol speed signal strength is moderate to weak, distortion harmonics will not be detectable and in the case of multiple bounce signals, the path length on a patrol speed double bounce signal will be twice that of the patrol speed signal, causing the double bounce signal strength to usually be below the normal detection threshold. The target processing for both strongest and fastest target signals in the preferred embodiment has special sections for dealing with targets that may be multiples of patrol speed. A table-driven variable threshold based on patrol speed absolute signal strength (true power) is used to set the detection threshold on targets that are possible multiples, thereby allowing increased range on such targets when the patrol speed signal is not strong.

Next, test 620 determines if the STRONGLINE spectral line number is within ±1 spectral line of the STRONGLINE spectral line returned the last time through this portion of the main loop. If so, then the STRONGLINE spectral line is deemed to designate a valid strongest target signal, and the process of block 622 clears a NEWLINE flag which was set in block 600 indicating that is not a new signal and has been seen at least once before. If STRONGLINE spectral line is not within ±1 spectral line of the STRONGLINE spectral line returned the last time through this portion of the main loop, then the NEWLINE flag is not cleared. Next, the processing of block 624 is performed to save the STRONGLINE spectral line as the OLD STRONGLINE and then the process of block 626 is performed to save the STRONGLINE spectral line number, the NEWLINE flag and the QSNFLAG in a circular history queue and will advance the queue pointer by one. The circular history queue is used to determine if the strongest target speed is decelerating. The reason it is desirable to determine if the strongest target speed is decelerating is because a phenomenon exits which can generate false fastest targets when the strongest target speed is apparently rapidly decreasing and the amplitude of the signal is rapidly decreasing also so as to form a chirp. This happens most frequently when the strongest target passes the patrol car in the opposite lane. Because this car is falling off the beam, just as the car passes the radar, its apparent speed decreases because of cosine effect and the amplitude rapidly falls off because the car is passing out of the radar beam. The FFT spectrum of a chirp signal like this is a peak signal with scallops that looks similar to a sin x/x function. The highest frequency scallop can be mistaken as a false fastest target and must be suppressed. In such a case, no fastest target speed is displayed. The processing to perform this analysis will be discussed below.

Next, an OPLFAST subroutine is called, as symbolized by block 628, to look for faster but weaker target than the strongest target signal for purposes of implementing the "fastest" mode of operation where the fastest target speed is displayed in the lock window. A flow chart for the OPLFAST subroutine is disclosed in FIGS. 24A–24D. Generally, the OPLFAST routine does a top down search for up to 7 potential fastest targets that are stronger than 24 db down from the strongest target signal and then does some special processing on these candidates.

Figure 24A:
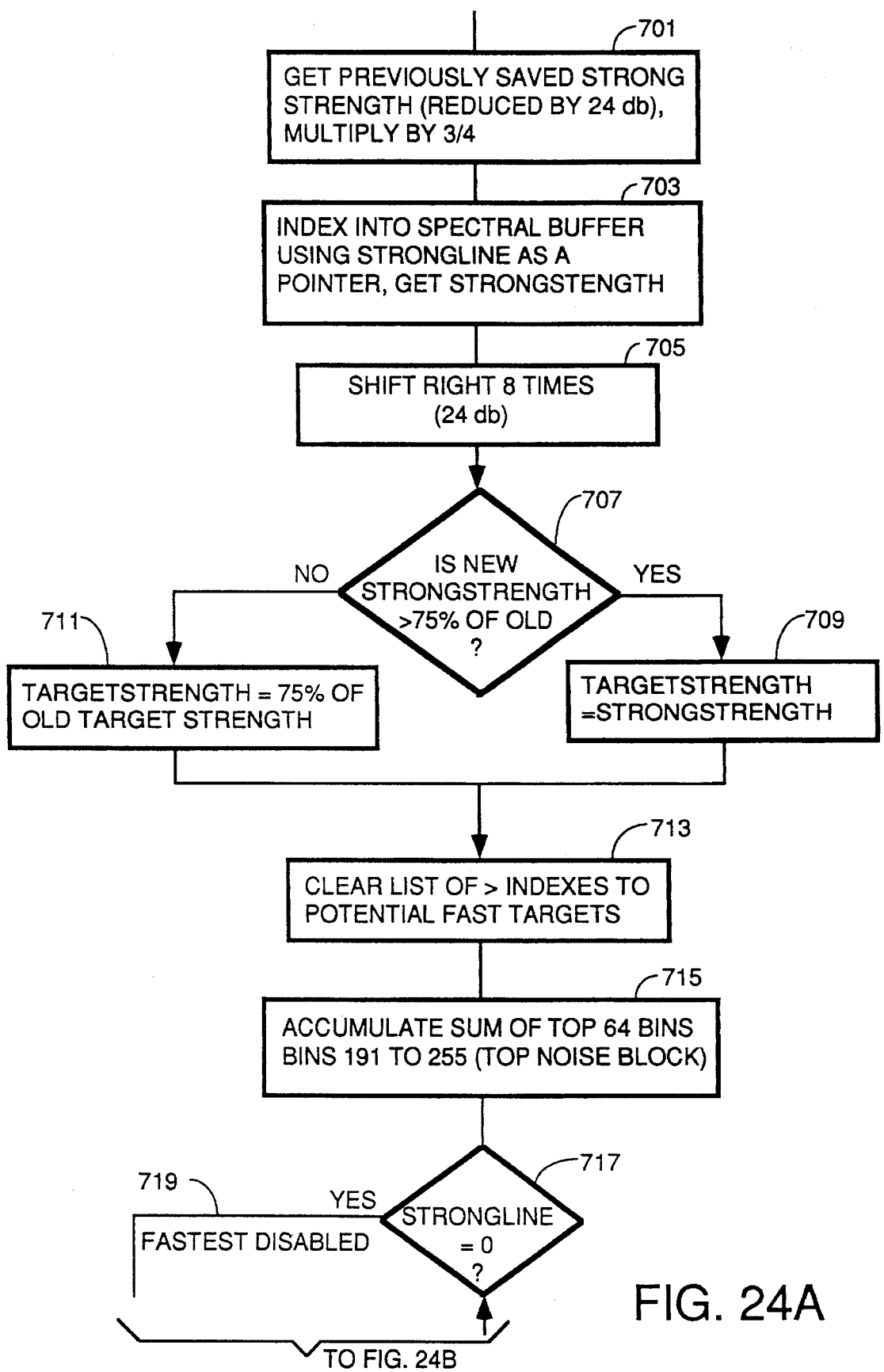
FIGS. 24A–24E are a flow chart of the OPLFAST subroutine which finds the 7 fastest target returns, calculates the target signals strength, local noise power and local signal maximum quantities for each of these signals and stores them in a table.

Referring to FIG. 24A, block 701 retrieves the previously saved true power of the strongest target signal (STRONGLINE), which has been previously reduced in true power by 24 db in the preceding pass through OPLFAST and then multiplies it by 0.75. The reason this is done is to act as an amplitude filter to prevent the amplitude of the saved strongest target signal from dropping more than 75% on each pass because this modified signal strength is used as a qualification criteria for the candidates for fastest target and it is undesirable to allow this signal to momentarily drop out thereby causing false fastest targets to appear. Next, block 703 is performed to retrieve the variable STRONG STRENGTH which is the true power of the current strongest target signal. This is done by using STRONGLINE as an index pointer into a spectral buffer that stores the 48 bit longwords. The retrieved variable STRONGSTRENGTH is reduced by 24 db by a right shift of 8 bit positions in block 705. Then test 707 is performed to determine if the new signal strength (of STRONGSTRENGTH ) is greater than 75% of STRONGSTRENGTH. If it is, then a variable TARGETSTRENGTH is set equal to STRONGSTRENGTH in block 709. If it is not, then TARGETSTRENGTH is reduced by 75% of old TARGETSTRENGTH in block 711.

Next a list of 7 indices in a table of four variables (see FIG. 24E) to make room for 7 new potential fastest targets in block 713. To start the top down search, the apparent powers of the spectral lines in the highest frequency 64 bins in the longword buffer (each longword represents one spectral line or bin) are summed by block 715. The test 717 determines whether a STRONGLINE spectal line has been qualified, because fastest processing will not be carried out without a valid STRONGLINE spectal line identified. If STRONGLINE is equal to zero, the fastest processing of the OPLFAST routine is disable by bypassing it by taking path 719.

Next, test 721 determines if the value of STRONGLINE is greater than 240 which represents a closure speed for the strongest target of about 200 MPH which renders fastest processing academic since somebody faster is unlikely. Next, test 723 is performed to determine if STRONGLINE is less than 190. If so, path 725 is taken to the process of block 727 where a variable BLOCKNOISESUM is set equal to the sum of the apparent powers in the 64 top bins in the longword buffer. Next, block 729 is performed to calculate the number of bins to test for the fastest signal, that number of bins being defined as bin 254 minus the bin of STRONGLINE plus 2. This number will be used as a limit for a do loop. Block 731 then sets a pointer into the spectral buffer of longwords at bin 254 as the fastest possible candidate. Block 733 then set the fastest target count to zero. At this point, a DO loop is entered with the first step being block 735 which retrieves the bin amplitude at the location of the pointer into the spectral buffer initialized in block 731.

Test 737 determines whether the amplitude retrieved by block 735 is greater than the TARGETSTRENGTH amplitude calculated in block 711 or 709. If not, path 739 is taken to a process for decrementing the pointer. If so, path 741 is taken to test 743 which determines if the next bin lower than the pointer has more amplitude than the amplitude of the bin of the pointer. If it does have more power, it is not a valid fastest signal, and path 739 is taken. If it does not have more power, test 745 is performed to determine if the next bin higher has more power than the TARGETSTRENGTH amplitude calculated in block 711 or 709. If it does, then the pointer does not point to a valid fastest signal, and path 739 is taken. If it does have less power, the processes of block 747 are performed to add the spectral line pointed to by the pointer to the list of valid possible fastest target speeds. The energy of the bin at the pointer is summed with the energies of the bin-1 and the bin+1 and that sum is store in the list or table as the fastest target candidate #1 signal strength. Then the spectral line number is also stored in the table as the target index value. Next, the value of variable BLOCKNOISESUM is stored in the table and the target count is incremented.

Next test 751 is performed to determine if the target count is equal to 7. If it is, then path 753 is taken to terminate the do loop. If the target count is not equal to 7, then path 755 is taken to block 757 to decrement the pointer into the spectral buffer. Then test 759 determines if the pointer is less than 190 which is equal to the start of the initial noise block buffer, i.e., the block of bins from which the BLOCKNOISESUM value was computed. If the pointer is below 190, the noise block buffer is slid down by one spectral line. This is done by subtracting the apparent power from the highest numbered bin from the sum of the apparent powers of the 64 bins in the noise block buffer and adding the apparent power of the bin one below the lowest numbered bin in the noise block buffer. That process is symbolized by block 761. If the pointer is equal to or greater than 190, then path 763 is taken to test 765 which determines if all bins have been tested and the do loop is complete. If not, path 767 is taken back to block 735 to continue the do loop at the bin pointed by the decremented pointer.

Figure 24B:
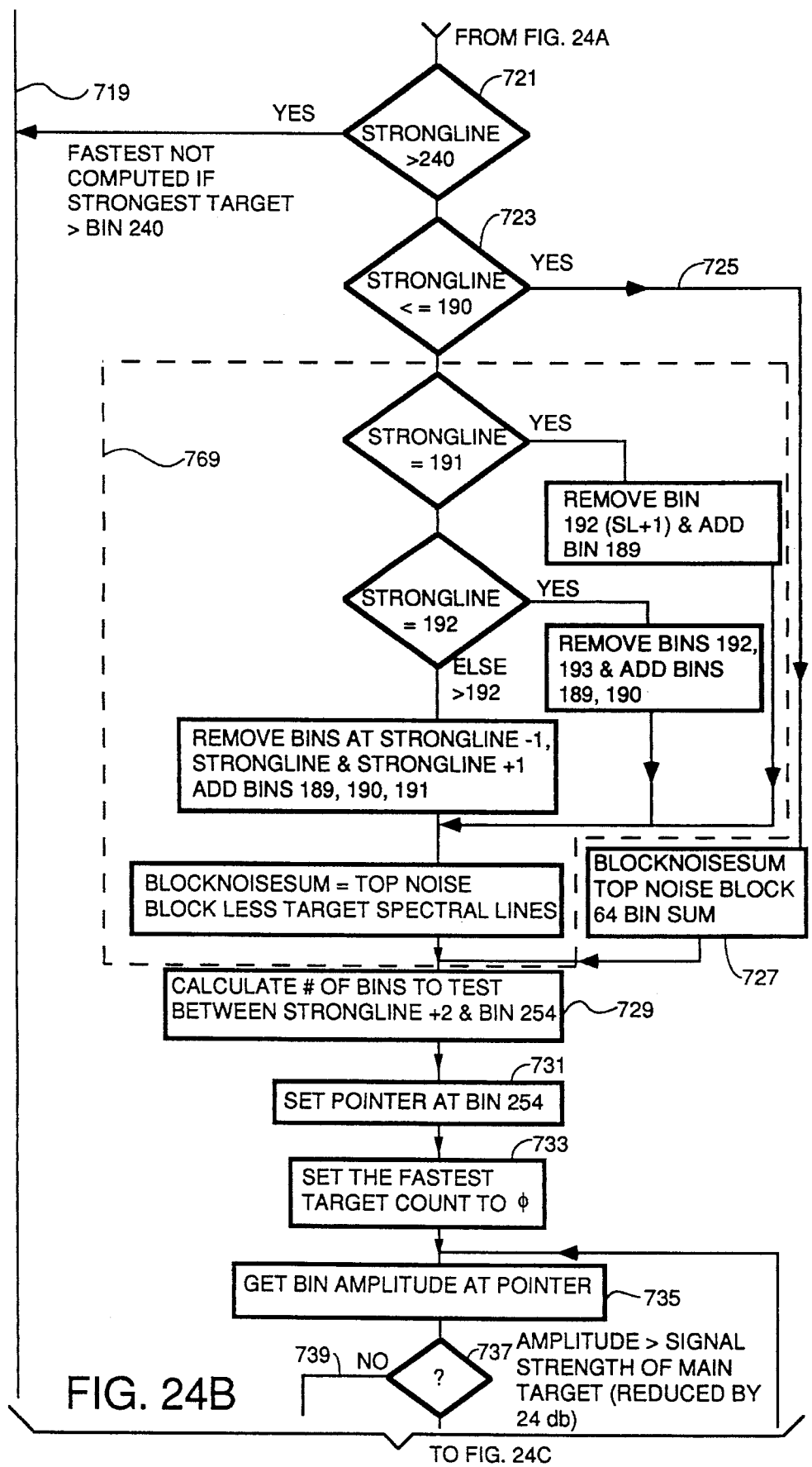
Figure 24C:
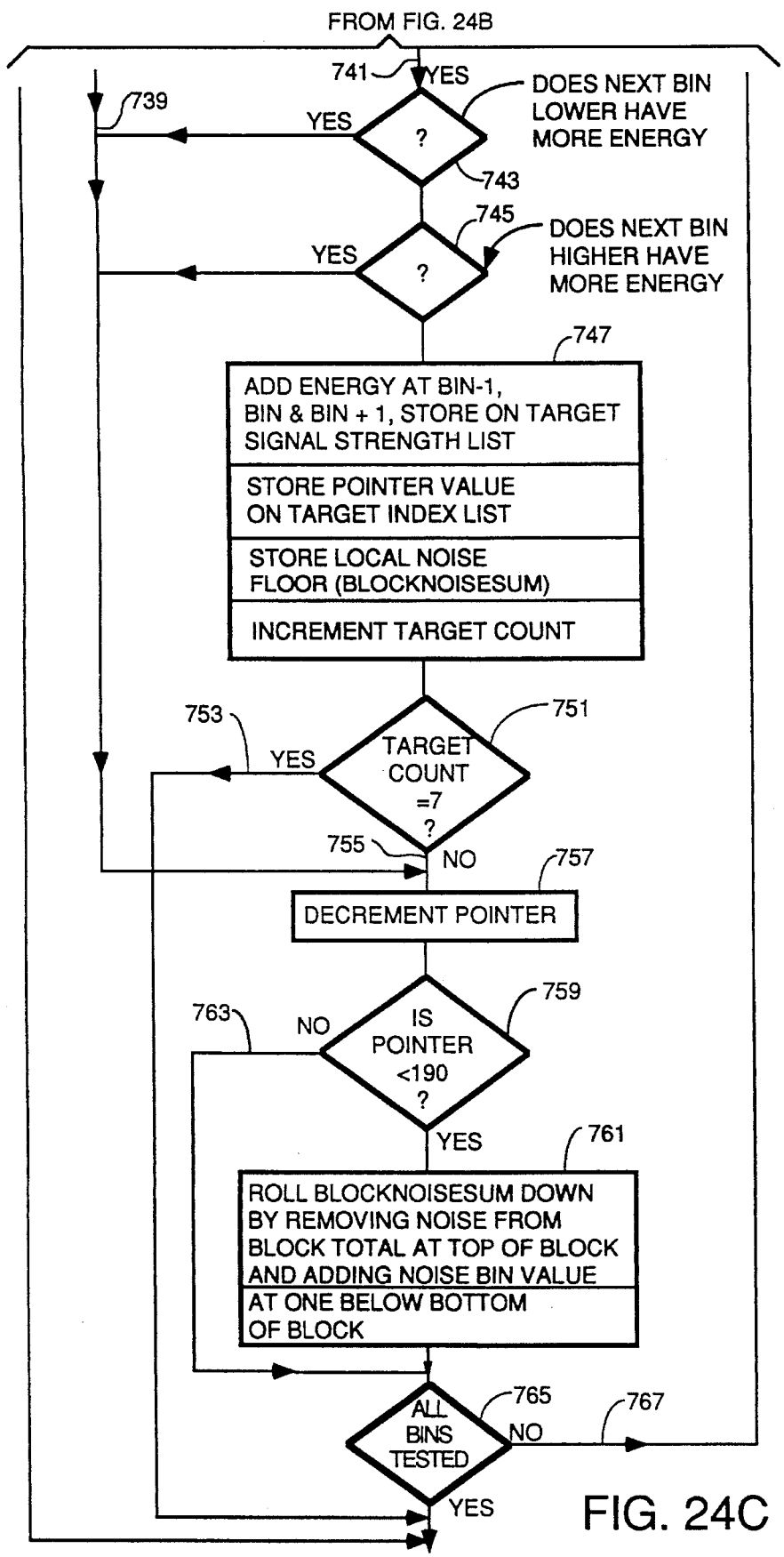
Figure 24D:
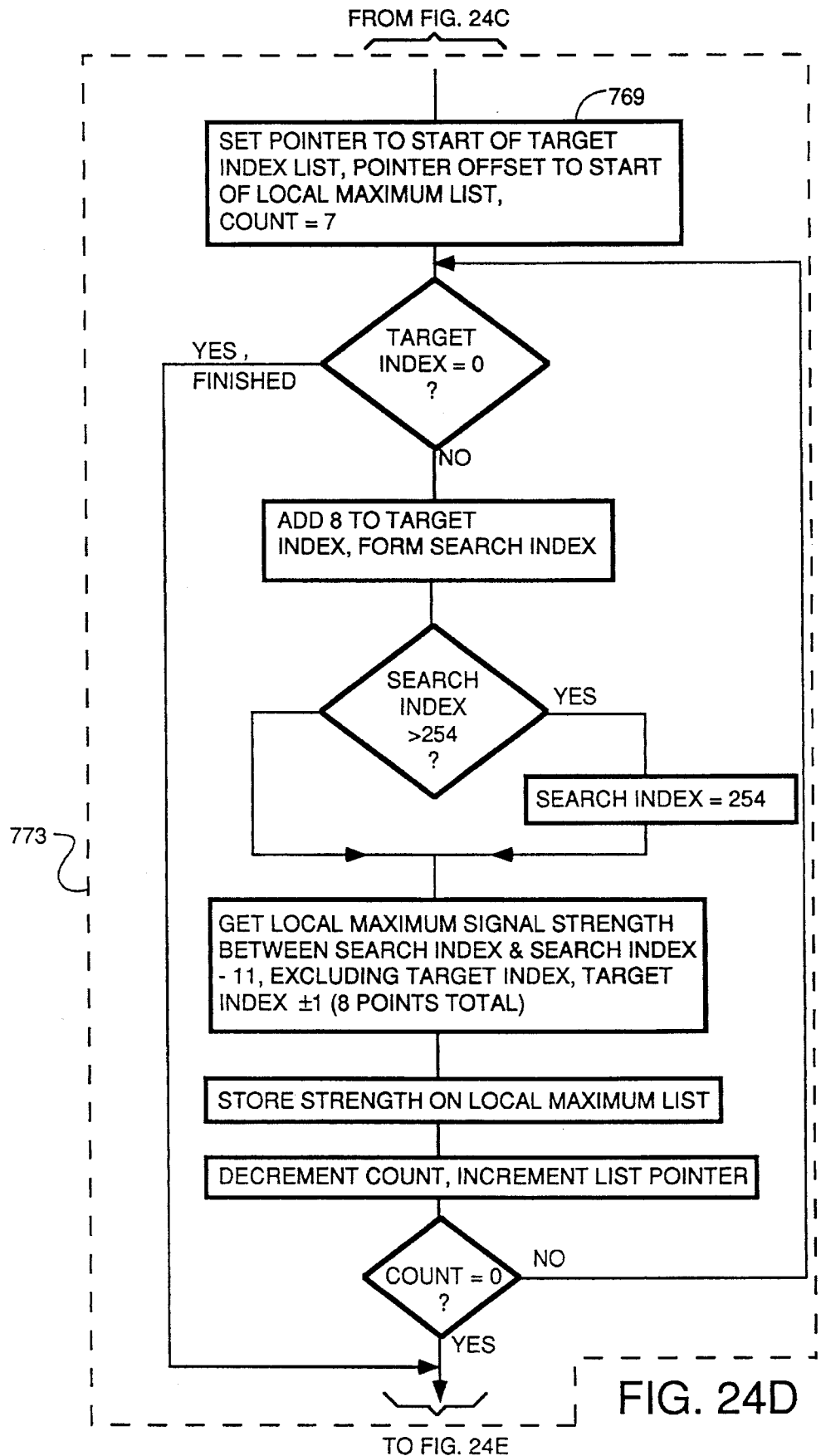

The processing within dashed box 769 on FIG. 24B serves to remove from the sum of variable BLOCKNOISESUM the apparent power of any and all of the three spectral lines of STRONGLINE, and STRONGLINE±1 spectral line which happen to fall within the 64 bin block noise buffer from which the noise power of BLOCKNOISESUM was calculated.

Figure 24E:
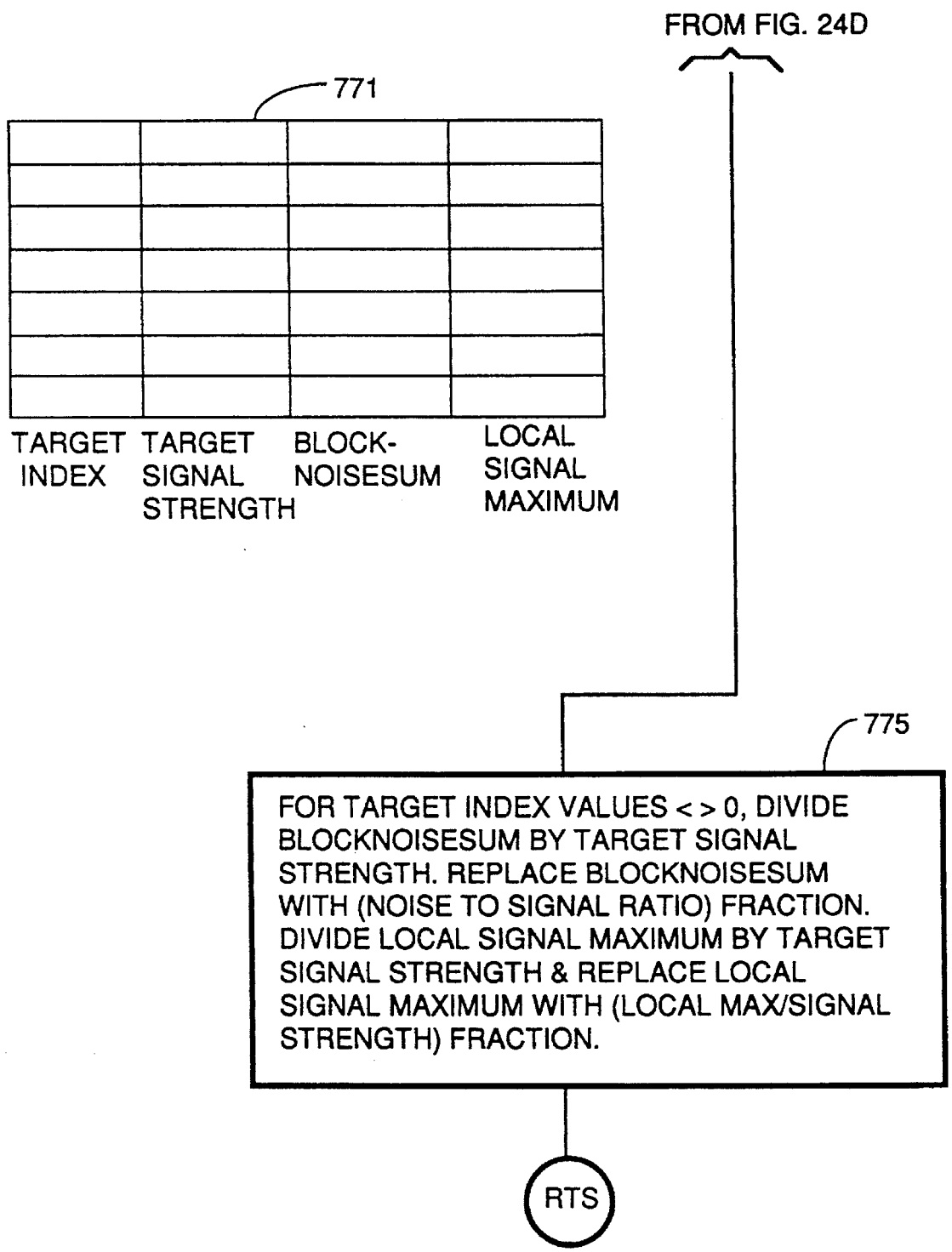

If all the bins have been tested, or if the target count has reached 7 in test 751, then the processing of block 769 is performed to start the process of filling in the table entries on table 771 on FIG. 24E for the local signal maximum entry for each fastest target candidate indexed in that table. At this point, table 771 has entries for TARGET INDEX, TARGET SIGNAL STRENGTH and BLOCKNOISESUM for each of 7 or more possible fastest target candidates. However, it is desirable to locate any weaker target signals in the immediate vicinity of each fastest target signal candidate on the higher frequency side for the purpose of possibly eliminating the adjacent fastest target speed candidate so as to eliminate any ambiguity as to which target is the target which returned the signal which gave rise to the fastest target candidate under scrutiny. The processing within dashed box 773 does this processing for each of the 7 fastest target speed candidates in table 771. Basically, this process gets the strongest signal strength from the 11 bins surrounding but excluding the target index spectral line ±1 with 7 bins on the high frequency side of the three excluded spectral lines of the fastest speed candidate and one bin on the low frequency side thereof. This strongest signal strength is stored as the LOCAL SIGNAL MAXIMUM for that target index in table 771.

Next, the processing of block 775 is performed to modify the entries in table 771. The process involves, for each target index not equal to zero, BLOCKNOISESUM is scaled by dividing by 32 and the result is divided by the associated TARGET SIGNAL STRENGTH. Then the BLOCKNOISESUM variable for each target index is replaced with the ratio (BLOCKNOISESUM/32)/TARGET SIGNAL STRENGTH. Then each LOCAL SIGNAL MAXIMUM for each target index that is not zero is divided by the TARGET SIGNAL STRENGTH, and the resulting ratio is written over the LOCAL SIGNAL MAXIMUM. The OPLFAST routine then returns table 771 to the main loop for further processing. In the preferred embodiment, both these ratios are calculated using the apparent power of the noise signals and the fastest speed candidate signal, but in alternative embodiments, the true power of the noise signals and the true power of the fastest speed candidate signal could be used to calculate these ratios.

Figure 23B:
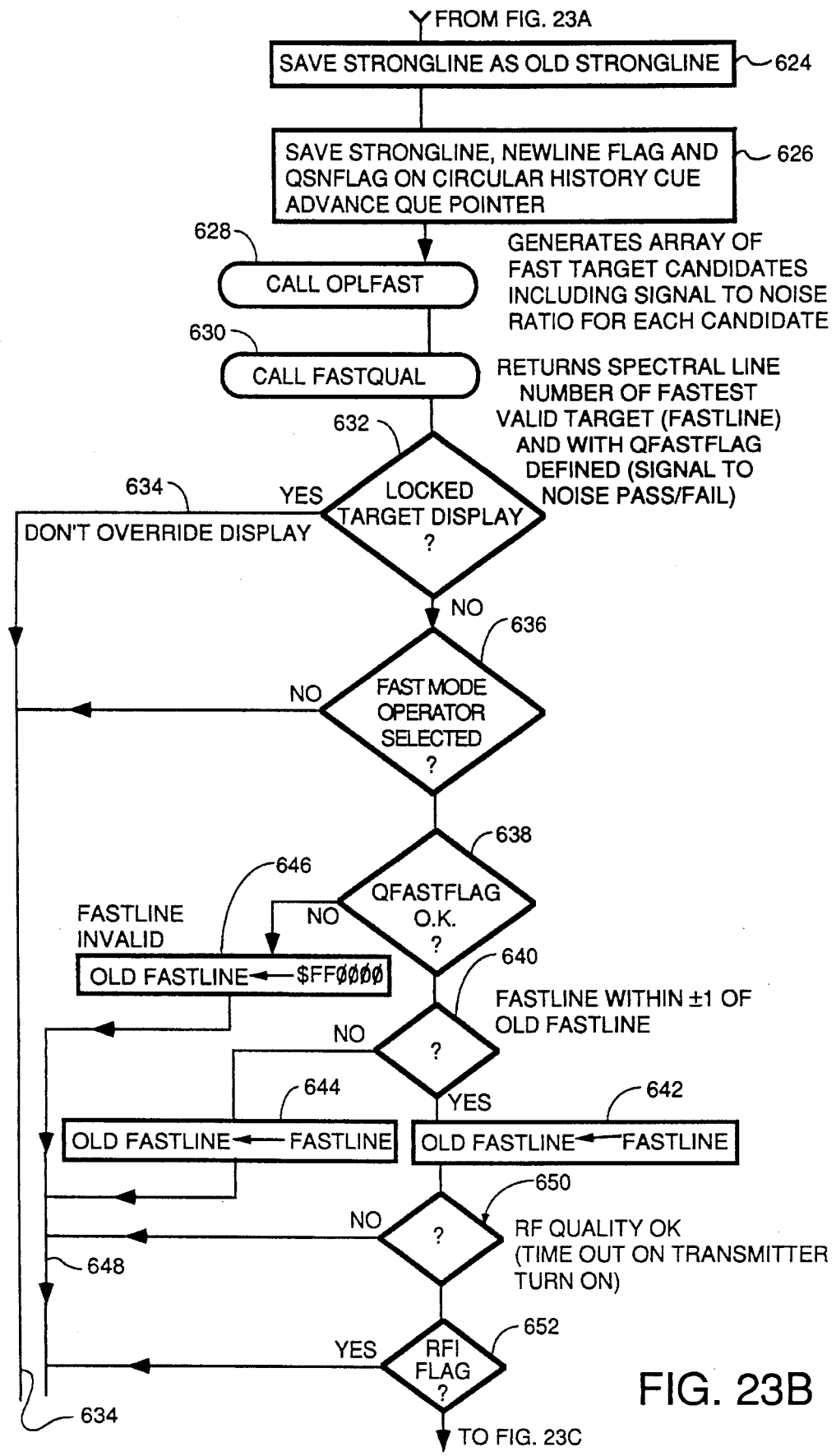
Figure 23C:
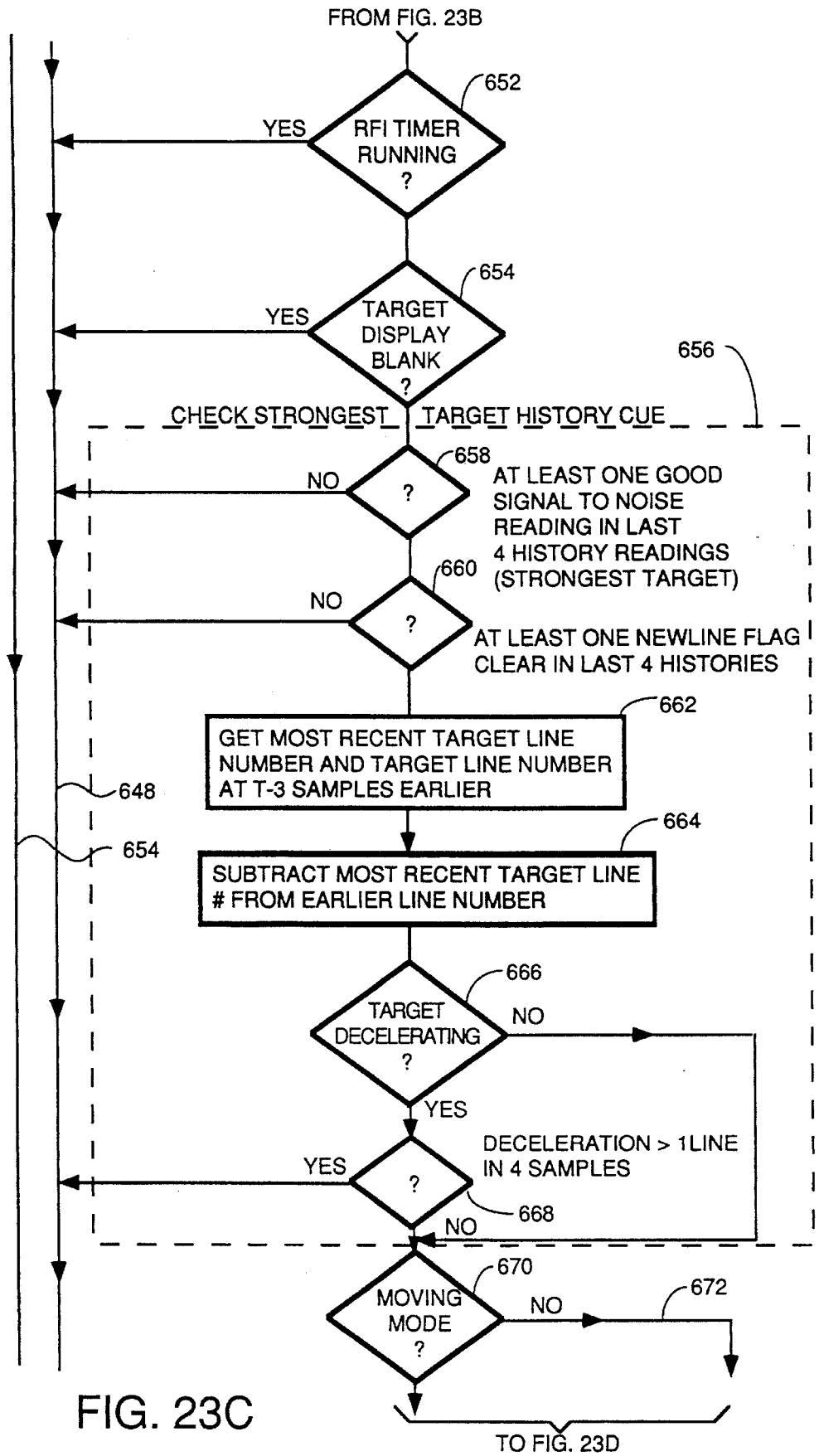
Figure 23D:
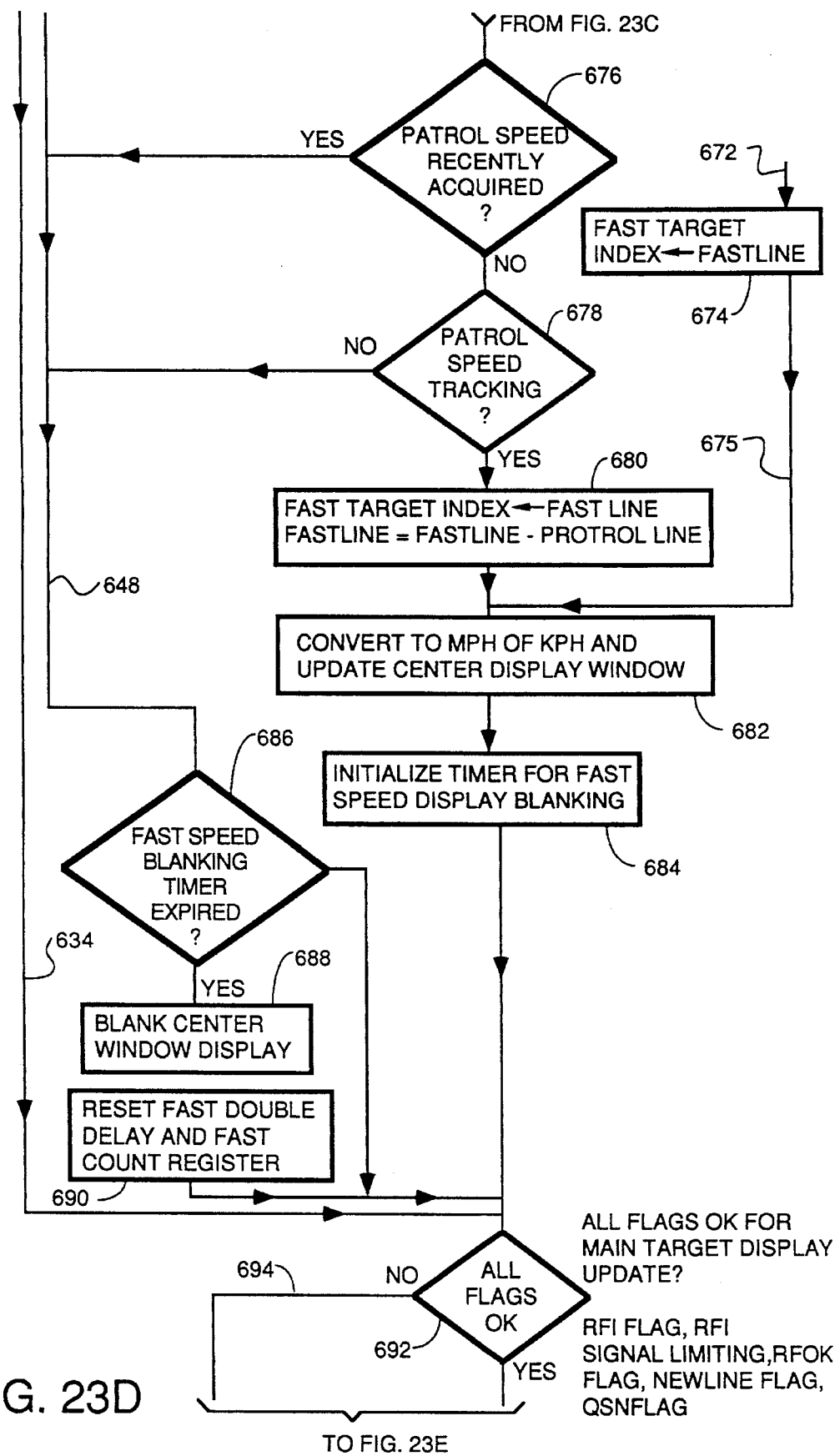
Figure 23E:
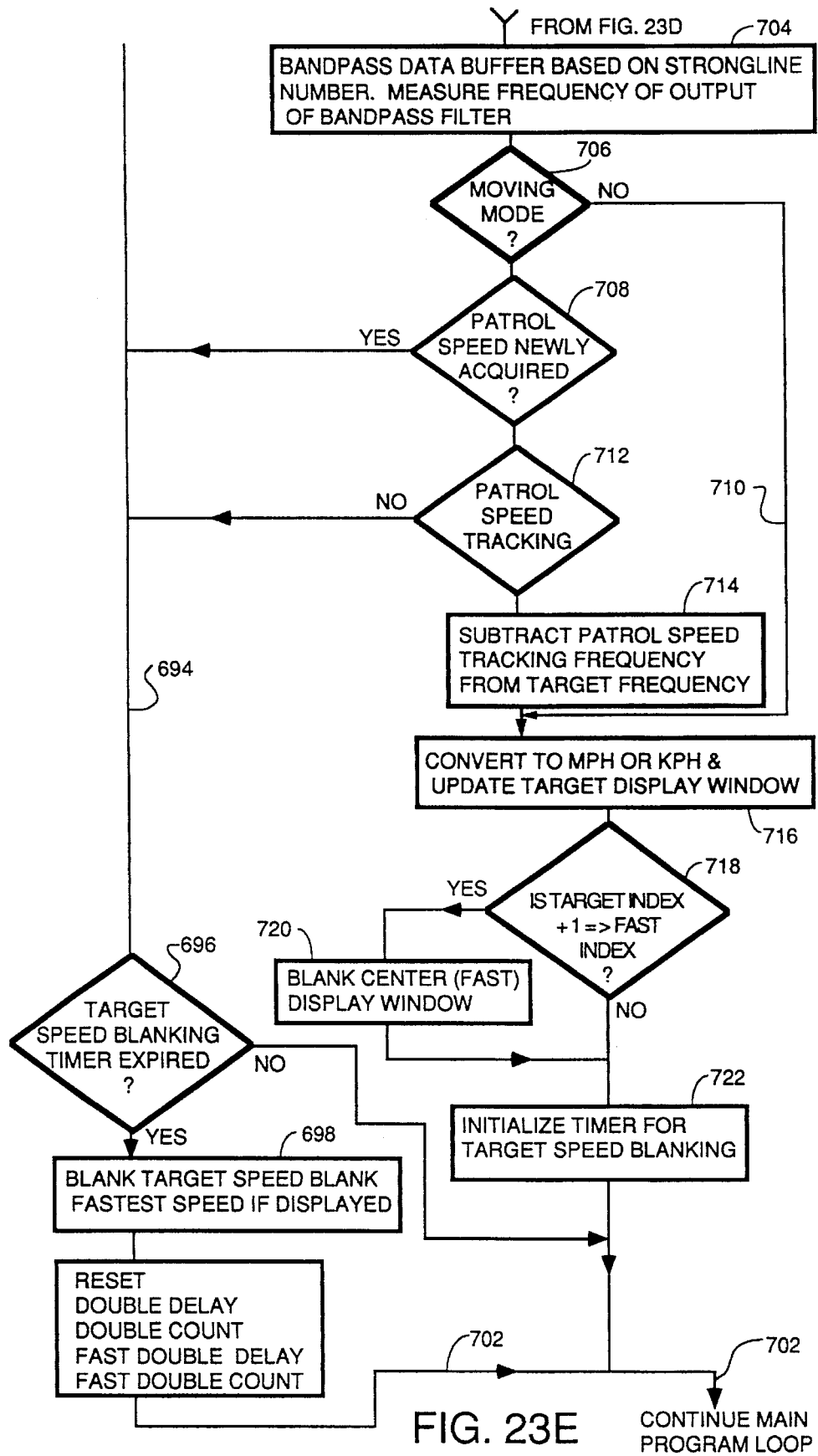

Returning to the consideration of FIG. 23B, the main loop process then calls the subroutine FASTQUAL which serves to screen the up to 7 fastest target candidates in table 771 for anomalies generated by intermodulation products or harmonics of the 5 strongest targets identified by the process of block 608 on FIG. 23A as symbolized by block 630. The subroutine also determines whether the signal-to-noise ratio and local noise maximum of each fastest speed candidate qualify the candidate given the factory setting for maximum sensitivity as modified by user choice for lesser sensitivity, if any. The FASTQUAL subroutine will return FASTLINE and QFASTFLAG variables identifying the first fastest target speed in table 771 that meets all the selection criteria.

Referring to FIG. 29A–29G, there is shown a flowchart of the FASTQUAL subroutine. The first step is symbolized by block 801 where the operator selected sensitivity number is retrieved. The operator selected sensitivity is a number from 0–3 and this is multiplied by a factor of 4. Block 803 adds the factory sensitivity number is added to the result from block 801 to generate a sensitivity index number from 0–12. Then, block 805 determines if the radar is in moving mode. If not, path 807 is taken. If so, test 809 determines if patrol speed is higher than a moving mode desensitization speed. It is undesirable to have a radar that is too sensitive when the patrol car is going slow because of 1/f noise floor characteristics. If the patrol speed is higher than the moving mode desensitization speed, path 811 is taken to block 813 which uses the high speed moving mode signal tables. Those tables contain moving mode noise/signal ratios. If patrol speed is not higher than desensitization speed, block 815 is performed to decrement the sensitivity index to reduce the sensitivity of the radar by one click. Then path 817 is taken joining path 807 to block 819 where the stationary noise/signal ratio tables are used. Out of block 813 and 819, paths are taken to block 821 where a pointer is set to the fastest index target entry generated by the OPLFAST routine and stored in table 771 in FIG. 24E.

Next, the processing of block 823 retrieves two numbers from two different tables. One of these numbers is a noise/ signal maximum ratio retrieved from whatever table was selected by blocks 813 and 819. The number is retrieved from this table using the sensitivity index number created by the processing steps 801–815 as an offset to the desired table entry. The second number retrieved is a local-noise-maximum/signal strength ratio retrieved from a table stored in RAM from a fixed table stored in ROM. The number retrieved from this table is retrieved using the sensitivity index calculated by blocks 801–815 as an offset into the table.

Next, using the two ratios retrieved by block 823, the fastest speed target entry in table 771 is tested against these ratios in a do loop. The do loop checks all fastest speed candidates until one passes the two tests or all valid candidates in table 771 are exhausted. Test 825 compares the noise/signal ratio of the current fastest candidate (the first pass through the do loop examines the fastest speed candidate in table 771) to the maximum noise/signal ratio retrieved from the currently selected table established by blocks 813 and 819. If the current fastest candidate's noise/signal ratio is higher than the maximum indicating a bad signal-to-noise ratio, path 827 is taken to block 829 where the pointer is advanced to the next fastest speed candidate. If the current fastest candidate's noise/signal ratio is lower than the maximum indicating a good signal-to-noise ratio, test 831 compares the local-noise-maximum/signal ratio to the ratio retrieved from the local-noise-maximum/signal ratio table stored in RAM. If the fastest candidate's ratio is greater than the retrieved table entry indicating a bad local noise condition, block 829 is executed to advance the pointer to the next candidate. If less than the retrieved table entry, the current fastest candidates passes both threshold acceptance tests and is selected as the only fastest candidate speed which has a chance of passing further processing to be described below. After the processing of block 829 is done, test 833 determines if all fastest candidates in table 771 have been tested against the two currently retrieved threshold criteria ratios by tests 825 and 831. If not, processing returns to test 825 to test the next fastest candidate. If all fastest candidates have been processed, the subroutine returns to the main processing loop without clearing the QFASTFLAG indicating that no valid fastest candidate exists.

Assuming a fastest candidate has passed the two threshold tests 825 and 831, path 835 is taken to test 837 with the fastest candidate selected by tests 825 and 831 designated as a preliminary fastest candidate. There, a test is performed to determine if a mobile data terminal (MDT) suppression flag has been set. This flag is set by the manufacturer of the radar unit for certain installations where the radar unit is to be mounted in a patrol car in close proximity to a cathode ray tube display used in some police car to show data from the dispatcher. The 15 KHz magnetic field from the sweep coils in the CRT can cause a false target at about 150 MPH closing speed. If this flag has been set, test 837 vectors processing to test 839 where the spectral line number of the preliminary fastest candidate is tested to determine if it falls between upper and lower MDT suppression limits. If so, the preliminary fastest candidate is rejected by returning from the subroutine without clearing the QFASTFLAG. If MDT suppression is not active or the spectral line of the preliminary fastest candidate is not between the MDT limits, test 841 is performed. This test determines whether the spectral line of the preliminary fastest candidate is a double ±1 of the spectral line of the STRONGLINE signal currently being displayed as the strongest target speed. If it is, then the subroutine returns to the main loop without clearing the QFASTFLAG indicating the preliminary fastest candidate has been rejected.

Assuming that the preliminary fastest candidate is not a double, the test 843 determines whether moving mode is active. If not in moving mode, path 847 is taken to test 849 where the spectral line number of the preliminary fastest candidate is compared to 14 to see if the fastest target is moving very slowly (spectral line number less than 14). If so, then the subroutine returns without clearing the QFASTFLAG thereby rejecting the preliminary fastest candidate. If the spectral line of the preliminary fastest candidate is higher than 14, path 851 is taken to block 853 to clear the QFASTFLAG.

If test 843 indicates moving mode is active, then test 845 is performed to determine if the spectral line number of the preliminary fastest candidate is a double of the patrol speed spectral line. The precise mathematical test performed is to determine if the spectral line number of the preliminary fastest candidate is less than the quantity 2 times the patrol speed line number plus 2 and greater than the quantity 2 times the patrol speed line number minus a variable SPREAD. SPREAD is a variable calculated each pass through the patrol speed tracking routine and is a number of spectral lines from 2 to 7 which reflects the spectrum width over time of the returns from stationary objects some of which have cosine errors while the patrol car moves past these objects. If the spectral line number of the preliminary fastest candidate is within the limits tested, then there is a possibility that the preliminary fastest candidate is a double and path 855 is taken to further processing to be described below to determine whether to display it or not. If the spectral line number of the preliminary fastest candidate is not within the limits tested in test 845, then the preliminary fastest candidate is not a patrol speed double, and block 857 is performed. This block clears a fast target double delay timer and clears a fast target double counter. The significance of this step will be explained below.

Next, test 859 is performed to determine if the preliminary fastest candidate is a triple of the patrol speed. This test determines if the spectral line number of the preliminary fastest candidate is greater than the quantity 3 times the spectral line number of the patrol speed less SPREAD and less than the quantity 3 times the spectral line number of the patrol speed plus 3. If the answer is no, then the preliminary fastest candidate is neither a double or a triple of the patrol speed, and path 861 is taken to test 863. This test determines if the patrol speed line number is greater than 15 because the radar is preferably desensitized if the patrol speed is very slow because low patrol speeds usually mean the patrol car is close behind other cars which leads to higher probability of multiple bounce signals creating false fastest targets. Therefore, if a low patrol speed exists, then block 865 is performed which points to the start of the low speed suppression table and sets the pointer offset to zero. The low speed suppression table is really two tables. One table stores noise/signal power ratios for low speeds, and the other table stores patrol speed signal strengths. A noise/signal ratio entry from the low speed suppression table will be used as an additional criteria to test the preliminary fastest candidate in low patrol speed situations. This entry is selected by the processing within dashed box 867 in FIG. 29D. Basically this process is a do loop that retrieves the actual patrol speed true power and then retrieves the lowest power entry from the patrol speed signal strength table and compares these two numbers. If the actual patrol speed true power exceeds the table entry, the table offset is incremented, and the next higher power table entry is retrieved and compared to the actual patrol speed true power. If the actual patrol speed true power is still higher than the table entry, then the do loop continues the process of incrementing the offset and retrieving a new higher power table entry until a table entry is found which exceeds the actual patrol speed true power. This particular do loop processing is used at several places within the subroutine to generate a number that is a function of the actual patrol speed true power.

When this entry is found by the process of block 867, the processing of block 869 is performed to use the table offset that was used to find the table entry of signal power that exceeds the actual patrol speed true power as an offset into the table of noise/signal ratios for low speeds. The entry at that offset value is used by the processing of test 869 to determine if the noise/signal power ratio of the preliminary fastest speed candidate is less than the entry retrieved from the table of noise/signal ratios for low speeds. If it is less, then the preliminary fastest speed candidate passes this test, and path 871 is taken to processing that imposes additional tests. Path 871 is also taken out of test 863 if the patrol speed spectral line number is greater than 15 indicating low patrol speed qualification of the preliminary fastest speed candidate is not necessary. If the noise/signal power ratio of the preliminary fastest speed candidate is greater than the entry retrieved from the table of noise/signal ratios for low speeds, then it is not a valid fastest speed and the subroutine returns without clearing the QFASTFLAG.

At this point, if processing is on path 871, it has been established that the preliminary fastest speed candidate is not a double or a triple of the patrol speed and, if the patrol speed spectral line is less than 15, the preliminary fastest speed candidate has passed an additional signal-to-noise requirement. Path 871 vectors processing to block 873 which is the start of a screening process to filter out the preliminary fastest speed candidate if it is likely to be an intermodulation product or a harmonic of one of the five strongest signals detected and recorded in strong signal table back at step 608 in the fast target processing section of the main loop the start of which is depicted on FIG. 23A. The five strong signals determined in step 608 were recorded in a strong signal table in decreasing order of power. Basically, if a strong signal recorded in the strong signal table does not have a true power which exceeds a first threshold, it will not have generated any detectable harmonic distortion. Likewise, if the signal does not have a true power which exceeds a second lower threshold, then it will not have generated any detectable intermodulation products. Intermodulation products are the sum and difference frequencies of strong received signals or a strong received signal and the transmit signal.

Figure 29A:
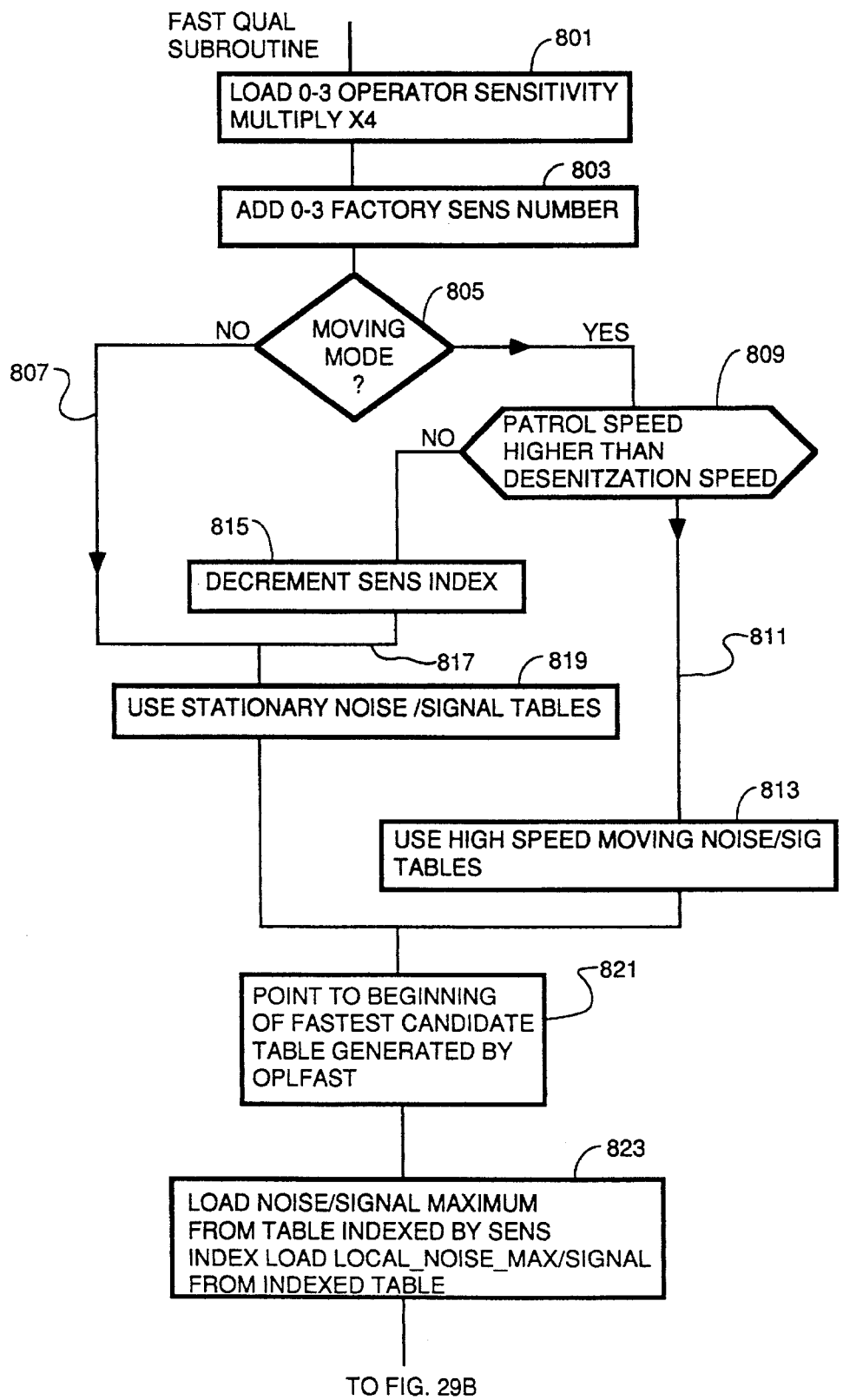
FIGS. 29A–29G illustrate the processing to qualify the fastest target signal for possible display.
Figure 29B:
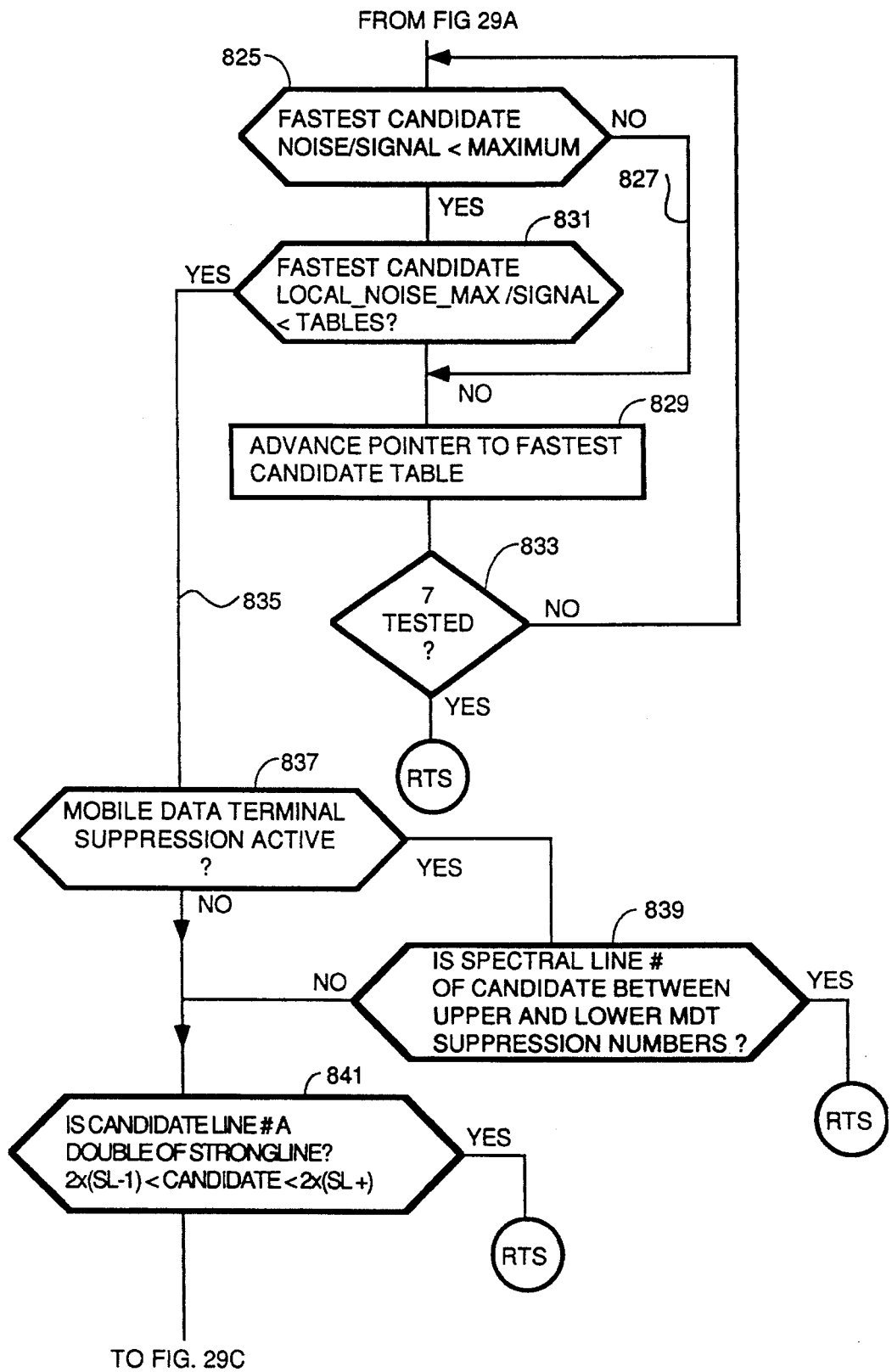
Figure 29C:
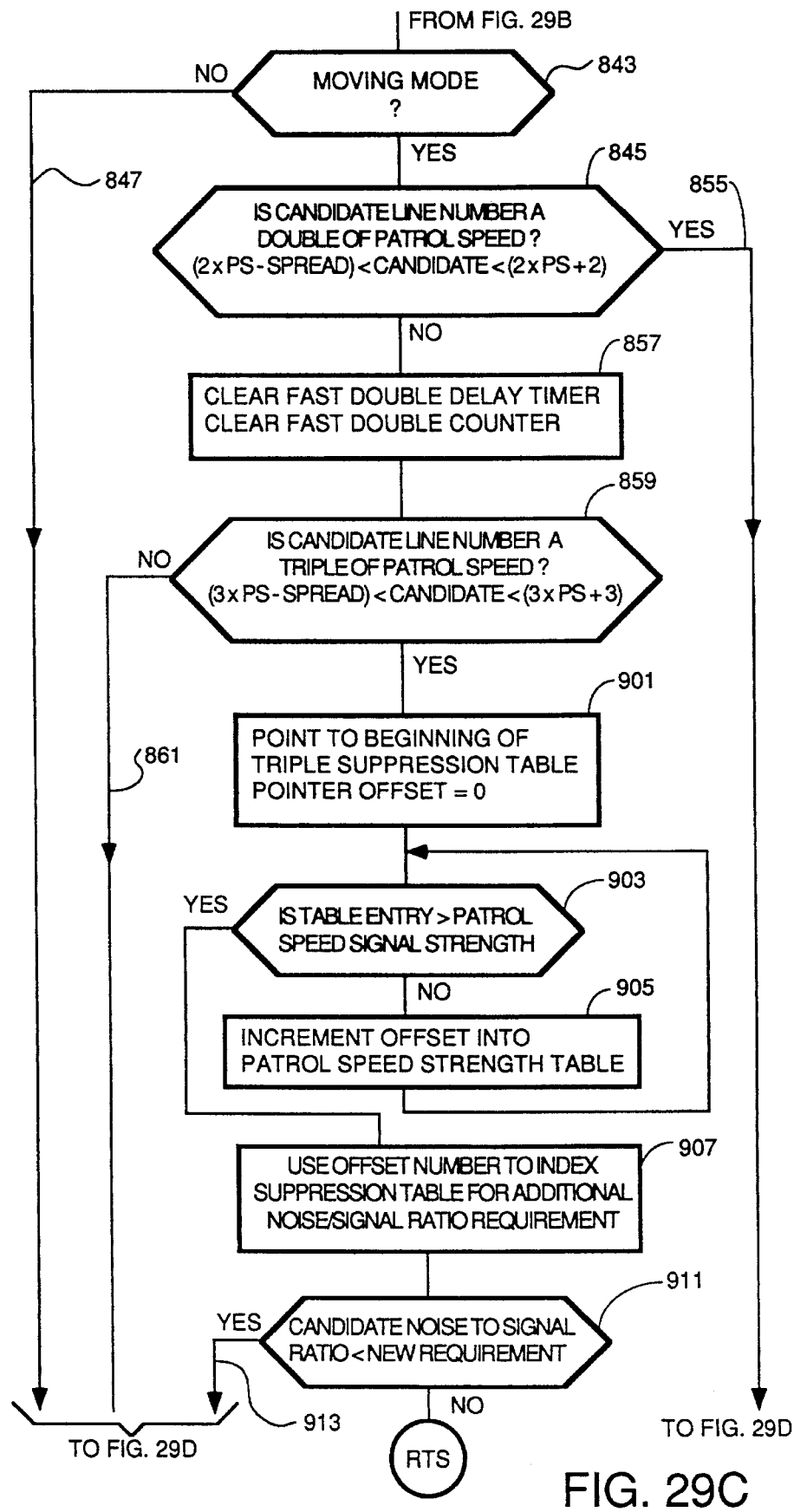
Figure 29D:
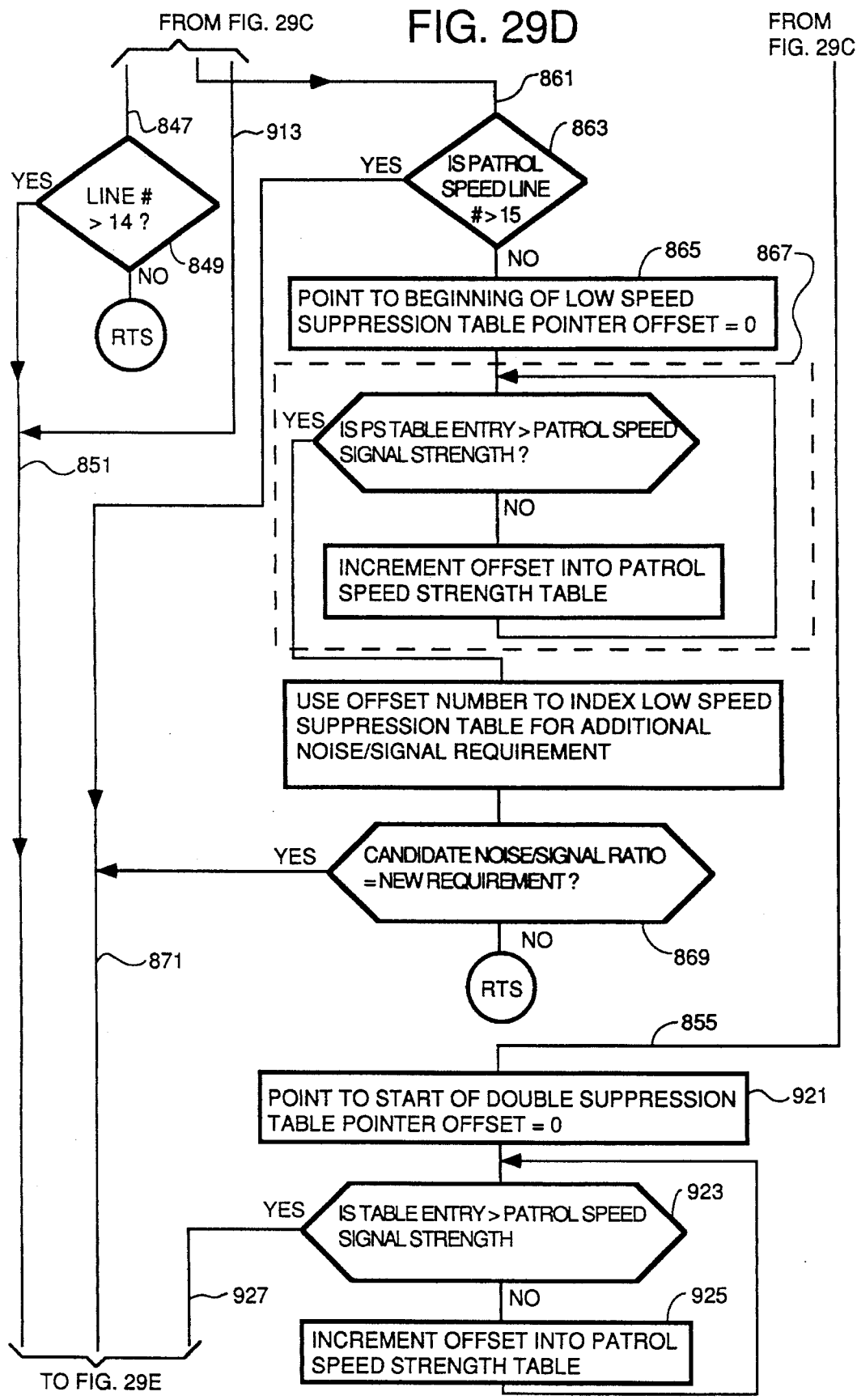
Figure 29E:
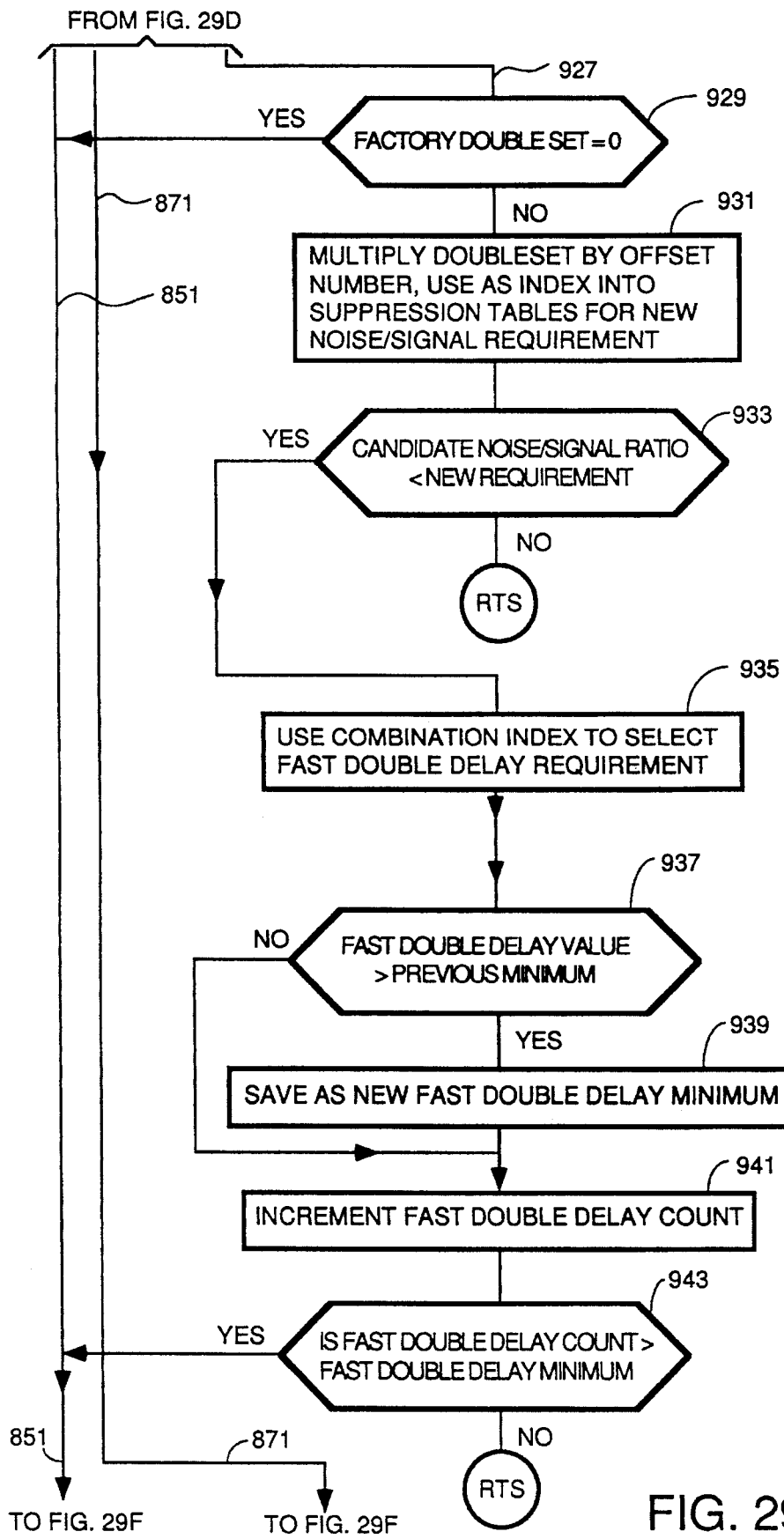
Figure 29F:
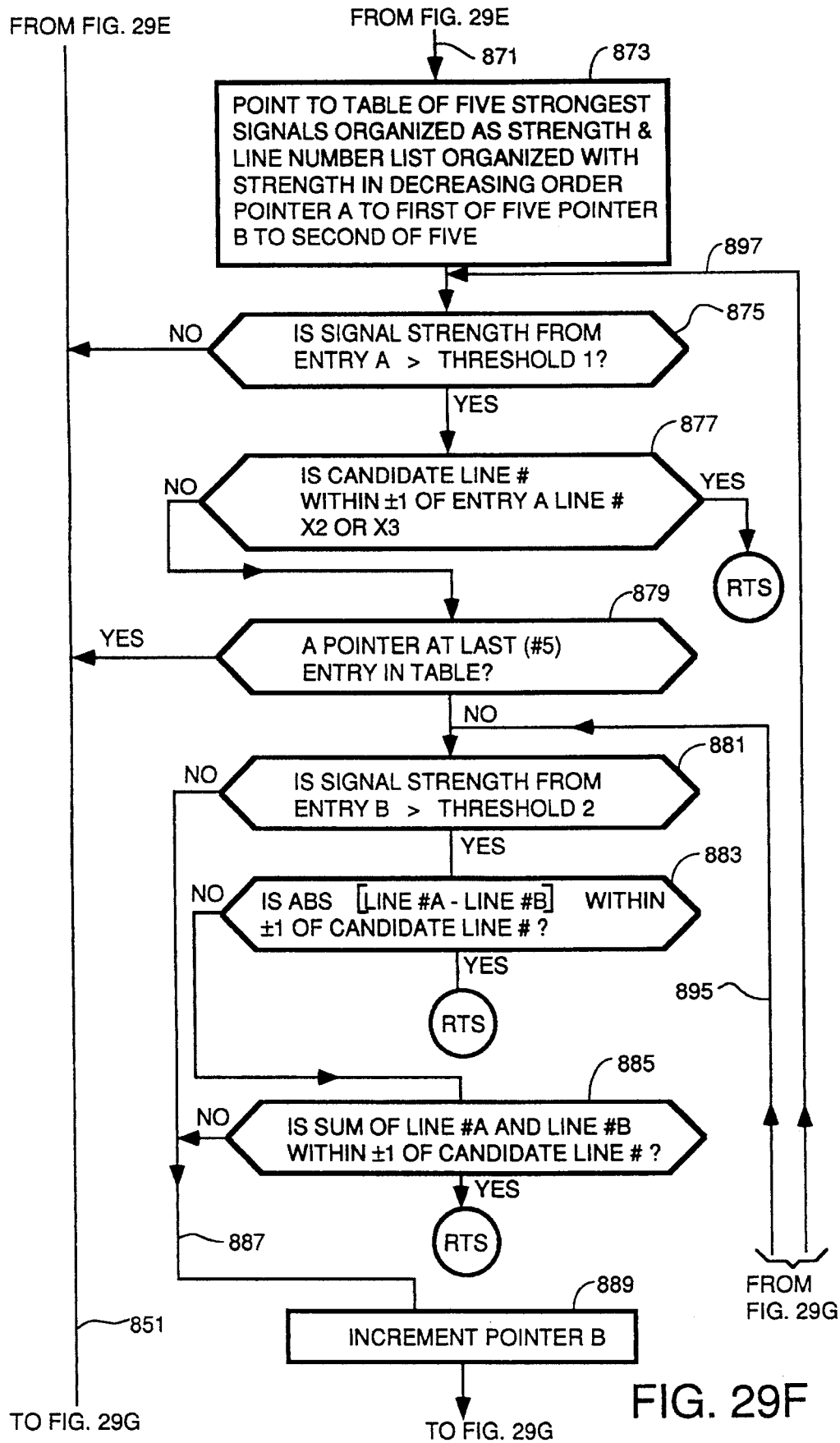
Figure 29G:
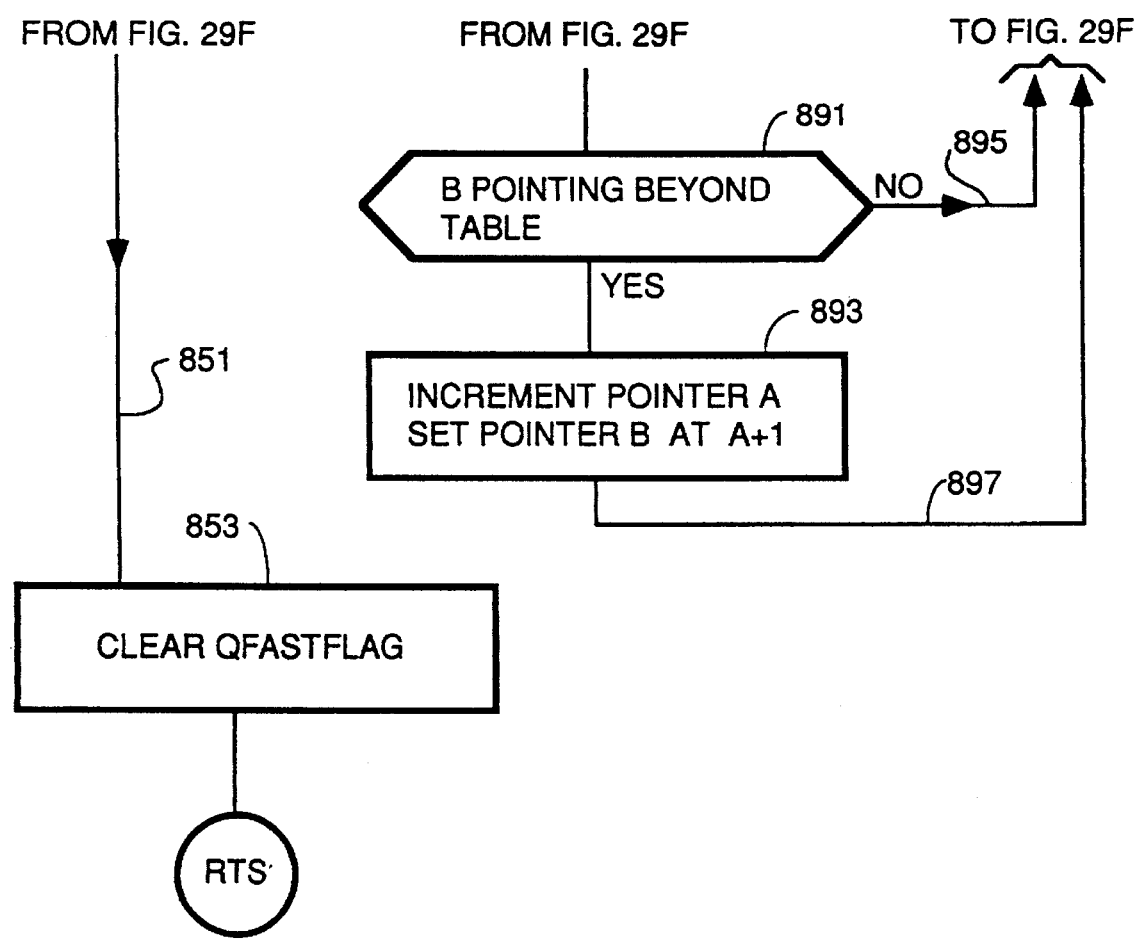

Block 873 on FIG. 29F starts this processing by setting up two pointers in the strong signal table. Pointer A points to the strongest signal and pointer B points to the second strongest signal of the 5 strong signals recorded. Next, test 875 is performed to determine if the true power of the signal pointed to by pointer A is greater than threshold 1, the harmonic threshold. If not, then path 851 is taken to block 853 which clears the QFASTFLAG indicating that the preliminary fastest target speed has passed all criteria and is cleared for display. No further processing is necessary because all other strong signals are weaker than the strong signal pointed to by pointer A and will not have had the power to generate harmonics or intermodulation products (because threshold 2, the intermodulation threshold is lower and for intermodulation to have existed, both thresholds have to have been exceeded).

Returning to test 875, if the signal power of the strong signal pointed to by pointer A is greater than threshold 1, then test 877 is performed to determine if the spectral line number of the preliminary fastest target signal is within ±1 of either two times or three times the spectral line number of the strong signal pointed to by pointer A. If so, then the preliminary fastest target signal is not valid, and the subroutine returns to the main loop without clearing the QFASTFLAG. If not, then test 879 determines if the strong signal pointed to by pointer A is the last entry in the strong signal table. If so, the subroutine takes path 851 to block 853 to clear the QFASTFLAG indicating a valid fastest signal has been found. If not, then test 881 determines if the signal strength of the strong signal pointed to pointer B is greater than threshold 2. If yes, then potential intermodulation is present, and test 883 is made. This test determines if the absolute value of the difference in spectral line numbers between the signals pointed to by pointers A and B is within ±1 spectral line of the spectral line number of the preliminary fastest candidate. If that is the case, the preliminary fastest speed signal is deemed to be an intermodulation product and is rejected by returning to the main loop without clearing the QFASTFLAG. If that is not the case, then test 885 is performed to determine if the sum of the spectral line numbers of the strong signals pointed to by pointers A and B is within ±1 spectral line of the spectral line number of the preliminary fastest candidate. If that is the case, the preliminary fastest speed signal is deemed to be an intermodulation product and is rejected by returning to the main loop without clearing the QFASTFLAG. If not the case, then path 887 is taken to block 889 to increment pointer B. Path 887 is also taken out of test 881 if the signal strength of the signal pointed by the then current pointer B is not greater than threshold 2 indicating that there is not likely to be an intermodulation problem.

After block 889 is performed, test 891 determines if pointer B points beyond the end of the 5 entry strong signal table. If it is, pointer A is incremented in block 893 and pointer B is set at pointer A ±1 and path 897 is taken to test 875 to determine if the signal strength of the new strong signal pointed to by pointer A is greater than threshold 1 as previously discussed. If B is not pointing beyond the end of the table, path 895 is taken to re-enter block 881 to start the intermodulation product screen process on a new set of combinations. The intermodulation product screening process essentially tests the spectral line number of the preliminary fastest speed candidate to determine if it is either the sum or difference of all combinations of the spectral line numbers of strong signals in the strong signal table which have signal powers for the signal pointed to by pointer A that exceed threshold 1 and signal powers for the signal pointed to by pointer B which exceed threshold 2. Therefore, the do loop to move the pointers A and B will set the pointer A at a signal and, if the signal pointed by the new position for pointer A has a signal power which exceeds threshold 1, then moves the pointer B to all signals that have signal powers that exceed threshold 2 and continues until the preliminary fastest candidate spectral line number has been checked for an intermodulation relationship against the combination of all signals in the table with powers that exceed threshold 2 against the signal pointed to by pointer A.

Referring again to test 859 on FIG. 29C, if the preliminary fastest candidate's spectral line number is a triple of the patrol speed line number, some suppression is necessary based upon strong patrol speed signal strength. If patrol speed true signal power is weak, very little suppression is needed as the preliminary fastest candidate signal may be a real target. To that end, a process similar to the process within dashed box 867 is performed by steps 901 through 905 to return a noise/signal ratio. This process uses the same patrol speed true signal power table as the process 867 used, but uses a different table filled with suppression factors for triples (hereafter called the triple suppression table). These suppression factors are noise/signal power ratios. When an entry in the patrol speed true signal power table is found which exceeds, the true power of the patrol speed signal, the offset of this entry is used as an offset into the triple suppression table to retrieve a triple suppression factor. The process of using the offset to retrieve the triple suppression factor from the triple suppression table is carried out by block 907. This triple suppression factor is used by test 911 to screen the preliminary fastest candidate by determining if the true noise/signal power ratio of the preliminary fastest candidate is less than the retrieved triple suppression factor. If so, then the preliminary fastest candidate is good, and path 913 joining path 851 to block 853 is taken where the QFASTFLAG is cleared and the subroutine returns to the main loop. If not, then the preliminary fastest candidate is no good, and the subroutine returns to the main loop without clearing the QFASTFLAG.

The preliminary fastest candidate must also be tested to determine if it is a double of the patrol speed. Real targets often travel at about the same speed as the patrol car so the closing speed in moving mode would appear to be a false double signal when it is in reality a valid target. About 20 db suppression of false doubles is achieved by the double balanced mixer, but further suppression in the software is desirable since the second harmonic of the patrol speed is often quite a strong signal if the patrol speed itself is a strong signal. To avoid suppression of preliminary fastest targets which are travelling at about the same speed as the patrol car in the opposite lane and represent valid targets while suppressing false doubles, the software goes through some screening of the preliminary fastest candidate which is based upon both the true signal power of the patrol speed signal and the fact that false target doubles are usually transitory in nature and will disappear after 1-3 seconds. Therefore, double suppression factors are selected based upon the true signal power of the patrol speed and, in addition, upon a setting recorded by the manufacturer in final road testing of each unit that points to one of a plurality of double noise/signal power ratio suppression factors and double delay factors that are selected based upon the actual test performance of a particular unit in the road test. Generally, if the patrol speed true signal power is not high, a not severe double suppression factor will be selected and a short double delay factor will allow the candidate to be displayed almost immediately. If, on the other hand, the true patrol speed signal power is high, a more severe double noise/signal power ratio suppression factor and a longer double delay factor will be selected to prevent display of a fastest candidate until it persists for an interval longer than the double delay factor. The details of this processing follow.

Returning to the consideration of test 845, if the preliminary fastest candidate is a double of patrol speed, path 855 is taken to block 921 on FIG. 29D which starts a process similar to the process of block 867 to generate an offset into a double suppression factor table based upon the true signal power of the patrol speed signal. This offset generation process is done by steps 921–925. Once the offset into the double suppression table is generated, path 927 is taken out of test 923 to test 929. Test 929 determines if the manufacturer set variable DOUBLESET is zero. DOUBLESET is the variable set permanently by the manufacturer during the final road test to take into account the peculiarities of the particular radar unit's performance and is not normally set to zero. If DOUBLESET is zero, path 851 is taken to block 853 where the QFASTFLAG is cleared and processing returns to the main loop. DOUBLESET is set to zero to test whether the radar unit under test measures up to a good radar unit that will not generate a false double under known test conditions thereby giving the manufacturer a way to make an initial evaluation of the quality of the particular unit. DOUBLESET is normally a number from 0–5. If DOUBLESET is not zero, then block 931 is performed multiply DOUBLESET by the offset number selected earlier by steps 921 through 925 based upon the true signal power of the patrol speed signal. This generates a new index number which indexes into one of 5 different stacked double suppression factor tables, each of which contains a different set of double suppression noise/signal power ratios of increasing severity. The offset is selected based upon the true signal power of the patrol speed, but the DOUBLESET variable will determine which of the 5 tables is entered by the index. The 5 stacked tables each have multiple suppression factors of increasing severity, but the beginning factor of the second table up in the stack is less severe than the last suppression factor of the first table and so on for each of the 5 tables. If the offset is, for example, 5, and the DOUBLESET variable is 1, then the first table in the stack will be entered at the 5th entry. If DOUBLESET is 2, and the offset is 5, the 2nd table will be entered at the 5th entry thereof. The same sort of scheme is used to select a double delay factor. The double delay factors are also stored in 5 stacked tables with entries therein which range from delays of from 80 milliseconds up to 20 seconds. A delay of 20 seconds means that at any normal speed, the target is past the patrol car before the fastest target speed is allowed to be displayed. This type delay would be imposed only for very strong patrol speed signals.

Then test 933 is performed to determine if the noise/signal power ratio of the preliminary fastest candidate is less than the double suppression noise/signal power ratio retrieved from the stacked double suppression table accessed by the current values of the offset and the DOUBLESET variable. If not, the subroutine returns without clearing the QFASTFLAG. If so, block 935 selects a double delay interval from the stacked double delay tables using the same combination offset derived from the DOUBLESET variable. Then test 937 determines whether the retrieved delay value is greater than the previously retrieved delay value. If it is, then the newly retrieved greater delay interval is used and saved in block 939. If not, then the previously retrieved delay value continues to be used and the processing of block 941 is performed to increment the fast target double delay counter. This processing takes into account the fact that stationary objects in the distance that are causing double bounce signals may cause stronger double bounce signals as the patrol car approaches them. The stronger signals require greater delays until the geometry of the situation causes the strength of the double bounce signal strength to fall off. After the processing of block 939 is performed, block 941 is performed to increment a fast target double delay counter. Then test 943 is made to determine if the incremented count is greater than the current double delay interval. If it is, the preliminary fastest candidate is valid and can be displayed, and path 851 to block 853 is performed where the QFASTFLAG is cleared and the subroutine returns. If not, the routine returns without clearing QFASTFLAG and the preliminary fastest candidate is not yet ready for display but may be displayed on subsequent subroutine calls when the double delay count exceeds the double delay interval.

When the FASTQUAL subroutine returns to the main loop, it returns to test 632 on FIG. 23B. At that point, there is always a spectral line identified as the fastest signal stored in a variable FASTLINE and there will be a flag QFAST-FLAG, which, if cleared, means that FASTLINE is a valid fastest signal that is eligible for display, and, if not cleared, means that FASTLINE is not valid. Test 632 determines if the middle display window has a locked target speed displayed therein. If so, the fastest target speed will not be displayed as symbolized by path 634. If not, then test 636 will be performed in the preferred embodiment to determine if the operator has selected fastest mode and desires to see the fastest target displayed in the middle window. In some embodiments, the fastest speed, if available, will always be displayed if there is no locked speed value being displayed in the middle window. In the preferred embodiment, if fastest mode is not selected, path 634 is taken that bypasses all processing related to the fastest target speed display mode.

If fastest mode is selected, test 638 determines if the QFASTFLAG has been cleared. If so, then test 640 determines if FASTLINE is within ±1 spectral line of the old FASTLINE on the last pass through this section of the main loop. This is done as a quality guarantee in that the fastest speed is not deemed to be ready for display until nearly the same value for FASTLINE has appeared on two consecutive passes. This is done because radar targets are more likely to be real if they have appeared twice in a row. The reason for the ±1 spectral line tolerance is to allow the target to be accelerating or decelerating and still qualify. Regardless of the results of test 640, blocks 642 and 644 replace the value of old FASTLINE with the current FASTLINE value.

If test 638 indicates that QFASTFLAG has not been cleared, block 646 stores a constant in old FASTLINE that is out of the range of a valid spectral line number. This is done so that an invalid FASTLINE will not be used in the comparison step of 640 and pass a valid new FASTLINE through test 640 on the first pass.

After block 646 is performed or block 644 is performed, path 648 is taken to a process to be described below which blanks the center display.

After block 642 is performed, test 650 determines if sufficient time has elapsed since the transmitter was turned on for the RF quality to be acceptable. If not, path 648 is taken to blank the middle window. If sufficient time has elapsed, test 652 is performed to determine if the RFI flag was set. The RFI flag is set by a process not shown which goes through a completed buffer full of sample words and ORs all the sample words in the buffer to see if any word has set the RFI bit. That is, the 2048 24-bit words in the data block stored in the buffer are logically "ORED" into a test word. If an RFI (Radio Frequency Interference) condition existed during any of the received words in the block, it will appear at the corresponding bit position in the test word and an RFI flag will be set. Also, each received data word from an antenna unit has certain bit positions that are always zero. If these positions are not zero in the test word, a loss of receive synchronization is indicated and the main program will act to re-initialize the SSI. If test 652 indicates the RFI bit has been set at any time during the data block acquisition period, then path 648 is taken to blank the middle window.

If the RFI flag has not been set, test 652 determines if the RFI timer is still running. If so, path 648 is taken to blank the middle window. The RFI timer is started whenever the RFI flag has been set, and this timer continues to run for about 0.5 seconds after the RFI flag has been cleared. This is done because if the RFI flag has been set, it is undesirable to allow fastest target speed display immediately after the RFI flag has been cleared to allow transients to clear the system and to allow the sensitivity of the system to be re-established in case the system was saturated with a very strong RFI signal. There is also an RFI LED on the front panel of the unit, and the RFI timer will keep this indicator lit for a reasonable time so that it can be noticed by the patrolman. If test 652 indicates the RFI timer is not still running, test 654 determines if there is currently displayed a strongest target speed in the left display window. If not, then it is preferred to not display any fastest target speed, although in alternative embodiments, this qualification may be omitted. If the strongest target display is blank, path 648 is taken to blank the middle window.

The processing of the steps within dashed box 656 (steps 658, 660, 662, 664, 666, 668) determine if the strongest target signal is rapidly decreasing in frequency indicating either a rapid deceleration of the target or a cosine effect apparent decrease in speed as the target passes the patrol car in the opposite direction. This rapid decrease in frequency can cause a chirp which causes scalloping in the FFT spectral results which can cause a false fastest target speed to be detected. The processing in dashed box 656 determines whether this rapid decrease in frequency is occurring by checking the spectral line values recorded in the circular history buffer created by the process of block 626 on FIG. 23B. This is done by checking the quality of the strong signal queue by determining if at least one good signal-to-noise reading exists in the last 4 entries in the history queue to prevent fastest display if the strongest target signal has disappeared and the strongest target display is only timing out. Another quality check is to determine if at least one NEWLINE flag has been cleared in the last 4 history entries which means the strong target signal is not a new spectral line and has occurred at least twice consecutively. Then the history entries are checked for rapidly decreasing frequency of greater than one line difference across 4 samples (greater than 0.8 MPH deceleration in 0.16 seconds). If the quality check fails or rapid frequency decrease is occurring, then path 648 is taken to blank the middle window.

Otherwise, test 670 determines if the unit is in moving mode. If not, then path 672 is taken to block 674 which loads the spectral line number of FASTLINE into a variable called FASTTARGET INDEX. FAST TARGET INDEX is a variable that saves the FASTLINE spectral line number in RAM since in subsequent processing FASTLINE's value in a DSP register (a closing speed) is going to be altered by subtracting the patrol speed to derive the fastest target speed. If the system is in moving mode, test 676 is performed to determine whether a timer is running indicating patrol speed was recently acquired. This timer is started whenever a new patrol speed is acquired. This timer and the test of 676 impose a 0.2 second delay to clear out the history queue to prevent erroneous readings from being displayed momentarily when the unit initially acquires patrol speed. If the timer is running, path 648 is taken. Otherwise, test 678 determines whether the unit is in patrol speed tracking mode. If not, path 648 is taken to blank the middle window. If patrol tracking mode is active, then block 680 determines the fastest target speed by subtracting the patrol speed (PATROLLINE) from the fastest speed candidate (FASTLINE) returned by the FASTQUAL subroutine.

Then block 682 is performed from either block 680 or path 675. Block 682 converts the spectral line number derived by block 680 to miles per hour in BCD format and updates the center display to display the fastest target speed and turns on the fastest icon. In some embodiments, the fastest icon can be eliminated as not critical to the invention.

Then block 684 initializes a timer to initialize a time to blank the middle display if the fastest speed is not updated within a predetermined interval (preferably 1.5 seconds).

The processing which blanks the middle display is symbolized by test 686, block 688, and block 690 all of which is led to by path 648. Test 686 is reached whenever any condition occurs which requires that the fastest signal speed not be displayed. This test determines whether the fast speed blanking timer has expired. This timer is started when block 684 is executed indicating a new fastest target speed has just been displayed and runs for a predetermined interval of 1.5 seconds in the preferred embodiment. If the fast speed timer has expired, block 688 blanks the center window and any fast icon or LED, if present. Then block 690 is performed to reset the fast double delay minimum value and fast double delay count counter (see steps 937, 939 and 941 on FIG. 29E).

After blocks 690 or 684 are performed or if test 686 indicates that the fast speed timer has not expired or if path 634 (fastest mode is not enabled or there is a locked strongest target speed in the middle window) has been taken from any previous step, test 692 is performed to determine if all flags are OK indicating the strongest target signal is acceptable for display update. The flags that are tested are: RFI, RFI timer, Signal Limiting (indicating whether there had been a momentary signal overload in which case the buffer of sample data is not processed), RF OK, NEWLINE, QSN FLAG (signal-to-noise ratio acceptable). Test 692 starts a process of decision for displaying strongest target speed. If any of those flags indicate the strongest target signal is not acceptable for display, path 694 is taken to test 696 which starts a process of blanking the strongest target display window on the left and the fastest target display in the middle window. Test 696 determines if the target speed blanking timer has expired. If it has, block 698 blanks the strongest target speed display and the fastest target speed, if displayed and resets the following variables: double delay: double count; fast double delay minimum and fast double delay count. These variables are reset because they are related to screening out false targets which are patrol speed doubles appearing in either the strongest target display or the fastest target display.

After the processing of block 698, path 702 is taken to some prior art processing found in the Stalker radar unit.

If test 692 indicates that all flags are OK, then block 704 bandpasses the data buffer to set a digital bandpass filter centered around the spectral line of the strongest target signal (STRONGLINE). The filtered output samples from the filtering process are stored in a temporary buffer. Block 704 calls another routine to measure the frequency of the STRONGLINE signal defined by the filter output in the temporary buffer by finding the zero crossings and measuring the time interval between the zero crossings by counting samples and calculating the frequency from this data.

Next, test 706 determines whether the unit is in moving mode. If not in moving mode, path 710 is taken to bypass the processing which determines whether patrol speed has been newly acquired etc. If the unit is in moving mode, test 708 determines whether the patrol speed has been newly acquired. If so, path 694 is taken to the process of test 696 to test for blanking of strongest target display. If patrol speed has not been newly acquired, test 712 determines whether patrol speed is been tracked. If not, path 694 is taken to the process of test 696 to test for blanking of strongest target display. If yes, block 714 subtracts patrol speed frequency from strongest target frequency and passes the frequency difference to block 716 where the frequency difference is converted to miles per hour using the relationship that Doppler shift results in a frequency shift of about 103 Hertz per mile per hour. If test 706 determines the unit is not in moving mode, the frequency determined in the process of block 704 is passed to block 716 for conversion to miles per hour. Thereafter, test 718 determines if the newly acquired strongest target speed is as fast or faster than the current fastest target display. If this situation exists, block 720 is performed to blank the fastest display window. In either case, block 722 subsequently initializes a timer for target speed blanking for a 1.5 second timeout.

After block 722 is performed, or if test 696 indicates the strongest target blanking timer is not expired, or after the processing of block 698, path 702 is taken to the balance of the main loop processing, most of which is in the prior art and none of which is critical to the claimed inventions.

Figure 30A:
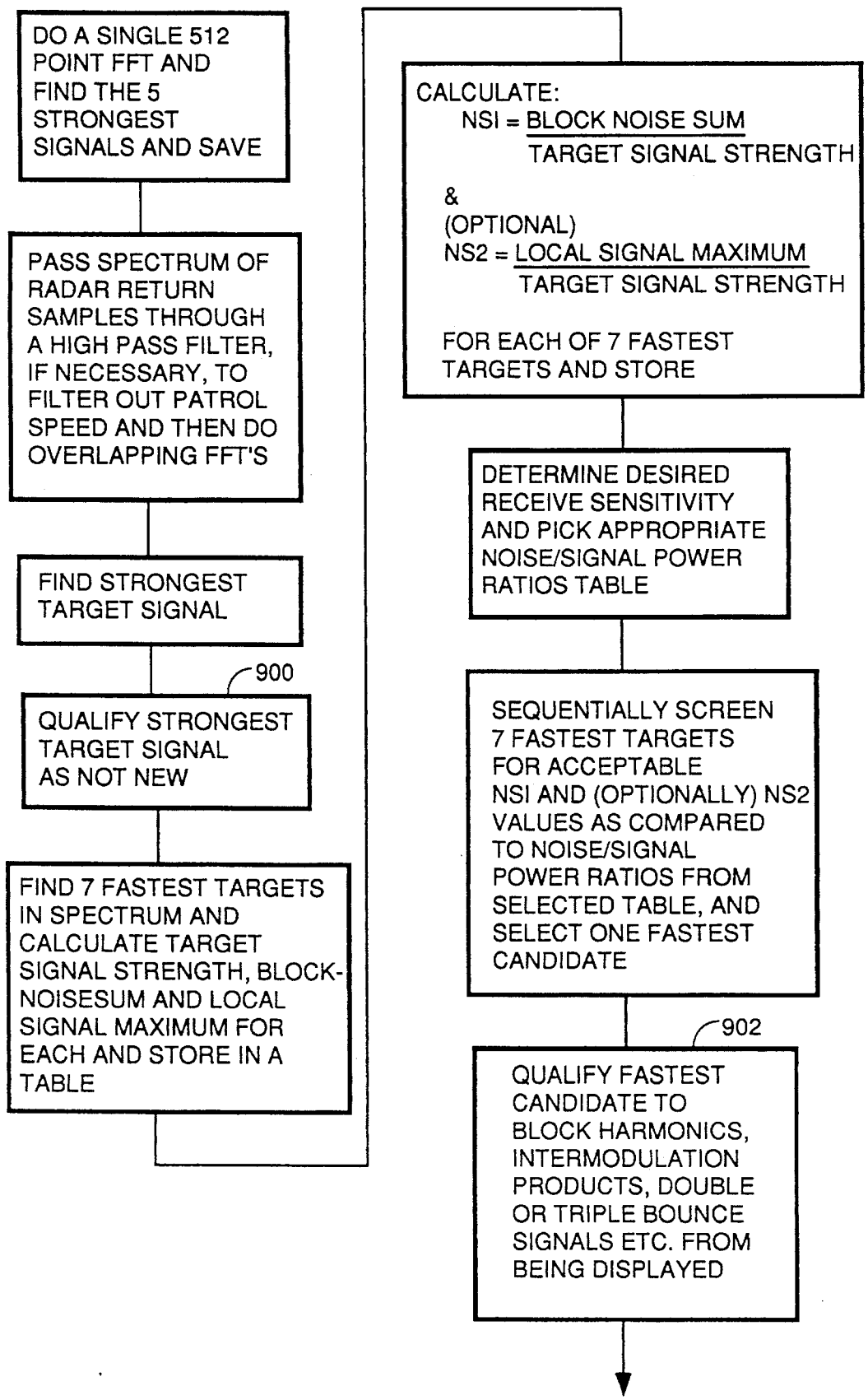
FIGS. 30A and 30B are a flow chart of a simpler embodiment for displaying fastest and strongest target signals simultaneously.
Figure 30B:
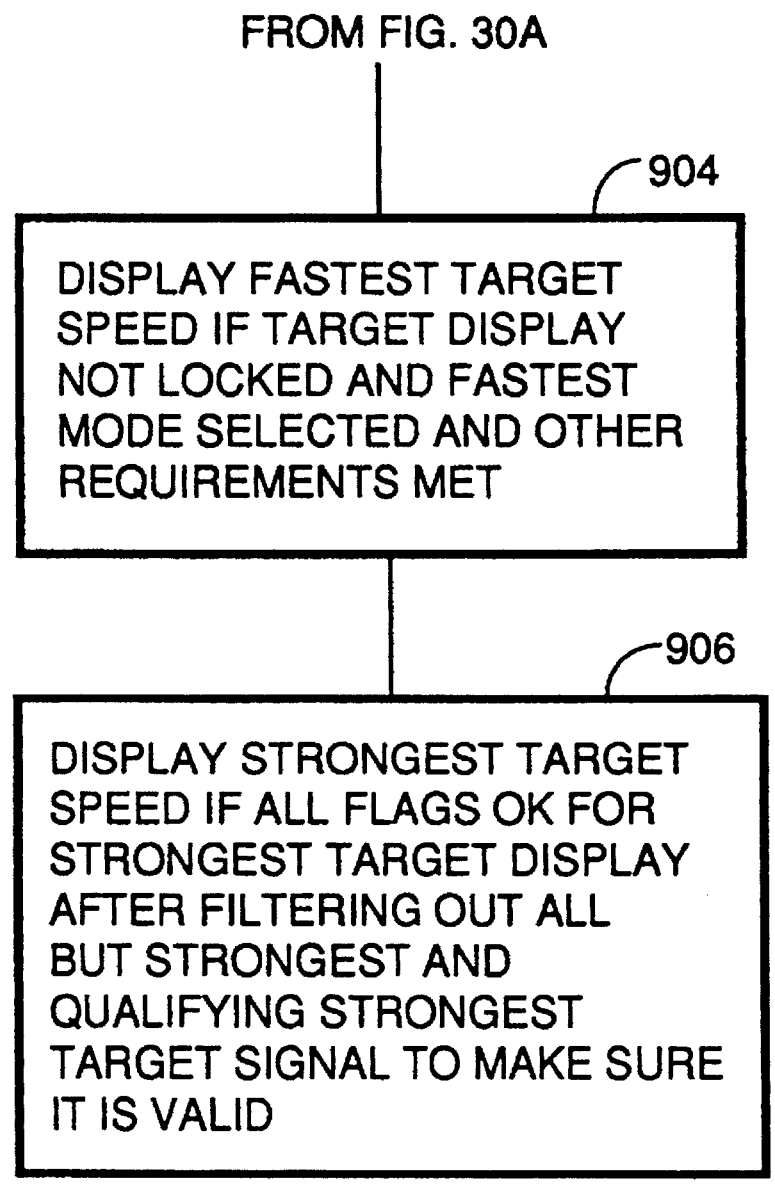

Referring to FIGS. 30A through 30B, there is shown a simplified flow chart of the processing of another embodiment that is similar to the processing flow of FIGS. 23A–E, 24A–E and 29A–G but simpler. The flow chart is self explanatory in light of FIGS. 23ACE, 24A–E and 29A–G and will not be discussed further herein except briefly. Those skilled in the art will appreciate that the virtual gauntlet of qualification and disqualification tests that the fastest speed candidate, the patrol speed candidate and the strongest target signal candidate go through in the processing of FIGS. 23A–E, 24A–E and 29A–G before display is allowed is very comprehensive, and simpler embodiments can easily be envisioned where one or more of these tests is eliminated or modified. The flow chart of FIGS. 30A and 30B is intended to symbolize these simpler embodiments where subsets and supersets, different permutations or combinations or modifications of the gauntlet of tests of FIGS. 23A–E, 24A–E and 29A–G are used. Therefore, blocks 900, 902, 904 and 906 on FIGS. 30A and 30B are intended to cover any different combination or permutation, subset or superset or other modification of the qualification and disqualification tests for the strongest target signal, fastest target signal and the patrol speed signal. Therefore, blocks 900, 902, 904 and 906 on FIGS. 30A and 30B are intended to cover any different combination or permutation, subset or superset or other modification of the qualification and disqualification tests for the strongest target signal, fastest target signal and the patrol speed signal. These different permutations, subset, supersets or other modifications of the gauntlet of tests of FIGS. 23A–E, 24A–E and 29A–G are referred to in the appended claims as "predetermined criteria" or "predetermined selection criteria" or "predetermined signal strength criteria".

Figure 31:
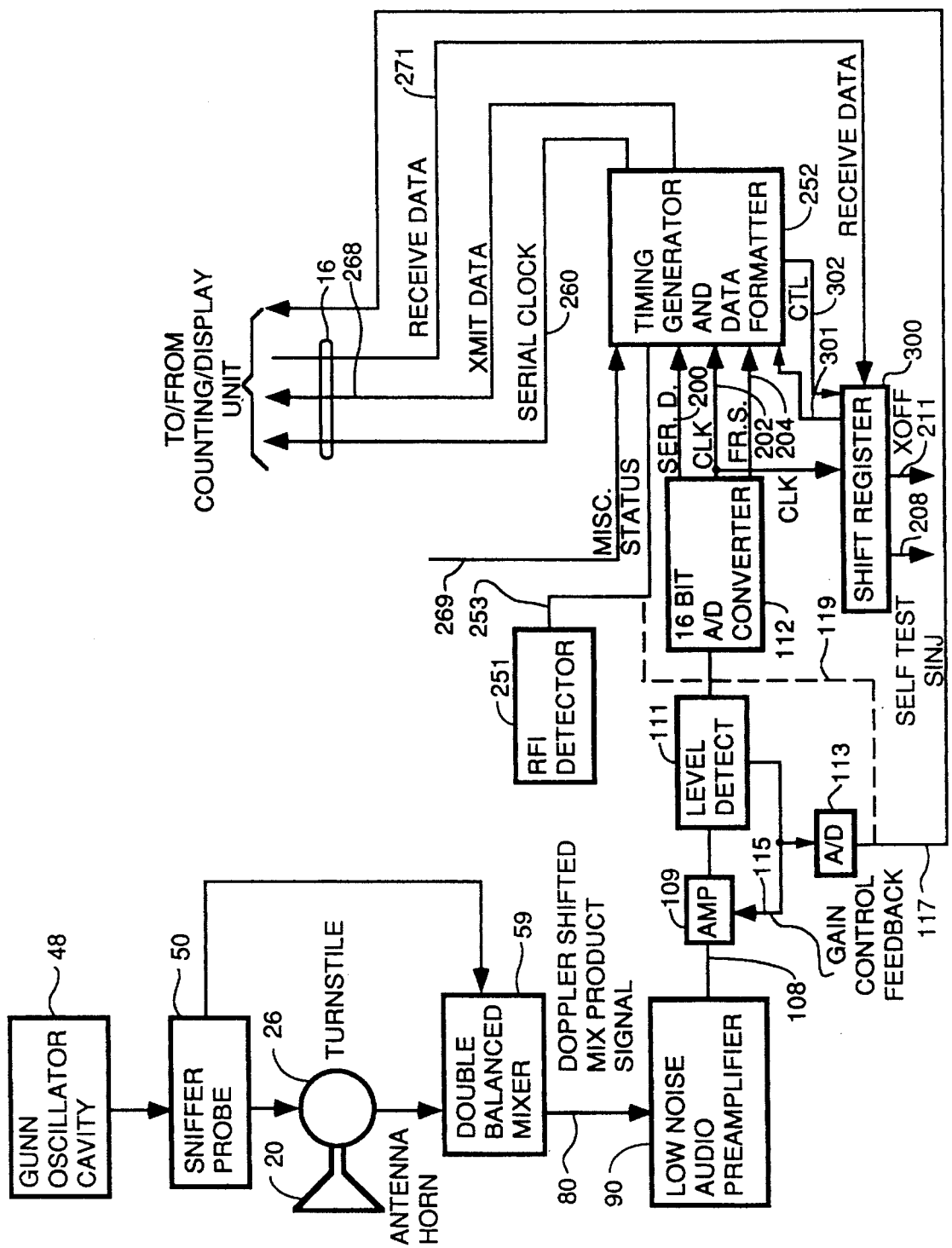
FIG. 31 is an alternative embodiment for a gain control system for the antenna.

Referring to FIG. 31, there is shown an alternative embodiment for a gain control system for the antenna. Functional blocks that have the same reference numbers as blocks in FIG. 6 do the same things except for the shift register 300. In this embodiment, the shift register 300 receives serial format data only for the self test signal and the transmitter on/off control signals and converts them to parallel format under control of signals from the timing generator and data formatter 252. No digital gain control data is received. Gain control is implemented by an analog gain control system comprised of amplifier 109, level detector 111 and analog-to-digital (hereafter A/D) converter 113. The amplifier 109 is a variable gain amplifier which has its gain set by an analog signal on line 115. The output of the amplifier 109 is input to a level detector 111 which compares the signal to upper and lower limits. In some embodiments, these limits are fixed, and in other embodiments, the limits may be adjustable by the user either through analog circuitry such as two potentiometers coupled to upper and lower limit inputs or by way of digital data generated by the processor in the counting unit under user control and sent to the antenna unit for conversion to analog upper and lower limit reference signals. The level detector passes the analog output from the amplifier 109 to the analog input of the A/D converter 112, and simultaneously generate a gain control feedback signal on line 115 based upon the results of the comparison of the level of the output signal from the amplifier to the upper and lower limits. The gain control feedback signal on line 115 is also coupled to the analog input of A/D converter 113 which converts it to either parallel or, preferably, serial format digital data which is transmitted to the counter/display unit for use by the DSP in determining true power of received radar signals. In one embodiment, the digital data output by A/D converter 113 on line 117 is sent as a separate serial or parallel data link to the counter/display unit. In the preferred embodiment, the output data is serial format and is merged into the frames of serial data sent to the counter unit on line 268 time cant of the feedback loop to be much long timg, takes to fill a buffer with data in the counter/display unit so that the gain does not change appreciably during the time the samples filling the buffer were accumulated. In the preferred embodiment, the time constant is set at 0.5 seconds which represents an interval 10 times as long as it takes to fill a 2048 sample buffer at a clock rate of 44 KHz. The components of the automatic analog gain control system and A/D converter 113 are conventional.

Although the invention has been described in terms of the preferred and alternative embodiments described herein, those skilled in the art may possibly appreciate other alternatives which do not depart from the spirit and scope of the claimed invention. All such embodiments which combine the same concepts disclosed herein to achieve substantially the same results are intended to be covered by the claims appended hereto.

```
_DATA P   0000
0AF080 00358C 000000 000000 000000 000000 000000 000000 0D00D1 000000
0D00D3 000000 0D0160 000000 0D015D 000000 000086 00000C 000000 000000
0BF080 002E65 0BF080 002E62 0BF080 002E50 003707 000000 000000 000000
000000 000000 68A100 61F400 000100 64F400 000520 060081 00002A F09800
F098D0 5661D0 5E5900 0C0039 68A100 64F400 000520 61F400 000100 4FDC00
060081 000038 4ED800 4ED8B0 4FDC00 F901B0 5E5900 0BF080 00124A 44C800
47C841 06D800 000053 46C879 45E050 221468 204818 574816 13E041 4ECC54
44605C 4CC818 576016 13E441 4EC850 444858 4CD810 5E4C1E 5F4C41 20AF54
44C87C 47C818 5F4C16 5E5C41 060480 000090 225000 0453A2 382000 3A0100
060580 000079 344000 231900 231C00 231D00 044811 044C15 044B16 205500
06DA00 000072 C4C100 CB8500 44CE00 06D800 000070 4FD9EA CA1DCF 8F8016
8AB8AE 45E1BF CF1C16 D92D00 D58800 230D00 234C2B 21B833 226D00 219A2B
21B300 304000 233800 225400 045811 044415 044B16 205D00 C4C100 CB8500
06DA00 000089 D1AEEA CA0DCF 8F8016 8AA8AE C4C1BF CF0C16 564D00 0456A2
23DA00 0462A3 204E00 204A00 04D6A2 63F400 000100 227400 0462A3 0500A3
0464A3 3B8000 237C00 044B13 044414 62F400 000721 3A8000 65F400 000321
66F400 00041F 75F400 000100 23BE00 0465A2 0466A2 0004F8 4EEA00 C98300
067F80 0000BC C7E400 4CE264 218578 21A7A0 44E3BC 56E418 4CDA40 200010
5E6D14 5FCB14 5E6EE0 4FC4C2 20007C 4FE410 5E5D14 4EEA14 AAC300 00F3B8
CB8300 5E6D3E 5F6600 0460A2 0461A2 0463A2 0464A2 65F400 000321 60F400
000221 4EED00 06FF80 0000CF 48E000 4CDD92 4EED82 485800 00000C 000000
000004 441D00 602100 052220 501E00 541F00 522000 0A36CF 0000F8 0506A0
68B500 08F4BE 002270 0A20D2 0000EA 5EB600 44F400 00FA88 44F445 00FD44
0E90EA 44F445 000080 0E90EB 44D800 0AA402 077084 003FFF 683500 05F420
FFFFFF 68B600 000000 045810 683600 0AA422 08F4BE 002220 0A2077 5EBB00
44F400 000001 60AE44 0E3109 56F400 0003E7 0A2076 0A206D 0E8106 673500
0A204C 0C0109 0A206C 0E8109 673600 5E3B00 5EE000 200003 0AA4AC 000111
0EB117 200040 0C011B 0EB115 44F400 FFFFFF 0C0117 200044 0C011B 051FA0
208E00 045810 602E00 5E6000 68B200 0507A0 0A60C0 000122 0AA524 0C0123
0AA504 0A58C1 000127 0AA523 0C0128 0AA503 683200 0AA42B 0E014F 0A1EF7
000139 0A1E56 0E0156 0AA40A 0A1E77 4CAB00 4C2E00 4CAC00 4C2F00 4CAD00
4C3000 304800 683100 0AA40B 5EAE00 200033 5C2E00 5EAF00 200037 5C2F00
5EB000 44F437 000024 5C3000 0E8147 0AA40A 0C014D 5EB100 200045 0EF14C
0AA429 0C0156 0AA42A 0AA409 0C0156 44F400 000001 5EB100 200044 0E2155
0A1E57 5C3100 449D00 05A220 60A100 509E00 549F00 52A000 000004 452300
08452E 0C0161 452300 612400 052521 085FAF 08F0AF 00001C 0A36EF 00018C
08F4BE 002270 0AA402 0A34CF 00017B 05B721 69B300 000000 45D900 077085
003FFF 693300 05F421 FFFFFF 69B400 000000 045911 693400 0C0189 0505A1
699C00 0B6777 0E8182 0A1CE0 000185 0C0184 0A1CC0 000185 4DD900 4DE100
077085 003FFF 691C00 0AA422 08F4BE 002220 05A521 61A400 45A300 000004
060088 00019C 45DA00 060280 00019B C3BCA3 21C62A 44DCAA 44DCDB B39CA8
16E0DB B3BC22 4D5D00 00F3B8 05F420 FFFFFF 0461A0 0464A0 00000C 0BF080
00128E 06DC00 0001B1 46D900 F09BD8 E19BDE B19BCF B39BDA 21A600 F09BD8
E19BDE B19BCF B39BDA 575A00 00F7B8 05F423 FFFFFF 0464A3 0465A3 00000C
200013 44D81B 068087 0001BF 208645 029040 44D85D 027058 200014 200022
560E00 00000C 060088 0001D4 4EE100 F09BD8 E19BDE B19BCF B39BDA 21E600
47DE00 2000B8 21E600 F4BAE8 C5BAEE A4BAFF 5F6558 45DAFB 5F5900 00F7B8
00000C 200013 060088 0001DF 57E000 4F922A 44E0FE 5F127C 20003A 575842
540F00 00000C 60F413 000220 060081 0001E6 485800 000000 00000C 221800
```

Appendix A

```
0451A0  0A1E6C  0A58B7  0001EF  0A1E4C  0B1E6C  06FF83  0001FB  0E01F6  0A58B7
0001FB  0C01F8  0A5897  0001FB  045911  045012  0B1E4C  0B1E6C  56F400  000002
222400  231045  0E8202  00000C  0A58B7  000207  0A5897  000204  0C0209  0A58B7
000207  045010  224E00  220400  200044  21C400  222E00  00FEB9  0618A0  018040
00000C  60F413  000221  64F41B  FFFFFF  65F400  000208  3D1000  320000  060880
000224  200013  062080  000222  205C05  038402  49D800  626D00  485D00  63F400
000218  65F400  000208  45F400  000001  44DB00  060780  000238  56E300  22B444
205D65  0E7238  48E400  49E500  20000D  03950C  200013  486400  44DB00  63F400
000208  64F400  000218  49DB00  60DC00  060780  000248  61E400  48E300  200005
038001  49E300  485B00  60E400  615C00  63F400  000219  64F400  000209  44DB1B
060680  000254  56E300  205C45  0E2254  496400  44DB00  44AF00  45F400  000166
44F4A0  000003  21C540  21C41B  63F400  000219  73F400  FFFFEF  56DB00  060780
000266  200045  0E0266  496B00  56DB00  63F400  000219  44F400  0000F9  56DB00
060780  000271  200045  0E8271  496B00  56DB00  65F400  000209  300600  060680
00028A  22B400  3D1000  48DC00  229200  49DC00  06D000  000280  23BA05  038402
49DC00  045212  56ED00  57EA00  566A00  576D00  48E500  49E200  486200  495D00
045010  63F400  000219  73F400  FFFFE7  65F400  000220  46F400  000001  47F400
0000FF  060480  0002B4  44F400  0000DF  56DB00  21DD45  020040  44F41B  00001F
200044  22A465  028060  200040  21D013  064180  0002A5  49D810  42ED00  23AF24
20005C  21FD00  200058  200058  42ED00  200024  21FD7D  0E12B2  42ED00  200024
0605A0  200022  486B00  63F400  000211  60F400  000220  3B0800  47F400  000002
060480  0002D5  44EB00  56F400  000006  340145  0E02CB  56F400  0000FA  34F445
0E82CB  56F400  FFFFFB  200040  21D400  228E1B  060B80  0002D4  229844  205C26
48E875  0E82D4  20000D  028008  228E00  495B00  60F400  000209  61F400  000201
62F400  000211  060480  0002FC  48D800  49E200  49E10D  0E02E4  33000D  0E82E7
51F400  7FFFFF  0C02FB  21C403  0E42EB  48E200  0C02F5  0616A0  01DB15  21C400
226E00  200036  06CC20  21D33A  48E200  06D320  200032  00FEB9  0618A0  018048
00FEB9  0618A0  018040  595900  585A00  000000  00000C  60F413  000221  64F41B
FFFFFF  65F400  000208  3D1000  320000  060880  000310  200013  062080  00030E
205C05  038402  49D800  626D00  485D00  63F400  000200  60F400  000221  20001B
060880  00031E  200013  062080  00031B  49D810  0605A0  200022  485B00  64F400
000200  3C011B  42E400  060780  000328  48EC00  205C2S  42E420  486400  63F400
000208  64F400  000218  49DB00  48E300  60DC00  61E400  060780  00033A  200005
038001  49E300  485B00  48E300  60E400  615C00  61E400  63F400  000219  73F400
FFFFEF  44F41B  0000F9  56DB00  060780  000347  200045  0E8347  496B00  56DB00
65F400  000209  300600  060680  000368  22B400  75F400  FFFFF8  48DC00  229200
49DC00  06D000  000357  23BA05  038402  49DC00  045212  48E500  49E200  486200
496500  48ED00  49EA00  486A00  496D00  3D1000  23BA00  56ED00  57EA00  566A00
576D00  045D15  045010  63F400  000219  64F400  000201  65F400  000220  46F400
000001  47F400  000100  060780  000388  48E400  75DB00  0605A0  200032  42ED00
23AF24  20005C  21FD00  0EF380  42ED00  200024  200058  200058  21FD7D  0E1386
42ED00  200024  0605A0  200022  485C00  63F400  000211  60F400  000220  3B0800
47F400  000002  060780  0003A9  44EB00  56F400  000006  340145  0E039F  56F400
0000FA  34F445  0E839F  56F400  FFFFFB  200040  21D400  228E1B  060B80  0003A8
229844  205C26  48E875  0E83A8  20000D  028008  228E00  495B00  60F400  000209
61F400  000201  62F400  000211  060780  0003D0  48D800  49E200  49E10D  0E03B8
33000D  0E83BB  51F400  7FFFFF  0C03CF  21C403  0E43BF  48E200  0C03C9  0616A0
01DB15  21C400  226E00  200036  06CC20  21D33A  48E200  06D320  200032  00FEB9
0618A0  018048  00FEB9  0618A0  018040  595900  585A00  000000  00000C  0A1ECE
000499  0A34B0  000426  0A340F  0E8426  0A348E  0003EA  0A27D7  0003E9  56B000
44F400  000005  45F445  000220  028040  200060  200044  21941B  060BA0  495C00
0C03EF  0A340E  64F413  000221  3C5800  0A16C0  0003F2  64F413  000239  3C4000
```

```
20001B 229200 06DC00 0003F8 200005 038402 49DC00 487000 000FFC 224F00
44F400 000221 20004C 21F200 578D00 44F40B 000001 0EA40A 20004C 0EA40A
21E43B 200048 06CD20 200022 57F400 000040 563300 200005 0E8485 623000
0A3430 0A1F68 44F400 FFFFA9 4C2300 61F400 001000 0A1ECB 00041B 61F400
001800 70B000 0BF080 001280 0D01A5 60F400 0003F8 0D01E9 20001B 573100
502F00 0C04C6 44F400 000100 45AF00 2000A1 44F400 000006 219845 028040
44F400 000005 200044 21D200 44F400 000220 21D440 21D000 205413 060B80
00043B 49D800 205C05 038402 487000 000FFC 224400 0A3426 250400 45F4A9
000003 200068 44F448 000220 200048 21F000 000000 49D800 20003A 20003A
49E005 0E9453 20003A 20003A 20003A 200005 0E7454 0A3406 0A16C0 00045B
224F00 44F400 000018 20004D 0E9485 578D00 44F40B 000001 0EA465 20004C
0EA465 21E43B 200048 06CD20 200022 21CF00 44B300 20004D 0E0470 208F00
0603A0 20003A 20004C 200018 0603A0 20002A 0A3486 00047B 573300 57F400
000002 200005 0E049A 20002A 20002A 200005 0E8485 623000 61F400 001000
0A1ECB 000482 61F400 001800 0BF080 001280 0D01A5 0A3297 000491 56B200
44F400 000001 0A3486 00048E 200040 200040 200040 563200 00000C 0A1FED
000495 0A1FF2 000497 0B1F65 0F09AD 0A3410 0F8CD6 00000C 623000 44F400
FFFFC4 443200 0A3430 0E84A4 0A1F68 44F400 FFFFA9 4C2300 61F400 001000
0A1ECB 0004AA 61F400 001800 0BF080 001280 0D01A5 60F400 0003F8 0D01E9
210F00 56AF00 0A34A6 0004B5 57AF00 200014 0EB4BD 44F400 004000 200045
020040 57AF00 20001C 572F00 21E500 44F400 000100 2000A1 44B000 200044
563100 21E800 0BF080 0010D0 200023 44F023 00032D 218F44 44F426 000001
200045 0EF4E0 57702B 00032D 20002B 21A400 0D0E33 448A00 200045 0EA4E0
540A00 0A1FED 0004DD 0A1FF2 0004E0 0B1F65 0F0D08 0D0CD6 00000C 5E9600
44F400 000006 200046 4C9532 57B040 21DB00 0A1EC6 0004FA 44F400 000033
45F44D 000001 0EF4F7 63F400 002D3B 60F400 000219 07EB85 63F400 002D4B
0C0501 200064 0EB4FA 21DB00 63F400 002D1B 60F400 000219 07EB85 63F400
002D2B 61F400 000201 07EB87 62F400 000211 44E000 340700 0A1EC6 00050B
340400 06D400 000512 5ED900 5FDA65 0E0512 00008C 0C0514 045810 0C05E0
44E000 20517D 0E05E0 0A37E1 000523 0A37C0 00052A 57F400 0000A2 57F44D
0000AE 0E052A 20004D 0E05E0 0C052A 57F400 0000AC 57F44D 0000B8 0E052A
20004D 0E05E0 0A1EC6 0005D8 60F400 000220 209800 49F000 000FFC 48E800
5EE105 0E75DF 57B100 46F42E 000005 47F45D 000007 020058 21E600 200078
21F800 45AF00 47F400 000200 47F4F9 000003 20007C 20005C 47F44C 000001
06D800 00054B 0E254B 00008C 0C05A2 200078 57B100 47F42E 000003 20007D
0E8557 45AF00 47F400 000200 2000F9 20004D 0E0596 0A340C 0E855E 20001B
577000 000328 577000 000329 57B000 21E73B 47F478 000003 20007C 20005C
47F44C 000001 06D800 00056B 0E256B 00008C 0C0583 200078 57F400 00000F
20004D 0E85DF 61F400 002D5B 71F400 00000C 45B300 060C80 00057C 07D98F
20006D 0E857C 00008C 0C057D 000000 045111 000000 07E985 200065 0E05E0
0C05DF 61F400 002D5B 71F400 000084 45B300 060C80 00058F 07D98F 20006D
0E858F 00008C 0C0590 000000 045111 000000 07E985 200065 0E05CF 0C05DF
61F400 002D5D 45B300 060A80 0005A0 07D98F 20006D 0E85A0 00008C 0C05AD
000000 0C05AD 61F400 002D5B 45B300 060C80 0005AC 07D98F 20006D 0E85AC
00008C 0C05AD 000000 045111 5F9700 45F40B 00000C 0EA5DF 21E700 2000F8
20002A 213900 000000 044911 000000 07E185 200065 0E05CF 71F400 00003C
56F000 000328 07E985 200065 028060 567000 000328 57F000 000329 47F405
000001 0E85DF 200078 577000 000329 0A342C 0A1E69 0B1F65 0E85E0 0A1FCC
0005D7 0A1FCB 0005D7 0A2D76 0F0CD6 00000C 0A1EC3 0005DF 56F400 00000E
200045 0E85DF 0A1E62 0A1E54 0A1FCC 0005E4 0A2D56 0F8CD6 00000C 0BA420
0F0E49 0BF080 00122A 0BF080 0011C7 0A1E50 0E0601 08F4A1 000003 44F400
000001 57F400 00001E 0AA5A5 0005F8 20004C 0E25F3 0C05FE 57F400 00001E
```

```
0AA585 0005FF 20004C 0E25FA 0A1E70 08F4A1 0001C3 0D09D9 0A1FD2 00060D
0A29F7 00060D 0A1FCD 00060D 0A1F52 0D09BB 0A1EC1 00060D 0A2C66 0BF080
001183 0BF080 002E6F 0BF080 002E80 0BF080 002ECF 0D01E2 0A1E75 0A1E74
0A1E73 0A1E72 0AA522 0A1ECB 000640 0A1E4B 44F400 00179C 22EE00 57F445
000028 0E162C 0A1E52 22E500 47F465 000001 0E2620 20007C 0E2625 0A1E70
0AA502 60F400 001040 0D01B8 44F400 0017DE 22EE00 57F445 000028 0E163D
22E500 47F465 000001 0E2632 20007C 0E2636 0A1E70 44F400 001000 0C0662
0A1E6B 44F400 001F9C 22EE00 57F445 000028 0E164F 0A1E52 22E500 47F465
000001 0E2643 20007C 0E2648 0A1E70 0AA502 60F400 001840 0D01B8 44F400
001FDE 22EE00 57F445 000028 0E1660 22E500 47F465 000001 0E2655 20007C
0E2659 0A1E70 44F400 001800 4C2100 4C1000 0D0985 68A100 459A00 00BFB9
0A1ED0 000670 060088 00066D 20001B 575800 5F1200 0C067D 0D01D7 0A1E51
0E6674 0A1E71 0A1E4A 0E867D 44F413 0000FF 548F00 44F446 000005 200045
0EA67F 0A1E4F 0E0686 44F400 FFFFFD 4C2600 0A1F77 0A2B74 0F0CD6 0C068A
0A26F7 00068A 0A2B54 0F8CD6 0A1EC6 000702 0D0020 0D03D3 0BF080 0036A0
0D0FF0 56B000 380103 0EA699 44F400 000064 200045 020040 21D800 0A1EC7
0006F2 44F400 00000B 200045 029040 21D800 0BF080 00125A 0D01E2 060580
0006AB 0D002C 0D0FF0 56F400 000180 4CA100 200040 5C2100 0BF080 002F0A
0C06EA 0A1ED3 0006B4 25FF00 4D1A00 0C06E2 5E9A00 4D1A64 47F426 000001
200075 0E76E2 0A1ECE 0006E2 0A1EF2 0006E2 0A1EEF 0006E2 0A26F7 0006E2
0A1EF1 0006E2 208E00 200065 0E16E2 0B1F65 0E86E8 47F400 000100 44AF00
2000C1 0A1EE8 0006D1 200064 0C06D2 200060 21C500 44F400 004000 2000A0
0BF080 0604A0 0010D0 200023 218400 0D0E33 218F00 0D0D2F 44F400 FFFFD3
4C2300 0C06E7 0A1F56 0E06E8 0B1F65 0E86E8 0D09BB 0D0CD6 44F000 000219
5E9300 4C1344 47F426 000002 200075 0E07DB 0A1E55 0C07DB 0BF080 001261
0D01E2 060580 0006FD 0D002C 0D0FF0 56F400 000180 4CA100 200040 5C2100
0D0213 0BF080 0010A2 0C070F 0D0FF0 060780 00070B 0D0020 0D0FF0 56F400
000100 4CA100 200040 5C2100 0D02FF 0BF080 00108F 0D04E1 5E9300 4C1344
47F426 000002 200075 0E0717 0A1E55 68F000 000BA0 051FA0 4C6000 0A1ED5
00071E 0A6068 0A1ED4 000721 0A606C 045810 05F420 FFFFFF 687000 000BA0
0BF080 0031AE 0BF080 0032C1 0A1FF2 0007DB 0A1EC1 0007DB 0A1ED3 000733
24FF00 4C1A00 0C07D0 5E9A00 4C1A44 47F426 000001 200075 0E77D0 0A1ECE
0007D0 0A1EF2 0007D0 0A1EEF 0007D0 0A26F7 0007D0 0A1EF1 0007D0 0B1F65
0E87DB 0A1FEB 0007D0 68F000 000BA0 051FA0 060480 000750 0A78EC 000750
00008C 0C0753 000000 0460A4 0C07D0 68F000 000BA0 060480 00075C 0A78C8
00075C 00008C 0460A4 0C07D0 380300 47F400 0000FF 5EE800 200076 21C500
5EE000 0460A4 200076 47F464 000001 0EF76A 200075 0E775A 208600 0A1EC6
000779 0A1FE8 0007D0 0A3490 0007D0 4C7000 000986 208E00 47F400 000100
45AF00 2000F7 21C400 463E00 4C7000 000987 057060 000988 45F400 003F5C
2000A0 0BF080 0010D0 0604A0 200023 218400 0D0E33 540B00 218F00 0D0D2F
44F400 FFFFD3 4C2300 0A1F75 0E87DA 60F400 000220 64F400 000A00 060081
000796 56D800 5C5C00 44AF00 4C5C00 44B000 4C5C00 44BD00 4C5C00 4C9A00
4C5C00 60F400 000982 060480 0007A4 4CD800 4C5C00 60F413 000FF8 060480
0007AA 44D800 4C5C00 4CF000 000986 4C5C00 4CF000 000987 4C5C00 4CF000
000988 4C5C00 448B00 4C5C00 44BD00 447000 000218 48F000 000FFD 487000
000208 60F400 000200 3C2000 062080 0007C4 48D800 586C00 5C5C00 68F000
000BA0 64F400 000B50 051FA0 062080 0007CD 4CF800 4C5C00 0460A4 0C07DA
0A1F56 0E07DB 20001B 577000 00032A 577000 00032B 0B1F65 0E87DB 0D09B7
0D0CD6 61F400 001000 0A1ECB 0007E1 61F400 001800 789300 0D01A3 0D0FF0
0A34EF 00085E 0A36EF 00085E 0A2052 0ABF2D 0A2054 0E885E 0A2053 0E885E
0A1EF0 00085E 44F413 0000FB 548F00 44F446 000001 200045 0EA7FC 0A1E70
56BC00 200040 563C00 0C085E 0A1ECE 00085E 0A1EF5 00085E 0A1EF4 00085E
```

```
0A1EF2  00085E  0A1EEF  00085E  0A26F7  00085E  0A1EF1  00085E  60F400  000BF8
0D01E9  210400  5F9300  45F400  000002  47F468  0000FF  46F47D  004000  0E0817
21E700  2000B8  212E00  200045  0E885E  5F9300  47F46C  000001  20007D  0E9821
21E700  2000B8  212E00  200045  0E085E  208800  0A1EC6  000839  0A3490  00085E
210F00  56AF00  0A1EC7  000836  0A1EE8  000833  200014  218800  0C0839  200010
218800  0C0839  20001C  0EB85E  21A800  0BF080  0010D0  0604A0  200023  218F00
21840B  0EA85E  0D0E33  540800  0A1E42  0E8859  44F400  FFFFD3  4C2200  44F400
FFFFEC  4C2500  689300  603D00  0A1FE5  000859  0D0CD8  0A1FD5  000859  56BD00
44F400  000001  44BE40  200045  0AF0A9  000859  0D09B7  0BF080  00107C  789300
781100  0C086E  0A1F57  0E086F  20001B  577000  000328  577000  000329  577000
00032A  577000  00032B  573D00  0D09B7  0A340C  0B1F65  0F09CE  0D0CD6  0B1E66
0BF0A0  0012AD  0B1E66  0BF0A8  0012D2  0BF080  00115B  0BF080  0010DC  0A1FC5
000897  0A28F7  000897  0A1F45  0A1F42  0A1F41  0A1F44  0A204F  0D09BA  0D09C8
0A1FD2  00088F  0D0D2D  0A1EC6  000896  0A1FED  00088F  54F000  00032C  540A00
0C0895  0A1EC6  000896  0A34B0  000895  0D09AD  0C0896  0D0D08  0D0CD6  0BF080
003457  0A1FD3  0005E5  0BF080  001055  0C05E5  56AE00  44AD00  209044  0EA8B3
0E38A6  45F400  000020  200060  45F400  FFFFE8  051FA0  21D100  06CE00  0008B2
5FD800  20006D  0E78B1  00008C  0C08B7  602D00  045111  0460A1  00000C  602D00
0C089E  222E00  46F403  000004  0EA8B3  5FD800  47F45D  00000C  0E98B5  24007D
0E78B5  221200  56AE1B  220500  310065  0EA8B3  5FD800  20592E  220548  21E465
0E28C6  5FE000  20002E  46F448  0000D5  22505D  0E18E2  46F400  000004  47F400
000014  5FD800  06D100  0008E0  20002E  20005D  0E98DE  20007D  0EF8E0  045010
00008C  0C08B5  5FD800  0C08B3  310013  562C00  5FD800  45F400  000001  0A2B16
060D80  00092C  205913  20000B  060880  0008F6  0E28F1  5FD800  20000B  0EB8F5
20006C  200060  0C08F6  200068  21C60B  0A2B16  0E8901  20000B  0E28FD  5FD800
20000B  0EB900  20006C  0C0901  200068  200013  20000B  060580  00090D  0E2908
5FD800  20000B  0EB90C  20006C  200060  0C090D  200068  21C70B  060380  000919
0E2914  0A2B36  5FD800  20000B  0EB918  20006C  200060  0C0919  200068  21C70B
44F450  000005  44F445  00000C  0E9926  20EE45  0E7927  44F454  000003  200026
20CE45  0E1929  045010  00008C  0C08B5  200074  56AC00  200037  562C00  045010
0460A1  602D00  21C500  44F400  0017C0  44F446  001000  260045  0EA93C  44F400
001040  46F445  000025  0E2953  4D7000  000989  54AB00  5C7000  00098A  44F400
00187F  45AC46  5E7000  00098B  200065  0EA954  44F400  1FE780  54AB00  200046
240062  542B00  5C7000  00098C  0A2B34  447000  00032E  00000C  57F000  00032E
44F400  000001  44F448  00000F  24004D  577000  00032E  0AF0A2  000962  0A2B35
447000  00032E  00000C  0A1FE9  000979  0A2D6E  0A1C24  0A1E4E  0A1E4D  44F400
FFFFD4  4C2A00  0A2064  44F400  FFFFFD  4C2400  0A1EE5  000977  44F400  FFFFEC
4C2500  0BF080  00107C  0D09CE  0D0CD6  00000C  0A1F40  0A2D4E  0D0CD6  0A1C04
0A1E4E  200013  5E2400  5E2500  0BF080  001081  00000C  0A1ECE  00099A  47F400
400000  46F400  100000  0A1F54  0E0991  47F400  700000  46F400  080000  45F400
000001  568E00  578C00  570D00  200075  0E099B  200055  0E899F  00000C  20000B
0EA9A5  20006C  0C09A4  46F400  000007  20005D  0EA9A5  200068  570C00  0A1F74
569C00  46F400  FFFFF8  458C56  200062  541C00  00000C  5EAB00  45F400  FC1000
47F466  0148BA  250072  5C2B00  457000  00032D  00000C  0A1F55  0F89BB  00000C
0D09CE  5EAB00  44F400  1FFFFF  45F446  02B840  5C2B00  5EAC00  200066  5C2C00
0A2D40  0A1F55  00000C  0D09BA  44F400  FC1000  5EAB00  200046  5C2B00  00000C
0A1F6B  5EAC00  44F400  FF4FFF  45F446  804205  5C2C00  5EAD00  200066  5C2D00
00000C  0D089E  47F400  00003F  200076  47F450  000024  0A2B14  0E89ED  0A2B15
0E0A1A  47F400  000025  47F475  000026  0E29EA  0B1F4F  0C0B72  200075  0EAC09
00000C  219875  0E29F7  0A1FE5  0009F8  46F400  FFFFD3  4E2800  0A1F63  0E09FF
0C09F8  0A1F43  60F400  0036C7  0A1FE5  000A02  0BE880  0D0CD6  00000C  0BF080
0010B5  00000C  0A1FE4  000A1B  0A1FE2  000A20  0A1FE1  000A2B  47F400  000009
```

```
60F475 000C30 0EAA17 47F400 000012 60F475 000BCB 0EAA17 47F400 00002E
60F475 000BE8 0E2A1A 0BE080 0D0BC3 0D0CD6 00000C 47F400 000026 200075
0EAC07 00000C 47F400 000024 47F475 000025 0EAA27 200075 0E2A1A 0D0B83
0D0B7A 0D0CD6 00000C 270000 47F475 000025 0EAA47 47F475 000018 0EAA47
47F475 00000A 0E2A3F 5E9B00 47F400 000001 200075 0E2A1A 0A206F 46F400
FFFFD3 4E2800 00000C 200075 0EAA43 0A204F 00000C 0A204F 0E0A1A 0B204E
00000C 0D0B5E 0D0A4E 0BF080 00107C 0D0CD6 00000C 00000C 0A1F65 0A1F61
0D0DD6 46F400 FFFFD3 4E2800 0BF080 0010B5 00000C 0A20CE 000A5B 0D0E49
00000C 44F400 FFCDA6 4C2A00 0D09C7 0A1E70 0BF080 0010B5 0D097B 0A3410
0A340F 0A2050 07F086 00001A 30001B 06C600 000A6C 07D885 200068 21A500
07E08F 20006D 0EAA71 44F400 000001 4C3B00 44F400 000006 440C00 0D09A6
0A36EF 000A78 0ABF2D 0BA407 45F400 000001 4D3B13 0A2056 0A2056 0E0A80
0A2055 60F400 000FE2 61F400 00000C 07D884 075984 045911 07D884 075984
060280 000A94 0A2056 0E8A94 0A2055 0E0A8E 200060 0C0A8E 0BA407 44F400
00233A 44F445 002288 0E7A9C 200045 0E1A9D 0A2070 60F413 000378 060082
000AA1 565800 44F400 001000 4C2100 060780 000AB6 0D0020 60F400 000378
65F400 000320 060082 000AB1 44E000 5EDD00 200040 565800 56F400 000100
4CA100 200040 5C2100 65F400 000379 75F400 000100 60F400 000221 4EED00
06FF80 000AC2 44DD90 46ED82 485800 60F413 000222 34001B 320000 06FE80
000ACB 205C05 038402 49D800 60F400 000220 224E00 44F400 000080 225845
0AF0AA 000AD5 0A2070 56E800 44F400 000400 200045 0E1ADB 0A2070 60F400
002C55 0A20F0 000AF7 301000 0D0B39 303500 0D0B39 306500 0D0B39 380100
0BF080 001122 0D0E0B 360C00 0D0B2F 0D0B3F 380000 0BF080 001122 0D0DEA
360C00 0D0B2F 0D0B3F 0A206B 0A206A 60F400 002C53 5EAC00 07D884 5FAD42
07E084 5C2C4A 5D2D00 0D0CD6 60F400 000FE0 61F400 00000C 07D884 075984
045911 07D884 075984 0D0CD6 061480 000B19 22EE00 45F400 000800 4CF066
00084E 200045 0EAB15 5E7000 00084E 0BF080 002ECF 0A2056 0E0B0A 0D089E
0A2B14 0BA407 0B1F60 0F8963 44F400 FFCDA6 4C2A00 0A1FD2 000B2B 0D0D2D
0A1EC6 000B2E 0A1FED 000B2C 54F000 00032C 540A00 0D0D08 00000C 0D09BA
0B1E66 0F89AD 00000C 0D0CD6 06D600 000B36 0A2056 0E0B32 0D089E 0A2B14
0BA407 000000 00000C 600800 220F00 0D0D0B 0D0CD8 360800 0D0B2F 0D09C7
360200 0D0B2F 00000C 0BF080 0010B5 0A1EC6 000B5D 0A1FD2 000B52 0B1F51
0E8B4D 0D09C8 00000C 54F000 00032C 540A00 0D0D08 00000C 0A3410 0E0B5D
0A340F 0A342E 44F400 FFFFEC 4C2700 0BF080 001081 0D09BA 0D09AD 00000C
0BF080 0010B5 5E9B00 46F400 000001 46F450 000005 200055 0E2B68 200013
5E1B00 301B00 601B00 0A1F73 00000C 0A1FC5 000B72 0A1FEF 000A47 0C0A27
0A1F41 0A1F42 0B1F6F 0F8A4E 0B1F6F 0F0B7A 0D0CD6 00000C 0A1F65 0A1F62
0D0DBE 46F400 FFFFD3 4E2800 0BF080 0010B5 00000C 5E9400 46F400 000001
46F450 000006 200055 0E2B8B 200013 5E1400 60F433 002E0D 64F433 000840
200033 219800 060880 000B95 07E886 B89803 301400 601B00 0A1F73 00000C
0BF080 0010B5 0BF080 001081 301E00 601B00 0A1F73 0A1F52 0A2B53 0A1EC1
000BA6 0A2C66 0A1F55 0B1E46 0E8BB7 44F400 831A87 441A00 0D09BA 0D09AD
0A3410 0A1EC7 000BB6 0A2C46 0A2B6C 0A1EE8 000BB6 0A2C71 00000C 44F400
862246 0A1EC3 000BBD 44F400 AA7914 441A00 0D09C8 0D09BA 0A2B4C 0A2C51
00000C 0A1F65 0D0D8A 46F400 FFFFD3 4E2800 0BF080 0010B5 00000C 5E9600
0A1EC6 000BD9 0A1EC7 000BD9 46F400 000007 46F456 000008 218700 5E9600
46F450 000018 0C0BE1 46F400 000019 46F456 000002 218700 5E9600 46F450
000006 200056 200072 5C1600 301600 601B00 0A1F73 00000C 5E9600 0A1EC6
000BF8 0A1EC7 000BF8 46F400 000006 46F456 000008 218700 0A1660 0E8C03
5E9600 46F450 000018 0C0C00 46F400 000018 46F456 000001 218700 5E9600
46F450 000007 200056 200072 5C1600 301600 601B00 0A1F73 00000C 0A1FC4
000B43 0A1F65 0A1F64 0F8C26 0D09BA 62F400 002C47 0A1EC5 000C13 62F400
```

```
002C50  5EAB00  07DA85  5FAC62  07DA85  5C2B6A  5EAD00  07DA85  5D2C62  5C2D00
0D09C8  46F400  FFFFD3  4E2800  0BF080  0010B5  0D0CD6  00000C  0BF080  0010B5
0B1E45  44F400  FFFFFF  4C2500  0BF080  00107C  301E00  601B00  0A1F73  00000C
0B1640  301600  601B00  0A1F73  00000C  0BF080  0010B5  0A1EC6  000C4D  0D09BA
0A1F52  0A2B53  0A1F55  301E00  601B00  0A1F73  0B1E47  0E8C48  0A2C46  0A2B6C
0A1EE8  000C47  0A2C71  00000C  0A2B4C  0A2C51  0A1EC1  000C4D  0A2C66  00000C
0BF080  0010B5  0A1FEE  000C62  44F400  FFB1E0  4C2900  0A1FEB  000C63  0B1F52
0E8C63  448800  440900  0D0D2D  0A2B73  0A2C46  0A1F55  0A1EC6  000C62  0D0D08
00000C  0A1F52  0A2B53  0D09BB  0A1EC1  000C6D  0A1EC6  000C6C  0A1EE7  000C6D
0A2C66  0A1EC6  000C74  0A34B0  000C73  0D09AD  00000C  0D0D08  00000C  0A1EC6
000C84  0A1EC7  000C84  301E00  601B00  0A1F73  0B1E48  0E8C80  0A2C51  0C0C81
0A2C71  0BF080  0010B5  00000C  0A20C3  000C81  0B1E41  0E0C8B  0A2C46  0D09B7
0C0C81  0A1FF2  000C8E  0A2C66  0A1EF0  0010C6  60F400  002A06  61F400  000340
693300  061480  000C98  07D884  445900  301300  603700  46F400  FFEF98  4E3400
00000C  0B1E64  0E8CA6  0A1E64  0A2D69  0A2D42  0AA40E  0C0CAD  0A1FC7  000CB8
0A2072  0A1E44  0A2D49  0A2D62  0AA42E  0B1F60  0F8963  0D09B7  0A1E6A  0A1E70
0BF080  0010B5  301E00  601B00  0A1F73  00000C  0BF080  0010B5  00000C  0BF080
0010B5  0A1F4A  0A1F40  0E0CCE  0A3410  0E0CC3  0A342F  0D09CE  0D09B7  0A1FED
000CC9  0A1FF2  000CCC  0A1EC6  000CCC  0D09AD  0D097A  0C0CD2  0A1FE9  000CD5
0A1F60  0D0963  301F00  601B00  0A1F73  00000C  0A1E76  00000C  47F400  00000F
0A1F4B  5EAC00  44F400  FF4FFF  578846  61F47E  002C5A  21B900  45F400  C04205
07E984  61F400  002C6A  5FAD42  21856E  07E984  61F44A  002C7A  46F400  0000F0
568800  0604A0  200023  218656  20CE00  0E2CF7  200003  0EAD05  0C0CFF  61F400
002C8A  0604A0  200023  219900  20CE00  07E984  20004A  61F476  002C7A  219900
000000  07E984  20004A  5D2D00  4D2C00  00000C  558A00  557000  00032C  0A1F51
45F400  FC1001  5CAB00  47F400  00000F  21A67E  21B900  61F400  002CEA  20CD66
07E985  61F400  002CFA  0604A0  20002B  21A67E  21B962  20CD00  07E985  0604A0
20002B  20007E  0EAD27  200062  45F400  028000  0C0D2A  232F00  20000B  0EAD2B
200062  5C2B00  00000C  578900  0A1F51  44F400  1FFFFF  5EAB00  47F446  00000F
21A67E  21B900  61F400  002C9A  44F400  02B860  07E985  5FAC62  61F44E  002CAA
5C2B00  20CE00  07E984  46F44A  0000F0  0604A0  200023  218656  20CE00  0E2D4D
200003  0E2D55  5D2C00  0A2D40  00000C  61F400  002CDA  0604A0  200023  219900
20CE00  07E984  20004A  61F476  002CBA  219900  5EAD00  45F400  FFFFFE  07E984
61F44A  002CCA  200066  07E984  5D2C42  5C2D00  00000C  60F400  002C3A  0A1EC3
000D68  045810  0D09C8  07E084  200042  5C2B00  00000C  60F400  002C3E  78B800
0D09C8  07E884  200042  5C2B00  00000C  4C9700  62F400  002C2A  0C0D7F  5F9500
46F400  00000D  62F458  002C24  21A400  0D0E33  218F00  0D0D2F  0D09CE  5EAC00
07DA85  5FAD62  07E285  5C2C6A  5D2D00  00000C  0D09BA  5F9600  0A1EC6  000D92
0A1EC7  000D92  20002B  20002B  46F42B  000003  46F45E  000001  61F458  002CBA
21B900  5EAC00  07E984  62F442  002C24  5FAD00  07DA85  61F462  002CCA  5C2C00
07E984  20004A  07E285  20006A  5D2D00  0D09C8  62F400  002C3C  0A16C0  000DAE
62F400  002C3D  000000  07E285  200062  5C2B00  00000C  0D09BA  390100  0A2D69
0A2D42  0A1FC7  000DBB  390200  0A2D62  62F400  002C2E  0C0DC5  0D09BA  5F9400
46F400  000001  62F458  002C26  21B900  61F400  002CBA  5EAC00  07E984  200042
5FAD00  07DA85  61F462  002CCA  5C2C00  07E984  20004A  07E285  20006A  5D2D00
0D09C8  00000C  0D09BA  799B00  61F400  002CBA  5EAC00  07E984  62F442  002C28
5FAD00  07DA85  61F462  002CCA  5C2C00  07E984  20004A  07E285  20006A  5D2D00
0D09C8  00000C  0BF080  0009CE  0BF080  0011A5  218400  0D0E33  218F00  62F400
002C32  0D0D81  0A2C65  0D09C8  00000C  57F400  000026  62F400  002C36  0D0D81
0D09C8  5EAB00  44F400  0129C6  200042  5C2B00  00000C  0D09C8  57F400  000347
62F400  002C38  0D0D81  0A2C65  00000C  0BF080  0009CE  0BF080  0011B5  0A20E0
000E17  44F432  733333  218500  44F4A0  000020  200040  200011  0E3E23  44F426
```

```
000063 200045 027040 218400 0D0E33 218F00 0D0D2F 0A2C73 0C0E27 218400
0D0E33 218F00 0D0D2F 44F400 FC1000 5EAB00 44F446 012F48 0A20C0 000E30
44F400 012DC8 200042 5C2B00 00000C 60F413 002C57 46F400 000FFF 208C00
310056 218400 060380 000E46 07D886 208E00 200054 0E8E43 218400 045911
0C0E3E 222C00 0604A0 200033 219100 200040 00000C 0D097B 0A3410 0E0E4D
0A342F 0A2D49 0A2D42 0D0D79 60F400 000012 607000 000327 0D0D63 0BF080
000CD6 380000 0BF080 001122 380100 0BF080 001122 0D089E 0A2B14 0E8E70
56F000 000327 47F400 00000A 200075 0EAE68 0A2C45 0C0E57 0A1EF7 000E68
22CE00 205603 0E2E55 360A00 0D0DEA 0C0E55 47F400 00003F 47F476 00001B
47F475 000012 0E2E8C 0D09BA 0A1F52 0A1F55 0D09C8 0B1F60 0F8963 0B1E66
0F89AD 0BF080 0010B5 0A2C45 0A1EC4 000E88 0A2D69 0A2D42 0D0CD6 00000C
0A2D49 0A2D62 0D0CD6 00000C 270075 0EAEB2 47F475 000024 0EAEC5 47F475
000010 0EAED1 47F475 000019 0EAEEA 47F475 00000A 0EAF1B 47F475 000008
0EAF5E 47F475 00001A 0EAF7C 47F475 000018 0EAF89 47F475 000011 0EAF95
200075 0EAF05 0A20CE 000E55 47F400 000009 47F475 000001 0EAFC9 200075
0EAFBC 0C0E55 47F000 000327 200075 567000 000327 0E2EC2 5E9500 46F400
000001 46F450 000003 200056 5E1500 301500 601B00 0A1F73 0D0D79 0D0D63
0C0FD9 56F000 000327 47F400 000012 20EE75 0E2EB2 0B1E43 0D0D63 301E00
601B00 0A1F73 0C0FD9 47F000 000327 57F400 000009 20007D 0EAFB5 200075
567000 000327 0E2EE7 5E9700 46F400 000001 46F450 000006 200055 0E9EE3
200013 5E1700 301700 601B00 0A1F73 0D0D75 0D09C8 0C0FD9 47F000 000327
200075 567000 000327 0E2EFC 5EB700 46F400 000001 46F450 000003 200055
0E9EF8 200013 5E3700 303700 601B00 0A1F73 78B700 60F400 002E3D 62F400
002C2C 07E88F 0D0D81 0D09C8 0C0FD9 47F000 000327 57F400 000009 20007D
0EAFB7 200075 567000 000327 0E2F13 0B2043 302000 601B00 0A1F73 0D09BA
62F400 002C47 0A20C3 000F46 62F400 002C4D 0C0F46 47F000 000327 57F400
000018 20007D 0EAF51 200075 567000 000327 0E2F37 0A1FEC 000F2D 0A1FEE
000F32 0A1FED 000F2F 0A1F6D 0C0F34 0A1F4C 0C0F34 0A1F4D 0A1F6E 0C0F34
0A1F4E 0A1F6C 301F00 601B00 0A1F73 0D09BA 62F400 002C4A 0A1FEC 000F46
62F400 002C47 0A1FEE 000F46 62F400 002C44 0A1FED 000F46 62F400 002C41
5EAB00 07DA85 5FAC62 07DA85 5C2B6A 5EAD00 07DA85 5D2C62 5C2D00 0D09C8
0C0FD9 44F400 000001 5EB800 44F440 000002 303845 0EFF59 200013 5E6000
601B00 0A1F73 0D0D6D 0C0FD9 47F000 000327 360A75 567000 000327 0E2F77
0BF080 0011A5 21C600 061480 000F76 5E9800 44F400 000001 44F440 0000FF
200046 5E1800 0BF080 0011A5 200055 0EAF76 00008C 0C0F77 000000 301800
601B00 0A1F73 0D0DEA 0C0FD9 47F000 000327 200075 567000 000327 0E2F87
0B2040 0A2041 302000 601B00 0A1F73 0D0E0B 0C0FD9 47F000 000327 200075
567000 000327 0E2F93 0B1F47 301F00 601B00 0A1F73 0D0DB3 0C0FD9 47F000
000327 200075 567000 000327 0E2FAC 5E9900 46F400 000001 46F450 000008
200055 0E9FA3 200013 60F400 002E48 21D800 5E1900 07E887 08C732 301900
601B00 0A1F73 789900 60F400 002E40 62F400 002C30 07E884 0D0D7F 0D0D6D
0C0FD9 0B2051 0C0FD7 60F400 00084F 44F400 000010 0C0FD2 47F000 000327
56F400 000009 60F475 00084F 0E2E55 5FE000 44F400 000001 45F44C 0001FF
0C0FD5 47F000 000327 60F475 00084F 567000 000327 0E2FD7 44F400 000001
5FE000 45F448 0001FF 20006E 5D6000 0BF080 00134F 0BF080 0010B5 0A1FD3
000E55 0BF080 001055 0C0E55 0D0160 0D015D 0D0FE7 0D0FE4 452300 08452E
45A300 085FAF 0B1C07 0AF0A8 000FEC 0B1C03 0A2075 08F0AF 00001C 000004
0BA428 0AF0A8 000FF4 0A1E6F 00000C 0BF080 001037 278000 220E00 0610A0
200033 380872 0BF080 001047 0BF080 001040 200013 061080 00100A 0628A0
000000 0BA423 200037 0AA425 0628A0 000000 0AA405 0AA406 00000C 0BF080
001037 0BF080 001016 0BF080 001037 0BF080 00101D 00000C 27C000 220C00
0610A0 200033 380872 0AF080 001024 274000 20B800 220C00 0610A0 200033
```

```
230572 381862 0BF080 001047 0AA406 0BF080 001040 0AA426 56F400 001000
47F400 000001 0BF080 001040 200074 0AF0AA 001035 0AA483 00102E 0AA406
00000C 0AA427 0AA405 0AA404 0628A0 000000 0AA426 0BF080 001040 0AA424
0628A0 000000 0AA425 0628A0 000000 0AA405 00000C 06D800 001052 200033
0AF0A8 00104F 0AA404 0AF080 001050 0AA424 0BF080 001040 000000 0AA404
00000C 0BF080 001062 609B00 0A1F53 4DE000 0BF080 00100D 0BF080 00105F
00000C 200013 0AF080 001063 2E3000 0BF080 001037 380800 0BF080 001047
0AA406 00000C 0D089E 0A2B14 0AF0A0 00107B 47F400 00003F 200050 47F476
00000A 47F475 00002D 0AF0AA 00107A 200075 0AF0A2 00107B 0A1F70 00000C
5E9B00 0A20EB 001081 0A25F7 001088 60F400 000848 56F400 000080 0606A0
5E5800 200013 21D800 60F400 002DEB 000000 07E886 4E1D00 00000C 60F400
000209 70F400 FFFFF7 49D800 0604A0 20002A 48D800 060680 00109F 20000D
0AF0A8 00109F 45F400 7FFFFF 4D6800 48D800 000000 00000C 56B000 45F400
000012 45F460 7FFFFF 60F400 000219 70F400 FFFFE7 57D800 060680 0010B2
20000D 0AF0A0 0010B2 4D6800 57D800 000000 00000C 0A1EF0 0010C6 60F400
00296E 61F400 000340 693300 061C80 0010BF 07D884 445900 301B00 603700
46F400 FFE5C0 4E3400 00000C 0ABF0D 46F400 000320 4E3500 46F400 FFF7CC
4E3600 0A2074 0A2073 00000C 210400 45F400 00D7E4 0A20C0 0010D7 45F400
015B71 2000A0 0604A0 200022 200011 00000C 45F400 000001 0A22D7 0010E6
5EA200 200060 5E2200 0AF0AB 0010E6 0A1F77 0A23D7 0010F1 5EA300 200060
5E2300 0AF0AB 0010F1 0A1F48 0AF0A8 0010F1 0A1F76 0A24D7 0010F6 5EA400
200060 5E2400 0A25D7 001101 0A1EC5 001101 5EA500 200060 5E2500 0AF0AB
001101 0BF080 001081 0A26D7 001106 5EA600 200060 5E2600 0A27D7 00110B
5EA700 200060 5E2700 0A28D7 001113 5EA800 200060 5E2800 0AF0AB 001113
0A1F43 0A29D7 001118 5EA900 200060 5E2900 0A2AD7 001121 5EAA00 200060
5E2A00 0AF0AB 001121 0A204D 0A204C 00000C 0AA427 0AA405 0AA424 0BF080
001158 0BF080 001153 0AA407 230E00 44F400 000001 200046 60F400 000980
0BF080 001153 0AA424 0BF080 001158 0BF080 001153 219823 0AF0A8 00113B
0AA404 0BF080 001158 0BF080 001153 0BF080 001158 0BF080 001153 060880
00114B 0BF080 001158 0BA423 200037 0BF080 001153 000000 0AA427 5E6800
0BF080 001158 0BF080 001153 00000C 0AA425 0606A0 000000 0AA405 00000C
0603A0 000000 00000C 48F000 000209 578D00 21E70B 0AF0AA 001165 20003B
200078 06CD20 200022 300003 0AF0AA 00116D 301C00 060EA0 01D815 060EA0
01D815 221800 60F400 002DF0 4E9D00 07E887 60F4B8 000848 21E600 47F400
600000 56F4B8 000080 21E700 218F70 5E5858 5F585C 5E585C 5F5874 200074
5E5800 5F6000 00000C 380000 0BF080 001122 0BF080 0011A5 0A1FE9 00119A
44F400 00004B 200045 0AF0A1 001199 0A2B72 0D097B 0A1FF2 001195 0B1E66
0F89AD 0A3410 0A1F69 0D09CE 0D0CD6 00000C 44F400 00005A 200045 0AF0AF
0011A4 0A1F49 0A2B52 0B1F60 0F8963 0D0CD6 00000C 5E9800 0608A0 200022
210413 2A0500 4DF040 000980 0604A0 200022 218400 247CA1 21C500 44F4A1
000004 200040 00000C 5E9800 0608A0 200022 210413 2A0500 4DF040 000981
0604A0 200022 218400 2000A0 200032 246432 21C500 44F4A0 000111 200044
00000C 5EBD00 44F400 000001 301044 5C3D00 0AF0A3 001229 683D00 380100
0BF080 001122 0BF080 0011B5 44F411 00005D 200045 0AF0AF 001229 0D097B
0A1E70 08F4A1 000003 300000 683D00 0A2056 0A3410 0D0010 0D089E 0A2B14
0BF0A8 0010B5 0A2056 0AF0A0 0011E1 380100 0BF080 001122 0BF080 0011B5
44F411 00005B 68BD45 0AF0AF 001218 220E00 205803 683D00 0AF0A2 001200
0D09C7 62F400 002C34 0D0D82 0A2B53 0D0CD6 0AF080 0011E1 44F400 00000C
44F445 000024 0AF0A2 001212 0D09C7 0A1FD2 00120F 0A2B73 0D0D2D 0A1FED
00120F 0B1E66 0F8D08 0D0CD6 0AF080 0011E1 300045 0AF0A2 0011E1 683D00
0AF080 0011E1 0D09C7 0B1F60 0F8963 0A1FD2 001226 0D0D2D 0A2B73 0A1EC6
001228 0A1FED 001226 0D0D08 0AF080 001228 0B1E66 0F89AD 0D0CD6 00000C
```

```
0A2056 0AF0A0 001249 5EBC00 0A1ED0 001237 44F400 000001 44F440 00000F
200046 0AF080 00123B 200003 0AF0AA 001249 200013 5E3C00 0A3CC3 001242
0A2D42 0A2D49 0AF080 001248 0A1EE4 001247 0A2D62 0AF080 001248 0A2D69
0D0CD6 00000C 62F400 000100 225000 384000 231C00 231E00 3B8000 05FFA0
0461A0 0464A0 0465A0 05F423 FFFFFF 0500A2 0466A2 00000C 60F400 002493
341000 044810 385A00 0AF080 001266 60F400 001E7D 341000 044810 386400
6AA100 0509A4 060280 001276 07E084 044810 445C00 07E085 044810 455C00
07E085 044810 455C00 445C00 07E085 044810 455C00 225500 300800 310A00
0501A0 0501A1 0008F8 C29C00 200022 0C0190 60F400 001586 330000 340400
044810 38FF00 0507A3 0503A4 74F400 000800 62F400 000378 0AF080 00129D
60F400 001586 330000 340000 044810 38FF00 0507A3 0503A4 20001B 0604A0
5F5C00 62F400 000B78 74F400 000480 060280 0012A9 07E084 044810 445B00
07E084 044810 445B00 07E084 044810 445B00 24C000 445B00 0008F8 44DB00
00000C 789100 699000 60F400 001B80 330000 340C00 044810 38FF00 0503A3
0501A4 07E084 044810 445B00 07E084 044810 445B00 07E084 044810 445B00
24C000 445B00 0008F8 44DB00 060088 0012CB 46E100 F09BD8 E19BDE B19BCF
B39BDA 5F5900 00F7B8 05F423 FFFFFF 0464A3 0465A3 00000C 789100 699000
60F400 001B80 330000 340C00 044810 38FF00 0503A3 0501A4 07E084 044810
445B00 07E084 044810 445B00 07E084 044810 445B00 24C000 445B00 0A1EE7
00130A 320400 350E00 5F9100 44B000 44F44C 00219D 200048 21F000 0503A2
0501A5 07E084 044810 445A00 07E084 044810 445A00 07E084 044810 445A00
244000 445A00 0008F8 44DB00 45DA00 66F400 000378 0D01C4 05F423 FFFFFF
0464A3 0462A3 0465A3 00000C 0008F8 44DB00 060088 001319 4EE100 F09BD8
E19BDE B19BCF B39BDA 21E600 21E700 2000B8 21E700 2760B8 2000BE 5F5900
00F7B8 05F423 FFFFFF 0464A3 0462A3 0465A3 00000C 60F400 00296E 61F400
000340 061C80 001328 07D884 445900 60F400 002A1A 61F400 000320 060780
001330 07D884 445900 60F400 002A21 61F400 000520 060082 001338 07D884
4C5900 60F400 00276E 388000 318000 068080 001342 07E884 446100 07D884
4C5900 60F400 00286E 61F400 000720 060081 00134A 07D884 4C5900 44F400
831A87 441A00 00000C 0D09BA 0D09C8 6AF000 00084F 72F400 000A00 0A2B40
57E200 0A20D1 00135B 0A2B60 5FEA00 47F400 00000F 21A67E 61F400 002C9A
21B900 5EAB00 07E985 5FAC62 61F400 002CAA 5C2B00 20CE00 07E984 61F44A
002CBA 0604A0 200023 218676 219900 5EAD00 07E984 61F44A 002CCA 000000
07E984 61F442 002CDA 218500 20CE00 0604A0 200023 218676 219900 20CE00
07E984 61F44A 002C5A 0604A0 200023 218676 219900 20AE00 07E984 61F44A
002C6A 5D2C00 07E984 20CF42 0604A0 20002B 21A67E 21B900 61F400 002C7A
20CF00 07E984 61F442 002C8A 0604A0 20002B 21B900 224F00 07E984 61F442
002CEA 5E2D7E 21B900 5EAB00 07E984 61F442 002CFA 224F00 0604A0 20002B
21A67E 21B900 000000 07E984 200042 20CD00 0604A0 20002B 20007E 0AF0AA
0013B4 44F400 028000 200042 5C2B00 00000C 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
```

000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 000000 000000 000000 000000 000000 000000 000000 000000 000000
000000 F40000 000A60 F40000 3FD961 278000 000706 D88700 598707 F08007
3FD90A F40000 800061 000000 F40030 2AAA47 C70000 3FE506 038000 3FE406
D98A00 08A007 002206 588C20 028007 3FEA06 D98A00 08A007 002206 F40020
800061 F4A400 009408 F4A200 4EF408 D98A00 08A007 002206 588C20 F40007
152E47 C70000 3FFE06 038000 3FFD06 D98A00 08A007 002206 588C20 000007
00000C 00268D 003CCC 005BD7 006C50 007557 007B19 007F1C 008213 00845B
00862B 0087A6 0088E0 0089E9 008ACD 008B91 008C3E 008CD6 008D5D 008DD6
008E43 008EA6 008F00 008F52 008F9E 008FE3 009024 009060 009097 0090CB
0090FC 00912A 009154 00917D 0091A3 0091C7 0091E9 00920A 009229 009246
009262 00927D 009297 0092AF 0092C7 0092DD 0092F3 009308 00931C 00932F
009342 009354 009365 009376 009387 009396 0093A6 0093B5 0093C3 0093D1
0093DF 0093EC 0093F9 009406 009412 00941E 00942A 009435 009441 00944C
009456 009461 00946B 009475 00947F 009489 009492 00949C 0094A5 0094AE
0094B7 0094BF 0094C8 0094D0 0094D9 0094E1 0094E9 0094F1 0094F9 009501
009508 009510 009517 00951F 009526 00952D 009534 00953C 009543 00954A
009550 009557 00955E 009565 00956B 009572 009579 00957F 009586 00958C
009592 009599 00959F 0095A5 0095AC 0095B2 0095B8 0095BE 0095C5 0095CB
0095D1 0095D7 0095DD 0095E3 0095E9 0095EF 0095F5 0095FC 009602 009608
00960E 009614 00961A 009620 009626 00962C 009632 009639 00963F 009645
00964B 009651 009658 00965E 009664 00966B 009671 009677 00967E 009684
00968B 009691 009698 00969F 0096A5 0096AC 0096B3 0096BA 0096C1 0096C8
0096CF 0096D6 0096DD 0096E5 0096EC 0096F3 0096FB 009703 00970A 009712
00971A 009722 00972B 009733 00973B 009744 00974D 009756 00975F 009768

| | | | | | | | | | |
|---|---|---|---|---|---|---|---|---|---|
| 009771 | 00977B | 009784 | 00978E | 009798 | 0097A2 | 0097AD | 0097B8 | 0097C3 | 0097CE |
| 0097D9 | 0097E5 | 0097F1 | 0097FD | 00980A | 009817 | 009824 | 009832 | 009840 | 00984E |
| 00985D | 00986D | 00987C | 00988D | 00989E | 0098AF | 0098C1 | 0098D4 | 0098E7 | 0098FB |
| 009910 | 009926 | 00993C | 009954 | 00996C | 009986 | 0099A1 | 0099BD | 0099DA | 0099F9 |
| 009A19 | 009A3C | 009A60 | 009A86 | 009AAE | 009AD9 | 009B07 | 009B37 | 009B6B | 009BA3 |
| 009BDE | 009C1F | 009C64 | 009CB0 | 009D02 | 009D5C | 009DBE | 009E2B | 009EA4 | 009F2B |
| 009FC3 | 00A06E | 00A133 | 00A215 | 00A31E | 00A457 | 00A5D0 | 00A79F | 00A9E4 | 00ACD7 |
| 00B0D3 | 00B68A | 00BF7C | 00CFC1 | 00F7FA | 009C3D | 3FB2E6 | 3F8669 | 3F4852 | 3F2760 |
| 3F1551 | 3F09CE | 3F01C8 | 3EFBDB | 3EF74A | 3EF3AA | 3EF0B5 | 3EEE40 | 3EEC2D | 3EEA67 |
| 3EE8DD | 3EE785 | 3EE655 | 3EE546 | 3EE454 | 3EE37A | 3EE2B4 | 3EE200 | 3EE15C | 3EE0C5 |
| 3EE039 | 3EDFB8 | 3EDF41 | 3EDED1 | 3EDE69 | 3EDE08 | 3EDDAD | 3EDD57 | 3EDD06 | 3EDCBA |
| 3EDC72 | 3EDC2D | 3EDBEC | 3EDBAE | 3EDB74 | 3EDB3C | 3EDB06 | 3EDAD3 | 3EDAA2 | 3EDA73 |
| 3EDA45 | 3EDA1A | 3ED9F0 | 3ED9C8 | 3ED9A1 | 3ED97C | 3ED958 | 3ED935 | 3ED913 | 3ED8F3 |
| 3ED8D3 | 3ED8B4 | 3ED897 | 3ED87A | 3ED85D | 3ED842 | 3ED828 | 3ED80E | 3ED7F4 | 3ED7DC |
| 3ED7C4 | 3ED7AC | 3ED795 | 3ED77F | 3ED769 | 3ED753 | 3ED73F | 3ED72A | 3ED716 | 3ED702 |
| 3ED6EF | 3ED6DC | 3ED6C9 | 3ED6B7 | 3ED6A5 | 3ED693 | 3ED681 | 3ED670 | 3ED65F | 3ED64F |
| 3ED63E | 3ED62E | 3ED61E | 3ED60E | 3ED5FF | 3ED5EF | 3ED5E0 | 3ED5D1 | 3ED5C3 | 3ED5B4 |
| 3ED5A5 | 3ED597 | 3ED589 | 3ED57B | 3ED56D | 3ED55F | 3ED552 | 3ED544 | 3ED537 | 3ED529 |
| 3ED51C | 3ED50F | 3ED502 | 3ED4F5 | 3ED4E8 | 3ED4DB | 3ED4CE | 3ED4C2 | 3ED4B5 | 3ED4A9 |
| 3ED49C | 3ED490 | 3ED483 | 3ED477 | 3ED46B | 3ED45E | 3ED452 | 3ED446 | 3ED43A | 3ED42D |
| 3ED421 | 3ED415 | 3ED409 | 3ED3FD | 3ED3F1 | 3ED3E4 | 3ED3D8 | 3ED3CC | 3ED3C0 | 3ED3B4 |
| 3ED3A7 | 3ED39B | 3ED38F | 3ED382 | 3ED376 | 3ED36A | 3ED35D | 3ED351 | 3ED344 | 3ED338 |
| 3ED32B | 3ED31E | 3ED311 | 3ED305 | 3ED2F8 | 3ED2EA | 3ED2DD | 3ED2D0 | 3ED2C3 | 3ED2B5 |
| 3ED2A8 | 3ED29A | 3ED28C | 3ED27E | 3ED270 | 3ED262 | 3ED254 | 3ED246 | 3ED237 | 3ED228 |
| 3ED219 | 3ED20A | 3ED1FB | 3ED1EB | 3ED1DB | 3ED1CB | 3ED1BB | 3ED1AB | 3ED19A | 3ED189 |
| 3ED178 | 3ED167 | 3ED155 | 3ED143 | 3ED131 | 3ED11E | 3ED10B | 3ED0F7 | 3ED0E4 | 3ED0D0 |
| 3ED0BB | 3ED0A6 | 3ED091 | 3ED07B | 3ED064 | 3ED04D | 3ED036 | 3ED01E | 3ED005 | 3ECFEC |
| 3ECFD2 | 3ECFB7 | 3ECF9C | 3ECF80 | 3ECF63 | 3ECF45 | 3ECF27 | 3ECF07 | 3ECEE6 | 3ECEC5 |
| 3ECEA2 | 3ECE7E | 3ECE58 | 3ECE32 | 3ECE0A | 3ECDE0 | 3ECDB5 | 3ECD87 | 3ECD58 | 3ECD27 |
| 3ECCF4 | 3ECCBF | 3ECC87 | 3ECC4C | 3ECC0E | 3ECBCD | 3ECB89 | 3ECB41 | 3ECAF4 | 3ECAA4 |
| 3ECA4E | 3EC9F3 | 3EC992 | 3EC92A | 3EC8BB | 3EC843 | 3EC7C2 | 3EC737 | 3EC6A0 | 3EC5FC |
| 3EC548 | 3EC483 | 3EC3A9 | 3EC2B8 | 3EC1AA | 3EC07B | 3EBF23 | 3EBD9A | 3EBBD5 | 3EB9C4 |
| 3EB751 | 3EB460 | 3EB0C3 | 3EAC38 | 3EA653 | 3E9E5A | 3E92EC | 3E8108 | 3E607D | 3E100C |
| 3EC785 | 804DF2 | 807B80 | 80BEF2 | 80EB95 | 810E57 | 812F7E | 815210 | 81776E | 81A050 |
| 81CD23 | 81FE27 | 823386 | 826D5D | 82ABBF | 82EEB8 | 833651 | 838291 | 83D37C | 842913 |
| 848359 | 84E24C | 8545EC | 85AE37 | 861B2B | 868CC7 | 870306 | 877DE5 | 87FD62 | 888176 |
| 890A20 | 899758 | 8A291C | 8ABF65 | 8B5A2F | 8BF973 | 8C9D2C | 8D4554 | 8DF1E6 | 8EA2D9 |
| 8F5828 | 9011CC | 90CFBF | 9191F8 | 925871 | 932321 | 93F203 | 94C50C | 959C36 | 967779 |
| 9756CB | 983A25 | 99217D | 9A0CCB | 9AFC06 | 9BEF25 | 9CE61E | 9DE0E8 | 9EDF7A | 9FE1C9 |
| A0E7CB | A1F177 | A2FEC2 | A40FA3 | A5240E | A63BF9 | A75759 | A87623 | A9984C | AABDCA |
| ABE690 | AD1293 | AE41C9 | AF7424 | B0A99A | B1E21E | B31DA4 | B45C21 | B59D88 | B6E1CC |
| B828E2 | B972BC | BABF4D | BC0E8A | BD6065 | BEB4D1 | C00BC1 | C16527 | C2C0F7 | C41F23 |
| C57F9E | C6E25A | C84748 | C9AE5D | CB1789 | CC82BF | CDEFF1 | CF5F10 | D0D00F | D242DF |
| D3B773 | D52DBB | D6A5A9 | D81F2F | D99A3F | DB16C9 | DC94BF | DE1412 | DF94B3 | E11695 |
| E299A7 | E41DDB | E5A321 | E7296C | E8B0AB | EA38D1 | EBC1CC | ED4B90 | EED60B | F06130 |
| F1ECEF | F37938 | F505FC | F6932D | F820BA | F9AE95 | FB3CAE | FCCAF5 | FE595C | FFE7D3 |
| 01764A | 0304B3 | 0492FD | 06211A | 07AEFB | 093C8F | 0AC9C8 | 0C5696 | 0DE2EA | 0F6EB4 |
| 10F9E6 | 128470 | 140E43 | 159750 | 171F88 | 18A6DA | 1A2D3A | 1BB296 | 1D36E1 | 1EBA0B |
| 203C06 | 21BCC2 | 233C31 | 24BA44 | 2636EC | 27B21A | 292BC0 | 2AA3D0 | 2C1A3B | 2D8EF1 |
| 2F01E6 | 30730B | 31E251 | 334FAA | 34BB08 | 36245E | 378B9C | 38F0B7 | 3A539E | 3BB446 |
| 3D12A0 | 3E6E9F | 3FC835 | 411F55 | 4273F2 | 43C5FF | 45156E | 466233 | 47AC41 | 48F38B |
| 4A3804 | 4B79A0 | 4CB853 | 4DF410 | 4F2CCB | 506278 | 51950A | 52C477 | 53F0B3 | 5519B1 |

```
563F67 5761C8 5880CB 599C63 5AB485 5BC928 5CDA40 5DE7C2 5EF1A5 5FF7DD
60FA62 61F927 62F425 63EB51 64DEA1 65CE0D 66B98A 67A110 688495 696411
6A3F7C 6B16CB 6BE9F8 6CB8F9 6D83C7 6E4A5A 6F0CA9 6FCAAE 708460 7139B8
71EAB0 72973F 733F60 73E30A 748238 751CE2 75B303 764494 76D18E 7759EC
77DDA8 785CBA 78D71E 794CCD 79BDC1 7A29F3 7A915E 7AF3FA 7B51C0 7BAAA8
7BFEA9 7C4DBA 7C97CE 7CDCD7 7D1CC3 7D577A 7D8CDC 7DBCBB 7DE6D1 7E0AB1
7E279F 7E3C36 7E4570 7E3B05 7DFB0B 7EBC99 019EF0 02D66C 02B25A 02495B
021C52 02030C 01F2CC 01E76F 01DF07 01D88D 01D367 01CF36 01CBBA 01C8CA
01C645 01C418 01C230 01C081 01BF02 01BDAB 01BC77 01BB5F 01BA60 01B978
01B8A2 01B7DD 01B726 01B67D 01B5E0 01B54D 01B4C4 01B443 01B3C9 01B357
01B2EB 01B285 01B225 01B1C9 01B172 01B11F 01B0CF 01B084 01B03B 01AFF6
01AFB4 01AF74 01AF37 01AEFC 01AEC3 01AE8D 01AE58 01AE25 01ADF4 01ADC4
01AD96 01AD69 01AD3E 01AD14 01ACEB 01ACC4 01AC9D 01AC77 01AC53 01AC2F
01AC0C 01ABEB 01ABC9 01ABA9 01AB8A 01AB6B 01AB4C 01AB2F 01AB12 01AAF5
01AADA 01AABE 01AAA3 01AA89 01AA6F 01AA56 01AA3D 01AA24 01AA0C 01A9F4
01A9DD 01A9C5 01A9AF 01A998 01A982 01A96C 01A956 01A941 01A92C 01A917
01A903 01A8EE 01A8DA 01A8C6 01A8B2 01A89F 01A88B 01A878 01A865 01A852
01A83F 01A82C 01A81A 01A808 01A7F5 01A7E3 01A7D1 01A7BF 01A7AD 01A79C
01A78A 01A778 01A767 01A755 01A744 01A732 01A721 01A710 01A6FF 01A6ED
01A6DC 01A6CB 01A6BA 01A6A9 01A698 01A687 01A675 01A664 01A653 01A642
01A631 01A620 01A60E 01A5FD 01A5EC 01A5DA 01A5C9 01A5B7 01A5A6 01A594
01A582 01A570 01A55E 01A54C 01A53A 01A528 01A516 01A503 01A4F0 01A4DE
01A4CB 01A4B8 01A4A4 01A491 01A47E 01A46A 01A456 01A442 01A42D 01A419
01A404 01A3EF 01A3D9 01A3C4 01A3AE 01A398 01A381 01A36B 01A354 01A33C
01A324 01A30C 01A2F4 01A2DB 01A2C1 01A2A7 01A28D 01A272 01A257 01A23B
01A21F 01A202 01A1E5 01A1C6 01A1A8 01A188 01A168 01A147 01A125 01A102
01A0DF 01A0BA 01A095 01A06E 01A047 01A01E 019FF4 019FC9 019F9D 019F6F
019F3F 019F0E 019EDC 019EA7 019E71 019E38 019DFE 019DC1 019D81 019D3F
019CFA 019CB2 019C67 019C18 019BC6 019B6F 019B14 019AB4 019A4F 0199E3
019972 0198FA 01987A 0197F1 01975F 0196C3 01961C 019567 0194A4 0193D0
0192E9 0191EE 0190D9 018FA8 018E55 018CDB 018B32 018950 01872B 0184B0
0181CB 017E5E 017A3F 017531 016ED4 01668E 015B55 014B1B 01312D 00FFAD
00B574 3F2007 3E85D1 3E607D 3E8108 3E92EC 3E9E5A 3EA653 3EAC38 3EB0C3
3EB460 3EB751 3EB9C4 3EBBD5 3EBD9A 3EBF23 3EC07B 3EC1AA 3EC2B8 3EC3A9
3EC483 3EC548 3EC5FC 3EC6A0 3EC737 3EC7C2 3EC843 3EC8BB 3EC92A 3EC992
3EC9F3 3ECA4E 3ECAA4 3ECAF4 3ECB41 3ECB89 3ECBCD 3ECC0E 3ECC4C 3ECC87
3ECCBF 3ECCF4 3ECD27 3ECD58 3ECD87 3ECDB5 3ECDE0 3ECE0A 3ECE32 3ECE58
3ECE7E 3ECEA2 3ECEC5 3ECEE6 3ECF07 3ECF27 3ECF45 3ECF63 3ECF80 3ECF9C
3ECFB7 3ECFD2 3ECFEC 3ED005 3ED01E 3ED036 3ED04D 3ED064 3ED07B 3ED091
3ED0A6 3ED0BB 3ED0D0 3ED0E4 3ED0F7 3ED10B 3ED11E 3ED131 3ED143 3ED155
3ED167 3ED178 3ED189 3ED19A 3ED1AB 3ED1BB 3ED1CB 3ED1DB 3ED1EB 3ED1FB
3ED20A 3ED219 3ED228 3ED237 3ED246 3ED254 3ED262 3ED270 3ED27E 3ED28C
3ED29A 3ED2A8 3ED2B5 3ED2C3 3ED2D0 3ED2DD 3ED2EA 3ED2F8 3ED305 3ED311
3ED31E 3ED32B 3ED338 3ED344 3ED351 3ED35D 3ED36A 3ED376 3ED382 3ED38F
3ED39B 3ED3A7 3ED3B4 3ED3C0 3ED3CC 3ED3D8 3ED3E4 3ED3F1 3ED3FD 3ED409
3ED415 3ED421 3ED42D 3ED43A 3ED446 3ED452 3ED45E 3ED46B 3ED477 3ED483
3ED490 3ED49C 3ED4A9 3ED4B5 3ED4C2 3ED4CE 3ED4DB 3ED4E8 3ED4F5 3ED502
3ED50F 3ED51C 3ED529 3ED537 3ED544 3ED552 3ED55F 3ED56D 3ED57B 3ED589
3ED597 3ED5A5 3ED5B4 3ED5C3 3ED5D1 3ED5E0 3ED5EF 3ED5FF 3ED60E 3ED61E
3ED62E 3ED63E 3ED64F 3ED65F 3ED670 3ED681 3ED693 3ED6A5 3ED6B7 3ED6C9
3ED6DC 3ED6EF 3ED702 3ED716 3ED72A 3ED73F 3ED753 3ED769 3ED77F 3ED795
3ED7AC 3ED7C4 3ED7DC 3ED7F4 3ED80E 3ED828 3ED842 3ED85D 3ED87A 3ED897
```

```
3ED8B4  3ED8D3  3ED8F3  3ED913  3ED935  3ED958  3ED97C  3ED9A1  3ED9C8  3ED9F0
3EDA1A  3EDA45  3EDA73  3EDAA2  3EDAD3  3EDB06  3EDB3C  3EDB74  3EDBAE  3EDBEC
3EDC2D  3EDC72  3EDCBA  3EDD06  3EDD57  3EDDAD  3EDE08  3EDE69  3EDED1  3EDF41
3EDFB8  3EE039  3EE0C5  3EE15C  3EE200  3EE2B4  3EE37A  3EE454  3EE546  3EE655
3EE785  3EE8DD  3EEA67  3EEC2D  3EEE40  3EF0B5  3EF3AA  3EF74A  3EFBDB  3F01C8
3F09CE  3F1551  3F2760  3F4852  3F9A58  3FA801  80E720  818CD3  81C4FB  81BA90
81C3CA  81D861  81F54F  82192F  824345  827324  82A886  82E33D  832329  836832
83B246  840157  845558  84AE40  850C06  856EA2  85D60D  86423F  86B333  8728E2
87A346  882258  88A614  892E72  89BB6C  8A4CFD  8AE31E  8B7DC8  8C1CF6  8CC0A0
8D68C1  8E1550  8EC648  8F7BA0  903552  90F357  91B5A6  927C39  934707  941608
94E935  95C084  969BEF  977B6B  985EF0  994676  9A31F3  9B215F  9C14AF  9D0BDB
9E06D9  9F059E  A00823  A10E5B  A2183E  A325C0  A436D8  A54B7B  A6639D  A77F35
A89E38  A9C099  AAE64F  AC0F4D  AD3B89  AE6AF6  AF9D88  B0D335  B20BF0  B347AD
B48660  B5C7FC  B70C75  B853BF  B99DCD  BAEA92  BC3A01  BD8C0E  BEE0AB  C037CB
C19161  C2ED60  C44BBA  C5AC62  C70F49  C87464  C9DBA2  CB44F8  CCB056  CE1DAF
CF8CF5  D0FE1A  D2710F  D3E5C5  D55C30  D6D440  D84DE6  D9C914  DB45BC  DCC3CF
DE433E  DFC3FA  E145F5  E2C91F  E44D6A  E5D2C6  E75926  E8E078  EA68B0  EBF1BD
ED7B90  EF061A  F0914C  F21D16  F3A96A  F53638  F6C371  F85105  F9DEE6  FB6D03
FCFB4D  FE89B6  00182D  01A6A4  03350B  04C352  06516B  07DF46  096CD3  0AFA04
0C86C8  0E1311  0F9ED0  1129F5  12B470  143E34  15C72F  174F55  18D694  1A5CDF
1BE225  1D6659  1EE96B  206B4D  21EBEE  236B41  24E937  2665C1  27E0D1  295A57
2AD245  2C488D  2DBD21  2F2FF1  30A0F0  32100F  337D41  34E877  3651A3  37B8B8
391DA6  3A8062  3BE0DD  3D3F09  3E9AD9  3FF43F  414B2F  429F9B  43F176  4540B3
468D44  47D71E  491E34  4A6278  4BA3DF  4CE25C  4E1DE2  4F5666  508BDC  51BE37
52ED6D  541970  554236  5667B4  5789DD  58A8A7  59C407  5ADBF2  5BF05D  5D013E
5E0E89  5F1835  601E37  612086  621F18  6319E2  6410DB  6503FA  65F335  66DE83
67C5DB  68A935  698887  6A63CA  6B3AF4  6C0DFD  6CDCDF  6DA78F  6E6E08  6F3041
6FEE34  70A7D8  715D27  720E1A  72BAAC  7362D4  74068D  74A5D1  75409B  75D6E4
7668A8  76F5E0  777E8A  78029E  78821B  78FCFA  797339  79E4D5  7A51C9  7ABA14
7B1DB4  7B7CA7  7BD6ED  7C2C84  7C7D6F  7CC9AF  7D1148  7D5441  7D92A3  7DCC7A
7E01D9  7E32DD  7E5FB0  7E8892  7EADF0  7ED082  7EF1A9  7F146B  7F410E  7F9979
7FA725  024C30  0252C7  02595C  025FE5  026656  026CBD  02731A  02796C  027FB5
0285F2  028C25  02924D  029869  029E7A  02A47F  02AA77  02B064  02B645  02BC19
02C1E0  02C79A  02CD46  02D2E6  02D877  02DDFB  02E371  02E8D9  02EE32  02F37D
02F8B9  02FDE6  030304  030813  030D12  031202  0316E1  031BB1  032070  03251F
0329BE  032E4C  0332C9  033735  033B8F  033FD9  034411  034837  034C4C  03504E
03543F  03581D  035BE9  035FA2  036349  0366DD  036A5E  036DCC  037126  03746E
0377A2  037AC2  037DCF  0380C8  0383AD  03867E  03893B  038BE3  038E77  0390F7
039362  0395B9  0397FA  039A27  039C3F  039E42  03A02F  03A208  03A3CB  03A578
03A710  03A893  03AA00  03AB57  03AC98  03ADC4  03AED9  03AFD9  03B0C3  03B196
03B253  03B2FA  03B38B  03B405  03B469  03B4B7  03B4EE  03B50E  03B518  03B50C
03B4E8  03B4AE  03B45E  03B3F6  03B378  03B2E3  03B238  03B175  03B09C  03AFAC
03AEA4  03AD87  03AC52  03AB06  03A9A3  03A82A  03A69A  03A4F2  03A334  03A15F
039F74  039D71  039B57  039927  0396E0  039482  03920E  038F83  038CE1  038A29
038759  038474  038178  037E65  037B3C  0377FD  0374A7  03713B  036DB9  036A21
036672  0362AE  035ED3  035AE3  0356DD  0352C1  034E90  034A48  0345EC  03417A
033CF2  033856  0333A4  032EDD  032A01  032510  03200B  031AF1  0315C2  03107F
030B27  0305BC  03003C  02FAA8  02F500  02EF45  02E976  02E393  02DD9E  02D794
02D178  02CB49  02C507  02BEB3  02B84C  02B1D2  02AB47  02A4A9  029DF9  029738
029065  028981  02828C  027B85  02746E  026D46  02660D  025EC4  02576B  025002
024889  024100  023969  0231C1  022A0B  022246  021A73  021291  020AA1  0202A3
01FA97  01F27D  01EA57  01E223  01D9E2  01D194  01C93B  01C0D5  01B863  01AFE5
```

```
01A75C 019EC7 019628 018D7D 0184C8 017C09 017340 016A6D 016191 0158AB
014FBD 0146C5 013DC6 0134BE 012BAE 012296 011977 011051 010724 00FDF1
00F4B7 00EB77 00E232 00D8E7 00CF97 00C642 00BCE8 00B38B 00AA29 00A0C4
00975B 008DEF 008481 007B10 0072B5 007367 007419 0074CB 00757E 007632
0076E6 00779B 007850 007906 0079BC 007A73 3B67A0 3B5A73 3B4D49 3B4036
3B3355 3B2687 3B19CD 3B0D27 3B0097 3AF41C 3AE7B6 3ADB67 3ACF2E 3AC30D
3AB703 3AAB11 3A9F37 3A9377 3A87CF 3A7C41 3A70CD 3A6573 3A5A35 3A4F11
3A4409 3A391D 3A2E4E 3A239B 3A1906 3A0E8E 3A0433 39F9F7 39EFDA 39E5DC
39DBFD 39D23E 39C89E 39BF20 39B5C2 39AC84 39A369 399A6F 399197 3988E1
39804E 3977DE 396F92 396769 395F64 395783 394FC6 39482E 3940BC 39396E
393246 392B44 392468 391DB3 391724 3910BC 390A7B 390462 38FE70 38F8A6
38F304 38ED8B 38E83A 38E311 38DE12 38D93C 38D48F 38D00B 38CBB2 38C782
38C37D 38BFA2 38BBF1 38B86B 38B510 38B1DF 38AEDA 38AC00 38A952 38A6CF
38A478 38A24D 38A04E 389E7B 389CD4 389B5A 389A0C 3898EA 3897F6 38972E
389693 389624 3895E3 3895CF 3895E9 38962F 3896A3 389744 389813 38990F
389A39 389B91 389D16 389EC9 38A0A9 38A2B7 38A4F3 38A75D 38A9F4 38ACB9
38AFAC 38B2CD 38B61B 38B997 38BD41 38C119 38C51E 38C951 38CDB1 38D23F
38D6FB 38DBE4 38E0FA 38E63E 38EBAF 38F14D 38F718 38FD10 390336 390988
391006 3916B2 391D8A 39248E 392BBF 39331C 393AA4 394259 394A3A 395246
395A7E 3962E1 396B6F 397428 397D0D 39861B 398F55 3998B8 39A246 39ABFE
39B5DF 39BFEA 39CA1E 39D47C 39DF02 39E9B1 39F489 39FF88 3A0AB0 3A15FF
3A2176 3A2D14 3A38D9 3A44C5 3A50D7 3A5D0F 3A696E 3A75F1 3A829B 3A8F69
3A9C5B 3AA973 3AB6AE 3AC40D 3AD190 3ADF35 3AECFE 3AFAE9 3B08F6 3B1724
3B2574 3B33E6 3B4278 3B512A 3B5FFC 3B6EEE 3B7DFF 3B8D2F 3B9C7D 3BABE9
3BBB73 3BCB1A 3BDADE 3BEABF 3BFABB 3C0AD3 3C1B05 3C2B53 3C3BBB 3C4C3C
3C5CD7 3C6D8B 3C7E57 3C8F3B 3CA036 3CB149 3CC272 3CD3B1 3CE506 3CF66F
3D07ED 3D1980 3D2B25 3D3CDE 3D4EA9 3D6086 3D7275 3D8475 3D9685 3DA8A5
3DBAD4 3DCD12 3DDF5E 3DF1B8 3E041F 3E1692 3E2912 3E3B9D 3E4E33 3E60D3
3E737C 3E862F 3E98EB 3EABAE 3EBE78 3ED14A 3EE421 3EF6FE 3F09E0 3F1A96
3F1933 3F17CF 3F166A 3F1503 3F139C 3F1234 3F10CA 3F0F60 3F0DF4 3F0C87
3F0B19 84B61A 84C3DD 84D19D 84E5CB 850806 852EE5 855A67 858A88 85BF46
85F89B 863686 867903 86C00D 870BA1 875BBB 87B056 88096D 8866FE 88C902
892F74 899A51 8A0992 8A7D33 8AF52D 8B717D 8BF21B 8C7702 8D002C 8D8D93
8E1F31 8EB4FF 8F4EF8 8FED14 908F4D 91359B 91DFF9 928E5E 9340C5 93F724
94B176 956FB2 9631D1 96F7CB 97C198 988F30 99608B 9A35A2 9B0E6A 9BEADD
9CCAF2 9DAEA0 9E95DE 9F80A4 A06EE8 A160A2 A255C8 A34E52 A44A36 A5496A
A64BE6 A7519F A85A8C A966A4 AA75DC AB882A AC9D85 ADB5E3 AED138 AFEF7C
B110A4 B234A5 B35B75 B48509 B5B157 B6E055 B811F7 B94632 BA7CFC BBB649
BCF210 BE3044 BF70DA C0B3C8 C1F902 C3407C C48A2B C5D605 C723FC C87406
C9C618 CB1A24 CC7021 CDC801 CF21B9 D07D3D D1DA82 D3397B D49A1C D5FC59
D76026 D8C577 DA2C3F DB9473 DCFE06 DE68EC DFD518 E1427E E2B111 E420C6
E5918F E70360 E8762D E9E9E8 EB5E86 ECD3F9 EE4A34 EFC12C F138D3 F2B11D
F429FD F5A365 F71D49 F8979D FA1253 FB8D5F FD08B2 FE8442 000000 017BE0
02F7D4 0473D0 05EFC7 076BAB 08E770 0A6308 0BDE67 0D5980 0ED445 104EA9
11C89F 13421B 14BB0F 16336E 17AB2B 192239 1A988B 1C0E14 1D82C7 1EF697
206976 21DB59 234C31 24BBF2 262A8E 2797FA 290427 2A6F0A 2BD895 2D40BA
2EA76F 300CA4 31704F 32D261 3432CE 35918A 36EE87 3849BA 39A315 3AFA8B
3C5011 3DA399 3EF517 404480 4191C5 42DCDB 4425B6 456C49 46B087 47F266
4931D8 4A6ED2 4BA948 4CE12C 4E1675 4F4915 507901 51A62D 52D08E 53F818
551CBE 563E77 575D36 5878F0 599199 5AA727 5BB98F 5CC8C5 5DD4BE 5EDD70
5FE2CF 60E4D2 61E36C 62DE95 63D641 64CA65 65BAF9 66A7F1 679143 6876E6
6958D0 6A36F6 6B1150 6BE7D3 6CBA76 6D8930 6E53F8 6F1AC4 6FDD8C 709C46
```

```
7156EA 720D70 72BFCE 736DFD 7417F4 74BDAA 755F19 75FC38 769500 772968
77B96A 7844FE 78CC1D 794EC0 79CCE0 7A4677 7ABB7E 7B2BEE 7B97C1 7BFEF2
7C617A 7CBF54 7D1879 7D6CE5 7DB3D3 7DB05D 7DACE4 7DA969 7DA5EB 7DA26B
7D9EE8 7D9B63 7D97DB 7D9450 7D90C3 7D8D33 3E9013 3D98F9 3CA54A 3BB50F
3AC84B 39DF01 38F933 3816E1 37380B 365CAD 3584C4 34B04B 33DF3D 331194
324748 318052 30BCAA 2FFC46 2F3F1D 2E8525 2DCE55 2D1AA1 2C69FF 2BBC64
2B11C4 2A6A15 29C54A 292359 288435 27E7D3 274E27 26B726 2622C3 2590F4
2501AC 2474E0 23EA85 23628F 22DCF3 2259A6 21D89D 2159CD 20DD2B 2062AE
1FEA4A 1F73F5 1EFFA5 1E8D50 1E1CEC 1DAE70 1D41D3 1CD70A 1C6E0D 1C06D3
1BA153 1B3D84 1ADB5E 1A7AD9 1A1BEC 19BE8F 1962BB 190868 18AF8E 185827
18022A 17AD90 175A54 17086D 16B7D6 166888 161A7C 15CDAC 158213 1537AA
14EE6C 14A652 145F57 141976 13D4A9 1390EC 134E39 130C8A 12CBDC 128C29
124D6D 120FA3 11D2C7 1196D5 115BC7 11219A 10E84A 10AFD3 107831 104160
100B5C 0FD622 0FA1AF 0F6DFD 0F3B0C 0F08D6 82E067 84D038 86BA34 889E43
8A7C4F 8C5446 8E261A 8FF1BF 91B730 937666 952F5E 96E21A 988E9B 9A34E6
9BD500 9D6EF2 9F02C5 A09084 A2183A A399F5 A515C3 A68BB4 A7FBD6 A9663C
AACAF5 AC2A14 AD83AC AED7CE B0268F B17001 B2B438 B3F347 B52D43 B66240
B79251 B8BD8B B9E402 BB05C9 BC22F5 BD3B99 BE4FC9 BF5F98 C06B1A C17262
C27583 C37490 C46F9B C566B7 C659F5 C74968 C83521 C91D32 CA01AC CAE29F
CBC01C CC9A33 CD70F5 CE4471 CF14B6 CFE1D5 D0ABDB D172D8 D236DA D2F7EF
D3B625 D4718A D52A2A D5E014 D69353 D743F5 D7F207 D89D93 D946A6 D9ED4B
DA918F DB337C DBD31C DC707C DD0BA5 DDA4A2 DE3B7C DED03E DF62F1 DFF39F
E08250 E10F0F E199E4 E222D7 E2A9F2 E32F3C E3B2BE E4347F E4B488 E532E0
E5AF8F E62A9C E6A40E E71BEC E7923E E80709 7E026B 7C01FD 79FF3C 77FAA4
75F4AA 73EDBD 71E643 6FDE9E 6DD727 6BD034 69CA12 67C50D 65C167 63BF60
61BF34 5FC117 5DC53C 5BCBD2 59D502 57E0F4 55EFCB 5401A8 5216A7 502EE4
4E4A76 4C6974 4A8BF0 48B1FB 46DBA4 4508F8 433A04 416ECF 3FA763 3DE3C6
3C23FC 3A680B 38AFF5 36FBBA 354B5D 339EDD 31F638 30516D 2EB078 2D1356
2B7A04 29E47B 2852B8 26C4B4 253A69 23B3D1 2230E4 20B19A 1F35EE 1DBDD5
1C4948 1AD840 196AB2 180096 1699E3 153691 13D695 1279E7 11207C 0FCA4C
0E774D 0D2776 0BDABC 0A9116 094A7A 0806DF 06C63B 058885 044DB3 0315BB
01E094 00AE35 FF7E93 FE51A6 FD2765 FBFFC6 FADABF F9B849 F8985A F77AE9
F65FED F5475D F43131 F31D61 F20BE4 F0FCB0 EFEFBF EEE508 EDDC83 ECD628
EBD1EE EACFCF E9CFC2 E8D1C0 E7D5C1 E6DBBE C1F429 C3D8E6 C5AE8C C77571
C92DEA CAD84D CC74F1 CE042B CF8650 D0FBB4 D264AB D3C188 D5129B D65837
D792A8 D8C23F D9E745 DB0208 DC12D0 DD19E4 DE178C DF0C0C DFF7A7 E0DA9F
E1B534 E287A4 E3522D E41508 E4D070 E5849E E631C7 E6D821 E777DF E81133
E8A44F E93161 E9B897 EA3A1E EAB621 EB2CCB EB9E43 ECOAB2 EC723D ECD50A
ED333D ED8CF8 EDE25E EE338F EE80AA EEC9CF EF0F1C EF50AC EF8E9D EFC909
F0000B F033BB F06432 F09189 F0BBD6 F0E32F F107AA F1295D F1485B F164B7
F17E85 F195D8 F1AAC0 F1BD50 F1CD98 F1DBA7 F1E78E F1F15C F1F920 F1FEE6
F202BF F204B5 F204D7 F20331 F1FFCF F1FABC F1F405 F1EBB3 F1E1D1 F1D66A
F1C987 F1BB33 F1AB76 F19A59 F187E6 F17424 F15F1B F148D4 F13157 F118AA
F0FED4 F0E3DE F0C7CD F0AAA7 F08C74 F06D39 3C468F 3C2A34 3C0CF7 3BEEDD
3BCFE9 3BB01F 3B8F83 3B6E1A 3B4BE7 3B28F0 3B0537 3AE0C3 3ABB96 3A95B6
3A6F27 3A47EE 3A200F 39F78E 39CE71 39A4BC 397A74 394F9D 39243C 38F856
38CBF0 389F0D 3871B3 3843E6 3815AB 37E706 37B7FD 378893 3758CE 3728B1
36F841 36C782 36967A 36652B 36339B 3601CE 35CFC7 359D8C 356B1F 353886
3505C4 34D2DD 349FD5 346CAF 343970 34061B 33D2B3 339F3D 336BBB 333832
3304A4 32D115 329D87 3269FF 32367F 32030B 31CFA4 319C4F 31690D 3135E2
3102D0 30CFDB 309D03 306A4D 3037BA 30054D 2FD308 2FA0ED 2F6EFE 2F3D3E
2F0BAE 2EDA51 2EA928 2E7836 2E477B 2E16FB 2DE6B6 2DB6AE 2D86E4 2D575B
```

| | | | | | | | | | |
|---|---|---|---|---|---|---|---|---|---|
| 2D2813 | 2CF90F | 2CCA4F | 2C9BD4 | 2C6DA1 | 2C3FB6 | 2C1214 | 2BE4BC | 2BB7B0 | 2B8AF1 |
| 2B5E7F | 2B325B | 2B0687 | 2ADB03 | 2AAFD0 | 2A84EF | 877535 | 87B4DF | 87FAE7 | 88473D |
| 8899D0 | 88F290 | 89516C | 89B651 | 8A212D | 8A91EC | 8B087A | 8B84C2 | 8C06B0 | 8C8E2E |
| 8D1B26 | 8DAD82 | 8E452A | 8EE207 | 8F8402 | 902B02 | 90D6F0 | 9187B3 | 923D31 | 92F752 |
| 93B5FC | 947915 | 954085 | 960C31 | 96DBFF | 97AFD5 | 98879A | 996332 | 9A4283 | 9B2574 |
| 9C0BEB | 9CF5CC | 9DE2FE | 9ED367 | 9FC6ED | A0BD76 | A1B6E8 | A2B329 | A3B221 | A4B3B6 |
| A5B7CF | A6BE52 | A7C728 | A8D238 | A9DF69 | AAEEA4 | ABFFD1 | AD12D8 | AE27A2 | AF3E19 |
| B05625 | B16FB1 | B28AA5 | B3A6EE | B4C475 | B5E325 | B702E9 | B823AE | B9455E | BA67E7 |
| BB8B35 | BCAF34 | BDD3D3 | BEF8FE | C01EA4 | C144B3 | C26B1A | C391C8 | C4B8AC | C5DFB6 |
| C706D6 | C82DFD | C9551B | CA7C21 | CBA301 | CCC9AD | CDF017 | CF1631 | D03BEE | D16141 |
| D2861E | D3AA78 | D4CE44 | D5F176 | D71402 | D835DE | D956FF | DA775A | DB96E6 | DCB599 |
| DDD369 | DEF04D | E00C3B | E1272C | E24117 | E359F4 | 7FC243 | 7F7B9B | 7F2C18 | 7ED3D0 |
| 7E72D7 | 7E0942 | 7D972A | 7D1CA5 | 7C99CC | 7C0EB9 | 7B7B86 | 7AE04E | 7A3D2D | 799240 |
| 78DFA4 | 782577 | 7763D7 | 769AE3 | 75CABD | 74F382 | 741555 | 733056 | 7244A7 | 715269 |
| 7059C0 | 6F5ACC | 6E55B2 | 6D4A94 | 6C3995 | 6B22D8 | 6A0682 | 68E4B5 | 67BD95 | 669147 |
| 655FED | 6429AB | 62EEA5 | 61AEFF | 606ADB | 5F225E | 5DD5AB | 5C84E4 | 5B302D | 59D7A7 |
| 587B77 | 571BBD | 55B89C | 545235 | 52E8AA | 517C1C | 500CAB | 4E9A78 | 4D25A3 | 4BAE4B |
| 4A3490 | 48B890 | 473A6B | 45BA3D | 443825 | 42B440 | 412EAA | 3FA781 | 3E1EDF | 3C94E1 |
| 3B09A0 | 397D38 | 37EFC3 | 36615B | 34D218 | 334212 | 31B163 | 302022 | 2E8E66 | 2CFC46 |
| 2B69D8 | 29D732 | 284469 | 26B193 | 251EC3 | 238C0D | 21F986 | 206740 | 1ED54D | 1D43C0 |
| 1BB2AB | 1A221F | 18922C | 1702E3 | 157454 | 13E68F | 1259A2 | 10CD9D | 0F428D | 0DB882 |
| 0C2F87 | 0AA7AB | 0920FB | 079B81 | 06174C | 049466 | C03926 | C07214 | C0AAC5 | C0E336 |
| C11B60 | C15340 | C18AD1 | C1C210 | C1F8F7 | C22F83 | C265B0 | C29B7A | C2D0DD | C305D6 |
| C33A60 | C36E78 | C3A21B | C3D546 | C407F5 | C43A25 | C46BD3 | C49CFD | C4CD9F | C4FDB7 |
| C52D43 | C55C40 | C58AAB | C5B882 | C5E5C4 | C6126D | C63E7D | C669F2 | C694C9 | C6BF01 |
| C6E899 | C7118F | C739E2 | C76190 | C78899 | C7AEFC | C7D4B7 | C7F9CA | C81E33 | C841F4 |
| C86509 | C88774 | C8A934 | C8CA49 | C8EAB1 | C90A6E | C9297F | C947E3 | C9659C | C982A8 |
| C99F09 | C9BABE | C9D5C8 | C9F027 | CA09DC | CA22E7 | CA3B48 | CA5301 | CA6A11 | CA807A |
| CA963C | CAAB58 | CABFCF | CAD3A1 | CAE6D0 | CAF95D | CB0B48 | CB1C92 | CB2D3D | CB3D4A |
| CB4CB9 | CB5B8C | CB69C5 | CB7763 | CB8468 | CB90D6 | CB9CAE | CBA7F1 | CBB2A1 | CBBCBD |
| CBC649 | CBCF45 | CBD7B3 | CBDF94 | CBE6E9 | CBEDB3 | CBF3F5 | CBF9AF | CBFEE2 | CC0391 |
| CC07BD | CC0B66 | CC0E8F | CC1138 | CC1364 | CC1513 | 00A801 | 00A801 | 00A801 | 00A801 |
| 00A801 | 00A801 | 00A801 | 00A801 | 00A801 | 00A801 | 00A801 | 00C0F0 | 00DADC | 00F5BA |
| 01117D | 012E1C | 014B8E | 0169CB | 0188CC | 01A88B | 01C903 | 01EA2E | 020C09 | 022E8E |
| 0251BA | 02758A | 0299FB | 02BF09 | 02E4B3 | 030AF5 | 0331CD | 03593A | 03813A | 03A9CA |
| 03D2E8 | 03FC95 | 0426CD | 045191 | 047CDE | 04A8B3 | 04D50F | 0501F2 | 052F5A | 055D47 |
| 058BB8 | 05BAAB | 05EA21 | 061A18 | 064A91 | 067B89 | 06AD04 | 06DEF8 | 07116F | 074463 |
| 0777D9 | 07ABC9 | 07E037 | 08151E | 084A84 | 088067 | 08B6C3 | 08ED9E | 0924F2 | 095CC0 |
| 09950C | 09CDCD | 0A070C | 0A40C0 | 0A7AEE | 0AB595 | 0AF0B7 | 0B2C52 | 0B6862 | 0BA4EC |
| 0BE1EB | 0C1F64 | 0C5D53 | 0C9BB7 | 0CDA94 | 0D19E3 | 0D59AB | 0D99E5 | 0DDA98 | 0E1BBD |
| 0E5D57 | 0E9F66 | 0EE1E7 | 0F24D9 | 0F6840 | 0FAC19 | 0FF063 | 103522 | 107A4E | 10BFEC |
| 1105F7 | 114C73 | 11935C | 11DAB6 | 12227D | 126AB1 | 12B34E | 12FC59 | 1345D0 | 138FB0 |
| 13D9F9 | 1424AB | 146FC6 | 14BB49 | 150731 | 15537E | 15A030 | 15ED46 | 163ABD | 168898 |
| 16D6D4 | 17256C | 177464 | 17C3BD | 181373 | 186380 | 18B3EA | 1904AB | 1955C5 | 19A737 |
| 19F8FD | 1A4B16 | 1A9D80 | 1AF03D | 1B434A | 1B96A7 | 1BEA4B | 1C3E3E | 1C9279 | 1CE6FB |
| 1D3BC5 | 1D90D6 | 1DE625 | 1E3BB4 | 1E9186 | 1EE792 | 1F3DD9 | 1F945B | 1FEB14 | 204203 |
| 209924 | 20F078 | 2147FA | 219FA5 | 21F77F | 224F7F | 22A7A4 | 22FFEF | 23585C | 23B0E2 |
| 240989 | 24624A | 24BB1F | 25140A | 256D05 | 25C60D | 261F25 | 267846 | 26D16C | 272A95 |
| 2783BE | 27DCE8 | 28360D | 288F26 | 28E836 | 294135 | 299A24 | 29F2FE | 2A4BBE | 2AA461 |
| 2AFCE7 | 2B554C | 2BAD8A | 2C059F | 2C5D85 | 2CB53D | 2D0CBF | 2D640A | 2DBB1B | 2E11ED |
| 2E6877 | 2EBEBE | 2F14BE | 2F6A6A | 2FBFC6 | 3014CF | 30697B | 30BDC7 | 3111B2 | 316538 |
| 31B856 | 320B03 | 325D3E | 32AF04 | 330050 | 33511A | 33A162 | 33F124 | 34405B | 348F00 |

```
34DD12  352A8D  35776C  35C3A8  360F3D  365A2D  36A46E  36EDFA  3736D2  377EED
37C64C  380CE5  3852B5  3897BB  38DBF0  391F4F  3961D4  39A37B  39E443  3A2420
3A6317  3AA11F  3ADE2F  3B1A4C  3B556D  3B8F8E  3BC8AC  3C00C1  3C37CA  3C6DC2
3CA2A9  3CD673  3D0924  3D3AB8  3D6B23  3D9A6B  3DC886  3DF573  3E2129  3E4BAD
3E74F7  3E9D02  3EC3CA  3EE953  3F0D91  3F3083  3F522A  3F727E  3F9182  3FAF29
3FCB79  3FE66D  90C2CE  90C2CE  90C2CE  90C2CE  90C2CE  90C2CE  90C2CE  90C2CE
90C2CE  90C2CE  90C2CE  91EF20  931394  943151  954928  965B96  97696E  987304
9978D5  9A7B35  9B7AA2  9C7747  9D714C  9E692F  9F5F1C  A05311  A14563  A23611
A3259A  A413D3  A50111  A5ED29  A6D86F  A7C30D  A8AD04  A99653  AA7F24  AB67A1
AC4FA0  AD3776  AE1F21  AF06A3  AFEDFA  B0D552  B1BCD3  B2A42B  B38BD6  B47382
B55B81  B643D4  B72C52  B81523  B8FE48  B9E7EA  BAD1E1  BBBC7F  BCA772  BD92E2
BE7EFA  BF6B90  C058BC  C14691  C23505  C32425  C413F5  C50479  C5F5B6  C6E7B4
C7DA73  C8CDF7  C9C244  CAB763  CBAD54  CCA41A  CD9BBB  CE9436  CF8D93  D087CF
D182F1  D27EFE  D37BF2  D479D1  D5789E  D67860  D77910  D87AB3  D97D4E  DA80DC
DB8566  DC8AE3  DD915C  DE98D0  DFA140  E0AAAC  E1B513  E2C076  E3CCD5  E4DA30
E5E88A  E6F7DB  E8082D  E91976  EA2BBB  EB3EF7  EC532E  ED685E  EE7E80  EF959A
F0ADA3  F1C6A4  F2E08F  F3FB6A  F51733  F633E3  F7517A  F86FF4  F98F54  FAAF91
FBD0AB  FCF29F  FE1569  FF3905  005D71  0182A8  02A8A7  03CF6A  04F6ED  061F2B
07481F  0871C9  099C20  0AC71D  0BF2BF  0D1F00  0E4BDC  0F794A  10A748  11D5CB
1304D1  143459  156452  1694BC  17C58F  18F6C2  1A2852  1B5A36  1C8C65  1DBEDB
1EF191  202479  215793  228ACE  23BE2B  24F19D  262518  27589B  288C15  29BF83
2AF2DC  2C260F  2D591D  2E8BF4  2FBE8C  30F0DC  3222D9  33547A  3485B6  35B67C
36E6C9  38168B  3945BB  3A744B  3BA22F  3CCF5F  3DFBCE  3F2770  40523F  417C1C
42A4FD  43CD0C  44F3CB  4619B9  473E57  4861D0  4983F9  4AA4D3  4BC487  4CE297
4DFF58  4F1A76  50341A  514C1B  52624E  5376DE  5489CA  559A95  56A9BD  57B6C3
58C1D3  59CAC1  5AD1B7  5BD639  5CD8C3  5DD8D8  5ED677  5FD1CC  60CAAC  61C0EC
62B48D  63A5B9  6493F3  657F63  66680A  674DE8  6830A9  691077  69ED29  6AC6BD
6B9D0A  6C703B  6D3FFB  6E0C4A  6ED552  6F9ABF  705CBC  711AF4  71D591  728C93
733FA7  73EEF6  749A56  7541C8  75E521  76848C  771FB4  77B6C3  7849BA  78D845
79628D  79E868  7A69D7  7AE6B0  7B5F1C  7BD2F2  7C4231  7CACB0  7D1299  7D7397
7DCFD5  7E2752  7E79E6  7EC765  7F0FF9  7F53A4  7F923A  7FCBBC  31DD2B  31DD2B
31DD2B  31DD2B  31DD2B  31DD2B  31DD2B  31DD2B  31DD2B  31DD2B  31DD2B  3114A9
3057DA  2FA594  2EFCDB  2E5CD5  2DC4CE  2D3426  2CAA58  2C26E9  2BA965  2B3177
2ABEC2  2A50FC  29E7DA  29831F  292296  28C600  286D2F  2817FC  27C637  2777BC
272C67  26E415  269EAA  265C03  261C11  25DEAD  25A3CA  256B4C  25351E  25012E
24CF68  249FBE  247219  24466F  241CB0  23F4CB  23CEB3  23AA5C  2387BE  2366C7
23476B  2329A6  230D6B  22F2B2  22D96F  22C198  22AB26  229614  22825A  226FEB
225EC4  224EDB  224031  2232BA  222670  221B4C  22114D  220868  22009B  21F9E4
21F438  21EF95  21EBF6  21E95B  21E7B8  21E710  21E758  21E892  21EABC  21EDCC
21F1BF  21F698  21FC50  2202E2  220A4E  22128C  221BA0  222585  223034  223BB0
2247F5  2254FC  2262C7  227154  2280A1  2290A8  22A16A  22B2E1  22C511  22D7F1
22EB85  22FFC5  2314B6  232A52  23409A  235786  236F1A  238751  23A02C  23B9A6
23D3C3  23EE7C  2409D0  2425C0  244246  245F63  247D18  249B63  24BA3D  24D9A9
24F9A5  251A2E  253B47  255CEA  257F17  25A1CB  25C509  25E8CD  260D13  2631DB
26572A  267CF2  26A340  26CA08  26F14A  271909  274142  2769F5  27931D  27BCBA
27E6C9  28114D  283C43  2867A9  28937D  28BFBE  28EC6C  291987  294706  2974EF
29A340  29D1F2  2A010C  2A3083  2A605F  2A909B  2AC133  2AF228  2B2379  2B5522
2B8723  2BB978  2BEC25  2C1F25  2C5276  2C861A  2CBA0A  2CEE4A  2D22D5  2D57A8
2D8CC5  2DC22B  2DF7D3  2E2DC3  2E63F1  2E9A5F  2ED10F  2F07F6  2F3F1C  2F767D
2FAE14  2FE5E2  301DE7  305619  308E7E  30C711  30FFD2  3138BD  3171D2  31AB11
31E471  321DF7  32579F  329168  32CB4B  33054F  333F68  33799E  33B3E5  33EE42
3428B3  346330  349DBF  34D85A  3512FD  354DA9  358859  35C30D  35FDC1  363876
```

```
36732A  36ADDA  36E87D  37231C  375DAF  379835  37D2AA  380D0F  38475E  388199
38BBBA  38F5C3  392FAD  39697B  39A327  39DCB1  3A1612  3A4F51  3A8861  3AC148
3AFA01  3B328B  3B6ADF  3BA301  3BDAEC  3C12A1  3C4A1B  3C8156  3CB852  3CEF0B
3D2585  3D5BB8  3D91A3  3DC743  3DFC98  3E31A1  3E665A  3E9ABF  3ECED5  3F0293
3F35F8  3F6905  3F9BB7  3FCE0C  04EA0A  04E8CE  04E8CE  04E765  04E737  04E761
04E7E3  04E8BC  04E9EB  04EB6F  04ED47  04EF72  04F1F1  04F4C2  04F7E4  04FB58
04FF1B  05032F  050792  050C43  051142  051690  051C2A  052211  052844  052EC3
05358E  053CA4  054404  054BAF  0553A5  055BE4  05646C  056D3E  057659  057FBD
05896A  05935F  059D9D  05A823  05B2F0  05BE06  05C964  05D50A  05E0F8  05ED2D
05F9AA  06066F  06137B  0620D0  062E6C  063C50  064A7D  0658F1  0667AE  0676B3
068601  069597  06A577  06B59F  06C611  06D6CC  06E7D2  06F921  070ABB  071CA0
072ECF  07414B  075411  076725  077A84  078E31  07A22B  07B673  07CB09  07DFEE
07F522  080AA6  08207B  0836A0  084D17  0863E1  087AFD  08926C  08AA2F  08C248
08DAB5  08F379  090C94  092606  F686D7  F69A2E  F6AC80  F6C2D1  F6D819  F6EE04
F7048F  F71BBB  F73384  F74BEB  F764ED  F77E89  F798BF  F7B38D  F7CEF2  F7EAEC
F8077C  F824A0  F84258  F860A2  F87F7D  F89EE9  F8BEE5  F8DF71  F9008C  F92235
F9446C  F96730  F98A81  F9AE5E  F9D2C7  F9F7BC  FA1D3D  FA4348  FA69DE  FA90FF
FAB8AA  FAE0E0  FB09A0  FB32EA  FB5CBE  FB871D  FBB206  FBDD79  FC0977  FC35FF
FC6312  FC90B1  FCBEDA  FCED90  FD1CD1  FD4C9E  FD7CF9  FDADE0  FDDF55  FE1158
FE43EA  FE770A  FEAABB  FEDEFC  FF13CE  FF4932  FF7F28  FFB5B2  FFECD0  002482
005CCA  0095A9  00CF20  01092F  0143D7  017F1A  01BAF9  01F775  02348E  027246
02B09F  02EF9A  032F37  036F78  03B05F  03F1ED  043424  047704  04BA8F  04FEC8
0543AF  058946  05CF8F  06168C  79CB59  7938F9  78A649  781347  777FF4  76EC51
76585D  75C417  752F82  749A9B  740563  736FD9  72D9FF  7243D2  71AD53  711682
707F5D  6FE7E6  6F501A  6EB7F9  6E1F84  6D86B9  6CED97  6C541E  6BBA4D  6B2024
6A85A1  69EAC4  694F8B  68B3F6  681804  677BB4  66DF05  6641F6  65A485  6506B1
64687A  63C9DF  632ADD  628B74  61EBA2  614B66  60AABF  6009AB  5F6829  5EC638
5E23D6  5D8101  5CDDB8  5C39F9  5B95C3  5AF114  5A4BEB  59A646  590022  58597F
57B25B  570AB3  566286  55B9D2  551096  5466CE  53BC7A  531197  526623  51BA1C
510D81  50604E  4FB282  4F041B  4E5516  4DA572  4CF52B  4C4440  4B92AE  4AE073
4A2D8C  4979F8  48C5B3  4810BB  475B0D  46A4A7  45ED87  4535A9  447D0B  43C3AA
430984  424E96  4192DC  40D654  C5D8D2  C65A28  C6DA6E  C759A7  C7D7D8  C85502
C8D12A  C94C53  C9C67E  CA3FB1  CAB7EC  CB2F35  CBA58C  CC1AF6  CC8F74  CD030A
CD75BA  CDE787  CE5873  CEC881  CF37B2  CFA60B  D0138D  D08039  D0EC13  D1571D
D1C159  D22AC9  D2936E  D2FB4C  D36263  D3C8B7  D42E48  D49319  D4F72B  D55A80
D5BD1B  D61EFC  D68025  D6E098  D74056  D79F61  D7FDBA  D85B64  D8B85E  D914AB
D9704B  D9CB41  DA258D  DA7F30  DAD82C  DB3082  DB8833  DBDF40  DC35AA  DC8B71
DCE097  DD351D  DD8904  DDDC4C  DE2EF6  DE8103  DED274  DF2349  DF7383  DFC322
E01227  E06093  E0AE66  E0FBA0  E14842  E1944D  E1DFC0  E22A9B  E274E0  E2BE8E
E307A5  E35026  E39810  E3DF65  E42622  E46C49  E4B1DA  E4F6D4  E53B37  E57F03
E5C237  E604D4  E646D9  E68846  256C44  256705  255B59  255D5F  2558F8  2554D9
255103  254D74  254A2D  25472E  254476  254207  253FE0  253E00  253C68  253B18
253A10  253950  2538D8  2538A7  2538BF  25391E  2539C5  253AB4  253BEB  253D6A
253F31  254140  254397  254636  25491D  254C4C  254FC3  255382  25578A  255BDA
256072  256553  256A7C  256FED  2575A7  257BAA  2581F5  258889  258F66  25968B
259DFA  25A5B1  25ADB1  25B5FB  25BE8E  25C769  25D08F  25D9FD  25E3B5  25EDB7
25F802  260297  260D76  26189E  262411  262FCE  263BD4  264825  2654C0  2661A6
266ED6  267C50  268A15  269825  26A680  26B525  26C415  26D351  26E2D7  26F2A9
2702C6  27132E  2723E1  2734E0  27462B  2757C1  2769A3  277BD0  278E49  27A10E
27B41F  27C77C  27DB25  27EF19  B5D25C  B5FD2B  B6376E  B65966  B68ACE  B6BE66
B6F42C  B72C20  B7663F  B7A289  B7E0FB  B82195  B86455  B8A93A  B8F042  B9396D
B984B9  B9D224  BA21AE  BA7356  BAC719  BB1CF8  BB74F1  BBCF02  BC2B2C  BC896B
```

| | | | | | | | | | |
|---|---|---|---|---|---|---|---|---|---|
| BCE9C1 | BD4C2B | BDB0A8 | BE1737 | BE7FD8 | BEEA8A | BF574A | BFC61A | C036F6 | C0A9DF |
| C11ED4 | C195D3 | C20EDC | C289EE | C30708 | C38628 | C4074F | C48A7B | C50FAB | C596DE |
| C62014 | C6AB4C | C73884 | C7C7BD | C858F4 | C8EC2A | C9815C | CA188B | CAB1B6 | CB4CDB |
| CBE9FA | CC8911 | CD2A20 | CDCD26 | CE2222 | CF1914 | CFC1F9 | D06CD1 | D1199B | D1C856 |
| D27901 | D32B9B | D3E023 | D49697 | D54EF7 | D60942 | D6C575 | D78391 | D84393 | D9057B |
| D9C947 | DA8EF6 | DB5687 | DC1FF7 | DCEB46 | DDB872 | DE8779 | DF585B | E02B14 | E0FFA5 |
| E1D60A | E2AE41 | E3884B | E46423 | 7E11AD | 7DD361 | 7D923A | 7D4E3B | 7D0764 | 7CBDB9 |
| 7C713A | 7C21EB | 7BCFCD | 7B7AE2 | 7B232B | 7AC8AC | 7A6B64 | 7A0B57 | 79A887 | 7942F4 |
| 78DAA1 | 786F8E | 7801BF | 779135 | 771DF1 | 76A7F4 | 762F41 | 75B3D9 | 7535BD | 74B4F0 |
| 743171 | 73AB44 | 732269 | 7296E3 | 7208B1 | 7177D6 | 70E453 | 704E2A | 6FB55B | 6F19E8 |
| 6E7BD3 | 6DDB1D | 6D37C7 | 6C91D2 | 6BE93F | 6B3E11 | 6A9048 | 69DFE5 | 692CEB | 687759 |
| 67BF31 | 670475 | 664726 | 658744 | 64C4D2 | 63FFD1 | 633841 | 626E24 | 61A17C | 60D249 |
| 60008D | 5F2C4A | 5E5580 | 5D7C31 | 5CA05E | 5BC209 | 5AE132 | 59FDDD | 591809 | 582FB8 |
| 5744EC | 5657A7 | 5567E9 | 5475B5 | 53810C | 5289F0 | 519062 | 509464 | 4F95F8 | 4E9520 |
| 4D91DD | 4C8C32 | 4B8420 | 4A79A9 | 496CD0 | 485D96 | 474BFE | 46380B | 4521BD | 440918 |
| 42EE1F | 41D0D2 | 40B136 | 3F8F4D | C139B6 | C155DA | C171EC | C18DEC | C1A9D9 | C1C5B2 |
| C1E178 | C1FD2B | C218C8 | C23452 | C24FC6 | C26B24 | C2866D | C2A19F | C2BCBB | C2D7BF |
| C2F2AC | C30D81 | C3283E | C342E2 | C35D6E | C377DF | C39237 | C3AC75 | C3C697 | C3E09F |
| C3FA8B | C4145C | C42E10 | C447A7 | C46122 | C47A7E | C493BD | C4ACDD | C4C5DF | C4DEC1 |
| C4F784 | C51027 | C528A9 | C5410A | C5594A | C57168 | C58963 | C5A13C | C5B8F2 | C5D084 |
| C5E7F2 | C5FF3B | C6165F | C62D5E | C64437 | C65AE9 | C67174 | C687D8 | C69E14 | C6B427 |
| C6CA11 | C6DFD2 | C6F569 | C70AD5 | C72017 | C7352C | C74A16 | C75ED3 | C77363 | C787C4 |
| C79BF8 | C7AFFD | C7C3D2 | C7D777 | C7EAEB | C7FE2E | C81140 | C8241F | C836CB | C84943 |
| C85B87 | C86D96 | C87F6F | C89112 | C8A27F | C8B3B4 | C8C4B0 | C8D574 | C8E5FE | C8F64E |
| C90664 | C9163D | C925DB | C9353B | 000000 | FCDBD5 | F9B827 | F69570 | F3742D | F054D9 |
| ED37F0 | EA1DEC | E70748 | E3F47E | E0E607 | DDDC5B | DAD7F4 | D7D947 | D4E0CB | D1EEF6 |
| CF043B | CC210D | C945E0 | C67323 | C3A946 | C0E8B6 | BE31E2 | BB8533 | B8E313 | B64BEB |
| B3C020 | B14017 | AECC33 | AC64D5 | AA0A5B | A7BD23 | A57D86 | A34BDF | A12883 | 9F13C8 |
| 9D0DFE | 9B1777 | 99307F | 975961 | 959267 | 93DBD7 | 9235F3 | 90A0FD | 8F1D34 | 8DAAD3 |
| 8C4A14 | 8AFB2D | 89BE51 | 8893B1 | 877B7C | 8675DC | 8582FB | 84A2FC | 83D604 | 831C31 |
| 8275A1 | 81E26C | 8162AA | 80F66E | 809DC9 | 8058C9 | 802778 | 8009DE | 800000 | 8009DE |
| 802778 | 8058C9 | 809DC9 | 80F66E | 8162AA | 81E26C | 8275A1 | 831C31 | 83D604 | 84A2FC |
| 8582FB | 8675DC | 877B7C | 8893B1 | 89BE51 | 8AFB2D | 8C4A14 | 8DAAD3 | 8F1D34 | 90A0FD |
| 9235F3 | 93DBD7 | 959267 | 975961 | 99307F | 9B1777 | 9D0DFE | 9F13C8 | A12883 | A34BDF |
| A57D86 | A7BD23 | AA0A5B | AC64D5 | AECC33 | B14017 | B3C020 | B64BEB | B8E313 | BB8533 |
| BE31E2 | C0E8B6 | C3A946 | C67323 | C945E0 | CC210D | CF043B | D1EEF6 | D4E0CB | D7D947 |
| DAD7F4 | DDDC5B | E0E607 | E3F47E | E70748 | EA1DEC | ED37F0 | F054D9 | F3742D | F69570 |
| F9B827 | FCDBD5 | 800000 | 8009DE | 802778 | 8058C9 | 809DC9 | 80F66E | 8162AA | 81E26C |
| 8275A1 | 831C31 | 83D604 | 84A2FC | 8582FB | 8675DC | 877B7C | 8893B1 | 89BE51 | 8AFB2D |
| 8C4A14 | 8DAAD3 | 8F1D34 | 90A0FD | 9235F3 | 93DBD7 | 959267 | 975961 | 99307F | 9B1777 |
| 9D0DFE | 9F13C8 | A12883 | A34BDF | A57D86 | A7BD23 | AA0A5B | AC64D5 | AECC33 | B14017 |
| B3C020 | B64BEB | B8E313 | BB8533 | BE31E2 | C0E8B6 | C3A946 | C67323 | C945E0 | CC210D |
| CF043B | D1EEF6 | D4E0CB | D7D947 | DAD7F4 | DDDC5B | E0E607 | E3F47E | E70748 | EA1DEC |
| ED37F0 | F054D9 | F3742D | F69570 | F9B827 | FCDBD5 | 000000 | 03242B | 0647D9 | 096A90 |
| 0C8BD3 | 0FAB27 | 12C810 | 15E214 | 18F8B8 | 1C0B82 | 1F19F9 | 2223A5 | 25280C | 2826B9 |
| 2B1F35 | 2E110A | 30FBC5 | 33DEF3 | 36BA20 | 398CDD | 3C56BA | 3F174A | 41CE1E | 447ACD |
| 471CED | 49B415 | 4C3FE0 | 4EBFE9 | 5133CD | 539B2B | 55F5A5 | 5842DD | 5A827A | 5CB421 |
| 5ED77D | 60EC38 | 62F202 | 64E889 | 66CF81 | 68A69F | 6A6D99 | 6C2429 | 6DCA0D | 6F5F03 |
| 70E2CC | 72552D | 73B5EC | 7504D3 | 7641AF | 776C4F | 788484 | 798A24 | 7A7D05 | 7B5D04 |
| 7C29FC | 7CE3CF | 7D8A5F | 7E1D94 | 7E9D56 | 7F0992 | 7F6237 | 7FA737 | 7FD888 | 7FF622 |
| 000000 | FE6DE3 | FCDBD5 | FB49E7 | F9B827 | F826A4 | F69570 | F50498 | F3742D | F1E43D |
| F054D9 | EEC60F | ED37F0 | EBAA89 | EA1DEC | E89226 | E70748 | E57D60 | E3F47E | E26CB0 |

```
E0E607 DF6090 DDDC5B DC5978 DAD7F4 D957DE D7D947 D65C3B D4E0CB D36704
D1EEF6 D078AE CF043B CD91AB CC210D CAB270 C945E0 C7DB6C C67323 C50D11
C3A946 C247CD C0E8B6 BF8C0E BE31E2 BCDA3F BB8533 BA32CA B8E313 B7961A
B64BEB B50493 B3C020 B27E9D B14017 B0049B AECC33 AD96EE AC64D5 AB35F6
AA0A5B A8E211 A7BD23 A69B9B A57D86 A462EF A34BDF A23863 A12883 A01C4C
9F13C8 9E0F00 9D0DFE 9C10CD 9B1777 9A2204 99307F 9842F0 975961 9673DC
959267 94B50E 93DBD7 9306CB 9235F3 916956 90A0FD 8FDCEF 8F1D34 8E61D3
8DAAD3 8CF83C 8C4A14 8BA062 8AFB2D 8A5A7A 89BE51 8926B6 8893B1 880546
877B7C 86F657 8675DC 85FA11 8582FB 85109D 84A2FC 843A1D 83D604 8376B4
831C31 82C67F 8275A1 822999 81E26C 81A01B 8162AA 812A1A 80F66E 80C7A8
809DC9 8078D4 8058C9 803DAA 802778 801634 8009DE 800278 800000 800278
8009DE 801634 802778 803DAA 8058C9 8078D4 809DC9 80C7A8 80F66E 812A1A
8162AA 81A01B 81E26C 822999 8275A1 82C67F 831C31 8376B4 83D604 843A1D
84A2FC 85109D 8582FB 85FA11 8675DC 86F657 877B7C 880546 8893B1 8926B6
89BE51 8A5A7A 8AFB2D 8BA062 8C4A14 8CF83C 8DAAD3 8E61D3 8F1D34 8FDCEF
90A0FD 916956 9235F3 9306CB 93DBD7 94B50E 959267 9673DC 975961 9842F0
99307F 9A2204 9B1777 9C10CD 9D0DFE 9E0F00 9F13C8 A01C4C A12883 A23863
A34BDF A462EF A57D86 A69B9B A7BD23 A8E211 AA0A5B AB35F6 AC64D5 AD96EE
AECC33 B0049B B14017 B27E9D B3C020 B50493 B64BEB B7961A B8E313 BA32CA
BB8533 BCDA3F BE31E2 BF8C0E C0E8B6 C247CD C3A946 C50D11 C67323 C7DB6C
C945E0 CAB270 CC210D CD91AB CF043B D078AE D1EEF6 D36704 D4E0CB D65C3B
D7D947 D957DE DAD7F4 DC5978 DDDC5B DF6090 E0E607 E26CB0 E3F47E E57D60
E70748 E89226 EA1DEC EBAA89 ED37F0 EEC60F F054D9 F1E43D F3742D F50498
F69570 F826A4 F9B827 FB49E7 FCDBD5 FE6DE3 000080 000095 0000AA 0000BC
0000CB 0000D6 0000DE 0000E0 0000DE 0000D6 0000CB 0000BC 0000AA 000095
000080 00006B 000056 000044 000035 00002A 000022 000020 000022 00002A
000035 000044 000056 00006B 000080 000086 00008B 000091 000096 00009B
0000A0 0000A4 0000A8 0000AB 0000AE 0000B0 0000B2 0000B3 0000B3 0000B3
0000B2 0000B0 0000AE 0000AB 0000A8 0000A4 0000A0 00009B 000096 000091
00008B 000086 000080 00007A 000075 00006F 00006A 000065 000060 00005C
000058 000055 000052 000050 00004E 00004D 00004D 00004D 00004E 000050
000052 000055 000058 00005C 000060 000065 00006A 00006F 000075 00007A
000080 000088 000090 000097 00009E 0000A4 0000A9 0000AE 0000B1 0000B3
0000B3 0000B3 0000B1 0000AE 0000A9 0000A4 00009E 000097 000090 000088
000080 000078 000070 000069 000062 00005C 000057 000052 00004F 00004D
00004D 00004D 00004F 000052 000057 00005C 000062 000069 000070 000078
000080 00008B 000096 0000A0 0000A8 0000AE 0000B2 0000B3 0000B2 0000AE
0000A8 0000A0 000096 00008B 000080 000075 00006A 000060 000058 000052
00004E 00004D 00004E 000052 000058 000060 00006A 000075 000080 00008D
00009A 0000A3 0000A9 0000AC 0000A9 0000A3 00009A 00008D 000080 000073
000066 00005D 000057 000054 000057 00005D 000066 000073 000080 0000CB
0000DE 0000AA 000056 000022 000035 000A3D 000A3F 000A42 000A48 000A50
000A5A 000A66 000A75 000A86 000A99 000AAF 000AC7 000AE1 000AFD 000B1B
000B3C 000B5F 000B84 000BAC 000BD5 000C01 000C2F 000C5F 000C92 000CC6
000CFD 000D36 000D71 000DAF 000DEE 000E2F 000E73 000EB9 000F01 000F4B
000F97 000FE5 001035 001087 0010DB 001131 001189 0011E4 001240 00129E
0012FE 001360 0013C4 00142A 001491 0014FB 001566 0015D4 001643 0016B4
001726 00179B 001811 001889 001903 00197E 0019FB 001A7A 001AFA 001B7C
001C00 001C85 001D0C 001D94 001E1E 001EA9 001F36 001FC4 002054 0020E5
002178 00220C 0022A1 002337 0023CF 002468 002503 00259F 00263B 0026DA
002779 002819 0028BB 00295D 002A01 002AA6 002B4B 002BF2 002C9A 002D42
002DEC 002E96 002F42 002FEE 00309B 003149 0031F7 0032A7 003356 003407
```

```
0034B9 00356A 00361D 0036D0 003784 003838 0038ED 0039A2 003A58 003B0E
003BC4 003C7B 003D32 003DEA 003EA1 003F59 004011 0040CA 004182 00423B
0042F4 0043AD 004466 00451F 0045D8 004691 00474A 004802 0048BB 004974
004A2C 004AE4 004B9C 004C54 004D0B 004DC2 004E79 004F30 004FE6 00509B
005151 005205 0052BA 00536D 005420 0054D3 005585 005636 0056E7 005797
005846 0058F5 0059A3 005A50 005AFC 005BA7 005C51 005CFB 005DA4 005E4B
005EF2 005F98 00603D 0060E0 006183 006224 0062C5 006364 006402 00649F
00653B 0065D5 00666E 006706 00679D 006832 0068C6 006958 0069E9 006A79
006B07 006B94 006C1F 006CA9 006D32 006DB8 006E3E 006EC1 006F43 006FC3
007042 0070BF 00713B 0071B4 00722C 0072A3 007317 00738A 0073FB 00746A
0074D7 007542 0075AC 007614 00767A 0076DD 00773F 0077A0 0077FE 00785A
0078B4 00790C 007962 0079B7 007A09 007A59 007AA7 007AF3 007B3D 007B85
007BCA 007C0E 007C4F 007C8F 007CCC 007D07 007D40 007D77 007DAC 007DDE
007E0E 007E3C 007E68 007E92 007EB9 007EDE 007F01 007F22 007F41 007F5D
007F77 007F8F 007FA4 007FB7 007FC8 007FD7 007FE4 007FEE 007FF6 007FFB
007FFF 008000 007FFF 007FFB 007FF6 007FEE 007FE4 007FD7 007FC8 007FB7
007FA4 007F8F 007F77 007F5D 007F41 007F22 007F01 007EDE 007EB9 007E92
007E68 007E3C 007E0E 007DDE 007DAC 007D77 007D40 007D07 007CCC 007C8F
007C4F 007C0E 007BCA 007B85 007B3D 007AF3 007AA7 007A59 007A09 0079B7
007962 00790C 0078B4 00785A 0077FE 0077A0 00773F 0076DD 00767A 007614
0075AC 007542 0074D7 00746A 0073FB 00738A 007317 0072A3 00722C 0071B4
00713B 0070BF 007042 006FC3 006F43 006EC1 006E3E 006DB8 006D32 006CA9
006C1F 006B94 006B07 006A79 0069E9 006958 0068C6 006832 00679D 006706
00666E 0065D5 00653B 00649F 006402 006364 0062C5 006224 006183 0060E0
00603D 005F98 005EF2 005E4B 005DA4 005CFB 005C51 005BA7 005AFC 005A50
0059A3 0058F5 005846 005797 0056E7 005636 005585 0054D3 005420 00536D
0052BA 005205 005151 00509B 004FE6 004F30 004E79 004DC2 004D0B 004C54
004B9C 004AE4 004A2C 004974 0048BB 004802 00474A 004691 0045D8 00451F
004466 0043AD 0042F4 00423B 004182 0040CA 004011 003F59 003EA1 003DEA
003D32 003C7B 003BC4 003B0E 003A58 0039A2 0038ED 003838 003784 0036D0
00361D 00356A 0034B9 003407 003356 0032A7 0031F7 003149 00309B 002FEE
002F42 002E96 002DEC 002D42 002C9A 002BF2 002B4B 002AA6 002A01 00295D
0028BB 002819 002779 0026DA 00263B 00259F 002503 002468 0023CF 002337
0022A1 00220C 002178 0020E5 002054 001FC4 001F36 001EA9 001E1E 001D94
001D0C 001C85 001C00 001B7C 001AFA 001A7A 0019FB 00197E 001903 001889
001811 00179B 001726 0016B4 001643 0015D4 001566 0014FB 001491 00142A
0013C4 001360 0012FE 00129E 001240 0011E4 001189 001131 0010DB 001087
001035 000FE5 000F97 000F4B 000F01 000EB9 000E73 000E2F 000DEE 000DAF
000D71 000D36 000CFD 000CC6 000C92 000C5F 000C2F 000C01 000BD5 000BAC
000B84 000B5F 000B3C 000B1B 000AFD 000AE1 000AC7 000AAF 000A99 000A86
000A75 000A66 000A5A 000A50 000A48 000A42 000A3F FFFFFE FFFFDF BFFFFF
002000 3EAC38 000000 2F8810 003000 3DB09A 000000 3B9CD2 000000 2B9DFA
000000 2DB8DA 002000 2F8DB2 000000 2F8DFA 000000 3D98DA 000000 379C38
000000 200C38 0142D2 016444 000398 006DFA 000200 000378 0003D0 E00000
754317 000001 000000 CD0090 000000 C00000 F54283 000001 000000 C5408D
000001 600000 CD068F 000001 000000 B54084 000001 ECF015 200D79 45B090
200C78 0003E8 000064 00000A 00B000 003000 009000 00B000 003000 00A000
00A000 00B000 00B000 00B000 00B000 002000 008000 003000 008000 008000
000052 000000 00001A 00B000 000048 00004A 00005A 000000 00005A 00004A
000058 00005A 000052 00001A 00005A 000058 3005A0 000180 300920 1009A0
000D80 100CA0 300CA0 0001A0 300DA0 100DA0 200DA0 300C80 300420 300980
300C20 200C20 07B000 009000 0B3000 0AB000 0C9000 0EA000 0FA000 00B000
```

```
0FB000  0EB000  0DB000  0F8000  072000  0B9000  0F2000  0D2000  A00000  200000
C00000  600000  600000  600000  E00000  200000  E00000  600000  E00000  E00000
800000  E00000  C00000  C00000  000702  000100  000700  000700  000102  000602
000602  000300  000702  000702  000302  000402  000602  000500  000602  000202
40009D  00000C  000099  00001D  40000C  400015  400095  00000D  40009D  40001D
40008D  400094  400091  00009C  400091  400081  000000  000000  000001  000001
000001  000001  000001  000000  000001  000001  000001  000001  000000  000001
000001  000001  B54000  300000  994000  B84000  3C0000  AC4000  AD4000  B00000
BD4000  BC4000  BD0000  2D4000  854000  394000  8D4000  8D0000  0001F8  000030
0002E8  0002B8  000330  000398  0003D8  000038  0003F8  0003B8  000378  0003D0
0002C0  0002F0  0003C8  000348  014C06  000404  006C02  002C06  012404  012806
016806  000C04  016C06  012C06  016C04  016006  006002  006406  016802  016800
00068E  00068E  00099A  000E06  001483  001DFC  002BE0  004029  005DD9  008944
00C8CD  0125B3  01AD8E  027454  039703  05402D  07AE14  0020C5  002EBA  00461B
006688  0095FB  00DB59  0140CC  01D53D  02AE64  03EC03  05BC56  0863F1  0C4578
11F30E  1A410B  266666  047AE1  051EB8  05C28F  066666  070A3D  07AE14  0851EC
08F5C3  09999A  0A3D71  0B851F  0CCCCD  19999A  266666  333333  400000  0020C5
002EBA  00461B  006688  0095FB  00DB59  0140CC  01D53D  02AE64  03EC03  05BC56
0863F1  0C4578  1090D6  165D3A  1E3151  047AE1  051EB8  05C28F  066666  070A3D
07AE14  0851EC  08F5C3  09999A  0A3D71  0B851F  0CCCCD  133333  19999A  266666
333333  000200  000417  000700  000EEF  001E00  0036C5  006D8A  00CC6B  0198D6
041183  082306  1CCE80  11F601  0C4578  0863F1  05BC56  03EC03  02AE29  01D53D
00A3D7  004189  0020C5  001062  000347  0C4578  0863F1  05BC56  03EC03  02AE29
01D53D  00A3D7  004189  0020C5  001062  000347  0001A3  0863F1  05BC56  03EC03
02AE29  01D53D  00C49C  008312  004189  0020C5  001062  000347  0001A3  05BC56
03EC03  02AE29  01D53D  0147AE  00C49C  008312  004189  0020C5  001062  000347
0001A3  05BC56  03EC03  02AE29  01D53D  00C49C  008312  004189  0020C5  001062
000347  0001A3  000054  000002  000004  000008  00000A  00000F  000014  000019
00001E  000028  000032  00004B  000064  000004  000008  00000C  00000F  000014
00001E  000032  000032  000032  000064  0000C8  0000C8  000008  00000F  000014
000019  00001E  000032  000032  000032  000064  0000C8  0000C8  0000C8  00000F
000014  000019  00001E  000032  000032  000032  000064  0000C8  0000C8  0000C8
0001F4  000014  000019  00001E  000032  000032  000032  000064  0000C8  0000C8
0000C8  0000C8  0001F4  0863F1  05BC56  03EC03  02AE29  01D53D  00C49C  008312
004189  0020C5  0020C5  0020C5  0020C5  000000  000008  000015  000033  00007F
0CCCCD  19999A  2020C5  2872B0  32F1AA  4020C5  50C49C  558106  5A9FBE  600000
65A1CB  6A7EFA  6CED91  6F7CEE  720C4A  7374BC  74BC6A  7624DD  776C8B  78D4FE
7A3D71  7BA5E3  7D0E56  7E978D  7FDF3B  7FDF3B  7FDF3B  7FDF3B  7FDF3B  000002
000002  000002  000002  000003  000002  000002  000002  000000  000003  000003
000003  000001  000003  000003  000003  000001  000002  000002  000002  000002
000002  000002  000002  000000  000002  000002  000002  000000  000002  000002
000002  000000  000003  000000  000002  000000  000003  000000  000002  000000
000000  000000  000000  000000  000000  000000  000000  000000  000140  000150
000003  000006  00000C  000018  000030  000060  0000C0  000180  00057D  0002BE
00015F  0000AF  000057  00002D  000016  00000A  612900  052A21  05F421  FFFFFF
61B800  000000  08D9F4  613800  61B900  000000  045911  05AA21  613900  0A39AF
002E60  0AB00C  61A900  000004  442800  084431  44A800  632600  052723  63BA00
051FA3  000000  085BF4  05A723  633A00  63A600  000004  0A2DCE  002E79  0A1EEE
002E7E  0A1EED  002E7A  0A24F7  002E79  0A1E6E  0A1E6D  00000C  0A24F7  002E79
0A1E6E  00000C  0A1E6D  00000C  5EAA00  200003  0AF0A2  002ECE  0A2DCE  002ECE
0B206C  0AF0A0  002ECE  56B600  44B500  44F444  001000  0AF0A3  002E90  200040
44F400  00019D  44F445  000143  0AF0A7  002E99  200045  0AF0A7  002EBA  0BF080
```

```
001081 0D09BA 60F400 002C55 5EAC00 07D884 5FAD42 07E084 5C2C4A 5D2D00
0D0CD6 0A1E70 0ABF0D 061480 002EB4 0A2056 0AF0A0 002EA9 46F400 000320
4E3500 46F400 FFFE0C 4E3600 0D089E 0A2B14 0BA407 000000 0ABF2D 0D09BA
0AF080 002ECA 0A1EE4 002EC3 0A2065 0AF0A0 002EC8 0A20E4 002ECA 0AF080
002EC8 0A2066 0AF0A0 002EC8 0A20E4 002ECA 0A206B 0A206A 0A2044 44F400
FFCDA6 4C2A00 00000C 0A20CB 002F01 0A34EF 002F01 0A204A 0AF0A8 002EE1
0A2049 0AF0A8 002EE7 0A2048 0AF0A8 002EED 0A2047 0AF0A8 002EF3 0A204B
00000C 0A2069 60F400 00298A 383700 0AF080 002EF6 0A2068 60F400 0029C2
382700 0AF080 002EF6 0A2067 60F400 0029EA 381B00 0AF080 002EF6 60F400
002A06 381300 61F400 000340 693300 703700 063880 002EFD 07D884 445900
46F400 FFEF98 4E3400 00000C 000005 000003 000002 000002 000001 000001
000001 000001 61F400 002F02 60F400 000221 060880 002F14 07D98A 49E000
06CA20 20003A 495800 61F400 000219 51F400 7FFFFF 0605A0 595900 0A3407
0A3408 0A3409 0A340A 0A3490 0031AD 44B000 56F400 000023 56F445 00001E
0AF0A9 002F35 56F445 000019 0AF0A9 002F36 56F445 000014 0AF0A9 002F37
200045 0AF0A9 002F38 0AF080 002F39 0A342A 0A3429 0A3428 0A3427 45F400
63D70A 45F4A1 000010 219C65 0AF0A9 0031AD 60F413 000221 340000 320000
06DC00 002F48 49D800 205C05 038402 627000 000219 224400 320000 60F413
000221 340100 46F400 000002 06DC00 002F71 000000 228F00 20004C 20002E
20005D 0AF0A7 002F6E 0AF0A2 002F6B 487000 000FFE 49D000 48D800 48F005
000FFE 0AF0A1 002F6B 56D800 48D000 48F005 000FFE 0AF0A9 002F6E 20581B
0AF080 002F71 49D800 200005 038402 045C14 627000 00021A 224500 320000
60F413 000221 340100 06DC00 002FAE 000000 228F00 20004C 20002E 20005D
0AF0A9 002FA8 0AF0A7 002F92 487000 000FFE 49D000 48D800 48F005 000FFE
0AF0A1 002FA8 56D800 48D000 48F005 000FFE 0AF0A1 002FA8 228F00 20006C
20002E 20005D 0AF0A7 002FAB 0AF0A9 002FA8 487000 000FFE 49D000 48D800
48F005 000FFE 0AF0A1 002FA8 56D800 48D000 48F005 000FFE 0AF0A9 002FAB
20581B 0AF080 002FAE 49D800 200005 038402 045C14 627000 00021B 224700
320000 60F413 000221 340100 06DC00 003001 000000 228F00 20004C 20002E
20005D 0AF0A9 002FFB 0AF0A7 002FCF 487000 000FFE 49D000 48D800 48F005
000FFE 0AF0A1 002FFB 56D800 48D000 48F005 000FFE 0AF0A1 002FFB 228F00
20006C 20002E 20005D 0AF0A7 002FE5 0AF0A9 002FFB 487000 000FFE 49D000
48D800 48F005 000FFE 0AF0A1 002FFB 56D800 48D000 48F005 000FFE 0AF0A1
002FFB 228F00 20007C 20002E 20005D 0AF0A7 002FFE 0AF0A9 002FFB 487000
000FFE 49D000 48D800 48F005 000FFE 0AF0A1 002FFB 56D800 48D000 48F005
000FFE 0AF0A9 002FFE 20581B 0AF080 003001 49D800 200005 038402 045C14
627000 00021C 320000 60F413 000221 340100 06DC00 00306D 000000 228F00
20004C 20002E 20005D 0AF0A9 003067 0AF0A7 003021 487000 000FFE 49D000
48D800 48F005 000FFE 0AF0A1 003067 56D800 48D000 48F005 000FFE 0AF0A1
003067 228F00 20006C 20002E 20005D 0AF0A7 003037 0AF0A9 003067 487000
000FFE 49D000 48D800 48F005 000FFE 0AF0A1 003067 56D800 48D000 48F005
000FFE 0AF0A1 003067 228F00 47F000 00021B 20007C 20002E 20005D 0AF0A7
00304F 0AF0A9 003067 487000 000FFE 49D000 48D800 48F005 000FFE 0AF0A1
003067 56D800 48D000 48F005 000FFE 0AF0A1 003067 228F00 47F000 00021C
20007C 20002E 20005D 0AF0A7 00306A 0AF0A9 003067 487000 000FFE 49D000
48D800 48F005 000FFE 0AF0A1 003067 56D800 48D000 48F005 000FFE 0AF0A9
00306A 20581B 0AF080 00306D 49D800 200005 038402 045C14 627000 00021D
60F413 00021F 61F400 000209 391000 060580 003080 70E900 000000 044810
000000 48D800 49D800 48E018 60F418 00021F 495900 61F400 000219 71F400
FFFFE7 56D900 44F41B 00000D 45F445 00000C 029040 60F464 000220 219800
219400 044810 46F400 000001 060A80 0030CC 56F000 000219 228400 200044
45F426 000002 200055 0AF0AF 0030C0 56F065 00021A 0AF0AA 0030C4 0A3487
```

```
0030CB 200044 200026 56F055 00021B 0AF0AF 0030C0 0A3488 0030CB 200044
200026 56F055 00021C 0AF0AF 0030C0 0A3489 0030CB 200044 200026 56F055
00021D 0AF0AF 0030C0 0A348A 0030CB 200044 200026 200055 0AF0A7 0030CB
045C14 045810 0AF080 003094 56F000 000219 200065 0AF0A7 0030CB 48E000
200018 48D800 205C18 496900 3C0500 0A34AA 0030DB 3C0400 0A34A9 0030DB
3C0300 0A34A8 0030DB 3C0200 0A34A7 0030DB 3C0100 060480 00311A 56D900
44F41B 000010 45F445 00000C 029040 60F464 000220 219800 219400 044810
46F400 000001 060A80 003119 56F000 000219 228400 200044 200026 56F055
00021A 0AF0AF 003114 0A3487 003118 200044 200026 56F055 00021B 0AF0AF
003114 0A3488 003118 200044 200026 56F055 00021C 0AF0AF 003114 0A3489
003118 200044 200026 56F055 00021D 0AF0AF 003114 0A348A 003118 200044
200026 200055 0AF0A7 003118 045C14 045810 0AF080 0030EC 48D800 205C18
496900 60F400 000209 61F400 000201 62F400 000219 06DC00 003139 48D800
49D900 33000D 0AF0A8 00312C 51F400 7FFFFF 0AF080 003139 200003 0AF0AC
003136 0616A0 01DB15 21C400 226E00 200036 06CC20 20003A 00FEB9 0618A0
018048 595A00 60F400 000219 44B000 256000 2000A1 060580 003148 45E000
200065 0AF0A1 003148 51F400 7FFFFF 596000 45D800 5E9600 44F400 002AF8
4C9546 60F423 000219 200040 219B00 63F400 002D0B 61F400 000219 07EB85
5ED900 62F465 000209 0AF0A0 00317B 49DA00 48E22A 20002A 44E00D 0AF0A9
00317B 56F400 000005 200045 0AF0AF 003178 56F000 00021F 45F000 00021E
457000 00021F 447044 00021E 47F426 000001 20AE75 0AF0A7 00317E 200044
200026 200075 0AF0A7 00317E 0A1E54 0AF080 00317E 25FF00 457000 00021E
0A3487 0031AD 380100 060380 003197 61F400 00020A 60F400 00021A 060380
003196 56E000 45E800 205865 0AF0A7 003196 48F800 49E800 486800 495800
48D900 49E100 485100 496100 045911 000000 63F400 002D0A 61F400 00021A
60F400 00021A 07EB85 060480 0031A8 5ED900 200065 0AF0A0 0031A8 00008C
0AF080 0031AB 045810 000000 00000C 45E000 0A1E53 00000C 63F400 000FFD
75BD00 65F400 000220 48E300 200022 49E322 48ED1C 0608A0 200022 20000D
029008 496300 65F413 00031E 320700 63F400 000219 0607A0 565B00 63F400
000209 49D500 064080 0031C8 49D510 57BD00 44F40B 0000F0 0AF0AA 00326C
44F44D 0000BE 0AF0A7 00326C 44F44D 0000BF 0AF0AF 0031EE 65F400 000221
21BD00 60F400 0002DD 44F44D 0000C0 0AF0AA 0031EB 045810 20554D 0AF0AA
0031E8 045810 045515 49D000 49ED10 205D14 49D000 49ED10 205D14 49E000
49ED10 200014 0605A0 200022 487000 000FFE 65F409 000319 56F41A 0000F7
44BD00 45F444 00003A 3D0265 027060 219800 48D500 06D800 003225 200005
0AF0A9 003225 497000 000FFF 49F000 000FFD 200005 0AF0A9 003223 49E500
200005 0AF0A9 003223 49ED00 3B1005 0AF0A9 003223 49DD10 656B10 200022
485B22 73F422 FFFFF7 49F022 000FFE 200022 20521C 496B00 224E00 205503
0AF0A2 003223 00008C 0AF080 00326C 49F000 000FFF 48D500 44BD00 56F400
0000BE 205D44 0AF0AF 00326C 219800 48F000 00031E 49F000 0002DF 48F018
0002E0 48F018 000FFE 0605A0 20002A 200014 200009 48701A 000FFE 06D800
00326B 48D500 3D0305 0AF0A9 003260 49F000 000FFD 200005 0AF0A9 003260
49E500 3D0205 0AF0A9 00325E 49ED00 3B1005 0AF0A9 00325E 49DD10 656B10
205222 485B00 73F400 FFFFF7 49F000 000FFE 496B00 224E00 205503 0AF0A2
00325E 00008C 0AF080 00326C 3D0300 000000 49ED00 3D4000 000000 48ED00
48F01C 000FFE 0605A0 20002A 200010 200009 48701A 000FFE 63F400 000211
3B0800 45F400 000220 060780 003292 56EB1B 44F403 000008 0AF0A2 00327C
57F400 7FFFFF 0AF080 003292 200040 44F400 00031E 200045 027040 21D500
44EB00 47F400 000001 060B80 00328E 200044 200026 48D575 0AF0AF 00328E
20000D 029008 22AE00 56EB00 200064 566B00 495B00 60F400 000209 61F400
000201 62F400 000211 060780 0032BE 48D800 49E200 49E10D 0AF0A0 0032A3
33000D 0AF0A8 0032A7 51F400 7FFFFF 0AF080 0032BD 21C403 0AF0A4 0032AD
```

```
48E200  0AF080  0032B7  0616A0  01DB15  21C400  226E00  200036  06CC20  21D33A
48E200  06D320  200032  00FEB9  0618A0  018048  00FEB9  0618A0  018040  595900
585A00  000000  00000C  5E9600  44F400  000006  45F446  000001  4C9532  57B040
21DB64  0AF0AB  0032CC  21DB00  0A1EC6  0032E0  44F400  000033  20004D  0AF0AF
0032DC  63F400  002D3B  60F400  000219  07EB85  63F400  002D4B  0AF080  0032E7
200064  0AF0AB  0032E0  21DB00  63F400  002D1B  60F400  000219  07EB85  63F400
002D2B  61F400  000201  07EB87  62F400  000211  44E000  060780  0032F6  5ED900
5FDA65  0AF0A0  0032F6  00008C  0AF080  0032F9  045810  0AF080  003456  44E000
20007D  0AF0A0  003456  0A37E1  00330C  0A37C0  003315  57F400  0000A2  57F44D
0000AE  0AF0A0  003315  20004D  0AF0A0  003456  0AF080  003315  57F400  0000AC
57F44D  0000B8  0AF0A0  003315  20004D  0AF0A0  003456  57BD00  47F400  000001
200078  20003B  57BD4D  0AF0A9  003322  20007C  20003B  20004D  0AF0AF  003456
0A1EC6  0033D6  57B100  46F42E  000005  47F45D  000007  020058  21E600  200078
21F800  45AF00  47F400  000200  47F4F9  000003  20007C  20005C  47F44C  000001
06D800  00333D  0AF0A2  00333D  00008C  0AF080  0033A6  200078  57B100  47F42E
000003  20007D  0AF0A8  00334B  45AF00  47F400  000200  2000F9  20004D  0AF0A0
003397  0A340C  0AF0A8  003353  20001B  577000  00032A  577000  00032B  57B000
21E73B  47F478  000003  20007C  20005C  47F44C  000001  06D800  003362  0AF0A2
003362  00008C  0AF080  00337E  200078  57F400  00000F  20004D  0AF0A8  0033D6
61F400  002D5B  390C00  45B300  060C80  003375  07D98F  20006D  0AF0A8  003375
00008C  0AF080  003376  000000  045111  000000  07E985  200065  0AF0A0  003456
0AF080  0033D6  61F400  002D5B  398400  57B300  20003A  20003A  21E500  060C80
00338E  07D98F  20006D  0AF0A8  00338E  00008C  0AF080  00338F  000000  045111
000000  07E985  200065  0AF0A0  003456  0AF080  0033D6  61F400  002D5D  45B300
060A80  0033A3  07D98F  20006D  0AF0A8  0033A3  00008C  0AF080  0033B3  000000
0AF080  0033B3  61F400  002D5D  45B300  060C80  0033B2  07D98F  20006D  0AF0A8
0033B2  00008C  0AF080  0033B3  000000  045111  5F9700  45F40B  00000C  0AF0AA
0033D6  21E700  2000F8  20002A  213900  000000  044911  000000  07E185  200065
0AF0A0  003456  393C00  56F000  00032A  07E985  200065  028060  567000  00032A
57F000  00032B  47F405  000001  0AF0A8  0033D6  200078  577000  00032B  00000C
61F400  000FF8  223400  71F400  FFF98A  233C00  330300  060380  003427  45F400
010000  56D900  46F465  001000  0AF0A9  0033FF  06D300  0033FC  4EEC00  5EE900
47F450  000003  200044  200026  200075  0AF0AF  0033F9  5EE900  200054  200026
200044  200026  200075  0AF0A7  0033FC  00008C  00008C  00000C  045911  0AF080
003425  200055  0AF0A1  003405  00008C  0AF080  003428  06D300  003424  56E100
46F400  000040  200055  0AF0A7  003410  00008C  0AF080  003425  5EE900  4EEC00
47F450  000001  200044  200026  200075  0AF0AF  003421  5EE900  200054  200026
200044  200026  205975  0AF0A7  003424  00008C  00008C  00000C  000000  045C14
045313  229100  61F400  000FF8  71F400  FFF98A  45F400  000040  48E100  060480
00344A  46B065  0AF0A7  003437  00008C  0AF080  00344B  0A3490  003440  5EE900
47F454  000001  200026  200075  0AF0AF  00344A  5EE900  200033  200044  47F426
000001  200075  0AF0A7  00344A  00008C  00000C  48D900  0A1EE6  003455  0A1EC3
003455  56F400  00000E  200045  0AF0A8  003455  0A1E62  0A1E53  00000C  0BF080
00347A  5EB900  21C403  0AF0AA  003462  5EBA00  45F400  00002E  200060  5E3A00
0AB0AC  003479  0AF0AB  003479  45F400  000005  2000A8  212400  200044  5E3A00
5EB800  44F403  000001  0AF0AA  003479  200045  0AF0A2  003477  0BF080  00350A
00000C  0BF080  00351E  00000C  56BA00  44BB00  209044  0AF0AA  0034B8  0AF0A3
003484  44F400  000020  200040  051FA0  44F400  000081  5FD800  221100  44F44D
000082  0AF0AA  003497  45F44D  000001  0AF0AA  0034BA  603B00  200064  0AF0A2
003485  0AF080  0034B8  45F400  000002  5FD865  0AF0A9  0034B8  44F400  000020
44F44D  000022  0AF0A9  003507  45F44D  000003  0AF0A7  003507  44F465  00000D
0AF0A9  0034B8  5FD000  20004D  0AF0A2  0034B6  5FD800  44F400  000020  20004C
```

```
5D3800 313800 611B00 0A1F73 205803 603B00 0460A1 00000C 45F464 000004
0AF0AA 0034F4 44F465 000030 0AF0AF 0034F6 5ED800 45F444 000009 0AF0AB
003507 46F465 0001F4 0AF0A7 003507 21C700 5ED8B8 200044 0AF0AB 003507
46F465 000032 0AF0A7 003507 21C700 2000B0 5ED818 200044 0AF0AB 003507
46F465 000005 0AF0A7 003507 21C700 2000B0 5ED818 200044 0AF0AB 003507
44F465 00000D 0AF0A7 003507 21C700 212E00 5FD870 20004D 0AF0A2 003507
5E391B 5F3A00 313900 611B00 0A1F73 603B00 0460A1 00000C 45F400 000009
5FD800 06CC00 003504 20004C 0AF0AB 003501 20006D 0AF0AF 003504 00008C
0AF080 003507 5FD800 0460A1 00000C 613B00 0460A1 00000C 60F400 000880
603800 340800 0A1FEB 003514 0BF080 003578 0AF080 003516 0BF080 003572
44F400 00000D 4C6000 60F400 FFFFFC 603900 0AB02C 00000C 60F400 000880
603800 44F400 000081 4C5800 240000 4C5800 4C5000 0A2DCE 00352A 0A6060
0A2DC9 00352D 0A6061 0A2DC2 003530 0A6062 0A2CD1 003533 0A6063 0A2BCC
003536 0A6064 0A2BD3 003539 0A6065 0A5866 0A2BD4 00353D 0A6060 0A2BD2
003540 0A6061 0A2CC6 003543 0A6062 0A5866 340A00 0A1EC6 00354D 0A3490
00354D 0BF080 003578 0AF080 00354F 0BF080 003572 340900 0A1FD2 003556
0BF080 003578 0AF080 003558 0BF080 003572 340B00 0A1FD5 00355F 0BF080
003578 0AF080 003561 0BF080 003572 340800 0A1FEB 003568 0BF080 003578
0AF080 00356A 0BF080 003572 44F400 00000D 4C6000 60F400 FFFFF0 603900
0AB02C 00000C 44F400 000020 4C5800 4C5800 4C5800 00000C 56E400 47F423
00000F 0607A0 200023 46F476 000030 200050 5C5800 56E400 0604A0 200023
200076 200050 5C5800 56E400 200076 200050 5C5800 00000C 67F400 001000
05F427 000FFF 08F4BE 002220 08F4A4 000084 08F4A2 004EF4 08F4A5 000010
08F4A3 00001C 300013 44F400 002000 06C400 00359F 485800 60F400 000820
602E00 602D00 60F400 000840 683200 60F400 000848 681C00 305000 681100
60F400 000860 603A00 603B00 60F400 000A00 687000 00084F 60F400 000B80
687000 000BA0 0A2071 0BF080 001321 08F4AC 006000 08F4AD 00B600 08F4B0
000B02 08F4A1 000003 08F4BF 007030 00FCB8 301400 0D0FF5 47F400 000005
200075 027070 5E1400 60F433 002E0D 64F433 000840 200033 219800 060880
0035D6 07E886 B89803 60F400 002C21 312B00 060380 0035DD 07D884 4C5900
0D0CD6 064B80 0035E6 0D0CD6 0A1EF6 0035E2 0BF080 00106A 0BA407 0A1FD0
0035EF 0D0DF7 361900 0D0B2F 0D0E03 361900 0D0B2F 312B00 240000 4C5900
44F400 000800 4C5900 248000 4C6100 0AA427 301700 0D0FF5 47F400 000005
200075 027070 200003 0AF0A2 003603 56F400 000002 5E1700 301500 0D0FF5
47F400 000004 200075 0AF0A8 00360D 56F400 000002 5E1500 303700 0D0FF5
47F400 000003 200075 0AF0A8 003616 200013 5E3700 303800 0D0FF5 47F400
000002 200075 0AF0AF 00361F 200013 5E3800 303900 0D0FF5 47F400 00270F
200075 0AF0AF 003628 200013 5E3900 0A1EF7 003629 301E00 0D0FF5 47F400
000078 47F400 0001F8 200076 5E1E00 0A1E6B 0A1EE4 00363A 0AA42E 0A2D62
0AF080 00363B 0A2D69 301F00 0D0FF5 47F400 007081 47F476 007000 5E1F76
47F400 001000 200075 0AF0AA 003653 200023 200075 0AF0AA 003653 200023
47F475 000081 0AF0AA 003653 5E9F00 200076 5C1F00 0A1EE6 00365C 44F400
862246 0A1EC3 00365C 44F400 AA7914 441A00 301600 0D0FF5 47F400 00001F
200076 5C1600 301900 0D0FF5 47F400 000007 200075 0AF0AF 00366B 56F400
000005 60F400 002E48 21D800 5E1900 07E887 08C732 301800 0D0FF5 47F400
0000FF 200075 0AF0A7 003679 5C1800 301B00 0D0FF5 47F400 000005 200075
0AF0A0 003681 5E1B00 302000 0D0FF5 47F400 00000B 200076 5E2000 47F400
000003 47F476 000001 200075 0AF0AA 00368F 0A2040 0BF080 001183 0A1FE9
003695 0B1F60 0F8963 0A1EC6 00369E 0D09AD 0A1EC7 00369E 0A2B6C 0A1EE8
00369E 0A2C71 0D0CD6 0C05E5 61F400 000982 63F400 000FF8 060480 0036B7
60F413 000221 340000 320100 06FE80 0036AE 49D800 205C05 038402 60F400
00021F 225800 485B00 044810 6A591B 495800 495800 496000 578D00 20000B
```

```
0AF0AA 0036C6 21E43B 63F448 000FF8 060480 0036C4 48E300 06CD20 200022
485B00 000000 00000C 0C0A4E 0C0B43 0C0A4D 0C0A4D 0C0A4D 0C0A4D 0C0A4D
0C0A4D 0C0C24 0C0BC3 0C0A57 0C0A4D 0C0A4D 0C0A4D 0C0A4D 0C0A4D 0C0B9A
0C0C75 0C0BC3 0C0A4D 0C0A4D 0C0A4D 0C0A4D 0C0A4D 0C0C35 0C0C4E 0C0C9F
0C0CBB 0C0A4D 0C0A4D 0C0A4D 0C0A4D 0C0A4D 0C0A4D 0C0A4D 0C0A4D 0C0B7A
0C0B6D 0C0C07 0C0A4D 0C0A4D 0C0A4D 0C0A4D 0C0A4D 0C0A4D 0C0A57 0C0BC3
0C0A4D 0C0A4D 0C0A4D 0C0A4D 0C0A4D 0C0A4D 0C0C9F 0C0B9A 0C0C75 0C0A4D
0C0A4D 0C0A4D 0C0A4D 0C0A4D 0C0C4E 0C0CBB 0C0C35
_END 0000
```

What is claimed is:

1. In a police traffic surveillance radar having an antenna unit of conventional design for transmitting radar signals and receiving radar signals reflected from stationary and moving objects, and coupled to a frequency counting and display unit of conventional design having at least one display window, the improvement comprising:

a switch having open and closed states and which can be caused to transition between said open and closed states by a user directly or through an infrared data link, said switch providing the capability for a user to reject an obviously incorrect patrol speed by causing said switch to transition to a predetermined one of said open or closed states;

a first circuit for selecting a radar return signal received by said antenna as the most likely candidate for calculating and displaying patrol car speed, and for calculating and displaying patrol car speed in said at least one display window of said counting and display unit based upon said selected most likely candidate radar return signal and wherein said first circuit is coupled to said switch so as to sense the state of said switch so as to determine if the displayed patrol speed currently displayed by said first circuit is incorrect, and, if said user has rejected the currently displayed patrol speed, said first circuit for blanking the displayed patrol speed and generating said reject signal and, upon receiving said reject signal, selecting a new most likely candidate radar return signal for calculating and displaying patrol car speed, and for calculating and displaying patrol car speed in said at least one display window based upon said selected new most likely candidate radar return signal.

2. A police traffic surveillance radar, comprising:

an antenna unit for transmitting radar signals and receiving a spectrum of radar signals reflected from stationary and moving objects;

a counter/display unit coupled to said antenna unit and having at least one display;

first means for selecting and tracking a radar return signal from the spectrum of radar return signals received by said antenna unit as the most likely candidate signal indicating patrol speed and for calculating patrol speed therefrom and displaying said patrol speed on a display of said counter/display unit;

a switch operable directly or indirectly by a user to reject an incorrect displayed patrol speed;

second means coupled to said switch for sensing when said switch has been changed by said user to a state indicating the patrol speed displayed by said first means is incorrect and for generating a reject signal indicating said displayed patrol speed is incorrect;

and third means for sensing activation of said reject signal and for selecting from said spectrum of radar return signals a new radar return signal which is different from the radar return signal previously selected and tracked from which the incorrect patrol speed was calculated, said new radar return signal being the next most likely candidate for patrol speed and calculating and displaying therefrom a new patrol speed.

3. An apparatus, comprising:

antenna means for sending radar signals and receiving a spectrum of reflected radar signals which bounced back to said antenna from stationary and moving objects;

counter/display means coupled to said antenna means and having at least one display, for receiving signals from said antenna means embodying said spectrum of reflected radar signals, and for selecting a reflected radar signal from said spectrum which is the most likely candidate for patrol car speed and calculating therefrom patrol car speed and displaying said calculated patrol car speed on said display, and for selecting the strongest radar return signal in said spectrum from a moving target and calculating the speed of said moving target therefrom and displaying said calculated speed on said display, and for receiving a signal from a user rejecting the currently displayed patrol car speed as incorrect and removing said currently displayed patrol car speed and excluding the reflected radar signal from which the rejected currently displayed patrol speed was calculated before re-selection of a new reflected radar signal from said spectrum of reflected radar signals as a new patrol speed candidate signal and calculating a new patrol car speed therefrom and displaying said new patrol car speed;

means operable by a user for generating said reject signal in response to a signal from a user in response to display of an incorrect patrol car speed displayed on said display of said counter/display means.

4. The apparatus of claim 3 wherein said counter/display means includes means for overriding said reject signal and re-displaying the originally calculated patrol speed rejected by the operator after a predetermined amount of time passes in trying to find a new candidate for patrol speed without success.

5. A police traffic surveillance radar, comprising:

an antenna unit for sending radar signals and receiving a spectrum of Doppler radar signals reflected from stationary and moving objects;

counter/display unit coupled to said antenna unit and having at least one display, for receiving signals from said antenna unit embodying said spectrum of radar signals, and including a computer programmed to carry out a target recognition algorithm imposing predetermined screening criteria on the signals in said spectrum so as to select a signal from said spectrum which is the most likely candidate for patrol car speed and calculate therefrom patrol car speed and display said calculated patrol car speed on said display, said computer also programmed to select a radar return signal in said spectrum representing the strongest radar return signal from a moving target and programmed to calculate the speed of said moving target therefrom and display said calculated speed on said display, and further programmed to receive a signal from a user indicating that the displayed patrol car speed is incorrect in the opinion of the user and programmed to remove said displayed patrol car speed and exclude from said target recognition algorithm the signal in said spectrum from which the rejected patrol speed was calculated, and programmed to re-execute said target recognition algorithm so as to select a new patrol speed candidate signal from said spectrum of Doppler radar return signals and calculate a new patrol car speed therefrom and display said new patrol car speed on said display.

6. A police traffic surveillance radar, comprising:

antenna means for generating radar signals and transmitting said radar signals and for receiving radar signals and suppressing even order harmonics thereof, and for amplifying the received signals with an adjustable gain and digitizing said received signals;

counting/display means for calculating the speed of the moving target having the strongest radar return signal and displaying said speed and for calculating and displaying from said radar return signals the speed of the patrol car carrying said police traffic surveillance radar;

digital serial data transmission means for transmitting said digital data in serial format from said antenna means to said counting display means;

a switch directly or indirectly operable by a user to reject an obviously incorrect patrol car speed displayed by said counting/display means;

and wherein said counting/display unit includes a computer programmed to read said switch to determine if it has been placed in a position indicating the currently displayed patrol car speed is incorrect and to select a new signal from said spectrum of radar return signals as a candidate for patrol car speed and calculate therefrom and display a new patrol car speed.

7. A police traffic surveillance radar, comprising:

an antenna unit for sending radar signals and receiving a spectrum of radar signals reflected from stationary and moving objects, said antenna unit having an amplifier therein coupled to amplify audio range frequencies derived from said spectrum of received radar signals and having a gain control signal input for receiving a gain control signal which controls the gain of said amplifier;

a switch directly or indirectly operable by a user to reject an obviously incorrect patrol car speed displayed by said counting/display means;

counter/display unit coupled to said antenna unit and having at least one display, for receiving signals from said antenna unit embodying said spectrum of radar signals, and including a computer programmed to carry out a target recognition algorithm imposing predetermined screening criteria on the signals in said spectrum so as to select a signal from said spectrum which is the most likely candidate for patrol car speed and calculate therefrom patrol car speed and display said calculated patrol car speed on said display, and further programmed to read the position of said switch to determine if said switch is in a position indicating that the displayed patrol car speed is incorrect in the opinion of the user and remove said patrol car speed from said display and exclude from said target recognition algorithm the signal in said spectrum from which the rejected patrol car speed was calculated, and programmed to re-execute said target recognition algorithm so as to select a new patrol speed candidate signal from said spectrum of radar return signals and calculate a new patrol car speed therefrom and display said new patrol car speed on said display;

means for comparing the amplitude of signals being received from the antenna unit to high and low reference limits and generating said gain control signal from said comparison to keep said amplitude within said limits and for informing said computer of the gain level that was in use for any signal received from said antenna unit; and wherein said computer is programmed to use said information about the gain applicable to signals received from said antenna unit to calculate the true power of said signals and to use said true power information to improve the process of selection of a signal from which said patrol speed is to be calculated by eliminating any signal as a candidate for calculation of patrol speed therefrom which does not satisfy minimum acceptable signal-to-noise criteria based upon said true power.

* * * * *